United States Patent [19]

Sugawa et al.

[11] Patent Number: 6,127,692
[45] Date of Patent: Oct. 3, 2000

[54] PHOTOELECTRIC CONVERSION APPARATUS

[75] Inventors: Shigetoshi Sugawa; Ihachiro Gofuku, both of Atsugi; Kazuaki Ohmi, Hadano; Yoshiyuki Osada, Atsugi; Masato Yamanobe, Machida, all of Japan

[73] Assignee: Canon Kabushiki Kaisha, Tokyo, Japan

[21] Appl. No.: 08/141,723

[22] Filed: Oct. 26, 1993

Related U.S. Application Data

[63] Continuation of application No. 07/667,400, Apr. 3, 1991, abandoned.

[30] Foreign Application Priority Data

| Aug. 4, 1989 | [JP] | Japan | 1-201449 |
|---|---|---|---|
| Mar. 2, 1990 | [JP] | Japan | 2-49592 |
| Mar. 2, 1990 | [JP] | Japan | 2-49593 |
| Mar. 2, 1990 | [JP] | Japan | 2-49594 |
| Mar. 2, 1990 | [JP] | Japan | 2-49595 |
| Mar. 2, 1990 | [JP] | Japan | 2-49602 |
| Aug. 3, 1990 | [WO] | WIPO | PCT/JP90/00999 |
| Aug. 4, 1990 | [JP] | Japan | 1-201450 |

[51] Int. Cl.$^7$ ............ H01L 29/06; H01L 39/00; H01L 31/075; H01L 31/105
[52] U.S. Cl. .................................... 257/30; 257/458
[58] Field of Search .......................... 257/30, 458

[56] References Cited

U.S. PATENT DOCUMENTS

| 4,887,134 | 12/1989 | Saito et al. | 357/16 |
|---|---|---|---|
| 4,933,731 | 6/1990 | Kimura | 357/30 |
| 4,980,736 | 12/1990 | Takasaki et al. | 357/30 |
| 5,023,685 | 6/1991 | Bethea et al. | 357/16 |

FOREIGN PATENT DOCUMENTS

| 0053513 | 6/1982 | European Pat. Off. |
|---|---|---|
| 0087299 | 8/1983 | European Pat. Off. |
| 227016 | 1/1988 | European Pat. Off. |
| 0277016 | 8/1988 | European Pat. Off. |
| 3829003 | 3/1989 | Germany. |
| 63-278269 | 11/1988 | Japan. |
| 63-233574 | 1/1989 | Japan. |

OTHER PUBLICATIONS

Jwo et al, IEEE Trans–on Electron Devices, vol. 35, No. 8, Aug. 1988, pp. 1279–1283.

"Amorphous Silicon/Silicon Carbide Superlattice Avalanche Photodiodes" by Shin–Chering Jwo et al.; IEEE Transactions on Electron Devices vol. 35; (1988) Aug., No. 8, New York, N.Y., USA; pp. 1279–1283.

*Primary Examiner*—Stephen Meier
*Attorney, Agent, or Firm*—Fitzpatrick, Cella, Harper & Scinto

[57] ABSTRACT

A photoelectric conversion apparatus of this invention has a high sensitivity and low noise, and can be formed to have a large area at a relatively low temperature since it has a light absorption layer (310), formed of a non-monocrystalline material, for absorbing light and generating photocarriers, and a multiplication layer (301, 303, 305, 307, 309) for multiplying the photocarriers generated by the light absorption layer.

13 Claims, 53 Drawing Sheets

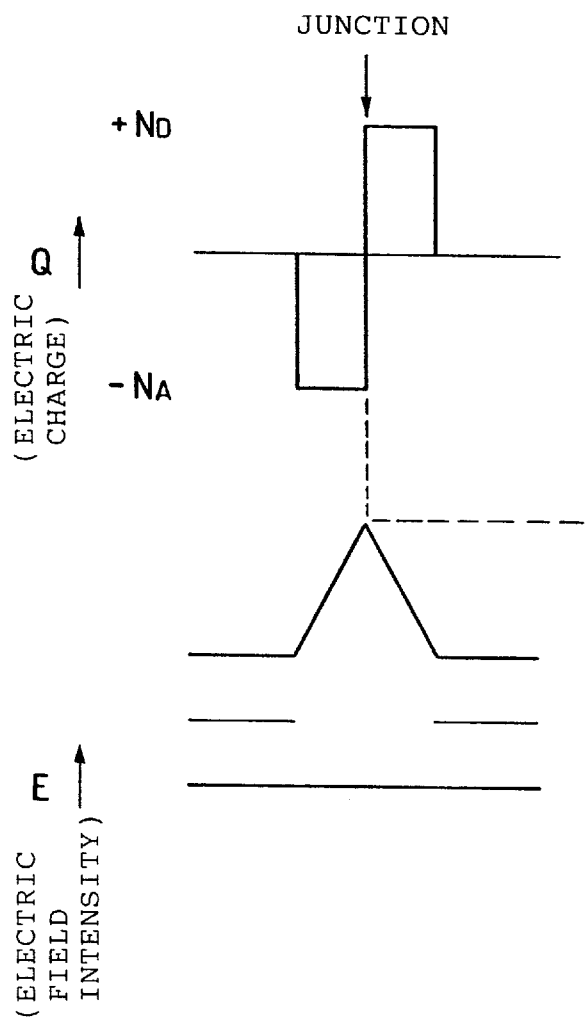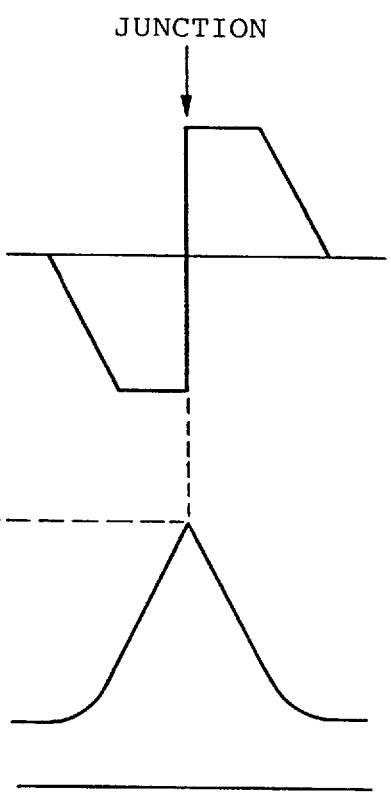
FIG. 5A
FIG. 5B

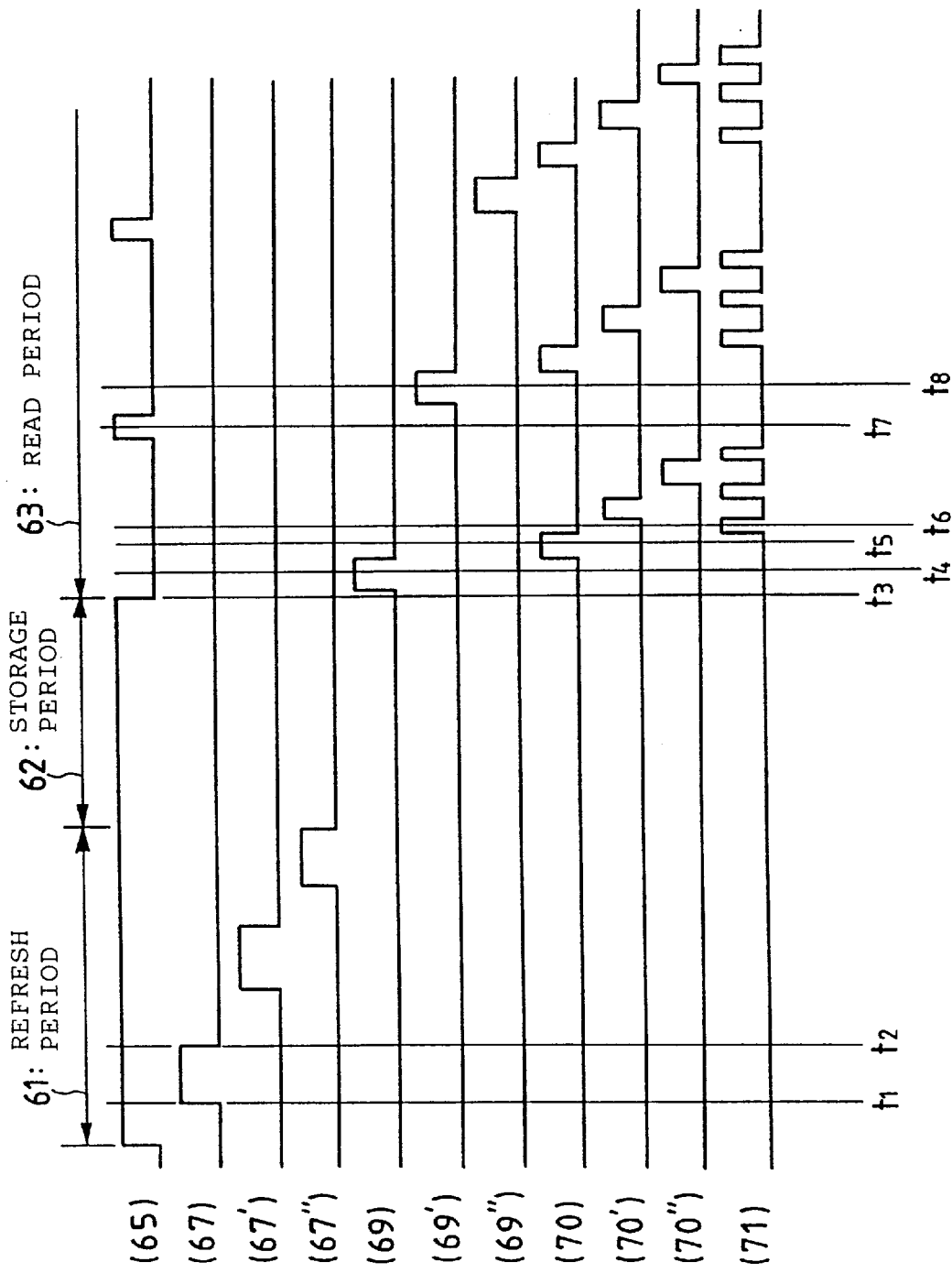

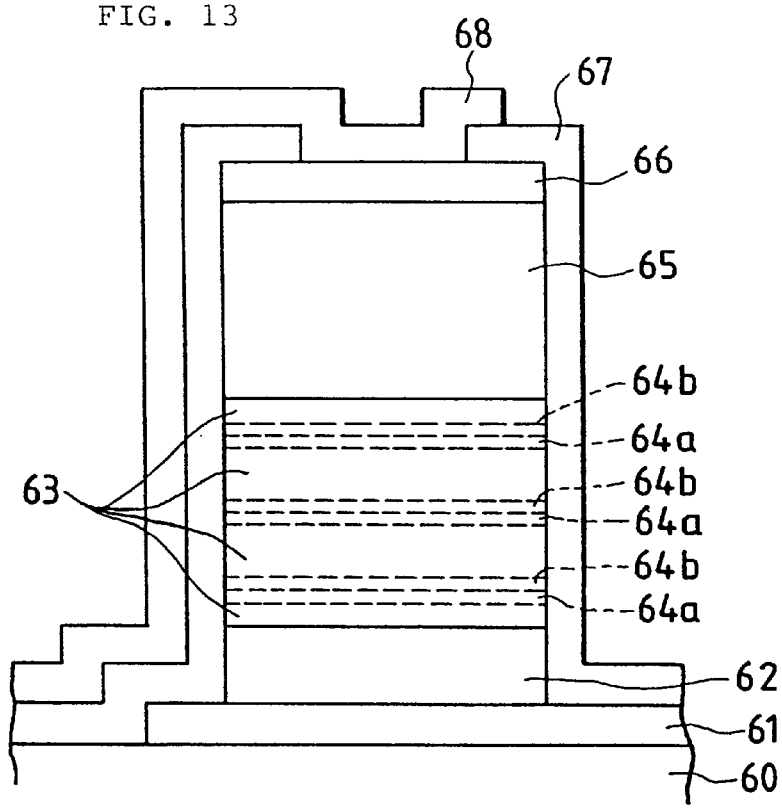
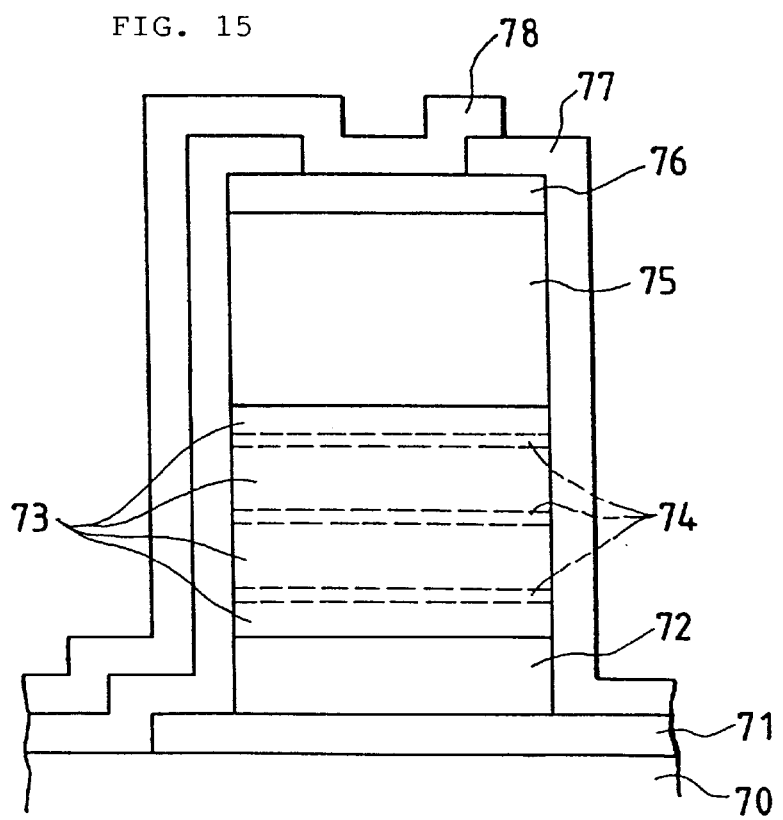

ONE PIXEL

ONE PIXEL

PHOTOELECTRIC CONVERSION APPARATUS

This application is a continuation of application Ser. No. 07/667,400 filed Apr. 3, 1991 now abandoned.

BACKGROUND ART

1. Technical Field

The present invention relates to a photoelectric conversion apparatus and, more particularly, to a photoelectric conversion apparatus utilizing an avalanche effect for amplifying optically generated carriers by impact ionization.

In particular, the present invention relates to a low-noise photoelectric conversion apparatus suitably used in a photometric sensor for a camera, or an image sensor for an image reading apparatus such as a facsimile system, a copying machine, or the like, or a light-receiving sensor in an optical communication apparatus, or the like.

2. Related Background Art

In information transmission techniques in a video information system, optical communication, and other industrial and commercial fields, which utilize light as a medium of an information signal, a semiconductor light-receiving element for converting a light signal into an electrical signal is one of the most important and basic constituting elements, and a large number of elements have already been commercially available. In general, semiconductor light-receiving elements are required to have a high signal-to-noise ratio against its photoelectric conversion characteristics.

Of these elements, an avalanche photodiode utilizing an avalanche effect (to be abbreviated to as an APD hereinafter) is a promising candidate of a semiconductor light-receiving element satisfying such requirements since it has a high gain and a high response speed.

A large number of APDs have already been commercially available as, in particular, semiconductor light-receiving elements in optical communication systems which elements use compound semiconductors such as InGaAs, and the like as materials. Furthermore, developments have been made to improve basic performance, e.g., low noise, high-speed response, a high gain, and the like of elements. In addition, demand has arisen for an application to other fields, for example, visible light light-receiving elements.

FIG. 1 is a longitudinal sectional view showing a structure of a conventional APD for optical communication.

In FIG. 1, reference numeral 101 denotes an n$^+$-type InP layer; 102, an n-type InGaAs layer; 103, an n-type InP layer; and 104, a p$^+$-type InP layer. Note that the n-type InGaAs layer 102, the n-type InP layer 103, and the p$^+$-type InP layer 104 are formed to have a mesa pattern. A p-type electrode 106 is formed on the upper surface of the p$^+$-type InP layer 104 to leave a window 105, and an n-type electrode 107 is formed on the lower surface of the n$^+$-type InP layer 101. Reference numeral 108 denotes a passivation film. When the p- and n-type electrodes 106 and 107 are biased in opposing directions, and light is radiated from the window 105, light is absorbed by the n-type InGaAs layer 102 (to serve as a light absorption layer), thus performing photoelectric conversion. More specifically, electron-hole pairs formed in the n-type InGaAs layer 102 respectively migrate toward the n- and p-type electrodes 107 and 106. Since the n-type InP layer 103 (serving as a multiplication layer) has a strong electric field, it causes an avalanche phenomenon for forming a large number of electron-hole pairs during a hole migration process, thus causing a multiplication effect for forming a plurality of electron-hole pairs per photon. As a result, very weak incident light can be detected. However, the conventional structure suffers from two drawbacks. That is, a practical multiplication effect is as small as about twice, and over-multiplication noise is generated due to a fluctuation present in a multiplication process, thus decreasing a signal-to-noise ratio.

It is known according to an article by R. J. McIntyre (IEEE Transactions on Electron Devices, Ver. 13, pp. 164–168 (January, 1966)) that noise generated during an avalanche multiplication process strongly depends on a ratio $k=\beta/\alpha$ of an electron ionization ratio a to a hole ionization ratio $\beta$.

Note that the electron ionization ratio is a ratio of generating electron-hole pairs by impact ionization when electrons are accelerated by an electric field. The hole ionization ratio is a ratio of impact ionization by holes. Furthermore, this article also reveals that in order to obtain a low-noise APD, k is decreased when electron multiplication is performed, while k is increased when hole multiplication is performed. More specifically, it is important for obtaining a high signal-to-noise ratio in an APD to avalanche-multiply only carriers having a larger ionization ratio in materials having considerably different carrier (electron or hole) ionization ratios. This article also describes that an over-noise index F becomes 2 as a low-noise limit attained when only one carrier is avalanche-multiplied. In an ideal state wherein no noise is generated at all, F should become 1. The article also implies that a certain mechanism for generating noise is present at the limit of F=2. As this mechanism, the phenomenon occurs. In this phenomenon, locations, where ionization (inverse Auger effect) as a fundamental process of avalanche multiplication occurs when avalanche multiplication is performed, fluctuate independently, and such fluctuations are multiplied, thus causing a fluctuation in multiplication ratio.

In consideration of the above-mentioned findings, in order to perform avalanche multiplication free from noise generation, ① a location where ionization as its fundamental process must be specified in an element, and ② a probability of ionization at the ionization location must be specified. Furthermore, in order to perform high-gain avalanche multiplication, the probability of ionization must be approximate to 1 as much as possible.

In consideration of the above-mentioned two drawbacks, i.e., a small degree of multiplication, and a decrease in signal-to-noise ratio (SN ratio), as an APD for optical communication, for example, F. Capasso et. al. proposed a low-noise APD which is prepared using a compound semiconductor mainly belonging to Group III–V using molecular beam epitaxy (MBE) and can be used in an optical communication system in Japanese Laid-Open Patent Application No. 58-157179, and IEEE Electron Device Letters, Ver. EDL3 (1982), pp. 71–73.

The characteristic feature of this element is a multilayered heterojunction structure. In this structure, a large number of semiconductor layers in which a band gap is continuously changed from a narrow side to a wide side by changing composition ratios of its constituting materials (for example, if compound semiconductors belonging to Group III–V are constituting materials, a composition ratio of Group III semiconductors to Group V semiconductors) are stacked, and ionization is promoted by utilizing stepwise transition portions of energy bands (to be referred to as a stepback structure hereinafter). The schematic structure of the proposed element will be described below with reference to FIGS. 2A to 2C.

FIG. 2A is a sectional view of this element. Stepback structure layers 201, 203, 205, 207, and consisting of five layers serving as multiplication layers are sandwiched between p- and n-type semiconductor layers 211 and 215 which serve as light absorption layers. An electrode 213 is in ohmic-contact with the p-type semiconductor layer 211, and an electrode 214 is in ohmic-contact with the n-type semiconductor layer 215.

FIG. 2B is a view showing a structure of energy bands of inclined band-gap layers when no bias is applied to this element, and illustrates three inclined band-gap layers. These layers have compositions for linearly changing a band gap from a narrow band-gap Eg2 to a wide band-gap Eg3.

Magnitudes of stepbacks of conduction and valence bands are represented by $\Delta Ec$ and $\Delta Ev$. As will be described later, in order to mainly facilitate ionization of electrons, $\Delta Ec$ is set to be larger than $\Delta Ev$.

FIG. 2C is a view showing a structure of energy bands when a reverse bias voltage is applied to this element. Note that the reverse bias voltage need not be a stronger electric field than that for an APD shown in FIG. 1.

When light is incident from the p-type semiconductor layer 211, light absorbed by the p-type semiconductor layer and the respective stepback structure layers is subjected to photoelectric conversion like in the above-mentioned APD, and formed electron-hole pairs migrate toward n- and p-type semiconductor layers 215 and 211, respectively. However, a difference from the APD shown in FIG. 1 is that when the energy step $\Delta Ec$ of each stepback structure (for electrons, $\Delta Ev$ for holes) becomes larger than an ionization energy, electrons are ionized to generate electron-hole pairs, and cause a multiplication effect. Of course, since the respective stepback structure layers perform the same operation, the multiplication effect occurs $2^n$ times with respect to the number of layers n. For example, ideally, since a hole ionization ratio can be suppressed to be very smaller than an electron ionization ratio when $\Delta Ec>>\Delta Ev=0$ is set, low noise can be realized as compared to the above-mentioned APD.

More specifically, a bias voltage is applied to generate an electric field (drift electric field) so as to convert at least the inclined band-gap layers 201, 203, 205, and 209 of the stepback structure layers into depletion layers, and to cause a carrier drift but not to cause ionization in the inclined band-gap layers. Light hυ is absorbed by a depletion region next to the p-type semiconductor layer 211, i.e., by the inclined band-gap layer 203, and generates electrons in the conduction band and holes in the valence band, respectively. The generated electrons drift in the layer 203 toward a stepback of the first conduction band. Since the energy step $\Delta Ec$ has already been present at the stepback, and the electrons can compensate for an energy necessary for causing ionization by this energy step, a probability of causing ionization by the electrons immediately after the stepback is increased. When $\Delta Ec$ is equal to or larger than the ionization energy of the electrons, or if a short energy can be supplied from the drift electric field even when it is smaller than the ionization energy of the electrons, the probability of causing ionization after the stepback can be sufficiently approximate to 1. When ionization occurs, one electron becomes two electrons and one hole. The two electrons drift in the inclined band-gap layer 203 toward the second stepback, and cause the same phenomenon as described above at the second stepback. Meanwhile, the hole generated in a front portion in the inclined band-gap layer 203 drifts forward, i.e., in a direction opposite to the electrons, and reaches the first stepback. If the energy step $\Delta Ev$ which does not cause ionization of the hole has already been present in the valence band of the first stepback, the drifting hole is kept migrating forward. If there is a positive energy step in front of the hole shown in FIG. 2C, the hole is scattered or stored at the stepback, but does not cause ionization. In this manner, a drift and ionization of electrons and a drift of holes are repeated at the respective inclined band-gap layers and stepbacks, thus multiplying the number of carriers. Finally, electrons multiplied by ionization reach the n-type semiconductor layer, and are extracted as an electron current from a layer which is in ohmic-contact with the n-type semiconductor layer, while holes reach the p-type semiconductor layer and are extracted as a hole current from a layer which is in ohmic-contact with the p-type semiconductor layer.

As can be understood from the above description, the multilayered heterojunction structure in which a large number of semiconductor layers in which a band gap is continuously changed from a narrow side to a wide side by changing a composition ratio of its constituting materials are stacked, and which utilizes stepbacks formed at that time to promote ionization can constitute a low-noise APD which embodies an idea in that a location of ionization is specified, and a probability of ionization is approximate to 1 as much as possible, as described above.

Although the above-mentioned element structure is one means for realizing a low-noise APD, various limitations are exerted in practice upon formation of an element having such a structure.

In order to obtain an element having stepback structure layers which can promote ionization by only changing a composition ratio of the constituting materials, constituting materials and a formation method are limited. For example, materials which can constitute an element having such a structure include Group III–V compound semiconductors, e.g., one obtained by growing AlGaAsSb/GaSb on a GaSb substrate, one obtained by growing InGaAlAs/InGaAs on an InP substrate, and one obtained by growing InGaAsSb/GaSb on a GaSb substrate, or a material obtained by growing HgCdTe as a Group II–VI compound semiconductor on a lattice-matched substrate.

However, Ga, As, Hg, Cd, and the like used herein are materials posing a lot of problems in industrial use since they have high toxicity, and are rare and expensive elements.

These compounds are prepared by molecular beam epitaxy (MBE). However, the MBE requires an ultra high vacuum, has a low growth rate of a semiconductor, and is not suitable for a large-area structure, thus disturbing mass-production. Furthermore, in the MBE, a growth temperature of a semiconductor is typically as high as 500 to 650° C. Therefore, when such a light-receiving element is stacked on a semiconductor device on which integrated circuits, and the like have already been formed, the existing semiconductor device may be damaged.

In order to form such a low-noise APD, the composition ratio of these materials must be changed to always cause ionization at stepbacks. For this purpose, the composition ratio of materials must be determined in consideration of a lattice matching property which does not cause a trap level of a heterojunction interface, and an electron affinity having a stepback energy step equal to or larger than an ionization energy. As a result, the band gap of an actually formed APD is limited.

For example, when the first materials were used, it was experimentally confirmed that in a lattice-matched structure, a band gap of a material (GaSb) having a narrowest band gap was 0.73 eV, a band gap of a material ($Al_{1.0}Ga_{0.0}As_{0.08}Sb_{0.92}$) having a widest band gap was 1.58 eV, a maximum band gap difference was 0.72 eV on the side of the conduction band and 0.13 eV on the side of the valence band, and an electron ionization energy was 0.80 eV (GaSb). 0.08 eV as a shortage of the electron ionization energy at the stepback is supplied from an electron drift electric field. In this element, a leaking current (dark current) signal which is generated when no light is radiated tends to be generated, and increases noise components. As a result, a low-noise element cannot be obtained, thus posing a serious problem. Causes for generating a dark current include carriers injected from an ohmic-contact layer (electrode outside the element), carriers thermally generated via a defect level in the element or a hetero interface level, and the like. In this element, an effect for blocking injected carriers is consequently obtained by arranging the p- and n-type semiconductor layers. However, any conscious and sufficient consideration is not made in this respect, and this effect is not satisfactory. The number of thermally generated carriers depends on a defect level density, an interface level density, or the like, and essentially depends on a magnitude of a band gap. In general, however, it is known that the number of thermally generated carriers is decreased as the magnitude of the band gap is increased. However, this element is too narrow in minimum band gap to suppress the thermally generated carriers. A semiconductor light-receiving element having such a band gap is suitable for receiving light within a wavelength range of 1.0 $\mu$m to 1.6 $\mu$m, but is not suitable for light-receiving elements in other wavelength ranges, e.g., for a visible light light-receiving element, resulting in a limited application field.

In a combination of the second materials, although an ionization energy is as high as about 1 eV, a conduction band energy step at a stepback is as small as about 0.6 eV. Thus, the second materials are not promising ones.

Other materials described above also have the same drawbacks as in the first materials. In particular, in the last combination of materials, an article by T. P. Pearsall described in Electronic Letters Ver. 18, Vol. 12 (June, 1982), pp. 512–514 proposed an element having a minimum band gap of 0.5 eV and a maximum band gap of 1.3 eV by changing a composition ratio of Hg to Cd. However, this element has a very narrow minimum band gap, and is more easily influenced by a thermally generated dark current.

Therefore, in order to effectively put a low-noise APD having a structure for increasing a carrier ionization ratio into practical applications, the degree of freedom in selection of manufacturing methods, suppression of a dark current, a band-structure having a wide light-receiving wavelength range, and the like must be taken into consideration.

More specifically, when technical problems to be solved of the above-mentioned APD are summarized, the following technical problems on performance and manufacture are given.

The technical problems on performance of the element are as follows:
(1) Since incident light is absorbed by the p-type semiconductor layer and the multiplication layers, a multiplication ratio is changed depending on an incident wavelength of light, and is not suitable for a reading element.
(2) Since light absorption layers and multiplication layers have small forbidden bandwidths, a dark current during an operation is high, and noise is large.
(3) Since the element aims at optical communication, materials are limited, light to be coped with falls within a range of about 800 to 1,600 nm, and light in other wavelength ranges such as visible light cannot be coped with.

The technical problems upon manufacture of the element are as follows:
(1) In order to form a stepback structure using compound semiconductors, it is difficult to modulate compositions, and magnitudes of $\Delta Ec$ and $\Delta Ev$ are limited, thus restricting a low-noise structure.
(2) Since compound semiconductors belonging Groups III–V, II–IV, and the like are used as materials, there are problems as industrial materials such as toxicity and material costs.
(3) A formation method of compound semiconductors suffers from various problems. For example, an ultra high vacuum must be set, film formation must be performed at high temperatures (about 500 to 650° C.), a large-area structure is difficult to attain, etc. Therefore, this method is not suitable for a manufacturing method of a reading element.

SUMMARY OF INVENTION

It is an object of the present invention to provide a photoelectric conversion apparatus which can solve the conventional technical problems, has high-speed response, and has a novel structure which has low noise and a high sensitivity especially for visible region light, and can easily attain a large-area structure.

It is another object of the present invention to provide a semiconductor light-receiving element, in particular, a low-noise APD as a photoelectric conversion apparatus in which a dark current can be suppressed, and which has a wide light-receiving wavelength range, and good characteristics especially in a visible light wavelength range.

It is still another object of the present invention to provide a low-noise APD which has a high degree of freedom in materials and manufacturing methods.

It is still another object of the present invention to provide a photoelectric conversion apparatus which is constituted in such a manner that a light absorption layer, having a forbidden bandwidth Eg1, for absorbing light to generate photocarriers, and a multiplication layer, obtained by stacking one or a plurality of layers having a stepback structure in which a forbidden bandwidth is continuously changed to have a minimum forbidden bandwidth Eg2 and a maximum forbidden bandwidth Eg3, for multiplying the carriers generated upon light absorption, are stacked to be sandwiched between electric charge injection blocking layers.

It is still another object of the present invention to provide a photoelectric conversion apparatus which is constituted in such a manner that a light absorption layer, having a forbidden bandwidth Eg1, for absorbing light to generate photocarriers, and a multiplication layer, obtained by stacking one or a plurality of layers having a stepback structure in which a forbidden bandwidth is continuously changed to have a minimum forbidden bandwidth Eg2 and a maximum forbidden bandwidth Eg3, for multiplying the carriers generated upon light absorption, are stacked to be sandwiched between electric charge injection blocking layers,
   wherein the forbidden bandwidth Eg1 of the light absorption layer is set to be substantially equal to the maximum forbidden bandwidth Eg3 of the multiplication layer.

It is still another object of the present invention to provide a photoelectric conversion apparatus which is constituted in such a manner that a light absorption layer, having a forbidden bandwidth Eg1, for absorbing light to generate photocarriers, and a multiplication layer, obtained by stacking one or a plurality of layers having a stepback structure in which a forbidden bandwidth is continuously changed to have a minimum forbidden bandwidth Eg2 and a maximum forbidden bandwidth Eg3, for multiplying the carriers generated upon light absorption, are stacked to be sandwiched between electric charge injection blocking layers, wherein the forbidden bandwidth Eg1 of the light absorption layer is set to be substantially equal to the minimum forbidden bandwidth Eg2 of the multiplication layer.

It is still another object of the present invention to provide a photoelectric conversion apparatus which is constituted in such a manner that a light absorption layer, having a forbidden bandwidth Eg1, for absorbing light to generate photocarriers, and a multiplication layer, obtained by stacking one or a plurality of layers having a stepback structure in which a forbidden bandwidth is continuously changed to have a minimum forbidden bandwidth Eg2 and a maximum forbidden bandwidth Eg3, for multiplying the carriers generated upon light absorption, are stacked to be sandwiched between electric charge injection blocking layers, wherein the forbidden bandwidth Eg1 of the light absorption layer is continuously changed from a side of one electric charge injection blocking layer stacked on the light absorption layer so as to be substantially equal to the maximum forbidden bandwidth Eg3 of the multiplication layer on a side of the multiplication layer.

It is still another object of the present invention to provide a photoelectric conversion apparatus which is constituted in such a manner that a light absorption layer, having a forbidden bandwidth Eg1, for absorbing light to generate photocarriers, and a multiplication layer, obtained by stacking one or a plurality of layers having a stepback structure in which a forbidden bandwidth is continuously changed to have a minimum forbidden bandwidth Eg2 and a maximum forbidden bandwidth Eg3, for multiplying the carriers generated upon light absorption, are stacked to be sandwiched between electric charge injection blocking layers, wherein the forbidden bandwidth Eg1 of the light absorption layer is continuously changed from a side of one electric charge injection blocking layer stacked on the light absorption layer so as to be substantially equal to the minimum forbidden bandwidth Eg2 of the multiplication layer on a side of the multiplication layer.

It is still another object of the present invention to provide a photoelectric conversion apparatus which comprises a plurality of photoelectric conversion units, and a signal output unit comprising at least one of storage means for storing an electrical signal generated by the photoelectric conversion units, scanning means for scanning the electrical signal generated by the photoelectric conversion units, and reading means for reading out the electrical signal generated by the photoelectric conversion units, wherein the photoelectric conversion apparatus is constituted in such a manner that a light absorption layer, having a forbidden bandwidth Eg1, for absorbing light to generate photocarriers, and a multiplication layer, obtained by stacking one or a plurality of layers having a stepback structure in which a forbidden bandwidth is continuously changed to have a minimum forbidden bandwidth Eg2 and a maximum forbidden bandwidth Eg3, for multiplying the carriers generated upon light absorption, are stacked to be sandwiched between an electric charge injection blocking layer stacked on the light absorption layer and a substrate on which the signal output unit is formed, and which has an electric charge injection blocking function.

It is still another object of the present invention to provide a photoelectric conversion apparatus which can reduce light entrance to a multiplication layer since a light absorption layer independent of the multiplication layer is sandwiched between a stepback layer and an electric charge injection blocking layer, and can minimize a variation in multiplication ratio caused by entrance of light into the multiplication layer.

It is still another object of the present invention to provide a photoelectric conversion apparatus in which a multiplication layer is subjected to electron-multiplication by a stepback structure layer which has a large $\Delta Ec$ as a conduction band energy step corresponding to a difference between its maximum and minimum forbidden bandwidths Eg3 and Eg2, and which can attain a low-noise structure and can obtain a sufficient multiplication ratio.

It is still another object of the present invention to provide a photoelectric conversion apparatus which can eliminate problems in formation of a multilayered structure, so that the apparatus can be easily formed on a large-area substrate at a low temperature (e.g., 200 to 300° C.) by a film formation method capable of forming a film at a relatively low temperature, e.g., by a plasma CVD method, a multiplication layer having a stepback structure can be relatively easily formed since control of a forbidden bandwidth, e.g., composition modulation, and the like can be facilitated, thermal diffusion of atoms due to, e.g., heat can be suppressed and a relatively reliable stepback structure can be formed, and so on.

It is still another object of the present invention to provide a photoelectric conversion apparatus which can increase a degree of freedom in selection of materials for forming respective layers since it has a light absorption layer for absorbing light and generating photocarriers, and a multiplication layer for multiplying the carriers independently of each other.

It is still another object of the present invention to provide a photoelectric conversion apparatus which has a high sensitivity for incident light having a desired wavelength, can reduce noise, and can easily attain a large-area, low-profile structure.

BRIEF DESCRIPTION OF DRAWINGS

FIGS. 5A and 5B are explanatory views for explaining a difference in distribution of electric fields E having different distributions of an impurity density in a p-n junction;

FIG. 12 is a timing chart for explaining the operation of the photoelectric conversion apparatus;

FIGS. 13, 15, and 16 are schematic sectional views showing photoelectric conversion apparatuses according to other embodiments of the present invention;

FIGS. 52A, 54A, and 55A are energy band charts in a non-bias state;

BEST MODE OF CARRYING OUT THE INVENTION

A structure of a photoelectric conversion apparatus according to the present invention, and its energy band structure will be described below with reference to FIGS. 3A to 3C, and effects of the present invention will be described below.

Figure 3A:
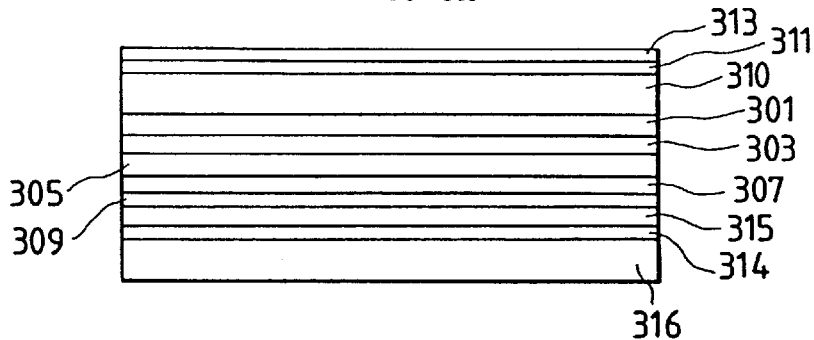
FIG. 3A is a schematic sectional view showing a photoelectric conversion apparatus according to an embodiment of the present invention.

FIG. 3A is a schematic sectional view showing a structure of a photoelectric conversion apparatus according to the present invention. In this apparatus, a light absorption layer 310 independent of a multiplication layer, and a plurality of stepback structure layers 301, 303, 305, 307, and 309 constituting multiplication layers are sandwiched between p- and n-type semiconductor layers 311 and 315 serving as electric charge injection blocking layers. The p-type semiconductor layer 311 and an electrode 313 are electrically connected to each other, and the n-type semiconductor layer 315 and an electrode 314 are electrically connected to each other. The structure is formed on a glass substrate 316. Note that the p-type semiconductor layer 311 serving as the electric charge injection blocking layer may be a metal for forming a Schottky junction with an adjacent semiconductor layer, with which the same effect can be expected. Five stepback structure layers are exemplified. However, the present invention is not limited to this, and the stepback structure may comprise one or two or more layers.

Figure 3B:
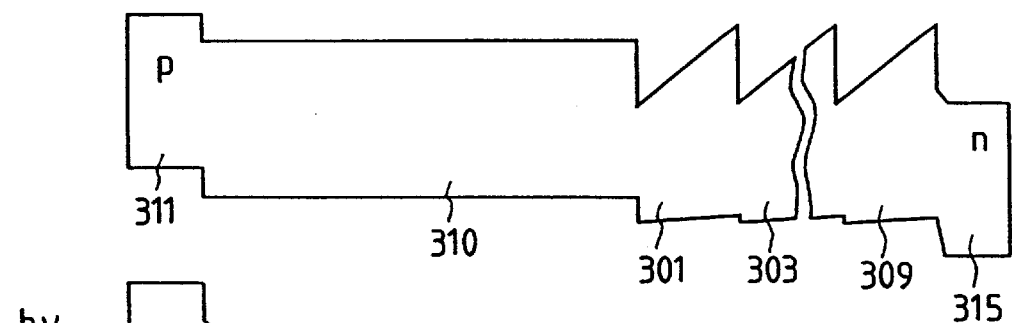
FIG. 3B is a energy band chart of the photoelectric conversion apparatus shown in FIG. 3A in a heat bias state.

FIG. 3B is an energy band chart of the photoelectric conversion apparatus in a non-bias state.

Figure 3C:
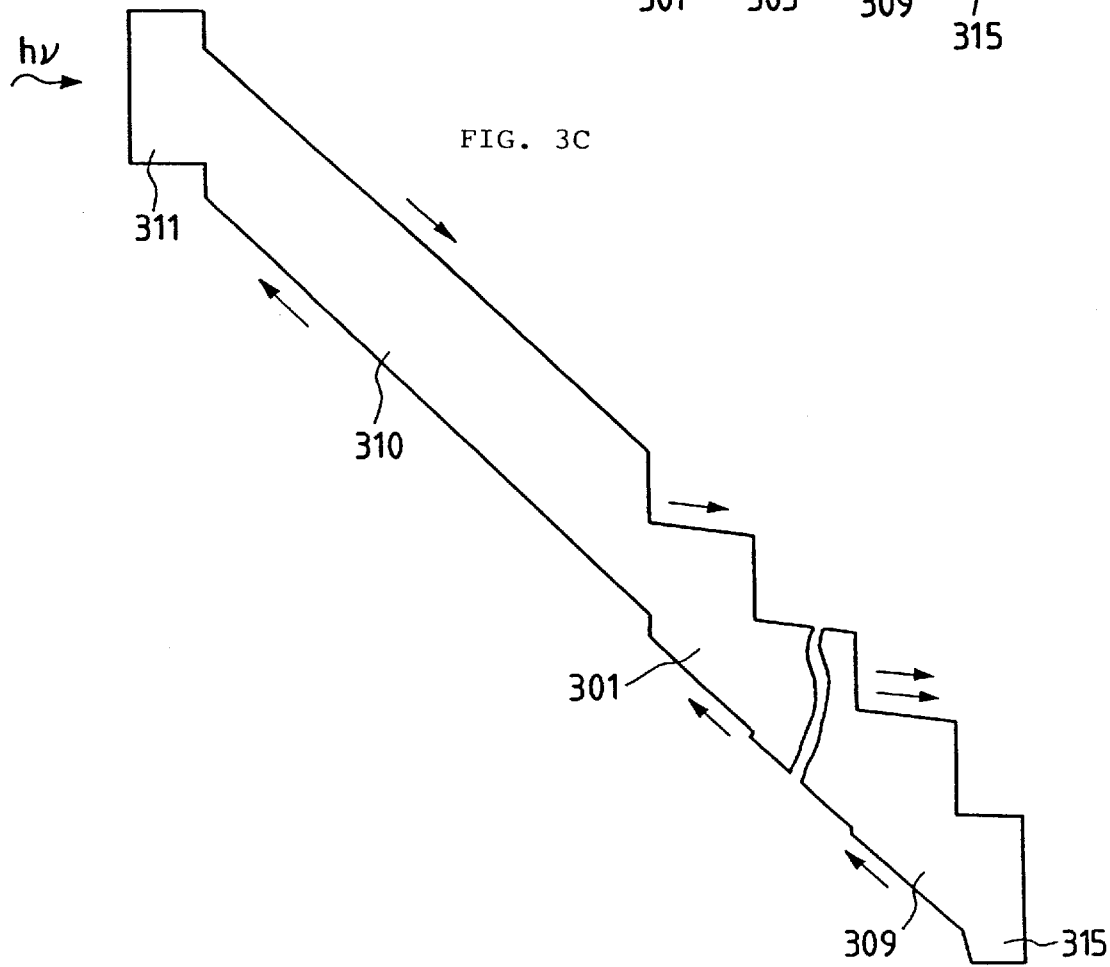
FIG. 3C is an energy band chart of a non-bias state.

FIG. 3C is an energy band chart of the photoelectric conversion apparatus in a reverse bias state.

The operation principle of a multiplication mechanism called an avalanche effect is the same as the prior art proposed by Capasso et. al., and the photoelectric conversion apparatus of the present invention particularly has the following effects.

(1) Since the independent light absorption layer 310 is sandwiched between the stepback layers 301 to 309 and the p-type semiconductor layer 311 as the electric charge injection blocking layer arranged on a light incident side, light entrance to the multiplication layers arranged deeper than the light absorption layer when viewed from the light incident side can be reduced, and a variation in multiplication ratio caused by light entrance to the multiplication layer can be reduced.

(2) Since the multiplication layer is formed of a non-monocrystalline material, it can easily form a stepback structure layer whose $\Delta Ec$ is approximate to or larger than an ionization threshold energy (for electron multiplication; $\Delta Ev$ is large for hall multiplication). As a result, a location where ionization occurs can be specified, and an ionization probability can be approximate to 1. Therefore, a low-noise structure can be attained, and a sufficient multiplication ratio can be obtained.

(3) As constituting materials of the light absorption layer and the multiplication layer of the photoelectric conversion apparatus to which the present invention is applied, non-monocrystalline materials are preferable in view of formation at a low temperature and a large structure. The non-monocrystalline materials include polycrystalline and amorphous materials, and the amorphous material include a so-called fine crystal structure in its category.

Note that the fine crystal structure is defined such that fine crystals having particle sizes falling within a range of 30 Å to 500 Å are dispersed in an amorphous substance.

More specifically, the non-monocrystalline materials include amorphous silicon (to be referred to as a-Si(H,X) hereinafter), amorphous silicon germanium (to be referred to as a-SiGe(H,X) hereinafter), and amorphous silicon carbide (to be referred to as a-SiC(H,X) hereinafter) which are compensated by a hydrogen element and/or a halogen element, polycrystalline silicons, or the like. The amorphous silicon includes one having a crystallinity in that an X-ray diffraction image of its thin film has peaks specified by Miller indices Si[111], Si[220], and Si[311] as well as a halo pattern.

In this manner, since the constituting materials of an element are non-monocrystalline materials, the element can be easily formed on a large-area substrate at a low temperature (e.g., 200 to 300° C.) by, e.g., a plasma CVD method, and control of a forbidden bandwidth, e.g., composition modulation, and the like can be facilitated. Therefore, the multiplication layer having the stepback structure can be relatively easily formed, and problems on formation of a multilayered structure can be eliminated. For example, diffusion of atoms due to, e.g., heat can be suppressed, a relatively reliable stepback structure can be realized, and so on.

In particular, since the electric charge injection blocking layer can be formed of materials having a relatively wide forbidden bandwidth, and non-monocrystalline materials such as amorphous silicon having a crystallinity with a high doping effect, a dark current can be reduced.

(4) Since a degree of freedom upon selection of materials for forming the light absorption layer is large, materials having a large light absorption coefficient (e.g., amorphous silicon hydride "a-Si:H", and the like) can be used.

Therefore, the film thickness of the light absorption layer can be decreased, and the entire apparatus can have a low profile.

(5) Since the degree of freedom of the forbidden bandwidth of the light absorption layer can be increased for the same reason as item (3) described above, a photoelectric conversion element having a high sensitivity for incident light components of various wavelengths can be constituted. In particular, when the forbidden bandwidth Eg1 of the light absorption layer 310 is set to correspond to visible region light, a high sensitivity for visible region light can be attained.

Embodiments

[Light Absorption Layer]

The light absorption layer of the present invention is arranged on a light incident side of the multiplication layer, and absorbs incident light to generate photocarriers.

As a material of the light absorption layer, non-monocrystalline semiconductor materials such as amorphous semiconductor materials such as a-Si(H,X), a-SiGe(H,X), a-SiC(H,X), a-SiGeC(H,X), and the like, fine crystalline semiconductor materials such as $\mu$c-Si(H,X), $\mu$c-SiGe(H,X), $\mu$c-SiC(H,X), and the like, and polycrystalline semiconductor materials such as poly-Si, poly-SiGe, poly-SiC, and the like can be used.

In order to provide a photoelectric conversion apparatus having a high sensitivity for visible light, the forbidden bandwidth Eg1 of the light absorption layer of the present invention preferably falls within a range of 1.1 eV to 1.8 eV and, more preferably, a range of 1.2 ev to 1.8 eV. In order to obtain a high sensitivity for infrared rays as well as visible light, the forbidden bandwidth Eg1 of the light absorption layer preferably falls within a range of 0.6 eV to 1.8 eV and, more preferably, a range of 0.8 eV to 1.2 eV. In order to obtain a high sensitivity for ultraviolet rays as well as visible light, the forbidden bandwidth Eg1 of the light absorption layer preferably falls within a range of 1.1 to 3.2 eV and, more preferably, a range of 1.2 eV to 3.0 eV.

Characteristics required for the light absorption layer and findings will be described in detail below.

The entire light absorption layer or a portion thereof preferably has a band gap and a thickness enough to substantially absorb and photoelectrically convert all the incident light components in a wavelength range to be photoelectrically converted. When incident light enters deeper than the light absorption layer, and the light which has reached the multiplication layer after the light absorption layer is absorbed by the multiplication layer and has an energy high enough to generate photocarriers, the photocarriers are also generated in the multiplication layer, and an ionization location may be fluctuated. It is generally known that in order to absorb light equal to or lower than a given light wavelength $\lambda$, a semiconductor light-receiving element must have a band gap Eg given by Eg$\leq$hc/$\lambda$=1,240 nm·eV/$\lambda$ [nm] where h is the Plank constant, and c is the light speed. In general, it is also known that a ratio of light absorbed from the surface of a light-receiving layer (depth of 0) up to a depth t of the light-receiving layer to incident light, i.e., a light absorption ratio is expressed by 1−exp(−$\alpha$t) where $\alpha$ is the light absorption coefficient. From these facts, for example, when light in a visible light wavelength region (light wavelength of about 400 to 700 nm) is to be received, these light components, in particular, light components having a long wavelength of about 700 nm which can enter a deeper portion of the element, are absorbed and photoelectrically converted by this light-receiving region. Therefore, the light-receiving region of a semiconductor light-receiving element as a photoelectric conversion element must have a band gap of about 1.77 eV or less, and must have a thickness given by −1/$\alpha$·ln(1−p) (where p is the light absorption ratio to be obtained). More specifically, when a crystalline silicon is used as a light absorption layer (light-receiving region) of a semiconductor light-receiving element, and 90% components of incident light of a wavelength of 700 nm are to be absorbed and photoelectrically converted by this light-receiving region, if calculations are made using about 2×10$^3$ cm$^{-1}$ as a typical value of the experimentally obtained light absorption coefficient $\alpha$, it is concluded that the light absorption layer must have a thickness of about 1.15 $\mu$m. In addition, a drift electric field or a diffusion electric field is preferably generated in this light absorption layer, so that, of photocarriers (electrons and holes) generated by photoelectric conversion in this light absorption layer, carriers having a larger ionization ratio are transferred to the multiplication layer to initiate avalanche multiplication.

In the light absorption layer which can be used in the present invention, the forbidden bandwidth Eg1 of the light absorption layer may be nonuniformly changed so as to obtain a high sensitivity for light of a desired wavelength and to efficiently cope with a wide wavelength range.

For example, in order to form a light absorption layer having a high sensitivity for a wavelength range from visible light to infrared light, a region where the forbidden bandwidth Eg1 of the light absorption layer is changed to Eg1' which is preferable to obtain a high sensitivity for visible light, and a region where the bandwidth Eg1 is changed from a forbidden bandwidth Eg1" (Eg1'>Eg1") for obtaining a high sensitivity for infrared light to the above-mentioned Eg1' may be arranged. In order to form a light absorption layer having a high sensitivity for a wavelength range of visible light to ultraviolet light, a region where the forbidden bandwidth is changed from Eg1' to Eg1'" (Eg1'<Eg1'") can be similarly arranged.

The region where the forbidden bandwidth is changed is preferably arranged at an edge portion of the light absorption layer, and it is also preferable in view of carrier migration that the forbidden bandwidth is continuously changed in the light absorption layer.

In order to efficiently absorb incident light to form photocarriers, it is preferable that the forbidden bandwidth is large at the incident side, and is small at a side opposite to the incident side in consideration of the relationship between light transmission/absorption and the forbidden bandwidth.

When ionization is to be caused at an interface between the light absorption layer and the multiplication layer, the forbidden bandwidth may be increased at a side opposite to the light incident side. In this case, in order to prevent noise generation, the maximum forbidden bandwidth of the light absorption layer whose forbidden bandwidth is changed is preferably set to be almost equal to that of the multiplication layer.

[Multiplication Layer]

The multiplication layer of the present invention is arranged behind the light absorption layer when viewed from the light incident side. When photocarriers generated by the light absorption layer are transferred, the layer multiplies the carriers by a so-called avalanche effect.

The multiplication layer of the present invention has a region for drifting carriers, and a region for causing ionization. The multiplication layer may have a structure wherein a layer having a large dielectric constant and a layer having a small dielectric constant are stacked, or a stepback structure wherein a forbidden bandwidth is continuously changed to have a minimum forbidden bandwidth Eg2 and a maximum forbidden bandwidth Eg3.

In either case, since a location for causing ionization in the multiplication layer can be specified, generation of noise due to a fluctuation in ionization location can be suppressed.

A multiplication layer formed by stacking layers having different dielectric constants will be described below.

In a structure of the multiplication layer formed by stacking layers having different dielectric constants, basically, a material having a large dielectric constant and a material having a small dielectric constant can be alternately arranged. For example, a composition ratio of an alloy material may be changed to form layers having large and small dielectric constants.

For example, amorphous silicon nitride $Si_zN_{1-z}$ (z is a composition ratio) may be used, so that $Si_xN_{1-x}$ layers (x>0.5) as layers having a large dielectric constant, and $Si_yN_{-y}$ (y<0.5) are alternately arranged to constitute an avalanche region.

Such an avalanche region can be constituted by amorphous silicon carbide $Si_zC_{1-z}$, amorphous silicon germanium $Si_zGe_{1-z}$, or the like in place of the amorphous silicon nitride described above.

As a method of manufacturing a photoelectric conversion apparatus of the present invention, deposition methods are easy, and those by vapor phase growth, e.g., an evaporation method, a chemical vapor deposition (CVD) method, a vapor phase epitaxial method, a sputtering method, a molecular beam epitaxial method, and the like can be utilized. In addition to these deposition methods, an ion implantation method may be used. That is, in order to form a layer having a small dielectric constant, ion implantation of hydrogen, carbon, nitrogen, or the like into silicon, ion implantation of hydrogen into gallium arsenide, or the like may be effective.

As materials which can easily form a layer, in which a dielectric constant and a band gap are changed, by changing their compositions, amorphous materials, Group III–V compound semiconductor materials, and the like are known.

In particular, the amorphous materials are more preferably formed by a grow discharge method, and have the following features. That is, upon manufacture of an element having a structure of the present invention, a manufacturing temperature of the amorphous materials is low, the element can be stacked and formed on a semiconductor device on which integrated circuits and the like have already been formed, materials can be widely selected regardless of a lattice matching property, i.e., a degree of freedom is high, a composition changed layer can be easily formed by changing flow rates of source gases, a high sensitivity for a visible light range can be attained, pollution-free, industrially inexpensive materials can be used, large-area film formation can be easily performed, and so on. Therefore, by utilizing this material, all the conventional problems can be solved.

More specifically, of the amorphous materials, tetrahedral silicons, chalcogenide seleniums, and the like can be utilized as base materials, silicon oxides, silicon nitrides, silicon oxide nitrides, silicon carbides, and the like can be utilized as materials of layers having different dielectric constants, and layers in which a band gap is to be changed. In this case, in order to form a band-gap changed layer from which a local level in a band gap is eliminated, band-gap changing atoms serving as a forbidden bandwidth adjusting agent are normally contained by 0.01% or more, preferably 1 to 60 atomic %, and, more preferably 5 to 35 atomic %.

In particular silicon atoms are used as a base material and a grow discharge method is utilized as a manufacturing method, chain silane compounds such as $SiH_4$, $Si_2H_6$, $Si_2F_6$, $Si_3H_8$, $SiH_3F$, $Si_2F_2$, and the like, or cyclic silane compounds such as $Si_5H_{10}$, $Si_6H_{12}$, $Si_4H_8$, and the like can be used as base source gases. As source gases for forming layers having different dielectric constants or layers in which a band gap is changed, carbon compounds such as $CH_4$, $CH_2F_2$, $C_6H_6$, $C_2H_4$, $C_2H_2$, $Si(CH_3)_4$, $SiH(CH_3)_3$, and the like, nitrogen compounds such as $N_2$, $NH_3$, $H_2NNH_2$, $HN_3NH_4N_3$, $F_3N$, $F_4N$, and the like, oxygen compounds such as $O_2$, $CO_2$, $NO$, $NO_2$, $N_2O$, $O_3$, $N_2O_3$, $N_2O_4$, $NO_3$, and the like, germanium compounds such as $GeH_4$, $GeF_4$, and the like, and tin compounds such as $SnH_4$, and the like are available.

As film formation conditions, known condition ranges upon a-Si film formation can be used. For example, a substrate temperature falls within a range of 50 to 600° C., and preferably 150 to 400° C., a discharging pressure falls within a range of 0.01 to 10 Torr, and preferably 0.1 to 1 Torr, a frequency power falls within a range of 0.01 to 10 $W/cm^2$, and preferably 0.1 to 1 $W/cm^2$. As a discharging frequency, all the DC and AC frequencies, particularly popular 13.56 MHz, microwaves (2.45 GHz is popular), and the like can be used.

Furthermore, as for atoms used as doping materials for an avalanche region and a blocking layer (electric charge injection blocking layer; to be described later), Group III atoms and Group V atoms are available for silicon. More specifically, the Group III atoms include boron (B), aluminum (Al), Ga (gallium), In (indium), Tl (thallium), and the like, and B and Ga are particularly preferable. The Group V atoms include P (phosphorus), As (arsenic), Sb (antimony), Bi (bismuth), and the like, and P, As, Sb are particularly preferable. A content of such atoms is preferably set to be 5% or less, and more preferably, 1% or less.

As described above, a location of ionization is specified by an avalanche region (multiplication layer) wherein first layers for generating an electric field which does not cause carrier ionization upon application of a voltage are stacked to be sandwiched between second layers for generating an electric field for promoting carrier ionization, or wherein the first and second layers are alternately stacked, so that a plurality of first layers are sandwiched by the second layers. Thus, a low-noise APD which can embody an idea that a probability of ionization is approximate to 1 as much as possible can be realized.

The film thickness of the first layer having a small dielectric constant is preferably set to fall within a range of 20 Å to 2,000 Å, and, more preferably, a range of 50 Å to 200 Å.

The film thickness of the second layer having a large dielectric constant is preferably set to fall within a range of 30 Å to 3,000 Å, and, more preferably, a range of 75 Å to 300 Å. The ratio of thickness of the first layer to that of the second layer is preferably 1.5 times or more, and more preferably, twice or more.

A multiplication layer having a stepback structure in which a forbidden bandwidth is continuously changed to have a minimum forbidden bandwidth Eg2 and a maximum forbidden bandwidth Eg3 will be described below.

The multiplication layer has at least one stepback structure in which a forbidden bandwidth is continuously changed, as described above. The number of stepback structures can be determined according to a required multiplication ratio.

In order to form a layer having a stepback structure (stepback layer) in which a forbidden bandwidth is continuously changed, a composition of major atoms forming the stepback layer can be changed.

For example, contents of Group III and Group V atoms in the periodic table in a Group III–V compound semiconductor can be changed to change a forbidden bandwidth.

As another example, in the case of an amorphous silicon alloy material, atoms such as germanium atoms or carbon atoms serving as a forbidden bandwidth adjusting agent may be contained, and their contents may be changed desirably.

It is preferable to specify a location of ionization that a difference between the maximum and minimum forbidden bandwidths Eg3 and Eg2 is large enough to cause ionization, so that stepbacks shown in an energy band chart are steeply changed. However, even when stepbacks become moderate to some extent, a multiplication layer having such stepbacks can be used in the present invention. When the stepbacks are moderate, a width of a layer region where the stepback is changed moderately preferably falls within a mean free path of electrons. More specifically, the width is preferably set to be 100 Å or less, and, more preferably, 50 Å or less.

The stepback layer need only have a film thickness falling within a range wherein carriers can migrate without being re-combined. The film thickness preferably falls within a range of 50 Å to 1 $\mu$m, and, more preferably, a range of 200 Å to 1,000 Å.

According to the present invention, in order to increase the degree of freedom upon selection of materials for forming the multiplication layer, a high-concentration impurity layer which is sandwiched between stepback layers having stepback structures (inclined band-gap layers) and contains an impurity for controlling conductivity at a high concentration may be arranged.

The high-concentration impurity layer may have either a single-layered or multilayered structure, or may nonuniformly contain an impurity in a direction of layer thickness.

When an impurity is to be nonuniformly contained in the layer, an impurity concentration in each inclined band-gap layer is continuously changed from the high-concentration impurity layer side toward the center, so that even when an energy step of a band is short from an ionization energy of carriers in a stepback portion obtained by a junction between the inclined band-gap layers, the energy shortage can be compensated for, ionization of carriers in the stepback portion can be ensured, and a fluctuation in location of ionization can be suppressed, thus attaining a low-noise structure.

When a bias exceeding that necessary for a carrier drift in the inclined band-gap layer is applied, since ionization can be satisfactorily performed in the stepback portion, a variation in multiplication ratio caused by a variation in bias and a change in temperature can be eliminated. For this reason, as a driving method of a photoelectric conversion apparatus, a carrier storage operation for storing and reading light signal carriers at one edge side of the photoelectric conversion apparatus is available. In addition, no temperature compensation of a multiplication ratio is necessary.

Since a low-noise photoelectric conversion apparatus can be manufactured using materials which cannot obtain an energy necessary for ionization of carriers on the basis of only an energy of a band step caused by an electron affinity difference, the degree of freedom of materials can be increased.

As materials used in the present invention, materials whose compositions can be desirably changed are preferable to form the inclined band-gap layer. Materials of the high-concentration impurity layer must be those to which an impurity can be doped since an energy shortage from an ionization energy of carriers at an energy step of a band obtained by a junction between the inclined band-gap layers is compensated for by utilizing an effect of a band profile which is changed upon doping of an impurity. As materials which satisfy such conditions, non-monocrystalline semiconductor materials such as amorphous or polycrystalline materials are preferable. For example, amorphous silicon hydride (a-Si:H) alloys, and Group III–V and Group II–VI compound semiconductor materials can be used. As the amorphous silicon alloys, a-SiGe:H, a-SiC:H, a-SiN:H, a-SiSn-H, a-SiO:H, a-GeC:H, and the like are utilized, as the Group III–V materials, Al•Ga•As•Sb, In.As.Sb, InGaAsSb, In•Ga•Al•As, In•AsP•Sb, InGaAsSb, AlGaP, and the like are utilized, and as the Group II–VI materials, ZnSSe, ZnCdS, HgCdTe, and the like are utilized.

The following impurities are used as those in the high-concentration impurity layer and the inclined band-gap layer. Group III atoms in the periodic table are used for p-type control of the amorphous silicon alloy, and Group V atoms in the periodic table are used for n-type control thereof.

More specifically, the Group III atoms include B (boron), Al (aluminum), Ga (gallium), In (indium), Tl (thallium), and the like, and B and Ga are particularly preferable. The Group V atoms include P (phosphorus), As (arsenic), Sb (antimony), Bi (bismuth), and the like, and P and Sb are particularly preferable.

As the high-concentration impurity layer, when electrons are to be ionized like in an amorphous silicon alloy, a wide band gap side is set to be a p type, and a narrow band gap side is set to be an n type. When holes are to be ionized, a wide band gap side is set to be an n type, and a narrow band gap side is set to be a p type.

When the high-concentration impurity layer is present at the wide gap side of the inclined band-gap layer, its composition must be determined so that its band gap does not become smaller than the band gap at the wide band gap edge of the inclined band-gap layer; when it is present at the narrow gap side of the inclined band-gap layer, the composition must be determined so that its band gap does not become larger than that at a narrow band gap edge of the inclined band-gap layer.

As for the distribution of the composition of the high-concentration impurity layer, on the wide band gap side, when the band gap is decreased from the stepback portion toward the wide gap edge of the inclined band-gap layer, the inclination of an energy band becomes moderate; otherwise, an electron affinity difference at the conduction band side and a maximum value of a sum of an electron affinity difference and a band gap difference at the valence band side cannot be utilized in the stepback portion. On the narrow band gap side, when the band gap is increased from the stepback portion toward the narrow band gap edge of the inclined band-gap layer, the inclination of the energy band becomes moderate; otherwise, an electron affinity difference at the conduction band side and a maximum value of a sum of an electron affinity difference and a band gap difference at the valence band side cannot be utilized in the stepback portion. For this reason, the high-concentration impurity layer preferably has a uniform composition to have a uniform band gap.

As compared to a uniform impurity concentration distribution, when the high-concentration impurity layer has a nonuniform concentration distribution, a maximum impurity concentration necessary for obtaining the equivalent effect must be increased, and the degree of freedom upon selection of materials is decreased in consideration of a doping limit of an impurity. For this reason, the high-concentration impurity layer preferably has a uniform distribution.

As for the film thickness of the high-concentration impurity layer, when the high-concentration impurity layers are arranged at the two edges of the inclined band-gap layer, a sum $d_1+d_2$ of the film thicknesses of the two layers is set to be equal to or smaller than a mean free path of carriers; when the high-impurity concentration layer is arranged at only one edge, its film thickness d is set to be equal to or smaller than a mean free path of carriers.

The impurity concentration of the high-concentration impurity layer is determined so that a voltage applied when the high-concentration impurity layer is completely depleted becomes larger than an energy shortage from an ionization energy of carriers in the stepback portion, as will be described later. More specifically, the impurity concentration of the high-concentration impurity layer is determined as follows depending on whether one or a plurality of layers are arranged between the inclined band-gap layers.

① When two high-concentration impurity layers are arranged between the inclined band-gap layers, a combination of $N_1$ and $N_2$ is determined to satisfy:

$$\frac{q(\varepsilon_1 N_1 + \varepsilon_2 N_2)}{2\varepsilon_1 \varepsilon_2}\left[\frac{N_1}{N_2}d_1^2 + \frac{N_2}{N_1}d_2^2\right] > V_D$$

$$V_D = \frac{Eion - (\chi_2 - \chi_1)}{q}$$

where suffixes 1 and 2 respectively correspond to wide and narrow band gaps, $\varepsilon_1$ and $\varepsilon_2$ are the dielectric constants of the high-concentration impurity layers, $N_1$ and $N_2$ are the impurity concentrations of the high-concentration impurity layers, $\chi_1$ and $\chi_2$ are the electron affinities of the high-concentration impurity layers, Eion is the ionization energy of carriers, and $d_1$ and $d_2$ are the film thicknesses of the high-concentration impurity layers. The above equation corresponds to the case of an electron current, and in the case of a hole current, it is rewritten as:

$$V_D = \frac{Eion - (\chi_2 - \chi_1) - (Eg_1 - Eg_2)}{q}$$

Note that Eg1 and Eg2 are the band gaps of the high-concentration impurity layers.

② When a single high-concentration impurity layer is arranged between the inclined band-gap layers, $$N > \frac{2\varepsilon V_D}{q \cdot d_2} \quad V_D = \frac{Eion - (\chi_2 - \chi_1)}{q}$$

where $\varepsilon$ is the dielectric constant of the high-concentration impurity layer, N is the impurity concentration of the high-concentration impurity layer, and d is the film thickness of the high-concentration impurity layer described as described above. The above equation corresponds to the case of an electron current, and in the case of a hole current, it is rewritten as:

$$V_D = \frac{Eion - (\chi_2 - \chi_1) - (Eg_1 - Eg_2)}{q}$$

In this case, the high-concentration impurity layer is assumed to have a uniform impurity concentration distribution.

As for a profile of an impurity concentration in the inclined band-gap layer, when the inclined band-gap layer has high-concentration impurity layers of different conductivity types at its two edges, the impurity concentration is continuously decreased from the two edges toward the center; when it has a high-concentration impurity layer at only one edge, the impurity concentration is continuously decreased from one edge toward the center. A function of a change in impurity concentration is not particularly limited. It is preferable that the impurity concentration is slowly changed at a high-concentration side, and is steeply changed at a low-concentration side.

Detailed materials and numerical values will be exemplified below with reference to an amorphous silicon alloy.

As materials, for example, when a composition is changed in an alloy of Si, Ge, and C, a band gap can be changed from 1.1 eV to about 2.5 eV. However, it is assumed that an inclined band-gap layer is formed to have a band gap falling within a range of 1.2 eV to 2.2 eV as a practical region. These materials have a band gap exceeding 1.1 eV of crystalline silicon, and composition ratios capable of obtaining a minimum band gap of 1.2 eV and a maximum band gap of 2.2 eV with which a dark current can be eliminated are respectively Ge/Si≅9 and C/Si≅1.5. In addition, flow rate ratios of formation gases have almost the same values as described above.

Upon comparison between a-SiGe:H having a band gap of 1.2 eV and a-SiC:H having a band gap of 2.2 eV in an impurity non-doping state, a step $\Delta Ec(|\chi_1-\chi_2|)$ at the condition band side is 0.9 eV, and an energy step $\Delta Ev$ of a band at the valence band side is 0.1 eV. Thus, the band step at the conduction band side where electrons having a large ionization coefficient are transferred is short by about 0.3 V from 1.2 eV as the ionization energy. In this state, if a repetitive structure of inclined band-gap layers is formed, it is insufficient to satisfactorily cause ionization at stepback portions, and it is supposed that a fluctuation in location of ionization will occur upon application of a high electric field.

For this reason, in order to ensure ionization at the stepback portion, it is assumed that a structure wherein a high-concentration impurity layer is arranged at one edge of the inclined band-gap layer, and an impurity concentration is decreased toward the center of the inclined band-gap layer is employed. For example, if the high-concentration impurity layer is preset at an a-SiC:H side, B as a p-type impurity is doped.

In an amorphous silicon alloy, since a typical mean free path $\lambda$ in an impurity layer falls within a range of 50 Å to 100 Å, the film thickness of the high-concentration impurity layer is set to be 50 Å as a value below $\lambda$.

Since a shortage Eion–$(\chi_2-\chi_1)$ is 0.3 eV in this case, a depletion layer width which is increased upon application of a voltage of 0.3 V can be equal to or smaller than a mean free path. In practice, a voltage applied when a high-concentration impurity layer is completely depleted can be equal to or higher than 0.3 V. Since a relative dielectric constant is about 6, the following relation need only be satisfied:

$$N > \frac{2\varepsilon V_D}{q \cdot d_2} = 0.8 \times 10^{18} \, (cm^{-3})$$

In order to realize an impurity concentration of $8.0 \times 10^{18}$, 0.3 to 0.4% of $B_2H_6$ can be added to $SiH_4$ and $CH_4$ source gases.

On the other hand, when the high-concentration impurity layer is arranged at an a-SiGe:H side, P as an n-type impurity is doped.

The film thickness of the high-concentration impurity layer is assumed to be 50 Å. A relative dielectric constant is about 16.

Therefore, an impurity concentration need only satisfy:

$$N > 2.1 \times 10^{19} (cm^{-3})$$

In order to realize an impurity concentration of $2.1 \times 10^{19}$, 0.8 to 1.0% of $PH_3$ can be added to $SiH_4$ and $GeI_4$.

A case will be examined below wherein a p-type high-concentration impurity layer is present at the a-SiC:H side, and an n-type high-concentration impurity layer is present at the a-SiGe:H side.

The film thickness of each high-concentration impurity layer is assumed to be 25 Å. If an impurity at the same concentration is to be doped, $$V_{D1} = \frac{q \cdot N(\varepsilon_1 N + \varepsilon_2 N)}{2\varepsilon_1 \cdot \varepsilon_2 N} d_1^2$$
$$= 1.3 \times 10^{-20} \times N$$

$$V_{D2} = \frac{q \cdot N(\varepsilon_1 N + \varepsilon_2 N)}{2\varepsilon_1 \cdot \varepsilon_2 N} d_2^2$$
$$= 1.3 \times 10^{-20} \times N$$

More specifically, $V_D = V_{D1} + V_{D2} = 2.6 \times 10^{-20} \times N > 0.3$ V is satisfied, and an impurity concentration can be equal to or higher than $1.2 \times 10^{19}$. In order to realize this impurity concentration, 0.5 to 0.6% or more of $B_2H_6$ and $PH_3$ can be respectively added to $SiH_4$ and $CH_4$, and $SiH_4$ and $GeI_4$ in gases introduced during film formation.

An amorphous silicon alloy has been exemplified as a high-concentration impurity layer which can be suitably used in the present invention. However, a high-concentration impurity layer which can be used in the present invention is not limited to the above embodiment.

Operations and effects obtained when a high-concentration impurity layer is arranged between inclined band-gap layers will be described in detail below with reference to the drawings.

Figure 4A:
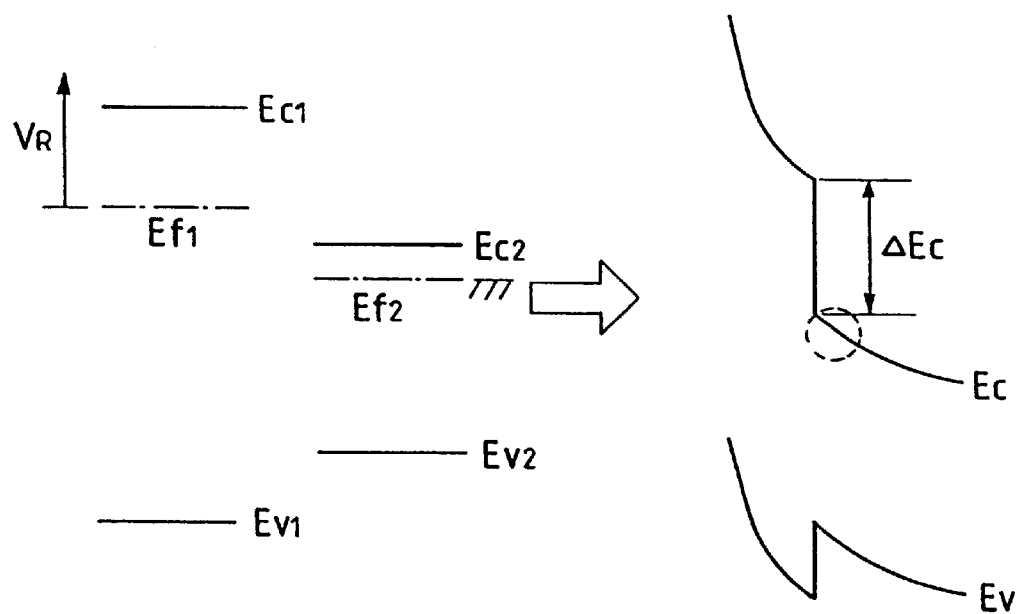
FIGS. 4A and 4B are explanatory views showing a state wherein a bias is applied to a conventional heterojunction modified by Applicant's high concentration impurity layer, in which FIGS. 4A and 4B respectively show a junction between identical conductivity types (n/n), and a junction between different conductivity types (p/n)
Figure 4B:
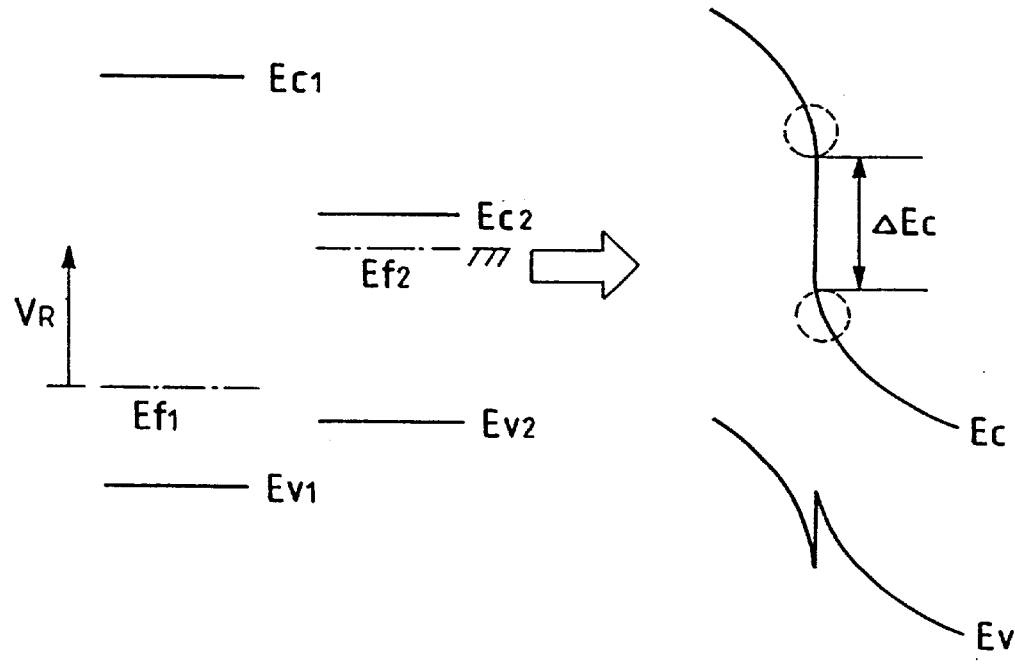

FIGS. 4A and 4B are explanatory views showing a state wherein a negative bias is applied to a wide band gap side of a heterojunction to deplete the entire layer for the purpose of observing a change in energy band at a conduction band side under an assumption of electron multiplication.

An energy that carriers (electrons) obtain near a junction corresponds to a sum of an energy band (conduction band: $\Delta Ec$) at the junction and an energy obtained upon acceleration of carriers by an electric field near the junction, i.e., a curvature amount of an energy band within a distance of a mean free path of carriers from the junction.

According to the present invention, when an impurity is doped near the junction, as indicated by dotted circles in FIGS. 4A and 4B, the curvature of the energy band is emphasized according to an impurity concentration. As a result, an energy that carriers obtain near the junction is increased, and a probability of ionization is increased.

In the case of the junction of semiconductor layers of the same conductivity type, a strong electric field is generated at the wide gap side, as shown in FIG. 4A. However, since the electric field is strengthened as it is away from the junction, a probability of ionization in a portion other than the junction is undesirably increased.

On the other hand, in the junction of semiconductor layers of different conductivity types, an electric field can be maximum at the junction, as shown in FIG. 4B, promotes ionization at the junction, and can suppress a fluctuation in location of ionization. More specifically, in a heterojunction formed by the junction between the inclined band-gap layers, a p/n, p/i, or i/n junction (wide gap/narrow gap) is adopted, so that an energy shortage from ionization of carriers can be compensated for at a stepback portion, and ionization of carriers can be ensured. In the case of hole multiplication, contrary to electron multiplication, an n/p, i/p, or n/i junction is preferable.

FIGS. 5A and 5B are explanatory views showing a change in electric field in a heterojunction when inclined band-gap layers have different distribution of an impurity concentration. FIG. 5A shows a stepwise change, and FIG. 5B shows a continuous (linear-function like) change. When the identical electric field is generated at the junction, an electric field in a portion other than near the junction can be decreased when an impurity concentration is slowly changed from the junction, as is apparent from the Poisson's equation. More specifically, when the impurity concentration at the high-concentration impurity layer side of the inclined band-gap layer is slowly changed, a probability of ionization at a point distant from the junction can be decreased, and a fluctuation in location of ionization can be suppressed.

Figure 6A:
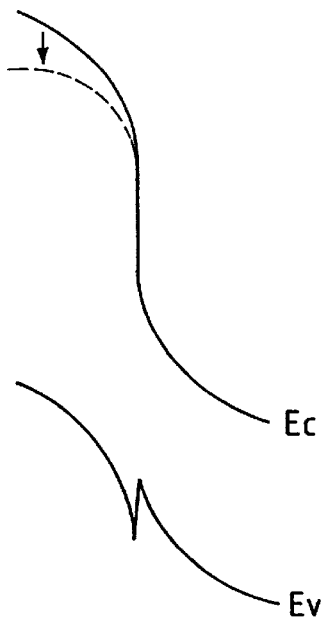
FIGS. 6A to 6C are explanatory views for explaining an influence of an inclined band-gap structure in a heterojunction.
Figure 6B:
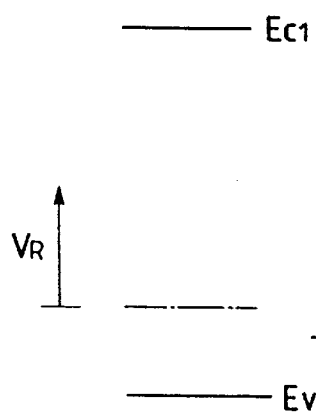
Figure 6C:
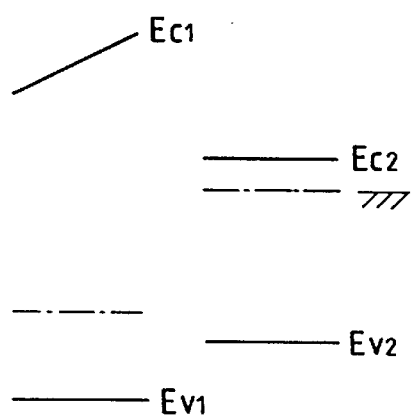

FIGS. 6A, 6B, and 6C are schematic views taking an inclination of a band gap in a heterojunction into consideration. A solid curve in FIG. 6A represents a state wherein a wide gap layer having a uniform impurity concentration shown in FIG. 6B is depleted, and a broken curve represents a state wherein a wide gap side of an inclined band-gap layer having a uniform impurity concentration shown in FIG. 6C is depleted.

As shown in FIGS. 6A to 6C, an inclined band increases a curvature of the band since a band gap is decreased, and leads to a decrease in energy and an increase in fluctuation upon ionization. For this reason, a layer having a uniform band gap is arranged at the edge portion of the inclined band-gap layer as a high-concentration impurity layer, thus suppressing a fluctuation in location of ionization.

As described above, according to the present invention, a probability of ionization of carriers is approximate to 1 in a stepback portion, a fluctuation in location of ionization can be suppressed, and noise can be reduced. Consequently, a low-noise APD having a high degree of freedom upon selection of materials and manufacturing methods can be provided, and an APD in which a dark current is suppressed can be provided.

[Electrode]

As an electrode which can be used in a photoelectric conversion apparatus of the present invention, an electrode material arranged at a light incident side preferably has a sufficiently high transmittance for light at a wavelength to be photoelectrically converted, and transmission conductive materials such as $In_2O_3$, $SnO_2$, ITO ($In_2O_3+SnO_2$), Si—Pd—O, Pd, and the like are preferable.

In addition, an interdigital, net-like, or lattice-like collector electrode may be added on the transmission conductive material to further decrease an electrical resistance.

An electrode arranged on a side opposite to the light incident side can adopt a normal conductive material.

[Electric Charge Injection Blocking Layer]

An electric charge injection blocking layer (blocking layer) having a p or n conductivity type can be arranged on the above-mentioned electrode. The blocking layer does not serve as a barrier in a migration direction of carriers serving as signals to be extracted from the light absorption layer or the multiplication layer, and is in ohmic-contact with the electrode, but serves as a barrier against migration of carriers of a dark current in a direction opposite to the migration direction of the carriers serving as signals.

When the blocking layer is arranged, since injection of unnecessary carriers can be blocked, noise caused by a dark current can be further decreased.

The blocking layer can be formed of a material obtained by doping an impurity capable of controlling conductivity in the same material as that of the light absorption layer or the multiplication layer.

The thickness of the blocking layer preferably falls within a range of 50 Å to 2,000 Å, and, more preferably, a range of 100 Å to 300 Å.

The impurity contained in the blocking layer is used so that the layer has a good ohmic junction and an electric charge injection blocking function. The layer preferably has a conductivity of $10^{-4}$ S/cm or more and, more preferably, $10^{-3}$ S/cm or more.

[Bias Voltage]

A bias voltage applied when a photoelectric conversion apparatus of the present invention is operated is set to be high enough to be able to deplete at least the multiplication layer, to cause a carrier drift but not to cause ionization in a low electric field layer. Such a bias voltage is applied to selectively cause ionization in a stepback region as a portion where an energy level in the multiplication layer is abruptly changed upon application of the bias voltage.

EMBODIMENTS

Embodiment 1

Embodiments of a photoelectric conversion apparatus of the present invention will be described hereinafter.

Figure 7A:
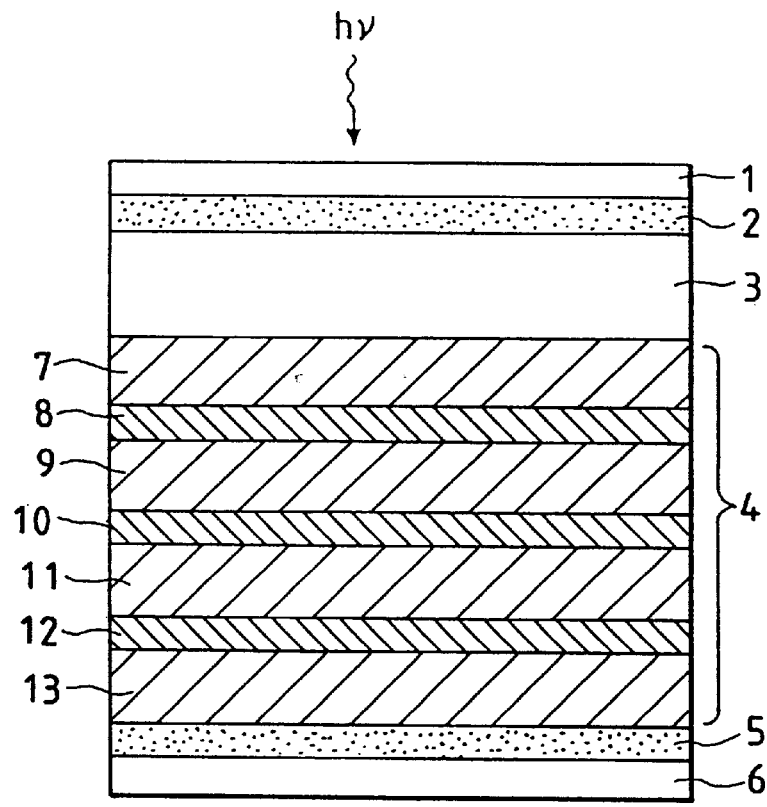
FIGS. 7A is a schematic sectional view showing a photoelectric conversion apparatus according to another embodiment of the present invention.

FIG. 7A is a schematic sectional view showing an embodiment of a photoelectric conversion element as a characteristic feature of the present invention.

Note that the size of the element and the thicknesses of the respective layers are exaggerated to some extent since constituting elements of the element of this embodiment are illustrated clearly.

The element shown in FIG. 7A comprises ohmic-contact layers for applying a voltage to the element or extracting signals therefrom, i.e., so-called electrodes 1 and 6, a blocking layer (electric charge injection blocking layer) 2 for blocking injection of carriers from the electrode 1, a blocking layer 5 for blocking injection of carriers from the electrode 6, a light-receiving layer 3, sandwiched between these blocking layers, for absorbing light incident on the element from the electrode 1 side, and generating photocarriers to perform photoelectric conversion, and an avalanche region (multiplication layer) denoted by 4 as a whole and consisting of a plurality of dielectric constant change layers. The avalanche region 4 is a multilayered region, and has a multilayered structure in which layers 7, 9, 11, and 13 having a given dielectric constant and layers 8, 10, and 12 having a smaller dielectric constant than the given dielectric constant are alternately arranged. Avalanche multiplication caused by impact ionization occurs in this region.

In FIG. 7A, the electrode 1 arranged at the light incident side preferably has a sufficiently high transmittance for light in a wavelength range to be photoelectrically converted. For example, an ITO (indium tin oxide), palladium silicon oxide, palladium, and the like correspond to a visible light wavelength range (light wavelength of about 400 to 700 nm).

In FIG. 7A, the blocking layer 2 may have a photoelectric conversion function, and may be a portion of the light-receiving layer 3. It is preferable that the blocking layer effectively blocks injection of carriers as dark current components of this element from the electrode, and can have ohmic contact characteristics with the electrode in association with extraction of carriers as signal current components. For example, when the blocking layer 2 comprises a p-type semiconductor and the blocking layer 5 comprises an n-type semiconductor, the blocking layer 2 effectively blocks injection of electrons from the electrode 1, but has ohmic contact characteristics with the electrode 1 for holes. The blocking electrode 5 effectively blocks injection of holes from the electrode 6, but has ohmic contact characteristics with the electrode 6 for electrons.

In FIG. 7A, the avalanche region 4 is constituted by a total of seven layers. However, the number of layers is merely an example, and can be increased/decreased according to a desired multiplication ratio. The thicknesses of the layers 7, 9, 11, and 13 having the given dielectric constant and the layers 8, 10, and 12 having a dielectric constant smaller than the given dielectric constant must be adjusted so that when a desired bias voltage is applied to the element, a carrier drift electric field is generated in the layers 7, 9, 11, and 13 having the given dielectric constant, and an electric field for promoting ionization of carriers with which avalanche multiplication is to be caused is generated in the layers 8, 10, and 12 having the smaller dielectric constant. Basically, a desired bias voltage must be applied to the electrodes 1 and 6, so that the avalanche region 4 is set in at least a depletion state. In this structure, the limit values of the thicknesses are determined by a bias voltage to be applied, the dielectric constant, spatial charge densities of, e.g., impurity doping, defect level, interface level, and the like, and the number of layers. The thicknesses of the layers having different dielectric constants and constituting the avalanche region 4 preferably fall within a range of about 20 Å to 10,000 Å. If the above-mentioned conditions are satisfied, the thicknesses may be larger or smaller than this range. The dielectric constants of these layers may be constant or changed. However, as will be described later, the layers having different dielectric constants preferably have a ratio of dielectric constants of 1.5 or more.

Avalanche multiplication is preferably caused by only carriers having a larger ionization ratio without multiplying both photocarriers (holes and electrons) generated by the light absorption layer.

Of dark currents generated in this element, carrier components injected from the electrode can be effectively suppressed by the blocking layer (electric charge injection blocking layer). In order to effectively suppress thermally generated carrier components as another major cause inside the element, it is preferable that materials constituting the element essentially have a large band gap. For example, when a semiconductor light-receiving element for a visible light wavelength range is to be constituted, the materials preferably have a band gap equal to or higher than about 1.2 eV as the band gap of crystalline silicon. For example, amorphous silicon prepared by discharge and containing about 15 atomic % of hydrogen has a band gap of about 1.7 eV, and can be listed as one of materials satisfying such conditions. According to the present invention, with this band gap, heat generation of a dark current inside the element can also be suppressed, and noise of the semiconductor light-receiving element can be further reduced.

Figure 7B:
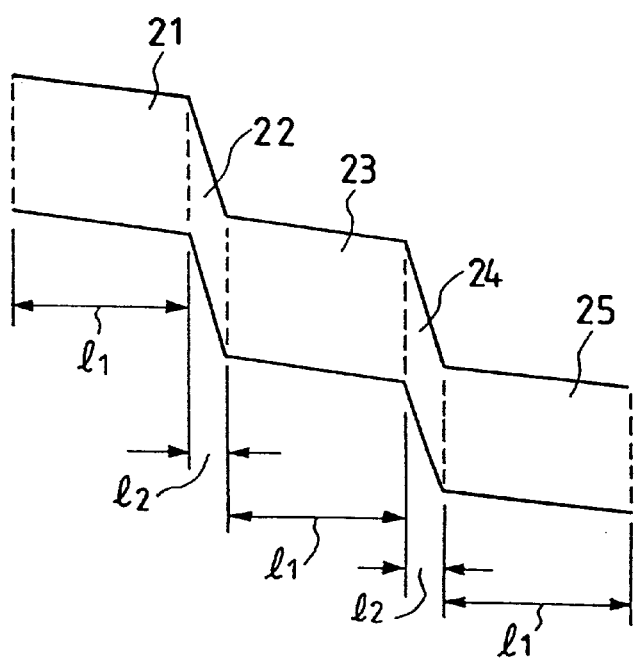
FIG. 7B is a energy band chart in a state wherein a bias voltage is applied to a multiplication layer in the photoelectric conversion apparatus.

FIG. 7B shows an energy band structure of a portion of the avalanche region when a bias voltage is applied to a semiconductor light-receiving element having the element structure shown in FIG. 7A.

The structure shown in FIG. 7B comprises layers 21 and 23 each having a layer thickness $l_1$ and a dielectric constant $\epsilon_1$, and layers 22 and 24 having the same band gap and electron affinity as those of the layers 21 and 23, and each having a layer thickness $l_2$ and a dielectric constant $\epsilon_2$ smaller than the above layers. Furthermore, at this time, these layers constituting the avalanche region are depleted, and no spatial electric charges caused by impurity doping, a defect level, an interface level, and the like are present at all. In this case, an electric field to be applied to the respective layers depends on only the dielectric constants of the layers, and an energy band is linearly changed in the layers, as illustrated in FIG. 7B. In this element, a voltage applied across the two edges of the avalanche region (multiplication layer) is represented by V, a total number of layers each having the dielectric constant $\epsilon_1$ is represented by m+1, and a total number of layers each having the dielectric constant $\epsilon_2$ is represented by m, an electric field $E_1$ of the layers each having each the dielectric constant $\epsilon_1$ is given by:

$$E_1 = V/((m+1) \cdot l_1 + m \cdot \epsilon_1/\epsilon_2 \cdot l_2)$$

an electric field $E_2$ of the layers having the dielectric constant $\epsilon_2$ is given by:

$$E_2 = V/((m+1) \cdot \epsilon_1/\epsilon_2 l_1 + m \cdot l_2)$$

As is understood from these equations, $E_1$ becomes smaller and $E_2$ becomes larger as a radio $\epsilon_1/\epsilon_2$ of the dielectric constants is larger.

Therefore, when the dielectric constant $\epsilon_1$ is large and the dielectric constant $\epsilon_2$ is small, the electric field $E_1$ of the layer having the dielectric constant $\epsilon_1$ becomes small. More specifically, the layer having the dielectric constant $\epsilon_1$ serves as a low-electric field layer. At this time, the layer having the dielectric constant $\epsilon_2$ serves as a high-electric field layer.

As can be seen from the above equations, in particular, when m is large, for example, a ratio $E_2/E_1$ of $E_2$ to $E_1$ is approximately equal to a ratio $\epsilon_2/\epsilon_1$ of $\epsilon_2$ to $\epsilon_1$.

In the preferred embodiment of this element, $\epsilon_1/\epsilon_2$ is selected so that upon application of a desired bias voltage, $E_1$ causes a carrier drift but becomes an electric field smaller than an ionization threshold value, and $E_2$ becomes an electric field almost equal to or larger than a carrier (electron) ionization threshold value.

This will be described in more detail below. The ionization ratio is an average number of times of ionization per unit distance, and hence, a product of the ionization ratio and the layer thickness is the average number of times of ionization occurring in the layer. The average number of times of ionization of the layer having the dielectric constant $\epsilon_1$ is expressed by $\alpha_1 \cdot l_1$, and the average number of times of ionization of the layer having the dielectric constant $\epsilon_2$ is expressed by $\alpha_2 \cdot l_2$. In this case, $\alpha_1$ and $\alpha_2$ are the ionization ratios of the layers having the dielectric constants $\epsilon_1$ and $\epsilon_2$, respectively. In the preferred embodiment described above, the average number of times of ionization of the layer having the dielectric constant $\epsilon_2$ must be at least larger than that of the layer having the dielectric constant $\epsilon_1$, and hence, $\alpha_2 \cdot l_2 > \alpha_1 \cdot l_1$ must be satisfied. The fact that the ratio $\epsilon_2/\epsilon_1$ of the dielectric constants must be at least larger than 1 in order to cause ionization only in or near layers having a small dielectric constant can be easily derived from this inequality, equations $\alpha_{1=A1} \cdot \exp(-B_1/E_1)$ and $\alpha_2 = A_2 \cdot \exp(-B_2/E_2)$ of electric field dependency of an ionization which have been experimentally established (where $A_1$, $B_1$, $A_2$, and $B_2$ are given constants inherent in materials), and the Gaussian law $\epsilon_{1-E1} = \epsilon_2 \cdot E_2$. Furthermore, in order to increase the degree of freedom upon selection of the layer thicknesses $l_1$ and $l_2$, and the degree of freedom in element design, the ratio $\epsilon_2/\epsilon_1$ of the dielectric constants is preferably as large as possible, and is preferably set to be 1.5 or more and, more preferably, 2.0 or more.

The thickness $l_2$ of the layer having a small dielectric constant and a bias voltage to be applied thereto are selected so that ionization occurs at most once in or near the layer having a smaller dielectric constant in units of layers. Therefore, a location of ionization can be specified in the layer having the dielectric constant $\epsilon_2$, and hence, a fluctuation in location of ionization as one of causes for generating over-multiplication noise can be eliminated. Therefore, low-noise avalanche multiplication can be performed. Even if an electric field of the layer having the smaller dielectric constant $\epsilon_2$ is smaller than the ionization threshold value, an energy shortage can be supplied from the drift electric field of the layer having the larger dielectric constant $\epsilon_1$. Therefore, a location of ionization can be specified to a position near the layer having the dielectric constant $\epsilon_2$, and low-noise avalanche multiplication can be performed.

The avalanche operation of the embodiment shown in FIGS. 7A and 7B will be briefly described below. Incident light effectively transmits through the electrode 1, and is absorbed by a light-receiving region, i.e., the blocking layer 2, the light-receiving layer 3, or the first layer 7 of the avalanche region 4, thus generating carriers (electrons and holes). Of these carriers, carriers (in this case, electrons) having a larger ionization drift toward the second layer 8 of the avalanche region. The layer 8 has a small dielectric constant, and electrons are ionized in or near this layer, as described above. The ionized and multiplied electrons drift in the third layer 9 having a larger dielectric constant toward the fourth layer 10. The drift in the layers having a larger dielectric constant and ionization in or near the layers having a smaller dielectric constant are repeated in the respective layers.

It is preferable upon execution of low-noise avalanche multiplication that a gain of the avalanche multiplication in units of layers is precisely doubled every time electrons cause ionization in or near a layer having a smaller dielectric constant. In practice, an optical phonon discharge process is present together with an ionization process, and an ionization gain in units of layer often inevitably becomes 2–δ. Therefore, in practice, a total gain of the semiconductor light-receiving element is generally given by $(2-\delta)^m$ (where m is the number of layers each having a smaller dielectric constant in the avalanche region). An over-noise coefficient F at this time is expressed by $F=1+\delta/(2-\delta)\cdot(1-1/((2-\delta)^m))$. When δ is equal to or smaller than about 0.1, the above equation can be approximate to $F=1+\delta\cdot(1-\frac{1}{2}^m)/2$, and if m is large, it can be approximate to $F=1+\delta/2$. δ is a value inherent to a material. An ionization ratio of electrons is related to a state density of electrons. In general, if an electron energy is larger than an ionization threshold energy by about 0.1 eV, electrons are ionized, and δ is ordinarily equal to or smaller than 0.1. In the present invention, since an electric field layer having an electric field larger than an ionization energy is concentrated on a region having a small dielectric constant, it is easy to set δ to be equal to or smaller than 0.1. Therefore, according to the present invention, from the above equation, a low-noise APD having an over-noise coefficient sufficiently smaller than a minimum over-noise coefficient F=2 of the conventional APD can be realized.

In the semiconductor light-receiving element, it is preferable that holes generated upon light absorption or ionization of electrons do not acquire an energy high enough to be ionized from an electric field. This can be realized by using a material having a difference between ionization ratios of electrons to holes and by adjusting a bias voltage value to be applied. Polycrystalline silicon, amorphous silicon, and the like have a ratio of ionization ratios of electrons to holes of about 1.0 or more, and are suitable for such materials.

A value of the ionization ratio is preferably 5 or more, and, more preferably 10 or more.

Embodiment 2

The second embodiment corresponding to a case wherein spatial electric charges caused by impurity doping, a deflect level, an interface level, and the like are present in the respective layers constituting the avalanche region (multiplication layer) 4 shown in FIG. 7A will be described below. In this case, an electric field generated in each layer upon application of a bias voltage for depleting the avalanche region 4 depends on a dielectric constant and a spatial electric charge amount of each layer.

Figure 8:
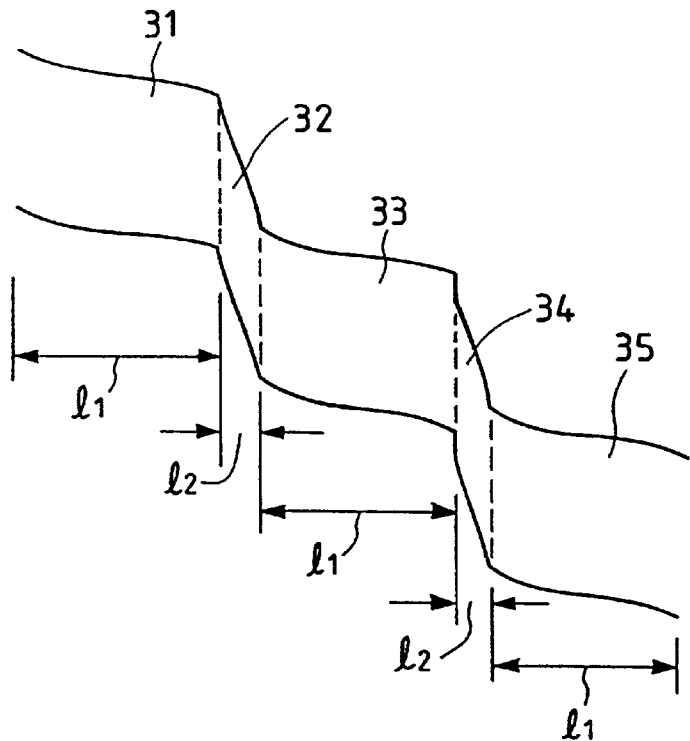
FIGS. 8 to 10 are energy band charts of the multiplication layer.

FIG. 8 shows an energy band structure of a portion of the avalanche region when each layer of the avalanche region of the semiconductor light-receiving element having the element structure shown in FIG. 7A has spatial electric charges.

The structure shown in FIG. 8 is constituted by layers 31, 33, and 35 each having a layer thickness $l_1$, and a constant total electric charge density $\rho_1$, which is constant regardless of positions in the layer, and a dielectric constant $\epsilon_1$, and layers 32 and 34 having the same band gap and electron affinity as those of the layers 31, 33, and 35, and each having a layer thickness $l_2$, a total electric charge density $\rho_2$, and a dielectric constant $\epsilon_2$ smaller than those of each of the layers 31, 33, and 35. Assuming that a layer thickness of a given layer is l, a total electric charge density is ρ, and the number of layers is 1, if a bias voltage is applied to the layer and a potential difference V is generated across the layer, an electric field at a position x (0<x<l) in the layer is given by $E=\rho/\epsilon \cdot (x-l/2)+V/l$ from the Poisson's equation. This implies that when spatial electric charges are present, an electric field is linearly changed. Therefore, as shown in FIG. 8, when each layer of the avalanche region has spatial electric charges, an electric field in each layer is linearly changed in the layer, and hence, an energy band of each layer is changed in a parabolic function pattern. It is also understood from this equation that an electric field depends on a ratio $\rho/\epsilon$ of a total electric charge density to a dielectric constant. Therefore, if a ratio $\rho_2/\epsilon_2$ is set to be larger than a ratio $\rho_1/\epsilon_1$, a drift electric field smaller than an ionization threshold value can be generated in the layers 31, 33, and 35, and an electric field almost equal to or larger than the ionization threshold value can be generated in the layers 32 and 34. Therefore, a location of ionization can be specified in or very near a layer having the dielectric constant $\epsilon_2$, and low-noise avalanche multiplication can be performed. In particular, if a region having a large electric charge density is formed in or near a region having the dielectric constant $\epsilon_2$ where an electric field is to be concentrated, an electric field can be further concentrated to effectively promote ionization.

Embodiment 3

The third embodiment corresponding to a case wherein a layer having a given dielectric constant and a layer having a dielectric constant smaller than the given dielectric constant have a band gap difference and an electron affinity difference in the layers constituting the avalanche region of the semiconductor light-receiving element having the element structure shown in FIG. 7A will be described below. In general, a material having a small dielectric constant tends to have a large band gap. Thus, when materials having desired dielectric constants are selected from a wide range of materials to constitute a plurality of dielectric constant change layers constituting the avalanche region, a band gap difference and an electron affinity difference often occur. For example, as combinations of materials having large and small dielectric constants, which constitute the avalanche region, silicon and a silicon oxide, silicon and a silicon nitride, silicon and a silicon carbide alloy, and the like are known.

Figure 9:
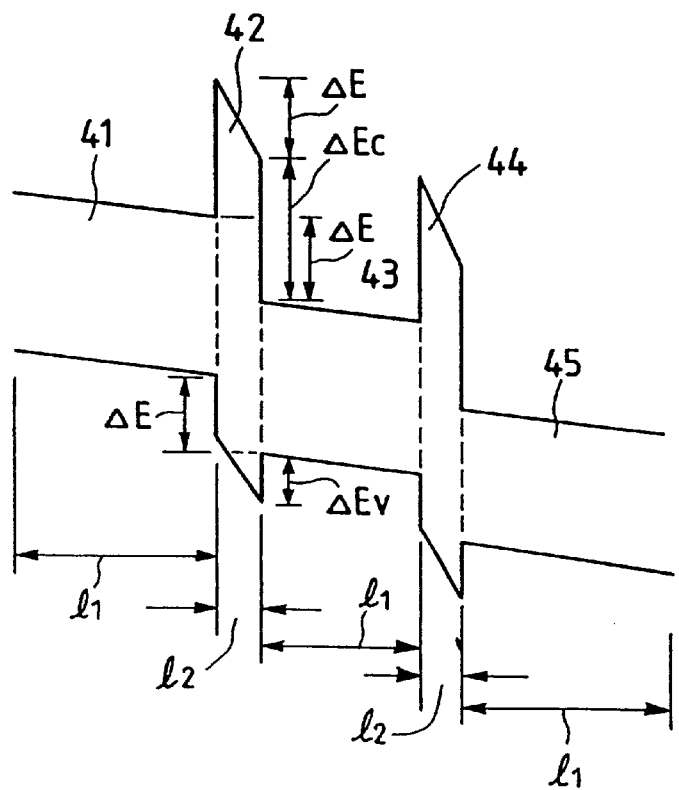

FIG. 9 shows an energy band structure of a portion of the avalanche region upon application of a bias voltage in a case wherein a layer having a given dielectric constant and a layer having a dielectric constant smaller than the given dielectric constant have a band gap difference and an electron affinity difference in the layers constituting the avalanche region shown in FIG. 7A.

The structure shown in FIG. 9 is constituted by layers 41, 43, and 45 each having a layer thickness $l_1$, a given dielectric constant $\epsilon_1$, and a given band gap Eg1, and layers 42 and 44 each having a layer thickness $l_2$, a dielectric constant $\epsilon_2$ smaller than the given dielectric constant, and a band gap Eg2 larger than the given band gap. Assume that in a junction between adjacent layers, an energy step $\Delta Ec$ is formed in a conduction band, and an energy step $\Delta Ev$ is formed in a valence band. Furthermore, the layers constituting the avalanche region are depleted, and no spatial electric charges caused by impurity doping, a defect level, an interface level, and the like are present at all. In this case, a ratio $\epsilon_1/\epsilon_2$ of the dielectric constants is selected so that an electric field which causes a carrier drift but is smaller than an ionization threshold value is generated in the low-electric field layers 41, 43, and 45 each having a large dielectric constant, and a high electric field which causes an energy difference between energy bands of adjacent layers each having a large dielectric constant to be almost equal to or larger than a carrier ionization threshold value is generated in the high-electric field layers 42 and 44 each having a small dielectric constant. When the energy step $\Delta Ec$ or $\Delta Ev$ in the junction between the layers falls within a range of several times of kT (where k is the Boltzmann constant and T is the temperature), electrons in a conduction band or holes in a valence band of a layer having a large dielectric constant which is adjacent to a layer having a small dielectric constant can sufficiently effectively pass through the layer having the small dielectric constant without being scattered or stored in the junction. Therefore, a low-noise APD can be realized in the same manner as in the embodiment described with reference to FIG. 7B. When the energy step $\Delta Ec$ or $\Delta Ev$ in the junction between the layers is sufficiently larger than kT, the thickness of the layer having the small dielectric constant is selected according to this embodiment so that electrons in the conduction band or holes in the valence band of the layer having the large dielectric constant which is adjacent to the layer having the small dielectric constant can sufficiently effectively pass through the layer having the small dielectric constant by a tunnel process or a thermal discharge process.

In this embodiment, even when carriers (electrons in this case) partially lose their energy due to any process when they pass through the layer having the small dielectric constant, a bias voltage to be applied can be adjusted to easily compensate for the shortage. Therefore, a high electric field which causes an energy difference between energy bands of layers having a large dielectric constant (low-electric field layers) adjacent to layers having a small dielectric constant (high-electric field layers) to be almost equal to or larger than a carrier ionization threshold value can be generated. The thickness of the layer having the small dielectric constant in this case normally falls within a range of about 5 to 200 Å. If the above-mentioned conditions are satisfied, the layer may have a larger or smaller thickness. As the larger electric field is generated in the layer having the small dielectric constant, its layer thickness can be increased.

The avalanche operation of the semiconductor light-receiving element according to this embodiment will be briefly described below with reference to FIGS. 7A and 9.

Incident light effectively transmits through the electrode 1, and is absorbed by a light-receiving region, i.e., the blocking layer 2, the light-receiving layer 3, or the first layer 7 of the avalanche region 4, thus generating carriers (electrons and holes). Of these carriers, carriers (in this case, electrons) having a larger ionization ratio drift toward the second layer 8 of the avalanche region. In this case, the layer 8 is a layer having a small dielectric constant and a larger band gap. As described above, electrons sufficiently pass through this layer, and reach the third layer 9 having a larger dielectric constant. A bias voltage is applied to form an energy difference almost equal to or larger than an electron ionization threshold value between energy bands of the layers 7 and 9, thereby generating a high electric field in the layer 8 having the small dielectric constant. Even if this energy difference is smaller than the ionization threshold value, a shortage can be supplied from the drift electric field, and electrons are ionized in or near this layer. The ionized and multiplied electrons drift in the third layer 9 toward the fourth layer 10. The drift in the layers having the larger dielectric constant and ionization in or near the layers having the smaller dielectric constant are repeated in the respective layers. In this manner, a low-noise APD in which a location of ionization is specified can be realized.

In the semiconductor light-receiving element, it is preferable that holes generated upon light absorption or ionization of electrons do not acquire an energy high enough to be ionized. This can be realized by, e.g., using a material having a difference between ionization ratios of electrons to holes and by adjusting a bias voltage value to be applied.

In this embodiment, when spatial electric charges caused by impurity doping, a defect level position, or an interface level, and the like are present in the respective layers constituting the avalanche region, the same function as in the second embodiment applies correspondingly.

Embodiment 4

The fourth embodiment corresponding to a case wherein the avalanche region of the semiconductor light-receiving element having the element structure shown in FIG. 7A is constituted by a layer having a band gap which is continuously changed by its composition, and having a given dielectric constant, and a layer having a dielectric constant smaller than the given dielectric constant will be described below.

Figure 10A:
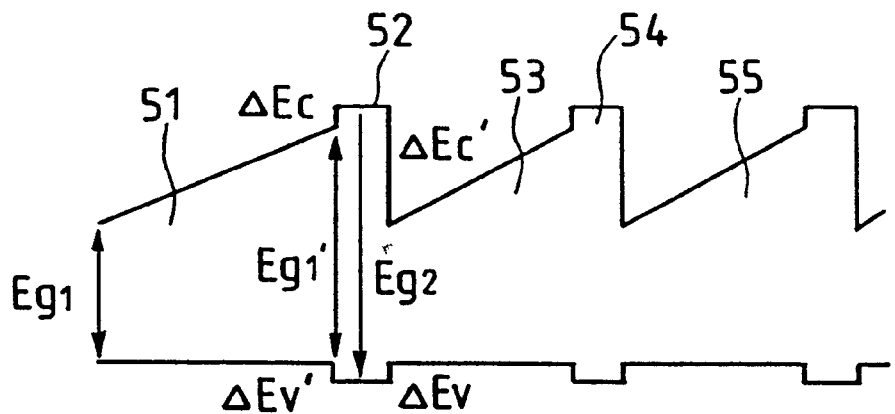

FIG. 10A shows a portion of an energy band structure of the avalanche region upon application of a zero bias in a case wherein the avalanche region of the semiconductor light-receiving element having the element structure shown in FIG. 7A is constituted by layers 51, 53, and 55 each having a layer thickness $l_1$ and a given dielectric constant $\epsilon_1$, and having a band gap which is continuously change from a minimum band gap Eg1 to a maximum band gap Eg1' by changing its composition, and layers 52 and 54 each having a layer thickness $l_2$ a dielectric constant $\epsilon_2$ smaller than the given dielectric constant, and a band gap Eg2 equal or larger than the above-mentioned band gap.

Figure 10B:
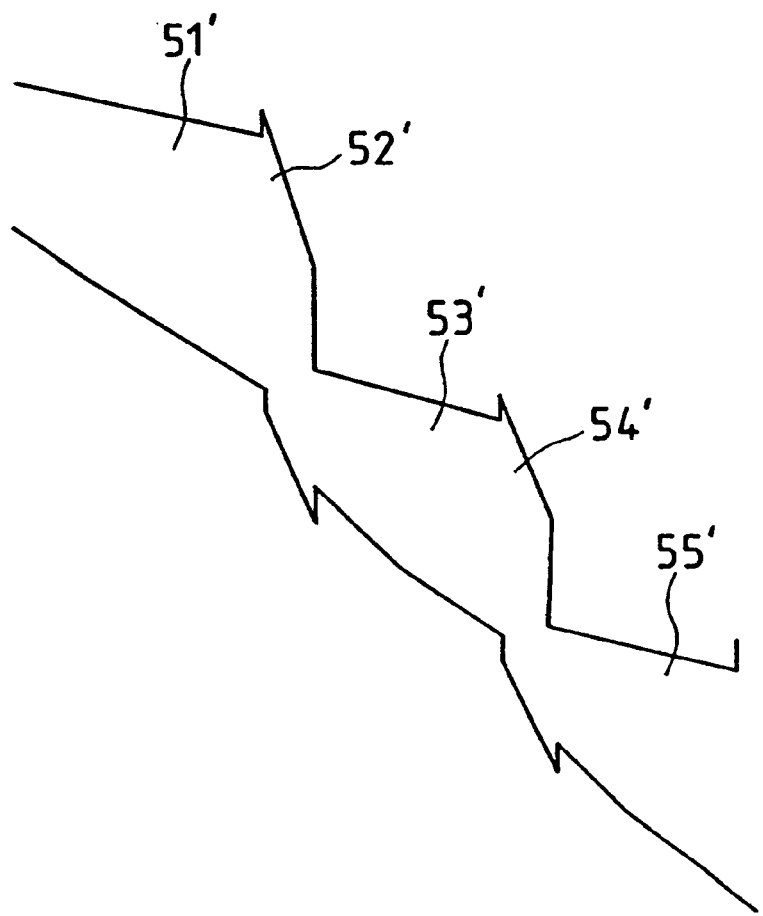

FIG. 10B shows a portion of an energy band structure of the avalanche region when a bias voltage is applied to the semiconductor light-receiving element having the avalanche region having the energy band structure shown in FIG. 10A.

In this embodiment, the composition of the layer having the large dielectric constant is changed, so that an energy step ΔEc is formed in a conduction band and an energy step ΔEv is formed in a valence band in a junction between a portion corresponding to the maximum band gap of the layer having the large dielectric constant $\epsilon_1$ and the layer having the small dielectric constant $\epsilon_2$, and an energy step ΔEc' is formed in a conduction band and an energy step ΔEv' is formed in a valence band in a junction between a portion corresponding to the minimum band gap of the layer having the large dielectric constant $\epsilon_1$ and the layer having the small dielectric constant $\epsilon_2$. Furthermore, the composition of the layer having the large dielectric constant is changed so that ΔEc or ΔEv of these energy steps falls with in a range of about several times of kT to cause electrons in the conduction band or holes in the valence band of the layer having the large dielectric constant to sufficiently and effectively pass through the layer having the small dielectric constant. Moreover, the layers constituting the avalanche region are depleted upon application of a bias voltage, and no spatial electric charges caused by impurity doping, a defect level, an interface level, and the like are present at all. In this embodiment, a ratio $\epsilon_1/\epsilon_2$ of the dielectric constants is selected so that when a bias voltage is applied, an electric field which causes a carrier drift but is smaller than an ionization threshold value is generated in the layers 51, 53, and 55 each having a large dielectric constant, and a high electric field which causes an energy difference between energy bands of adjacent layers each having a large dielectric constant to be almost equal to or larger than an ionization threshold value of carriers (electrons in this case) is generated in the high-electric field layers 52 and 54 each having a small dielectric constant. An energy difference between energy bands on two sides of the layer having the small dielectric constant is a sum of a potential gradient formed in the layer having the small dielectric constant and the energy step ΔEc'. A bias voltage to be applied can be decreased due to the presence of the energy ΔEc', and a variation in avalanche amplification factor caused by a variation in bias voltage can be suppressed. In the layer which constitutes the avalanche region of this element and a band gap of which is changed by changing its composition, even when the composition is changed and its dielectric constant is changed, there is no problem as long as the minimum value of the dielectric constant of the layer is equal to or larger than the dielectric constant of the layer having the small dielectric constant constituting the avalanche region.

The avalanche operation of the semiconductor light-receiving element according to this embodiment will be briefly described below with reference to FIGS. 7A and 10.

Incident light effectively transmits through the electrode 1, and is absorbed by a light-receiving region, i.e., the blocking layer 2, or the light-receiving layer 3, or the first layer 7 of the avalanche region 4, thus generating carriers (electrons and holes). Of these carriers, carriers (in this case, electrons) having a larger ionization ratio drift toward the second layer 8 of the avalanche region. In this case, since the layer 8 is a layer having a small dielectric constant and a larger band gap, electrons sufficiently pass through this layer, and reach the third layer 9 having a larger dielectric constant. Since the layer 8 having the small dielectric constant has a high electric field so that an energy difference equal to or larger than a carrier ionization threshold value is formed in the energy bands of the layers 7 and 9, even if this energy difference is smaller than the ionization threshold value, a shortage can be supplied from the drift electric field, and electrons are ionized in or near this layer. The ionized and multiplied electrons drift in the third layer 9 having the larger dielectric constant toward the fourth layer 10. The drift in the layers each having the larger dielectric constant and ionization in or near the layers having the smaller dielectric constant are repeated in the respective layers. In this manner, a low-noise APD in which a location of ionization is specified can be realized.

In the semiconductor light-receiving element, it is preferable that holes generated upon light absorption or ionization of electrons do not acquire an energy high enough to be ionized. This can be realized by, e.g., using a material having a difference between ionization ratios of electrons to holes, or setting ΔEv' to be smaller than ΔEc' and by adjusting a bias voltage value to be applied.

In this embodiment, when spatial electric charges caused by impurity doping, a defect level position, or an interface level, and the like are present in the respective layers constituting the avalanche region, the same function as in the second embodiment applies correspondingly.

Embodiment 5

An embodiment of a photoelectric conversion apparatus according to the present invention, which is constituted by two-dimensionally arranging photoelectric conversion elements according to the structure as described above will be described below with reference to the drawings.

Figure 11:
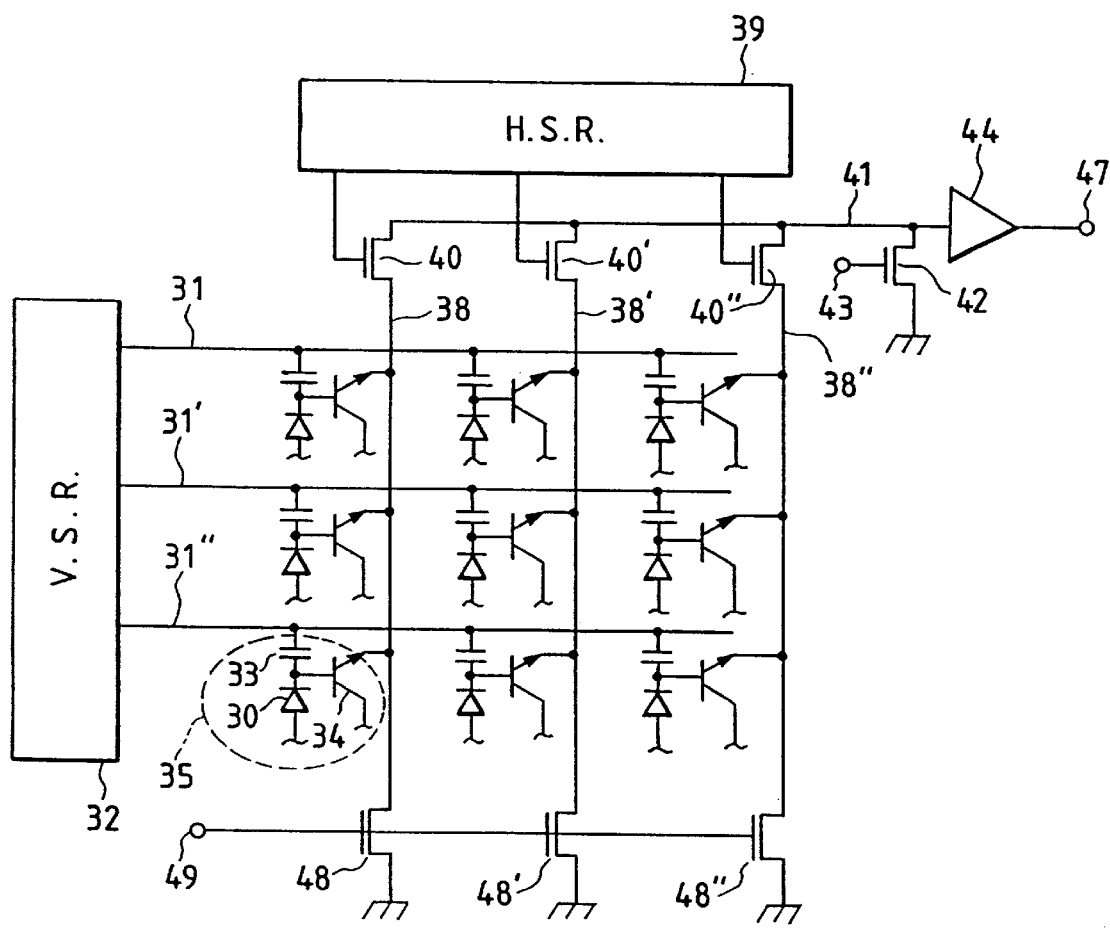
FIG. 11 is a circuit diagram showing a photoelectric conversion apparatus according to still another embodiment of the present invention.

FIG. 11 is a circuit diagram of a photoelectric conversion apparatus fundamental sensor cell structures 35 each comprising a photoelectric conversion element 30 described above, a capacitor 33 for applying a read pulse and a refresh pulse to the photoelectric conversion element 30, and a bipolar transistor 34 for reading out a stored voltage from the photoelectric conversion element 30 are two-dimensionally arranged in a 3×3 matrix.

The circuit shown in FIG. 11 is constituted by the fundamental sensor cells 35, horizontal lines 31, 31', and 31" for applying a read pulse and a refresh pulse, a vertical shift register 32 for generating a read pulse, vertical lines 38, 38', and 38" for reading out a stored voltage from the fundamental sensor cells 35, a horizontal shift register 39 for generating a pulse for selecting the respective vertical lines, gate MOS transistors 40, 40', and 40" for opening/closing the corresponding vertical lines, an output line 41 for reading out a stored voltage to an amplifier unit, a MOS transistor 42 for refreshing electric charges stored on the output line after read access, a terminal 43 for applying a refresh pulse to the MOS transistor 42, an amplifier 44, comprising, e.g., a bipolar transistor, MOS FET, J-FET, or the like, for amplifying an output signal, an output terminal 47 of the amplifier, MOS transistors 48, 48', and 48" for refreshing electric charges stored on the vertical lines 40, 40', and 40" in a read operation, and a terminal 49 for applying a pulse to the gates of the MOS transistors 48, 48', and 48".

The operation of the photoelectric conversion apparatus will be described below with reference to FIG. 11 and the timing chart shown in FIG. 12.

In FIG. 12, a period 61 corresponds to a refresh operation, a period 62 corresponds to a storage operation, and a period 63 corresponds to a read operation. At time $t_1$, a potential 65 of the terminal 49 is at high level, the MOS transistors 48, 48', and 48" are kept enabled, and the photosensor cells are grounded through the vertical lines 38, 38', and 38". In this state, when a pulse is applied from the shift register 32 to the horizontal line 31, as indicated by a waveform 67, the base voltages of the photosensor cells in the first row are increased via the capacitor 33, and the bipolar transistor 34 is turned on to start the refresh operation, thus refreshing electric charges stored so far.

At time $t_2$, when the pulse 67 goes to low level, the bases of the transistors of the photosensor cells in the first row are reverse-biased to their emitters, thus starting the next storage period 62. In this case, in the photosensor cells in the second and third rows, pulses 67' and 67" are applied from the vertical shift register 32 to the horizontal lines 31' and 31", respectively, to perform refresh operations in the same manner as in the photosensor cells in the first row.

During the storage operation period 62, the above-mentioned photoelectric conversion operation and multiplication operation are performed in the respective photoelectric conversion elements upon light radiation.

After the storage period 62, the read period 63 starts from time $t_3$. At time $t_3$, a potential 65 of the gate terminal 49 of the MOS transistors 48, 48', and 48" is set at low level.

At time $t_4$, of the outputs of the vertical shift register 32, one connected to the horizontal line 34 goes to high level, as indicated by a waveform 69, and read operations of the three sensor cells of the first row connected to this horizontal line 34 are performed. Signal voltages generated by signal charges stored in the base regions of the respective photosensor cells directly appear on the vertical lines 38, 38', and 38".

At time $t_5$, of the outputs of the horizontal shift registers 39, the output connected to the gate of the MOS transistor 40 connected to the vertical line 38 goes to high level, as indicated by a waveform 70, and the MOS transistor 40 is enabled. The output signal from the transistor 40 is input to the amplifier 44 via the output line 41, and is output from the output terminal 47. After the signal is read out in this manner, since signal electric charges caused by a wiring capacitance are left on the output line 41, a pulse is applied to the gate terminal 43 of the MOS transistor 42, as indicated by a pulse waveform 71, so that the MOS transistor 42 is enabled to ground the output line 41, thereby refreshing the residual signal electric charges. Thereafter, the switching MOS transistors 40' and 40" are sequentially enabled to read out signal outputs on the vertical lines 38' and 38". After the signals are read out from the horizontally aligned photosensor cells for one line, since signal electric charges caused by their wiring capacitances are left on the vertical lines 38, 38', and 38" like in the output line 41, the gate terminal 49 of the MOS transistors 48, 48', and 48" connected to the vertical lines 38, 38', and 38" is set at high level to enable these transistors, as indicated by a waveform 65, thereby refreshing these residual signal electric charges.

At time $t_8$, of the outputs of the vertical shift register 32, the output connected to the horizontal line 31' goes to high level, as indicated by a waveform 69', and the stored voltages of the respective photosensor cells connected to the horizontal line 31' are read out onto the corresponding vertical lines 38, 38', and 38". Signals are then sequentially read out from the output terminal 47 by the same operations as described above.

In the above description, an operation state applied to an application field in which the storage period 62 and the read period 63 are clearly distinguished from each other has been described. However, when pulse timings shown in FIG. 12 are changed, the present invention is applicable to an application field in which an operation in the storage period 62 and an operation in the read period 63 are simultaneously performed like in a television camera.

In the above embodiments, the sensor cells are two-dimensionally arranged in a 3×3 matrix. Of course, the present invention is not limited to this, and the number of sensor cells to be arranged may be increased or decreased, or the sensor cells may be arranged linearly. When the sensor cells are linearly arranged to constitute a line sensor, the vertical shift register 32 can be omitted.

In the element of each of the above embodiments, basically, materials having a large dielectric constant and materials having a small dielectric constant need only be alternately arranged as the avalanche region.

In order to form these, various materials and manufacturing methods can be utilized. The layers of this embodiment may adopt fine crystalline, or polycrystalline, or amorphous materials.

In each of the above embodiments, layers having different dielectric constants are stacked as the multiplication layer. However, the present invention is not limited to the multiplication layer obtained by stacking the layers having different dielectric constants.

EXAMPLE 1

Example 1 of the present invention will be described below with reference to FIG. 7A. FIG. 7A shows an element in which a chromium electrode 6, an n-type amorphous silicon blocking layer 5, an avalanche region 4 formed of intrinsic amorphous silicon and amorphous silicon nitride layers, an intrinsic amorphous silicon light-receiving layer 3, a p-type amorphous silicon blocking layer 2, and an ITO electrode 1 are formed on a glass substrate.

This element was manufactured by the following operations.

A chromium electrode was formed on a 7059 glass substrate (available from Corning Glass Works) by an evaporation apparatus, and was etched so that an electrode shape had a desired pattern.

The substrate was then placed on an anode electrode of a capacitive coupling type deposition film formation apparatus. The interior of a deposition chamber was evacuated to about $10^{-6}$ Torr, and the substrate was heated to 300° C. by a heater. After the temperature of the substrate reached a predetermined temperature, 30 sccm of silane gas $SiH_4$ and 30 sccm of phosphine gas $PH_3$ diluted to 500 ppm with hydrogen gas $H_2$ were introduced into the deposition chamber as source gases for forming the blocking layer. After it was confirmed that the inner pressure of the deposition chamber reached 0.3 Torr, a high-frequency electric power (frequency=13.56 MHz) of 0.5 W/cm² was applied into the deposition chamber. Glow discharge was performed for a predetermined period of time to deposit an n-type amorphous silicon blocking layer to 500 Å. After the blocking layer was formed, the interior of the deposition chamber was sufficiently evacuated, and the substrate temperature was decreased to a room temperature. The substrate was then taken outside the deposition chamber, and the blocking layer was etched to have a desired pattern.

Thereafter, the substrate was placed in the deposition chamber again, and a total of six 2.00-Å thick amorphous silicon layers from 30 sccm of source gas silane $SiH_4$ and a total of five 50-Å thick amorphous nitride silicon layers from 30 sccm of source gas silane $SiH_4$ and 30 sccm of ammonia gas $NH_3$ were alternately deposited as an avalanche region following the same procedures as in the blocking layer.

Following the same procedures as described above, a 1.5-μm thick amorphous silicon layer was deposited from 30 sccm of source gas silane $SiH_4$ as a light-receiving layer, and a 500-Å thick p-type amorphous silicon layer was then deposited from 30 sccm of source gas silane $SiH_4$, and 30 sccm of diborane gas $B_2H_6$ diluted to 300 ppm with hydrogen gas $H_2$ as a blocking layer.

Finally, ITO was deposited as a transparent electrode.

The band gaps and dielectric constants of the respective layers of the avalanche region were optically measured, and were respectively about 1.7 eV and about 12 for the amorphous silicon layers, about 2.0 eV and about 5 for the amorphous silicon nitride layers.

When light having a wavelength of 550 nm was incident on the photoelectric conversion element of this example, an SN ratio could be improved about four times that of a photoelectric conversion element described in Comparative Example 1 below.

Comparative Example 1

A photoelectric conversion apparatus was manufactured following substantially the same procedures as in Example 1 except that no ammonia gas was introduced into the deposition chamber during formation of the avalanche region in Example 1. The apparatus of Comparative Example 1 does not include a layer having a small dielectric constant, to which an electric field is concentrated, as the characteristic feature of the present invention.

EXAMPLE 2

As Example 2 of the present invention, an element in which a chromium electrode 6, an n-type amorphous silicon blocking layer 5, an avalanche region 4 formed of impurity-doped amorphous silicon, intrinsic amorphous silicon, and amorphous silicon nitride layers, an intrinsic amorphous silicon light-receiving layer 3, a p-type amorphous silicon blocking layer 2, and an ITO electrode 1 are formed on a glass substrate will be described below.

This element was manufactured by the following operations.

A chromium electrode was formed on a 7059 glass substrate (available from Corning Glass Works) by an evaporation apparatus, and was etched so that an electrode shape had a desired pattern.

The substrate was then placed on an anode. electrode of a capacitive coupling type deposition film formation apparatus. The interior of a deposition chamber was evacuated to about $10^{-6}$ Torr, and the substrate was heated to 300° C. by a heater. After the temperature of the substrate reached a predetermined temperature, 30 sccm of silane gas $SiH_4$ and 30 sccm of phosphine gas $PH_3$ diluted to 500 ppm with hydrogen gas $H_2$ were introduced into the deposition chamber as source gases for forming the blocking layer. After it was confirmed that the inner pressure of the deposition chamber reached 0.3 Torr, a high-frequency electric power (frequency=13.56 MHz) of 0.5 W/cm² was applied into the deposition chamber. Glow discharge was performed for a predetermined period of time to deposit an n-type amorphous silicon blocking layer to 500 Å. After the blocking layer was formed, the interior of the deposition chamber was sufficiently evacuated, and the substrate temperature was decreased to a room temperature. The substrate was then taken outside the deposition chamber, and the blocking layer was etched to have a desired pattern.

Thereafter, the substrate was placed in the deposition chamber again, and as an avalanche region, following the same procedures as in the blocking layer, a 200-Å thick i-type amorphous silicon layer (to be referred to as an i-layer hereinafter) from 30 sccm of source gas silane $SiH_4$, a 20-Å thick p-type amorphous silicon layer (to be referred to as a p-layer hereinafter) from 30 sccm of source gas silane $SiH_4$ and 3 sccm of phosphine gas $PH_3$ diluted to 300 ppm with hydrogen gas $H_2$, and a 200-Å thick amorphous silicon nitride layer (to be referred to as an SiN layer hereinafter) from 30 sccm of source gas silane $SiH_4$ and 30 sccm of ammonia gas $NH_3$ were sequentially deposited in the order of the i-layer, the p-layer, the SiN layer, the p-layer, the i-layer, . . . , i.e., so that the p-layers sandwich the SiN layer therebetween, until a total of six i-layers of the avalanche region were formed.

Subsequently, following the same procedures as described above, a 1.5-μm thick amorphous silicon layer was deposited from 30 sccm of source gas silane $SiH_4$ as a light-receiving layer, and a 500-Å thick p-type amorphous silicon layer was then deposited from 30 sccm of source gas silane $SiH_4$, and 30 sccm of diborane gas $B_2H_6$ diluted to 300 ppm with hydrogen gas $H_2$ as a blocking layer.

Finally, ITO was deposited as a transparent electrode.

The band gaps and dielectric constants of the respective layers of the avalanche region were optically measured, and were respectively about 1.7 eV and about 12 for the amorphous silicon layers, about 2.0 eV and about 5 for the amorphous silicon nitride layers.

The SN ratio of the photoelectric conversion element of this example was improved about 1.2 times that of the photoelectric conversion element shown in Example 1.

EXAMPLE 3

As Example 3 of the present invention, an element in which a chromium electrode 6, an n-type amorphous silicon blocking layer 5, an avalanche region 4 formed of amorphous silicon layers whose band gap is changed by doping carbon atoms and amorphous silicon nitride layers, an intrinsic amorphous silicon light-receiving layer 3, a p-type amorphous silicon blocking layer 2, and an ITO electrode 1 are formed on a glass substrate will be described below.

This element was manufactured by the following operations.

A chromium electrode was formed on a 7059 glass substrate (available from Corning Glass Works) by an evaporation apparatus, and was etched so that an electrode shape had a desired pattern.

The substrate was then placed on an anode electrode of a capacitive coupling type deposition film formation apparatus. The interior of a deposition chamber was evacuated to about $10^{-6}$ Torr, and the substrate was heated to 300° C. by a heater. After the temperature of the substrate reached a predetermined temperature, 30 sccm of silane gas $SiH_4$ and 30 sccm of phosphine gas $PH_3$ diluted to 500 ppm with hydrogen gas $H_2$ were introduced into the deposition chamber as source gases for forming the blocking layer. After it was confirmed that the inner pressure of the deposition chamber reached 0.3 Torr, a high-frequency electric power (frequency=13.56 MHz) of 0.5 $W/cm^2$ was applied into the deposition chamber. Glow discharge was performed for a predetermined period of time to deposit an n-type amorphous silicon blocking layer to 500 Å. After the blocking layer was formed, the interior of the deposition chamber was sufficiently evacuated, and the substrate temperature was decreased to a room temperature. The substrate was then taken outside the deposition chamber, and the blocking layer was etched to have a desired pattern.

Thereafter, the substrate was placed in the deposition chamber again, and as an avalanche region, following the same procedures as in the blocking layer, a total of six 500-Å thick amorphous silicon carbide layers whose band gap was changed by continuously decreasing a methane gas amount as a layer was deposited from 30 sccm of source gas silane $SiH_4$ and 50 to 0 sccm of methane gas $CH_4$, and a total of five 50-Å thick amorphous silicon nitride layers from 30 sccm of ammonia gas $NH_3$ were deposited.

Subsequently, following the same procedures as described above, a 1.5-$\mu$m thick amorphous silicon layer was deposited from 30 sccm of source gas silane $SiH_4$ as a light absorption layer (light-receiving layer), and a 500-Å thick p-type amorphous silicon layer was then deposited from 30 sccm of source gas silane $SiH_4$, and 30 sccm of diborane gas $B_2H_6$ diluted to 300 ppm with hydrogen gas $H_2$ as a blocking layer.

Finally, ITO was deposited as a transparent electrode.

The band gaps of the respective layers of the avalanche region were optically measured, and were a minimum band gap of about 1.7 eV and a maximum band gap of about 2.1 for the amorphous silicon carbide layers, and about 2.0 eV for the amorphous silicon nitride layers.

The SN ratio of the photoelectric conversion element of this example was improved about 1.8 times that of the photoelectric conversion element shown in Example 1.

EXAMPLE 4

Figure 14:
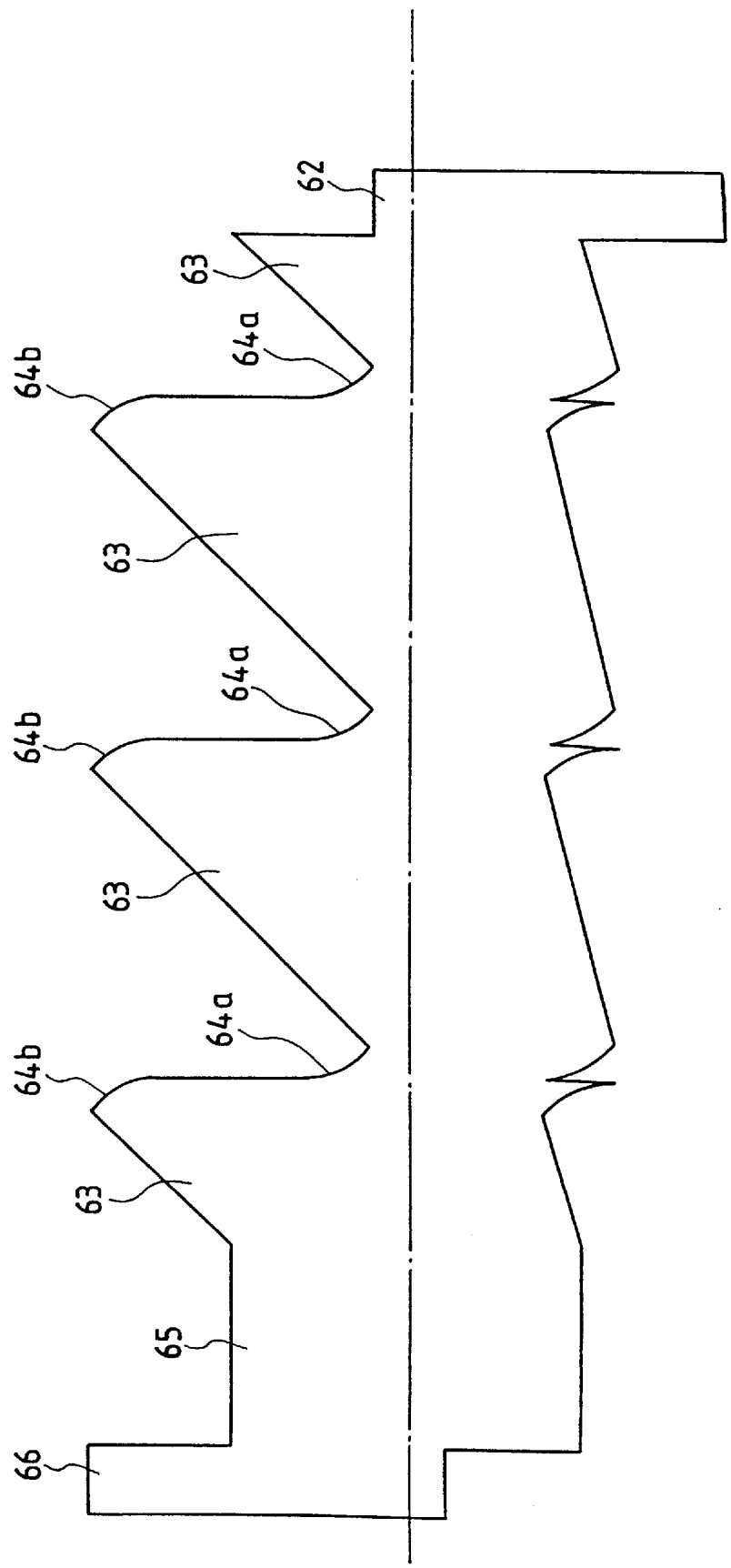
FIG. 14 is an energy band chart showing a band profile of the photoelectric conversion apparatus of the present invention in a non-bias state.

Example 4 will be described below with reference to FIGS. 13 and 14.

FIG. 13 is a schematic sectional view of Example 4 of a photoelectric conversion element of the present invention.

A 0.2-$\mu$m thick Cr lower electrode 61 was deposited by sputtering on a glass substrate 60 (#7059, available from Corning Glass Works), and was patterned to a desired pattern. Thereafter, the substrate was set in a capacitive coupling type CVD apparatus, and a substrate temperature was set at 300° C. 60 sccm of $SiH_4$ gas and 20 sccm of $H_2$-diluted 10%-$PH_3$ gas were introduced, and discharge was performed at a high-frequency electric power of 0.2 W/cm and a gas pressure of 0.2 Torr for 5 minutes and 30 seconds, thereby forming a hole blocking layer 62 (film thickness=1,000-Å).

In the capacitive coupling type CVD apparatus, the substrate temperature was set at 300° C. Gases were introduced so that a flow rate of $SiH_4$ gas was continuously changed from 60 sccm to 6 sccm, a flow rate of $GeH_4$ gas was continuously changed from 0 sccm to 54 sccm, and a flow rate of $H_2$-diluted 10%-$PH_3$ gas was continuously changed from 0 sccm to 6 sccm. In this state, discharge was performed at a high-frequency electric power of 0.5 $W/cm^2$ and a gas pressure of 0.2 Torr for 5 minutes and 30 seconds (deposition process ①), and thereafter, discharge was continued for 8 seconds while maintaining the reached gas flow rates (deposition process ②), thereby forming a lowermost inclined band-gap layer 63 (film thickness=1,000 Å), and an n-type high-concentration impurity layer 64a (film thickness=25 Å) (during formation of the inclined band-gap layers, a state wherein $GeH_4$ gas=0 sccm is temporarily set in this example, and the layers include an amorphous silicon hydride region. The same applies to examples to be described later).

Subsequently, in the capacitive coupling type CVD apparatus, the substrate temperature was set at 300° C. 24 sccm of $SiH_4$ gas, 36 sccm of $CH_4$ gas, and 6 sccm of $H_2$-diluted 10%-$B_2H_6$ gas were introduced, and discharge was performed at a high-frequency electric power of 0.2 $W/cm^2$ and a gas pressure of 0.3 Torr for 14 seconds (deposition process ③). Thereafter, discharge was continued for 9 minutes and 15 seconds while only gas introduction conditions of the $SiH_4$, $CH_4$, and $H_2$-diluted 10%-$B_2H_6$ gases were respectively changed from 24 sccm to 60 sccm, from 36 sccm to 0 sccm, and from 6 sccm to 0 sccm (deposition process ④) (during formation of the inclined band-gap layers, a state wherein $CH_4$ gas=0 sccm is temporarily set in this example, and the layers include an amorphous silicon hydride region. The same applies to examples to be described later). Subsequently, the deposition processes ① and ② were performed, thus forming a high-concentration impurity layer 64b (film thickness=25 Å), an inclined band-gap layer 63 (film thickness=2,000 Å), and a high-concentration impurity layer 64a (film thickness= 25 Å) for one cycle. After these operations were repeated for another cycle, the deposition processes ③ and ④ were performed to form an uppermost high-concentration impurity layer 64b and an inclined band-gap layer 63 (film thickness=1,000 Å). As a result, a total of three stepbacks were formed.

Thereafter, the substrate temperature was set at 300° C. in the capacitive coupling type CVD apparatus, 30 sccm of $SiH_4$ gas and 30 sccm of $H_2$ gas were introduced, and discharge was performed at a high-frequency electric power of 0.2 $W/cm^2$ and a gas pressure of 0.3 Torr for 75 minutes, thereby forming a light absorption layer 65 (film thickness= 8,000 Å).

The substrate temperature was set at 300° C. in the capacitive coupling type CVD apparatus, 24 sccm of $SiH_4$ gas, 20 sccm of $H_2$-diluted 10%-$B_2H_6$ gas, and 36 sccm of $CH_4$ gas were introduced, and discharge was performed at a high-frequency electric power of 0.2 $W/cm^2$ and a gas pressure of 0.3 Torr for 5 minutes, thereby forming an electron blocking layer 66 (film thickness=500 Å).

Thereafter, the semiconductor layers 62 to 66 were patterned to desired patterns, thus isolating these semiconductor layers.

In the capacitive coupling type CVD apparatus, the substrate temperature was set at 300° C., and discharge was performed for an hour using hydrogen-diluted 10%-SiH$_4$ gas at a flow rate of 100 sccm and 99.999%-NH$_3$ gas at a flow rate of 100 sccm at a high-frequency electric power of 0.01 W/cm$^2$ while adjusting a gas pressure to 0.4 Torr, thus forming a 3,000-Å thick SiN$^x$ film as a protection layer 67. Thereafter, the SiH$_x$ film was patterned to form a contact hole for an upper electrode. A 700-Å thick ITO upper transparent electrode 68 was formed by sputtering, thus completing an element.

Upon evaluation of the photoelectric conversion element manufactured as described above, the following results were obtained.

(1) When a reverse bias of 10 V or more was applied, an 8-time multiplication ratio can be obtained. Even at a high electric field of 50 V or more, the multiplication ratio was saturated to 8 times. Thus, a sensor can be driven in a storage operation mode with an electric field as low as about 15 V. A ratio of a photocurrent to a dark current was equivalent to that of a C-Sipn sensor without multiplication.

(2) A multiplication ratio 8 times that of a photoelectric conversion element which had no high-concentration impurity layers and in which no impurity was doped in the inclined band-gap layers could be obtained, and noise could be reduced to about ½.

(3) There is no change in multiplication ratio due to a change in temperature (5° C. to 90° C.), and no temperature compensation which was indispensable in a conventional APD need not be performed.

EXAMPLE 5

FIG. 15 is a schematic sectional view showing Example 5 of a photoelectric conversion element of the present invention.

A 0.2-μm thick Cr lower electrode 71 was deposited by sputtering on a glass substrate 70 (#7059, available from Corning Glass Works), and was patterned to a desired pattern. Thereafter, the substrate was set in a capacitive coupling type CVD apparatus, and a substrate temperature was set at 300° C. 60 sccm of SiH$_4$ gas and 20 sccm of H$_2$-diluted 10%-PH$_3$ gas were introduced, and discharge was performed at a high-frequency electric power of 0.2 W/cm$^2$ and a gas pressure of 0.2 Torr for 5 minutes and 30 seconds, thereby forming a hole blocking layer 72 (film thickness=1,000 Å).

In the capacitive coupling type CVD apparatus, the substrate temperature was set at 300° C. Gases were introduced so that a flow rate of SiH$_4$ gas was continuously changed from 60 sccm to 6 sccm, and a flow rate of GeH$_4$ gas was continuously changed from 0 sccm to 54 sccm. In this state, discharge was performed at a high-frequency electric power of 0.5 W/cm$^2$ and a gas pressure of 0.2 Torr for 5 minutes and 30 seconds (deposition process ①), thereby forming a inclined band-gap layer 73 (film thickness=1,000 Å).

Subsequently, in the capacitive coupling type CVD apparatus, the substrate temperature was set at 300° C., 24 sccm of SiH$_4$ gas, 36 sccm of CH$_4$ gas, and 6 sccm of H$_2$-diluted 10%-B$_2$H$_6$ gas were introduced, and discharge was performed at a high-frequency electric power of 0.2 W/cm$^2$ and a gas pressure of 0.3 Torr for 28 seconds (deposition process ②). Thereafter, discharge was continued for 9 minutes and 15 seconds while only gas introduction conditions of the SiH$_4$, CH$_4$, and H$_2$-diluted 10%-B$_2$H$_6$ gases were respectively changed from 24 sccm to 60 sccm, from 36 sccm to 0 sccm, and from 6 sccm to 0 sccm (deposition process ③). Subsequently, the deposition process ① was performed, thus forming a high-concentration impurity layer 74 (film thickness=50 Å) and an inclined band-gap layer 73 (film thickness=2,000 Å) for one cycle. After these operations were repeated for another cycle, the deposition processes ② and ③ were performed to form an uppermost high-concentration impurity layer 74 and an inclined band-gap layer 73. As a result, a total of three stepbacks were formed.

Thereafter, the substrate temperature was set at 300° C. in the capacitive coupling type CVD apparatus, 30 sccm of SiH$_4$ gas and 30 sccm of H$_2$ gas were introduced, and discharge was performed at a high-frequency electric power of 0.2 W/cm$^2$ and a gas pressure of 0.3 Torr for 75 minutes, thereby forming a light absorption layer 75 (film thickness=8,000 Å).

The substrate temperature was set at 300° C. in the capacitive coupling type CVD apparatus, 24 sccm of SiH$_4$ gas, 20 sccm of H$_2$-diluted 10%-B$_2$H gas, and 36 sccm of CH$_4$ gas were introduced, and discharge was performed at a high-frequency electric power of 0.2 W/cm$^2$ and a gas pressure of 0.3 Torr for 5 minutes, thereby forming an electron blocking layer 76 (film thickness=500 Å).

Thereafter, the semiconductor layers 62 to 66 were patterned to desired patterns, thus isolating these semiconductor layers.

In the capacitive coupling type CVD apparatus, the substrate temperature was set at 300° C., and discharge was performed for an hour using hydrogen-diluted 10%-SiH$_4$ gas at a flow rate of 100 sccm and 99.999%-NH$_3$ gas at a flow rate of 100 sccm at a high-frequency electric power of 0.01 W/cm$^2$ while adjusting a gas pressure to 0.4 Torr, thus forming a 3,000-Å thick SiN$_x$ film as a protection layer 77. Thereafter, the SiH$_x$ film was patterned to form a contact hole for an upper electrode. A 700-Å thick ITO upper transparent electrode 78 was formed by sputtering, thus completing an element.

Upon evaluation of the photoelectric conversion element manufactured as described above, an element which had a ratio of a photocurrent and a dark current about three times that of a C-Sipn sensor without multiplication at an 8-time multiplication ratio could be obtained. Noise could be reduced to about 1/1.7 at an 8-time multiplication ratio as compared to a photoelectric conversion apparatus in which no impurity was doped in the inclined band-gap layers, and which had no high-concentration layers.

EXAMPLE 6

Figure 16:
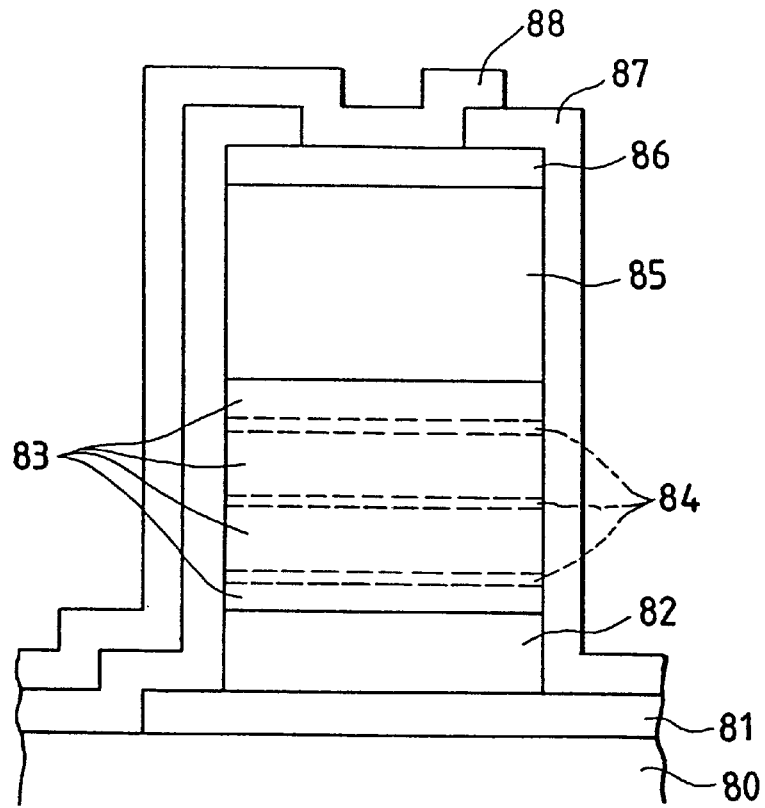

FIG. 16 is a schematic sectional view showing Example 6 of a photoelectric conversion element of the present invention.

A 0.2-μm thick Cr lower electrode 81 was deposited by sputtering on a glass substrate 80 (#7059, available from Corning Glass Works), and was patterned to a desired pattern. Thereafter, the substrate was set in a capacitive coupling type CVD apparatus, and a substrate temperature was set at 300° C. 60 sccm of SiH$_4$ gas and 20 sccm of H$_2$-diluted 10%-PH$_3$ gas were introduced, and discharge was performed at a high-frequency electric power of 0.2 W/cm$^2$ and a gas pressure of 0.2 Torr for 5 minutes and 30 seconds, thereby forming a hole blocking layer 82 (film thickness=1,000 Å).

In the capacitive coupling type CVD apparatus, the substrate temperature was set at 300° C. Gases were introduced so that a flow rate of $SiH_4$ gas was continuously changed from 60 sccm to 6 sccm, a flow rate of $GeH_4$ gas was continuously changed from 0 sccm to 54 sccm, and a flow rate of $H_2$-diluted 10%-$PH_3$ gas was continuously changed from 0 sccm to 6 sccm. In this state, discharge was performed at a high-frequency electric power of 0.5 W/cm² and a gas pressure of 0.2 Torr for 5 minutes and 30 seconds (deposition process ①), and thereafter, discharge was continued for 16 seconds while maintaining the reached gas flow rates (deposition process ②), thereby forming a lowermost inclined band-gap layer 83 (film thickness=1,000 Å), and an n-type high-concentration impurity layer 84 (film thickness=50 Å).

Subsequently, in the capacitive coupling type CVD apparatus, the substrate temperature was set at 300° C. Gases were introduced so that a flow rate of $SiH_4$ gas was continuously changed from 24 sccm to 60 sccm, and a flow rate of $CH_4$ gas was continuously changed from 36 sccm to 0 sccm, and discharge was performed at a high-frequency electric power of 0.2 W/cm² and a gas pressure of 0.3 Torr for 9 minutes 15 seconds (deposition process ③). Furthermore, the deposition processes ① and ② were performed to form another inclined band-gap layer 83 (film thickness=2,000 Å), and a high-concentration impurity layer 84 (film thickness=50 Å) for one cycle. These operation are repeated for another cycle, and finally, the deposition process ③ was performed to form an uppermost inclined band-gap layer 83 (film thickness=1,000 Å). As a result, a total of three stepbacks were formed.

Thereafter, the substrate temperature was set at 300° C. in the capacitive coupling type CVD apparatus, 30 sccm of $SiH_4$ gas and 30 sccm of $H_2$ gas were introduced, and discharge was performed at a high-frequency electric power of 0.2 W/cm² and a gas pressure of 0.3 Torr for 75 minutes, thereby forming a light absorption layer 85 (film thickness= 8,000 Å).

The substrate temperature was set at 300° C. in the capacitive coupling type CVD apparatus, 24 sccm of $SiH_4$ gas, 20 sccm of $H_2$-diluted 10%-$B_2H_6$ gas, and 36 sccm of $CH_4$ gas were introduced, and discharge was performed at a high-frequency electric power of 0.2 W/cm² and a gas pressure of 0.3 Torr for 5 minutes, thereby forming an electron blocking layer 86 (film thickness=500 Å).

Thereafter, the semiconductor layers 82 to 86 were patterned to desired patterns, thus isolating these semiconductor layers.

In the capacitive coupling type CVD apparatus, the substrate temperature was set at 300° C., and discharge was performed for an hour using hydrogen-diluted 10%-$SiH_4$ gas at a flow rate of 100 sccm and 99.999%-$NH_3$ gas at a flow rate of 100 sccm at a high-frequency electric power of 0.01 W/cm² while adjusting a gas pressure to 0.4 Torr, thus forming a 3,000-Å thick $SiN_x$ film as a protection layer 87. Thereafter, the $SiH_x$ film was patterned to form a contact hole for an upper electrode. A 700-Å thick ITO upper transparent electrode 88 was formed by sputtering, thus completing an element.

Upon evaluation of the photoelectric conversion element manufactured as described above, an element which had a ratio of a photocurrent and a dark current about 10 times that of a C-Sipn sensor without multiplication at an 8-time multiplication ratio could be obtained. Noise could be reduced to about 1/1.5 at an 8-time multiplication ratio as compared to a photoelectric conversion apparatus in which no impurity was doped in the inclined band-gap layers, and which had no high-concentration layers. Other effects were the same as those of Example 4.

EXAMPLE 7

Example 7 of the present invention will be described below with reference to FIG. 17 and FIGS. 18A and 18B.

Figure 17:
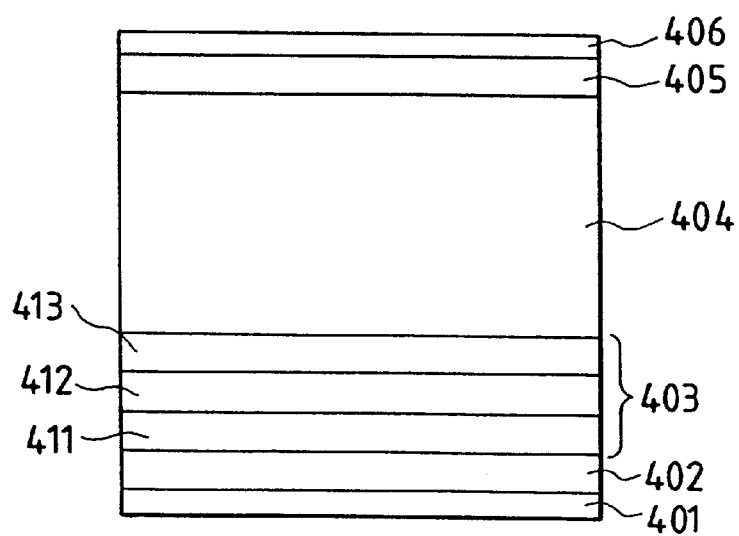
FIG. 17 and 20A are schematic sectional views showing photoelectric conversion apparatuses according to other embodiments of the present invention.

FIG. 17 is a schematic longitudinal sectional view showing Example 7 of a photoelectric conversion apparatus of the present invention.

In FIG. 17, reference numeral 401 denotes a Cr electrode; 402, a 500-Å thick n-type a-$Si_{1-x}$:H electric charge injection blocking layer for blocking hole injection; 403, a multiplication region, whose composition is changed from a-$Si_{1-x}Ge_x$:H to a-$Si_{1-y}C_y$:H, for performing carrier multiplication; 404, a 1-μm thick a-$Si_{1-y}C_y$:H light absorption layer for absorbing light and generating carriers; 405, a 100-Å thick p-type a-$Si_{1-y}C_y$:H electric charge injection blocking layer for blocking electron injection; and 406, a transparent electrode containing indium oxide as a major component.

The Cr electrode 401 and the transparent electrode 406 were formed by EB evaporation, and amorphous layers, i.e., the electric charge injection blocking layer 402, the multiplication region 403, the light absorption layer 404, and the electric charge injection blocking layer 405 were formed by plasma CVD. As source gases upon formation of amorphous layers, $SiH_4$, $GeH_4$, $PH_3$, and $H_2$ gases were used for the electric charge injection blocking layer 402, $SiH_4$, $GeH_4$, $CH_4$, and $H_2$ were used for the multiplication region 403, $SiH_4$, $CH_4$, and $H_2$ gases were used for the light absorption layer 404, and $SiH_4$, $CH_4$, $B_2H_6$, and $H_2$ gases were used for the electric charge injection blocking layer 405.

The multiplication region 403 comprises three layers, i.e., 200-Å thick composition change layers 411, 412, and 413 formed by continuously changing flow rates of $CH_4$ and $GeH_4$ gases of the source gases.

Figure 18A:
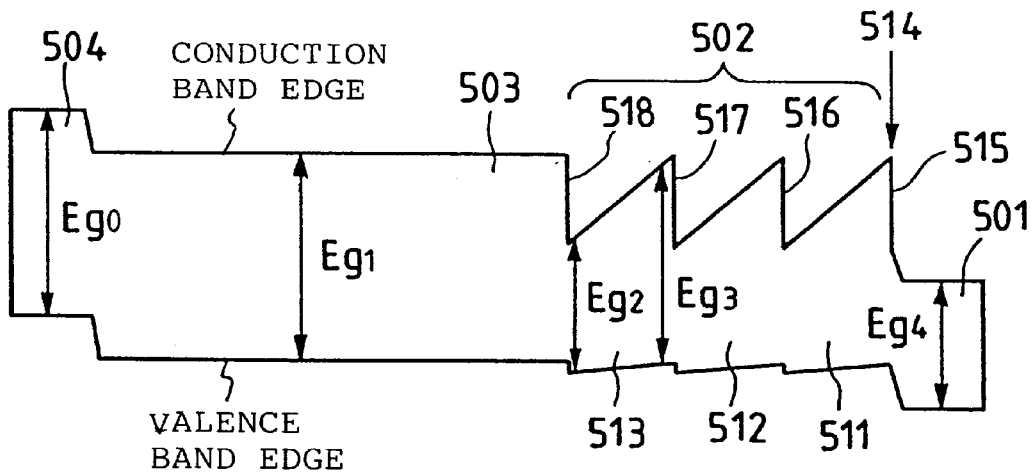
FIGS. 18A and 19A are energy band charts in a non-bias state.
Figure 18B:
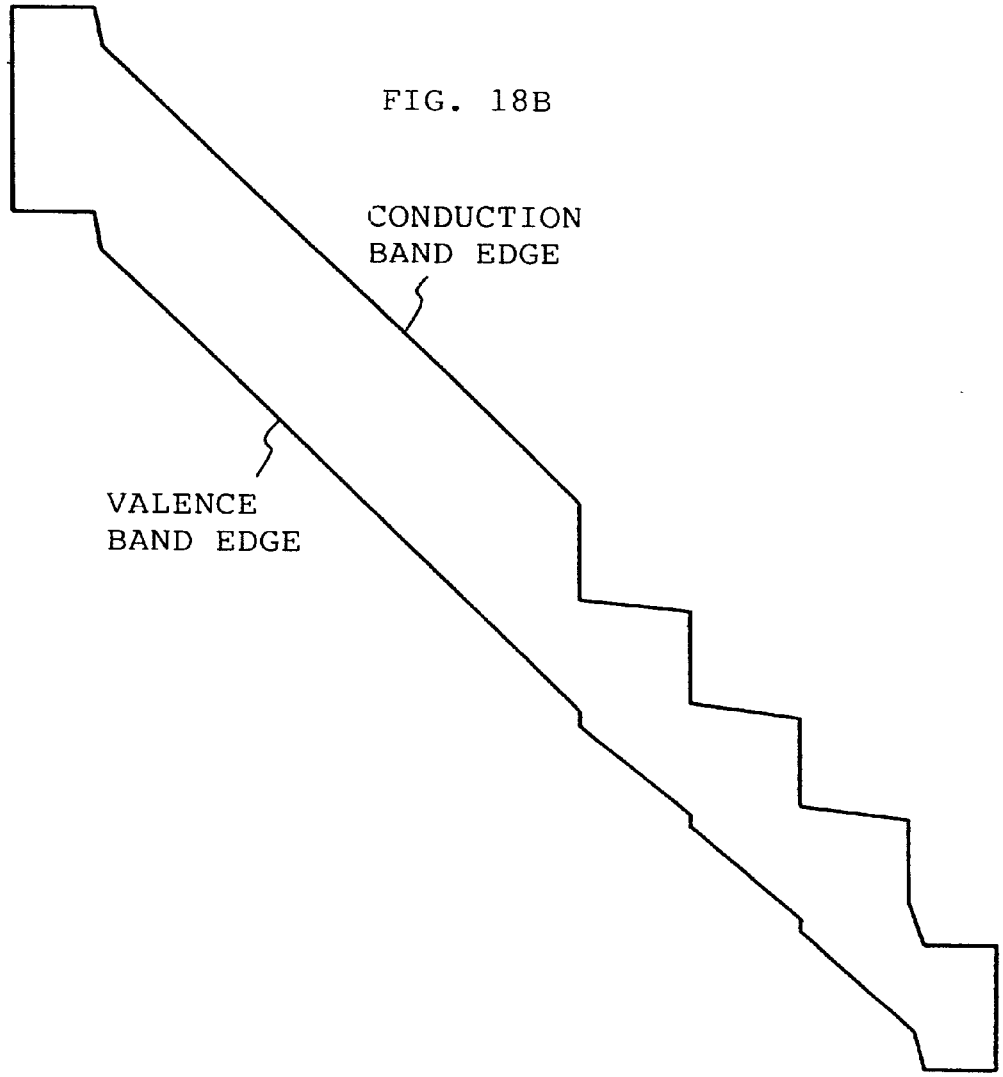
FIGS. 18B and 19B are energy band charts in a bias application state.

The photoelectric conversion apparatus of Example 7 shown in FIG. 17 is assumed to ideally have an energy band structure as shown in FIGS. 18A and 18B.

FIG. 18A is an energy band chart when the photoelectric conversion apparatus of Example 7 is in a non-bias state, and FIG. 18B is an energy band chart when the apparatus is applied with a bias to perform a carrier multiplication operation.

FIGS. 18A and 18B illustrate that an n-type a-$Si_{1-x}Ge_x$:H layer 501 has a forbidden bandwidth Eg4, a multiplication region 502 consisting of three layers, i.e., a-$Si_{1-x}Ge_x$:H to a-$Si_{1-y}C_y$:H composition change layers 511, 512, and 513 has a minimum forbidden bandwidth Eg2, and a maximum forbidden bandwidth Eg3, an a-$Si_{1-y}C_y$:H layer 503 has a forbidden bandwidth Eg1, and a p-type a-$Si_{1-y}C_y$:H layer 504 has a forbidden bandwidth Eg0.

In FIG. 18A, although energy discontinuous points are present at both conduction and valence band edges, there is almost no barrier due to energy discontinuity in a migration direction of carriers in a bias application state, as can be seen from FIG. 18B. Thus, carrier migration is not disturbed.

A C composition ratio y of the a-$Si_{1-y}C_y$:H layers 504 and 503 manufactured in this example was about 0.4, and both the forbidden bandwidths Eg1 and Eg0 were about 2.3 eV. Of the composition change layers 511, 512, and 513, a layer giving the maximum forbidden bandwidth Eg3 was also formed of a-$Si_{1-y}C_y$:H, and Eg3 was also about 2.3 eV.

A Ge composition ratio x of the a-Si$_{1-x}$Ge$_x$:H layer 501 was about 0.6, and the forbidden bandwidth Eg4 was about 1.3 eV. Of the composition change layers 511, 512, and 513, a layer giving the minimum forbidden bandwidth Eg2 was also formed of a-Si$_{1-x}$Ge$_x$:H, and Eg2 was also about 1.3 eV.

The light absorption layer 503 had a light absorption coefficient of about 4×10$^3$ cm$^{-1}$ or more for light having a wavelength of 540 nm, and about 3×10$^4$ cm$^{-1}$ or more for light having a wavelength of 350 nm. Thus, the layer 503 could satisfactorily absorb ultraviolet region light.

A multiplication ratio of this apparatus was about 10 times or more upon application of a bias of 10 V.

The multiplication ratio was not changed even if a wavelength was changed for ultraviolet region light having a wavelength of 400 nm or less.

A leak current in a dark state was as low as 1 nA/cm$^2$ or less upon application of a bias of 10 V.

Furthermore, a light response speed was equivalent to that of a pin-type photoelectric conversion apparatus having no multiplication layer 502, and was high.

In this example, the multiplication region included three composition change layers. However, this is merely an example, and the number of layers may be arbitrarily determined according to a multiplication ratio to be obtained.

In this example, a structure wherein stepbacks are immediately changed is assumed as an ideal energy band chart. Even if the structure has moderate stepbacks, the same effects as described above can be obtained as long as they fall within a mean free path of electrons. Furthermore, if the structure has moderate stepbacks, an operation range can be assured.

In this example, each composition change layer has a thickness of about 200 Å, but may have a thickness within a range wherein carriers can migrate without being re-combined. In this case, each composition change layer preferably has a small thickness since an application bias can be lowered.

In this example, the light absorption layer has a thickness of about 1 μm, but may have a thickness which is large enough to allow light to pass therethrough but not to allow it to reach the multiplication layer. This thickness is determined by a light absorption coefficient.

Although SiH$_4$, B$_2$H$_6$, PH$_3$, CH$_4$, and GeH$_4$ were used as the source gases for the amorphous layers of this example, in place of SiH$_4$, a chain silane compound such as SiF$_4$, Si$_2$H$_6$, Si$_2$F$_6$, Si$_3$H$_8$, SiH$_3$F, Si$_2$F$_2$, or the like, or a cyclic silane compound such as Si$_5$H$_{10}$, Si$_6$H$_{12}$, Si$_4$H$_8$, or the like may be used, in place of B$_2$H$_6$, a gas containing a Group III atom such as B (boron), Al (aluminum), In (indium), Tl (thallium), or the like may be used, in place of PH$_3$, a gas containing a Group IV atom such as P (phosphorus), As (arsenic), Sb (antimony), Bi (bismuth), or the like may be used, in place of CH$_4$, a carbon compound such as CH$_2$F$_2$, C$_2$H$_6$, C$_2$H$_4$, C$_2$H$_2$, Si(CH$_3$)$_4$, SiH(CH$_3$)$_3$, or the like, a nitrogen compound such as N$_2$, NH$_3$, H$_2$NNH$_2$, HN$_3$NH$_4$N$_3$, F$_3$N, F$_4$N, or the like, or an oxygen compound such as O$_2$, CO$_2$, NO, NO$_2$, N$_2$O, O$_3$, N$_2$O$_3$, N$_2$O$_4$, NO$_3$, or the like may be used, and in place of GeH$_4$, a germanium compound such as GeF$_4$, or a tin compound such as SnH$_4$ may be used.

Furthermore, a composition ratio of each composition change layer preferably falls within a range of 0 to about 0.6 to eliminate a local level.

Upon formation of the amorphous layers, an ECR plasma method may be employed in place of a plasma CVD method.

In this example, semiconductor layers comprise amorphous layers, but may comprise non-monocrystalline layers such as polycrystalline layers.

In this example, light is incident from the p-type electric charge injection blocking layer side, and a multiplication operation is caused by electrons. However, the p- and n-type electric charge injection blocking layers may be replaced with each other, so that the stepback structure is formed at the valence band side of the multiplication region. Thus, light may be incident from the n-type electric charge injection blocking layer side to cause a multiplication operation by holes.

The forbidden bandwidth Eg2 of the light absorption layer is about 2.3 eV. The C composition ratio may be changed to control Eg2, so that desired spectral sensitivity characteristics can be obtained.

The forbidden bandwidths and doping amounts of the electric charge injection blocking layers (both the p- and n-type layers) need only be adjusted to suppress injection of minority carriers from the corresponding electrodes and not to disturb migration of majority carriers.

EXAMPLE 8

Example 8 of the present invention will be described below with reference to FIGS. 19A and 19B.

Figure 19A:
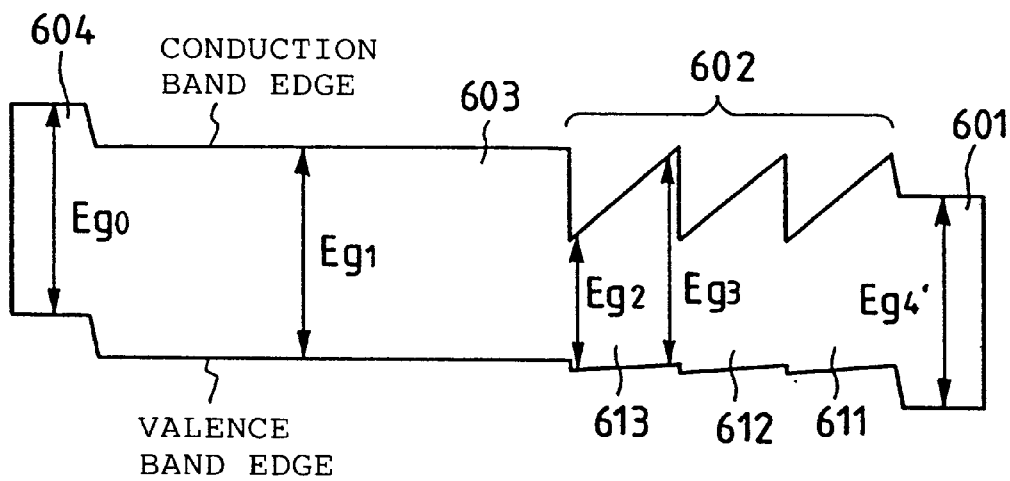
Figure 19B:
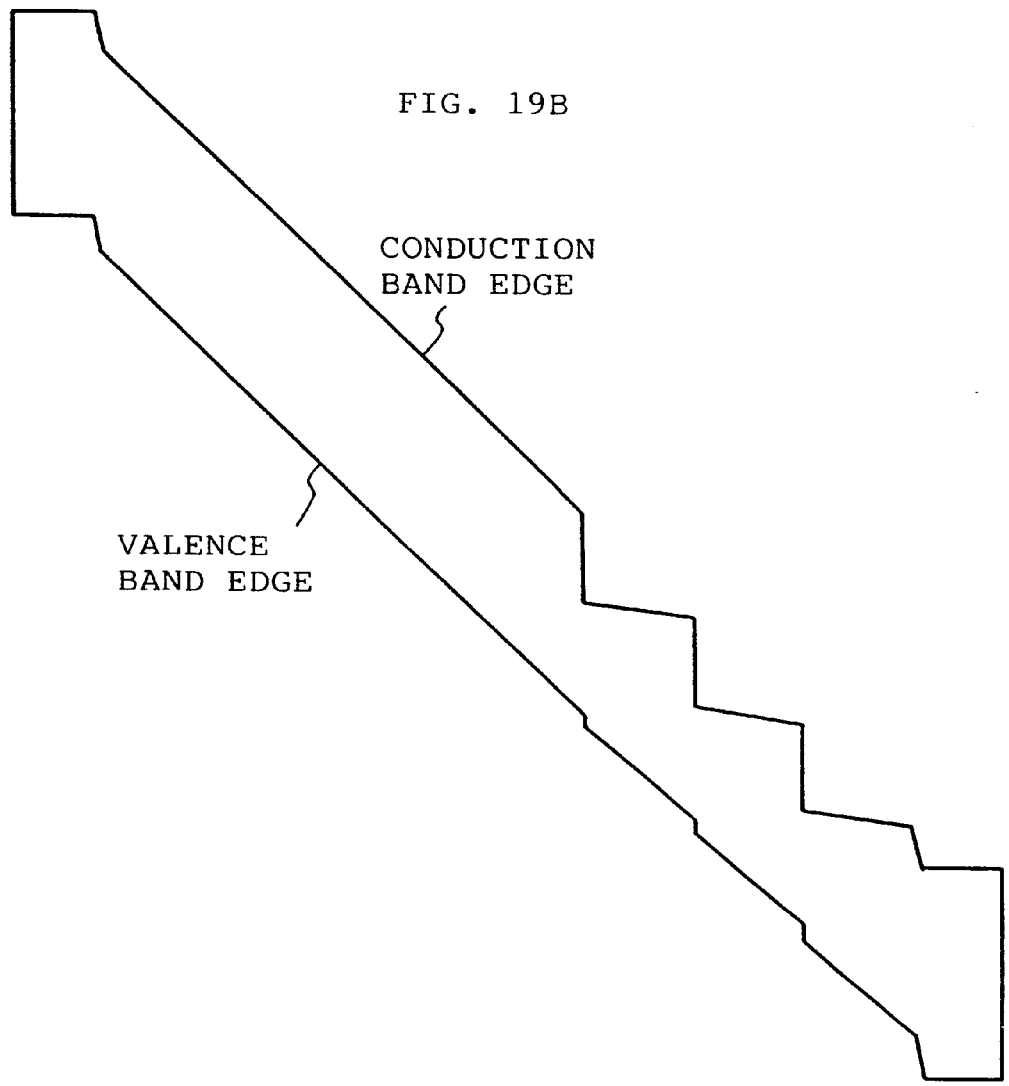

FIGS. 19A and 19B are ideally assumed energy band charts of Example 8 of the present invention.

FIG. 19A is an energy band chart obtained when the photoelectric conversion apparatus of Example 8 is in a non-bias state, and FIG. 3B is an energy band chart obtained when the apparatus is applied with a bias to perform a carrier multiplication operation.

FIG. 19A is substantially the same as FIG. 18A, except that 601 denotes an n-type a-Si$_{1-y}$C$_y$:H layer having a forbidden bandwidth Eg4', and illustrates that a multiplication region 602 consisting of three layers, i.e., a-Si$_{1-x}$Ge$_x$:H to a-Si$_{1-y}$C$_y$:H composition change layers 611, 612, and 613 has a minimum forbidden bandwidth Eg2, and a maximum forbidden bandwidth Eg3, an a-Si$_{1-y}$C$_y$:H layer 603 has a forbidden bandwidth Eg1, and a p-type a-Si$_{1-y}$C$_y$:H layer 604 has a forbidden bandwidth Eg0.

A multiplication ratio of this apparatus was about 10 times or more upon application of a bias of 10 V.

The multiplication ratio was not changed even if a wavelength was changed for ultraviolet region light having a wavelength of 400 nm or less.

A leak current in a dark state was as low as 0.1 nA/cm$^2$ or less upon application of a bias of 10 V.

Furthermore, a light response speed was equivalent to that of a pin-type photoelectric conversion apparatus having no multiplication layer 602, and was high.

EXAMPLE 9

In this example, a photoelectric conversion apparatus described in Example 7 is stacked on a scanning circuit and a read circuit already proposed in Japanese Laid-Open Patent Application No. 63-278269 by the present inventors.

Figure 20A:
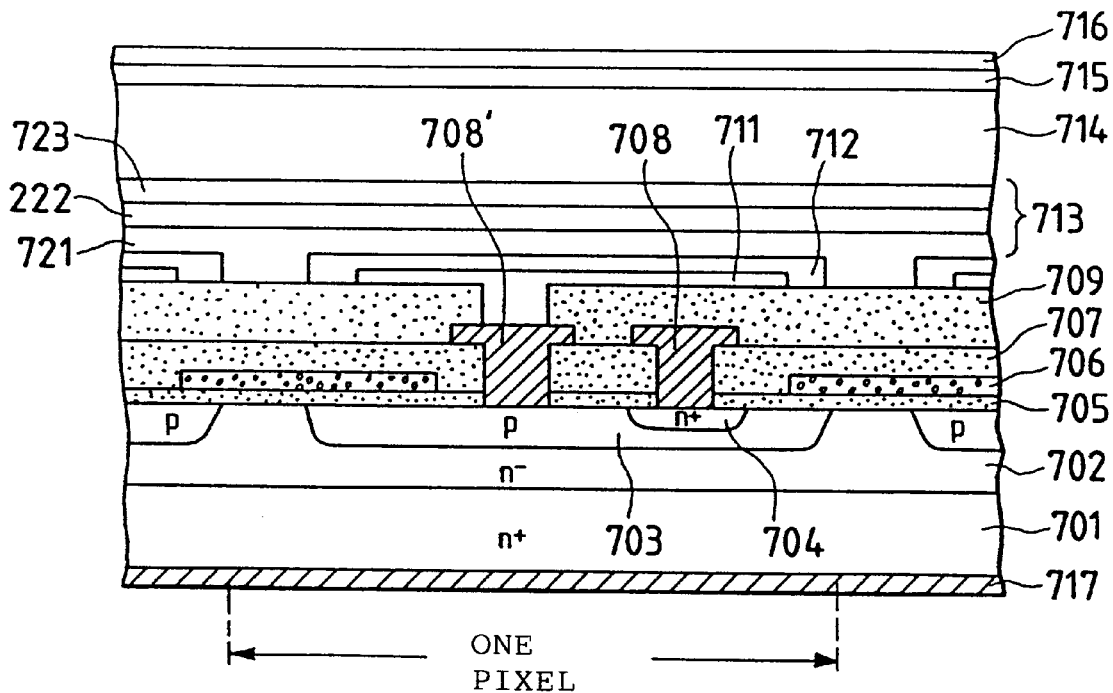
Figure 20B:
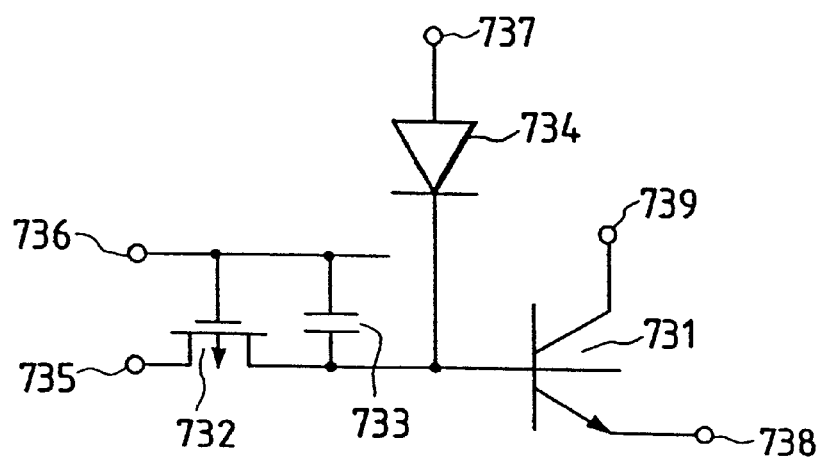
FIGS. 20B and 20C are circuit diagrams showing photoelectric conversion apparatuses according to other embodiments of the present invention.
Figure 20C:
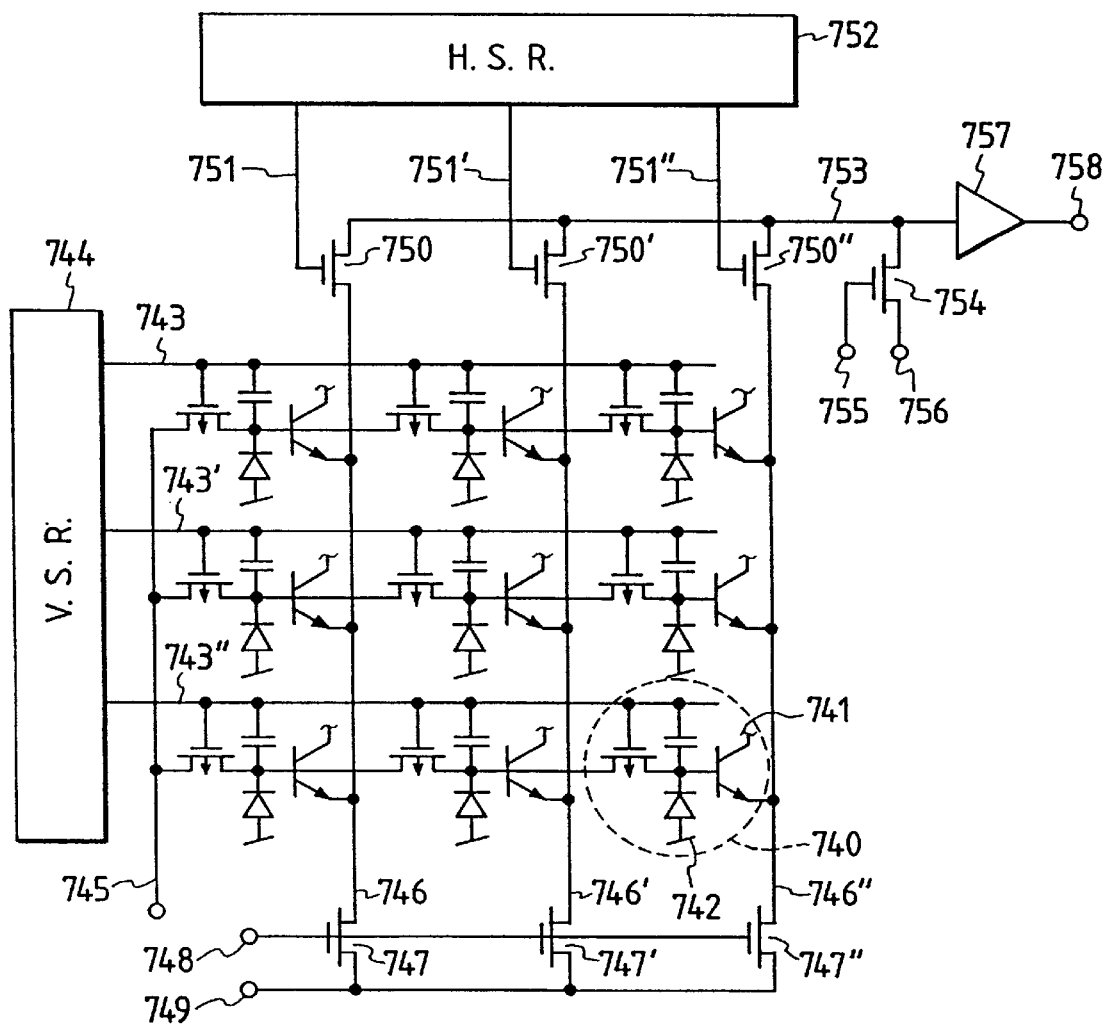

FIG. 20A is a schematic sectional view of a structure near a light-receiving unit of the example of the present invention, FIG. 20B is an equivalent circuit diagram of one pixel, and FIG. 20C is an equivalent circuit diagram and a block diagram of the overall apparatus.

In FIG. 20A, an n-type layer 702 serving as a collector region is epitaxially grown on an n-type silicon substrate 701, and a p-type base region 703 and an n+-type emitter region 704 are formed in the layer 702, thus constituting a bipolar transistor.

The p-type base region 703 is isolated from adjacent pixels, and a gate electrode 706 is formed between horizontally adjacent p-type base regions to sandwich an oxide film 705 therebetween. Therefore, a p-channel MOS transistor is formed to have the adjacent p-type base regions 703 as source and drain regions. The gate electrode 706 also serves as a capacitor for controlling a potential of the p-type base region 703.

After an insulating layer 707 is formed, an emitter electrode 708 and a base electrode 708' are formed.

Thereafter, an insulating layer 709 is formed, and then, an electrode 711 is formed. The resultant structure is isolated in units of pixels. The electrode 711 is electrically connected to the electrode 708'. Furthermore, an n-type a-$Si_{1-y}Ge_y$:H layer 712 is formed, and is isolated in units of pixels.

Subsequently, a-$Si_{1-x}Ge_x$:H to a-$Si_{1-y}C_y$:H composition change layers 721, 722, and 723 are formed to constitute a multiplication region 713. Then, an a-$Si_{1-y}C_y$:H light absorption layer 714 is formed, a p-type a-$Si_{1-y}C_y$:H layer 715 is formed, and a transparent electrode 716 for applying a bias voltage to a sensor is formed.

A collector electrode 717 is in ohmic-contact with the lower surface of the substrate 701.

Therefore, an equivalent circuit for one pixel is expressed by a crystalline silicon bipolar transistor 731, the base of which is connected to a p-channel MOS transistor 732, a capacitor 733, and a photoelectric conversion apparatus 734 which is the same as that in Example 1, a terminal 735 for applying a potential to the base, a terminal 736 for driving the p-channel MOS transistor 732 and the capacitor 733, a sensor electrode 737, an emitter electrode 738, and a collector electrode 739, as shown in FIG. 4B.

FIG. 20C is a circuit diagram showing a 3×3 two-dimensional matrix of pixel cells 740 shown in FIGS. 20A and 20B.

In FIG. 20C, a collector electrode 741 of each pixel cell 740 is arranged for all the pixels, and a sensor electrode 742 is also arranged for all the pixels. The gate electrodes and the capacitor. electrodes of the p-channel MOS transistors are connected to driving lines 743, 743', and 743" in units of rows, and are connected to a vertical shift register (V.S.R) 744. The emitter electrodes are connected to vertical lines 746, 746', and 746" for reading out signals in units of columns. The vertical lines 746, 746', and 746" are connected to switches 747, 747', and 747" for resetting electric charges on the vertical lines, and read switches 750, 750', and 750", respectively. The gate electrodes of the reset switches 747, 747', and 747" are commonly connected to a terminal 748 for applying a vertical line reset pulse, and their source electrodes are commonly connected to a terminal 749 for applying a vertical line reset voltage. The gate electrodes of the read switches 750, 750', and 750", are connected to a horizontal shift register (H.S.R) via lines 751, 751', and 751", respectively, and their drain electrodes are connected to an output amplifier 757 via a horizontal read line 753. The horizontal read line 753 is connected to a switch 754 for resetting electric charges on the horizontal read line.

The reset switch 754 is connected to a terminal 755 for applying a horizontal line reset pulse and a terminal 756 for applying a horizontal line reset voltage.

Finally, an output from the amplifier 757 is extracted from a terminal 758.

An operation will be briefly described below with reference to FIGS. 20A to 20C.

Incident light is absorbed by the light absorption layer 714 shown in FIG. 20A, and generated carriers are multiplied by the multiplication region 713 and are stored in the base region 703.

When a drive pulse output from the V.S.R. shown in FIG. 20C appears on the driving line 743, a base potential is increased through the capacitor, and signal charges according to a light amount are output from the pixels in the first row onto the vertical lines 746, 746', and 746".

When scanning pulses are sequentially output from the H.S.R. 752 onto the lines 751, 751', and 751", the switches 750, 750', and 750" are sequentially ON/OFF-controlled, and signals are output to the output terminal 758 via the amplifier 757. In this case, the reset switch 754 is set in an ON state while the switches 750, 750', and 750" are sequentially turned on, thus removing residual charges from the horizontal line 753.

The vertical line reset switches 747, 747', and 747" are sequentially turned on to remove residual charges from the vertical lines 746, 746', and 746". When the V.S.R. 744 applies a negative pulse to the driving line 743, the p-channel MOS transistors of the pixels in the first row are turned on, and base residual charges of these pixels are removed, thus initializing the pixels.

Then, a drive pulse output from the V.S.R. 744 appears on the driving line 743', and signal charges of pixels in the second row are similarly output.

An output operation of signal charges of pixels in the third row is performed in the same manner as described above.

The apparatus of this example is operated by repeating the above-mentioned operations.

In the example described above, a circuit invented by the present inventors has been exemplified. However, the present invention may be applied to a conventional photoelectric conversion apparatus.

A case will be described below wherein the present invention is applied to a photoelectric conversion apparatus having a conventional arrangement.

Figure 21:
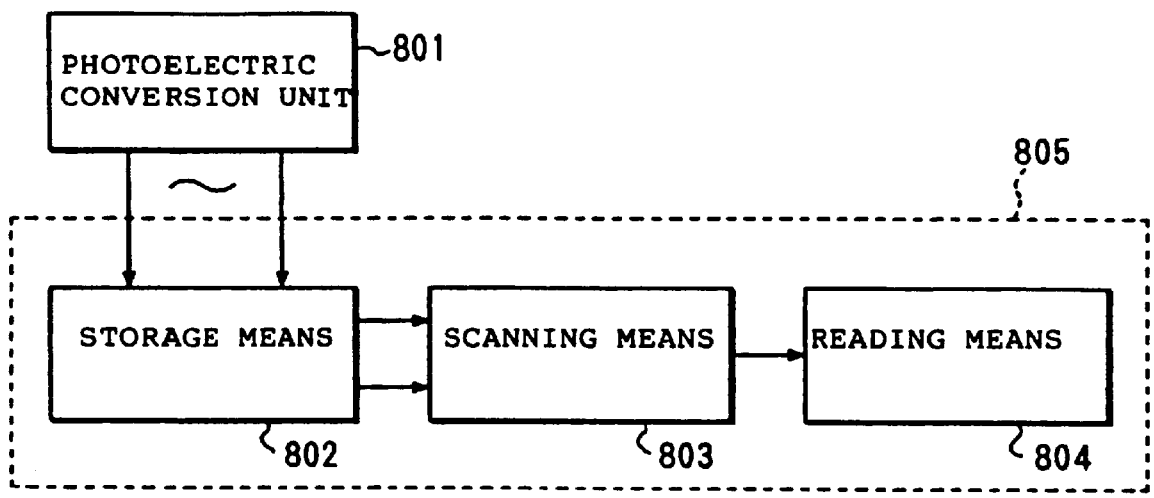
FIG. 21 is a block diagram showing an arrangement obtained when the present invention is applied to a photoelectric conversion apparatus having a conventional arrangement.

FIG. 21 is a block diagram showing an arrangement when the present invention is applied to a photoelectric conversion apparatus having a conventional arrangement.

In FIG. 21, reference numeral 801 denotes a photoelectric conversion unit according to the present invention, which comprises, e.g., a photoelectric conversion apparatus according to the present invention described in, e.g., Example 1 or 2. The photoelectric conversion unit 801 is connected to a signal output unit 805. In the signal output unit 805, reference numeral 802 denotes a storage means for storing signal charges generated by the photoelectric conversion means 801; 803, a scanning means for scanning the signal charges; and 804, a read means comprising, e.g., a circuit for amplifying or noise-compensating signal charges transferred from the scanning means 803. Note that the storage means 802 may be omitted although it is necessary when a storage operation is performed.

As described above, according to the present invention, there can be provided a photoelectric conversion apparatus which is constituted in such a manner that a light absorption layer, having a forbidden bandwidth Eg1, for absorbing light, and a multiplication layer, obtained by stacking one or a plurality of layers having a stepback structure in which a forbidden bandwidth is continuously changed to have a minimum forbidden bandwidth Eg2 and a maximum forbidden bandwidth Eg3, for multiplying the carriers generated upon light absorption, are stacked to be sandwiched between electric charge injection blocking layers, wherein the forbidden bandwidth Eg1 of the light absorption layer and the maximum forbidden bandwidth Eg3 of the multiplication layer are set to be substantially equal to each other, so that various problems caused by band mismatching can be eliminated, and high-response characteristics equivalent to those of a photodiode having no multiplication layer can be obtained, and wherein the forbidden bandwidth Eg1 of the light absorption layer is set to particularly cope with ultraviolet region light to have a high sensitivity for ultraviolet region light.

When the number of layers of the stepback structure is selected, an amplification factor of 2 or more can be obtained, and noise can be further reduced.

When constituting elements of the photoelectric conversion apparatus of the present invention are formed of monocrystalline materials at least containing an Si atom, easy controllability of forbidden bandwidths and low-temperature formation of a multilayered structure can be assured, and various problems caused upon formation of the multilayered structure can be solved.

EXAMPLE 10

Example 10 of the present invention will be described below with reference to FIG. 22 and FIGS. 23A and 23B.

Figure 22:
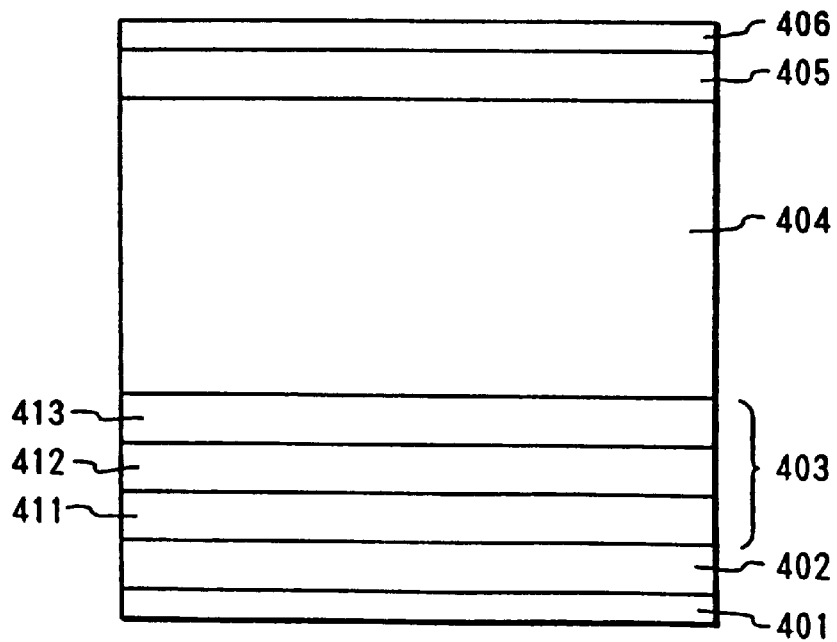
FIGS. 22 and 25A are schematic sectional views showing photoelectric conversion apparatuses according to other embodiments of the present invention.

FIG. 22 is a schematic longitudinal sectional view showing Example 1 of a photoelectric conversion apparatus of the present invention.

In FIG. 22, reference numeral 401 denotes a Cr electrode; 402, a 500-Å thick n-type a-$Si_{1-x}Ge_x$:H electric charge injection blocking layer for blocking hole injection; 403, a multiplication region, whose composition is changed from a-$Si_{1-x}Ge_x$:H to a-$Si_{1-y}C_y$:H, for performing carrier multiplication; 404, a 1-$\mu$m thick a-$Si_{1-x}Ge_x$:H light absorption layer for absorbing light and generating carriers; 405, a 100-Å thick p-type a-$Si_{1-x}Ge_x$:H electric charge injection blocking layer for blocking electron injection; and 406, a transparent electrode containing indium oxide as a major component.

The Cr electrode 401 and the transparent electrode 406 were formed by EB evaporation, and amorphous layers, i.e., the electric charge injection blocking layer 402, the multiplication region 403, the light absorption layer 404, and the electric charge injection blocking layer 405 were formed by plasma CVD. As source gases upon formation of amorphous layers, $SiH_4$, $GeH_4$, $PH_3$, and $H_2$ gases were used for the electric charge injection blocking layer 402, $SiH_4$, $GeH_4$, $CH_4$, and $H_2$ were used for the multiplication region 403, $SiH_4$, $GeH_4$, and $H_2$ gases were used for the light absorption layer 404, and $SiH_4$, $GeH_4$, $B_2H_6$, and $H_2$ gases were used for the electric charge injection blocking layer 405.

The multiplication region 403 comprises three layers, i.e., 200-Å thick composition change layers 411, 412, and 413 formed by continuously changing flow rates of $CH_4$ and $GeH_4$ gases of the source gases.

Figure 23A:
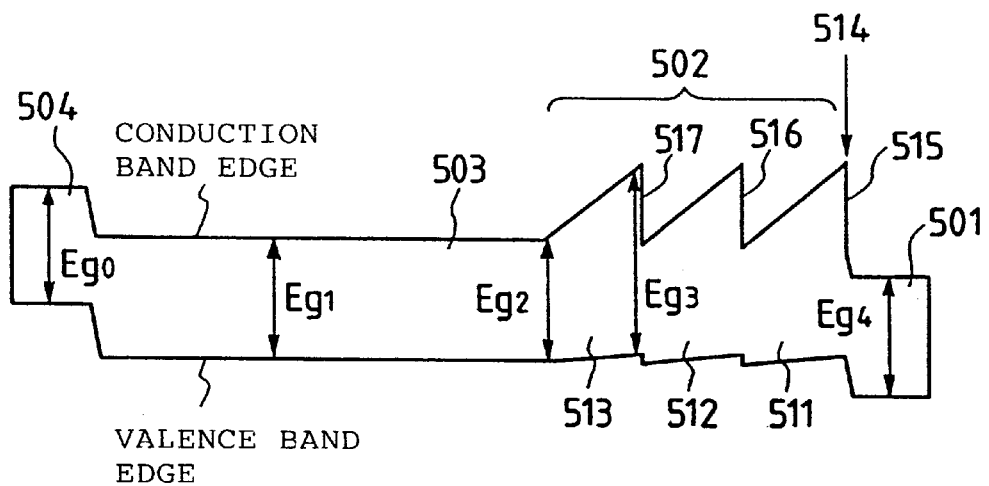
FIGS. 23A and 24A are energy band charts in a non-bias state.
Figure 23B:
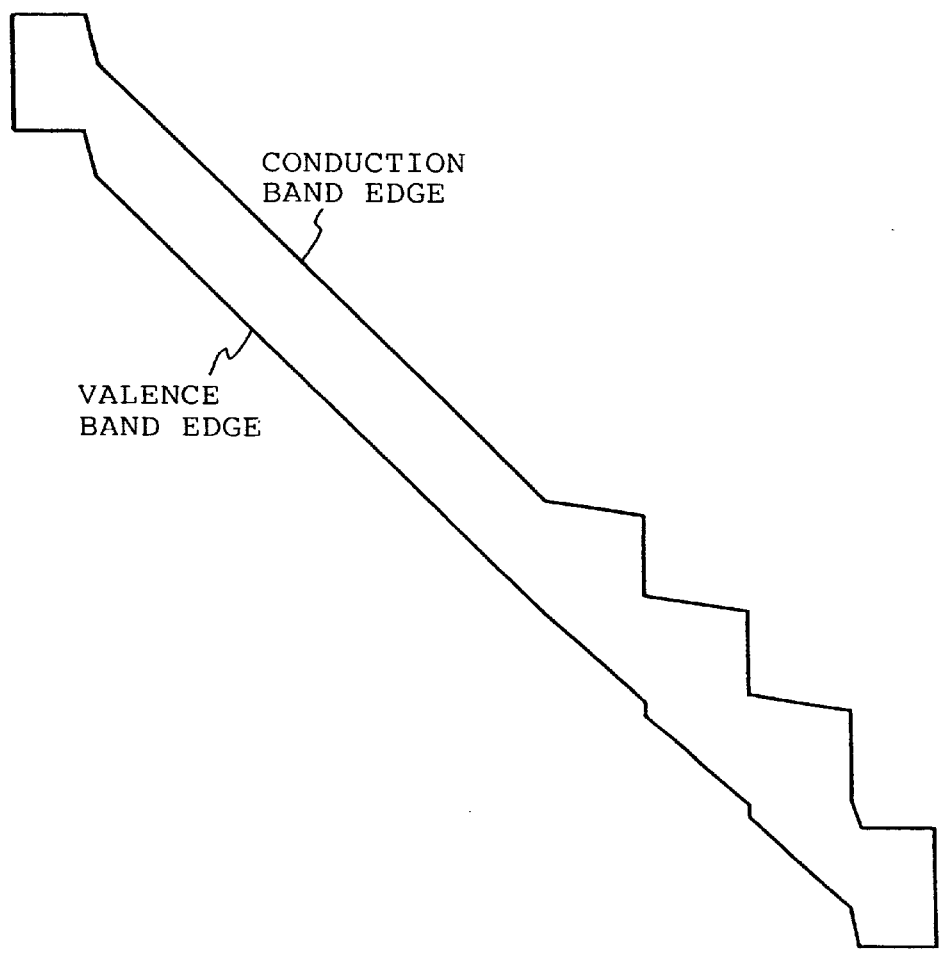
FIGS. 23B and 24B are energy band charts in a bias application state.

The photoelectric conversion apparatus of Example 10 shown in FIG. 22 is assumed to ideally have an energy band structure as shown in FIGS. 23A and 23B.

FIG. 23A is an energy band chart obtained when the photoelectric conversion apparatus of Example 1 is in a non-bias state, and FIG. 23B is an energy band chart obtained when the apparatus is applied with a bias to perform a carrier multiplication operation.

FIGS. 23A and 23B illustrate that an n-type a-$Si_{1-x}Ge_x$:H layer 501 has a forbidden bandwidth Eg4, a multiplication region 502 consisting of three layers, i.e., a-$Si_{1-x}Ge_x$:H to a-$Si_{1-y}C_y$:H composition change layers 511, 512, and 513 has a minimum forbidden bandwidth Eg2, and a maximum forbidden bandwidth Eg3, an a-$Si_{1-x}Ge_x$:H layer 503 has a forbidden bandwidth Eg1, and a p-type a-$Si_{1-x}Ge_x$:H layer 504 has a forbidden bandwidth Eg0.

Of the composition change layers 511, 512, and 513 manufactured in this example, a layer giving the maximum forbidden bandwidth Eg3 was formed of a-$Si_{1-y}C_y$:H having a C composition ratio of about 0.4, and Eg3 was also about 2.3 eV.

A Ge composition ratio x of the a-$Si_{1-x}Ge_x$:H layers 501 503, and 504 was about 0.6, and the forbidden bandwidths Eg4, Eg1, and Eg0 were about 1.3 eV. Of the composition change layers 511, 512, and 513, a layer giving the minimum forbidden bandwidth Eg2 was also an a-$Si_{1-x}Ge_x$:H layer, and Eg2 was also about 1.3 eV.

The light absorption layer 503 had a light absorption coefficient of about $1 \times 10^5$ cm$^{-1}$ or more for light having a wavelength of 800 nm, and about $2 \times 10^4$ cm$^{-1}$ or more for light having a wavelength of 1,000 nm. Thus, the layer 503 could satisfactorily absorb infrared region light.

A multiplication ratio of this apparatus was about 10 times or more upon application of a bias of 10 V.

The multiplication ratio was not changed even if a wavelength was changed for light having a wavelength of 1,000 nm or less.

A leak current in a dark state was as low as 10 nA/cm$^2$ or less upon application of a bias of 10 V.

Furthermore, a light response speed was equivalent to that of a pin-type photoelectric conversion apparatus having no multiplication layer 502, and was high.

In this example, the multiplication region included three composition change layers. However, this is merely an example, and the number of layers may be arbitrarily determined according to a multiplication ratio to be obtained.

In this example, a structure wherein stepbacks are immediately changed is assumed as an ideal energy band chart. Even if the structure has moderate stepbacks, the same effects as described above can be obtained as long as they fall within a mean free path of electrons. Furthermore, if the structure has moderate stepbacks, an operation range can be assured.

In this example, each composition change layer has a thickness of about 200 Å, but may have a thickness within a range wherein carriers can migrate without being re-combined. In this case, each composition change layer preferably has a small thickness since an application bias can be lowered.

In this example, the light absorption layer has a thickness of about 1 $\mu$m, but may have a thickness which is large enough to allow light to pass therethrough but not to allow it to reach the multiplication layer. This thickness is determined by a light absorption coefficient.

Although $SiH_4$, $B_2H_6$, $PH_3$, $CH_4$, and $GeH_4$ were used as the source gases for the amorphous layers of this example,
in place of $SiH_4$, a chain silane compound such as $SiF_4$, $Si_2H_6$, $Si_2F_6$, $Si_3H_8$, $SiH_3F$, $Si_2F_2$, or the like, or a cyclic silane compound such as $Si_5H_{10}$, $Si_6H_{12}$, $Si_4H_8$, or the like may be used,
in place of $B_2H_6$, a gas containing a Group III atom such as B (boron), Al (aluminum), In (indium), Tl (thallium), or the like may be used, in place of $PH_3$, a gas containing a Group IV atom such as P (phosphorus), As (arsenic), Sb (antimony), Bi (bismuth), or the like may be used, in place of $CH_4$, a carbon compound such as $CH_2F_2$, $C_2H_6$, $C_2H_4$, $C_2H_2$, $Si(CH_3)_4$, $SiH(CH_3)_3$, or the like, a nitrogen compound such as $N_2$, $NH_3$, $H_2NNH_2$, $HN_3NH_4N_3$, $F_3N$, $F_4N$, or the like, or an oxygen compound such as $O_2$, $CO_2$, NO, $NO_2$, $N_2O$, $O_3$, $N_2O_3$, $N_2O_4$, $NO_3$, or the like may be used, and in place of $GeH_4$, a germanium compound such as $GeF_4$, or a tin compound such as $SnH_4$ may be used.

Furthermore, a composition ratio of each composition change layer preferably falls within a range of 0 to about 0.6 to eliminate a local level.

Upon formation of the amorphous layers, an ECR plasma method may be employed in place of a plasma CVD method.

In this example, semiconductor layers comprise amorphous layers, but may comprise non-monocrystalline layers such as polycrystalline layers.

In this example, light is incident from the p-type electric charge injection blocking layer side, and a multiplication operation is caused by electrons. However, the p- and n-type electric charge injection blocking layers may be replaced with each other, so that the stepback structure is formed at the valence band side of the multiplication region. Thus, light may be incident from the n-type electric charge injection blocking layer side to cause a multiplication operation by holes.

The forbidden bandwidth Eg2 of the light absorption layer is about 1.3 eV. The Ge composition ratio may be changed to control Eg2, so that desired spectral sensitivity characteristics can be obtained.

Figure 1:
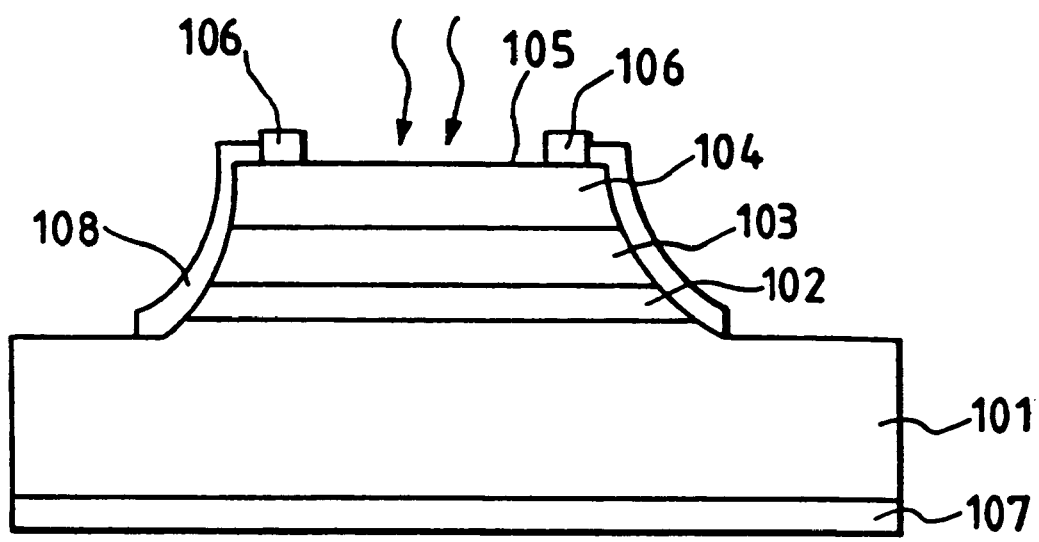
FIG. 1 is a longitudinal sectional view illustrating a structure of a conventional optical communication APD.
Figure 2A:
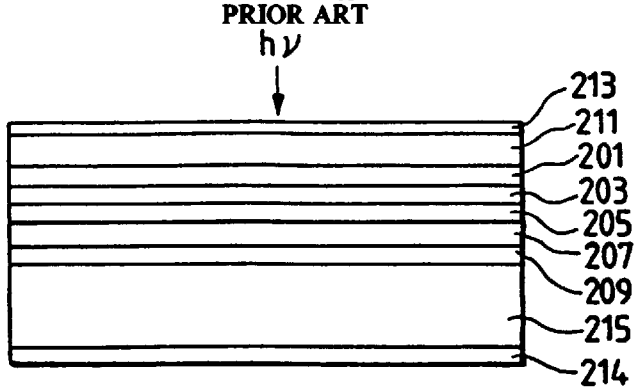
FIG. 2A is a longitudinal sectional view of a conventional optical communication APD having a stepback structure.
Figure 2B:
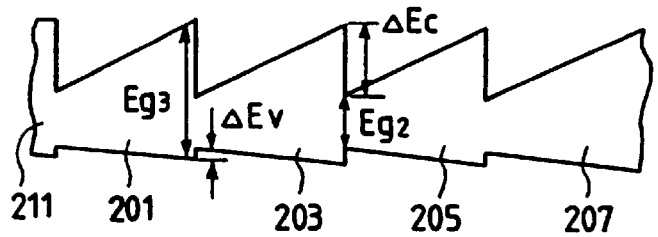
FIG. 2B is a view showing a structure of energy bands of inclined band-gap layers when no bias is applied.

In FIG. 23A, although energy discontinuous points are present at both conduction and valence band edges, there is almost no barrier due to energy discontinuity in a migration direction of carriers, as can be seen from FIG. 2B. Thus, carrier migration is not disturbed.

The forbidden bandwidths and doping amounts of the electric charge injection blocking layers (both the p- and n-type layers) need only be adjusted to suppress injection of minority carriers from the corresponding electrodes and not to disturb migration of majority carriers.

EXAMPLE 11

Example 2 of the present invention will be described below with reference to FIGS. 24A and 24B.

Figure 24A:
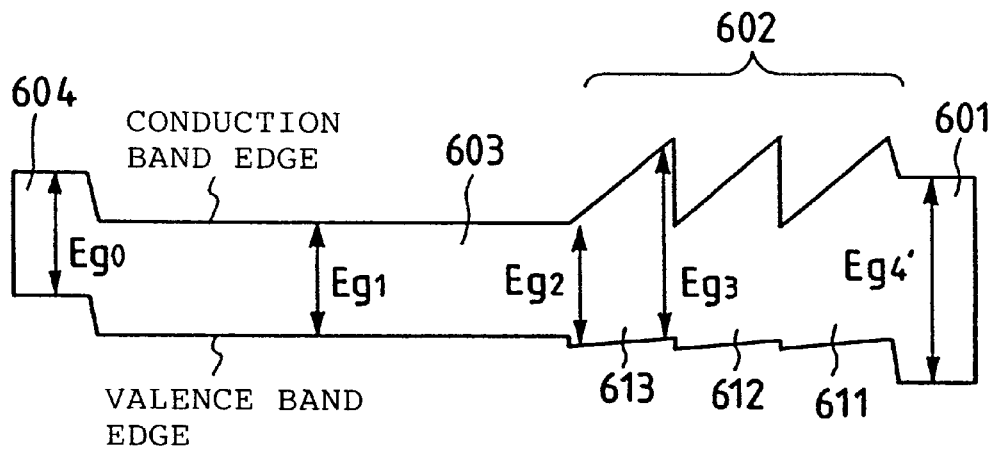
Figure 24B:
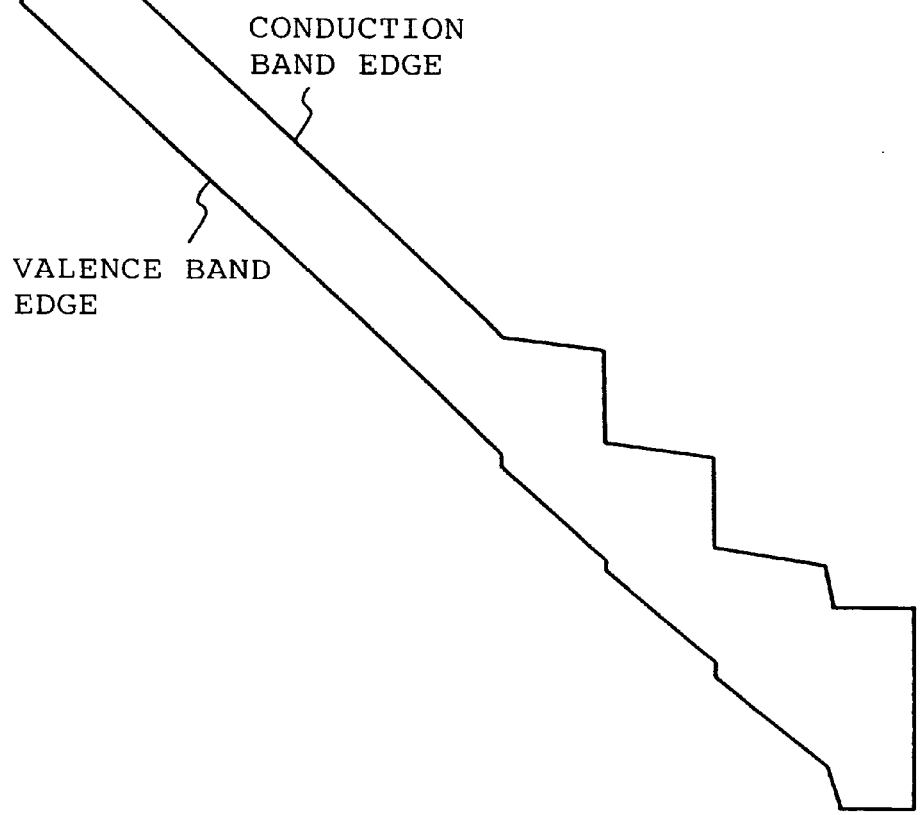

FIGS. 24A and 24B are ideally assumed energy band charts of Example 2 of the present invention.

FIG. 24A is an energy band chart obtained when the photoelectric conversion apparatus of Example 11 is in a non-bias state, and FIG. 24B is an energy band chart obtained when the apparatus is applied with a bias to perform a carrier multiplication operation.

FIG. 24A is substantially the same as FIG. 23A, except that 601 denotes an n-type a-$Si_{1-y}C_y$:H layer having a forbidden bandwidth Eg4', and illustrates that a multiplication region 602 consisting of three layers, i.e., a-$Si_{1-x}Ge_x$:H to a-$Si_{1-y}C_y$:H composition change layers 611, 612, and 613 has a minimum forbidden bandwidth Eg2, and a maximum forbidden bandwidth Eg3, an a-$Si_{1-x}Ge_x$:H layer 603 has a forbidden bandwidth Eg1, and a p-type a-$Si_{1-x}Ge_x$:H layer 604 has a forbidden bandwidth Eg0.

A multiplication ratio of this apparatus was about 10 times or more upon application of a bias of 10 V.

The multiplication ratio was not changed even if a wavelength was changed for infrared region light having a wavelength of 1,000 nm or less.

A leak current in a dark state was as low as 10 nA/cm$^2$ or less upon application of a bias of 10 V.

Furthermore, a light response speed was equivalent to that of a pin-type photoelectric conversion apparatus having no multiplication layer 602, and was high.

EXAMPLE 12

In this example, a photoelectric conversion apparatus described in Example 10 is stacked on a scanning circuit and a read circuit already proposed in Japanese Laid-Open Patent Application No. 63-278269 by the present inventors.

Figure 25A:
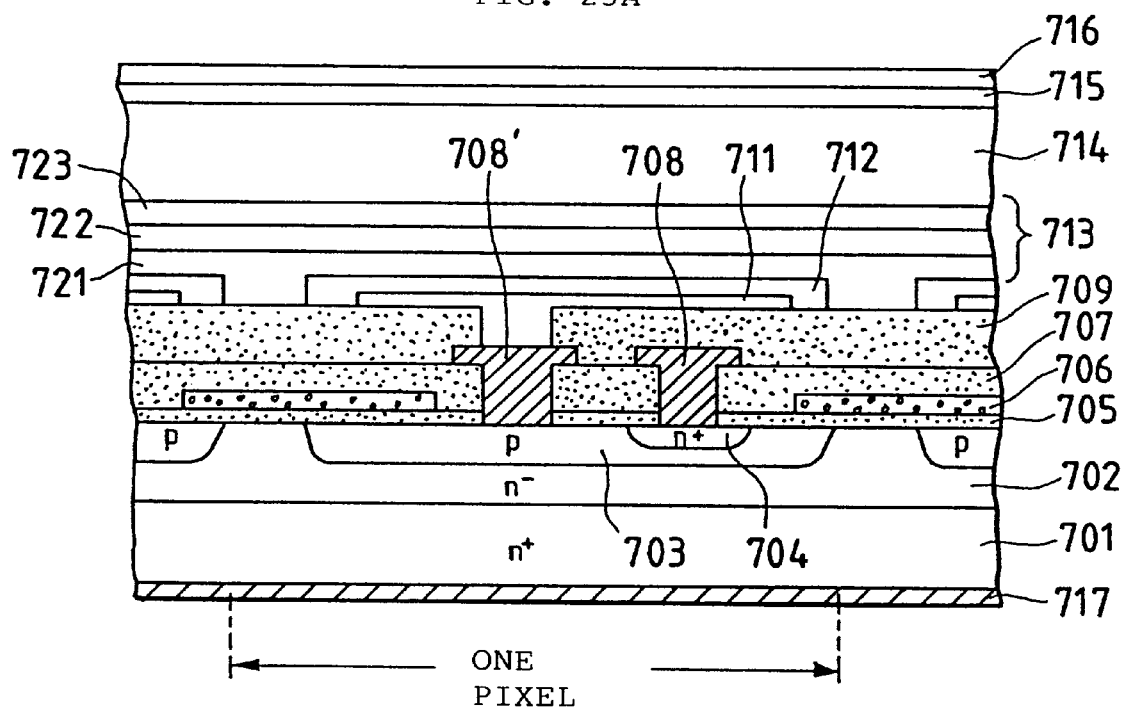
Figure 25B:
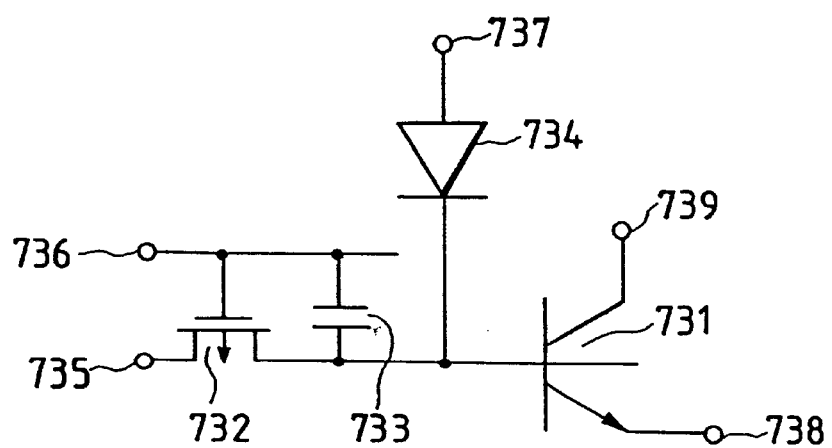
FIGS. 25B and 25C are circuit diagrams showing photoelectric conversion apparatuses according to other embodiments of the present invention.
Figure 25C:
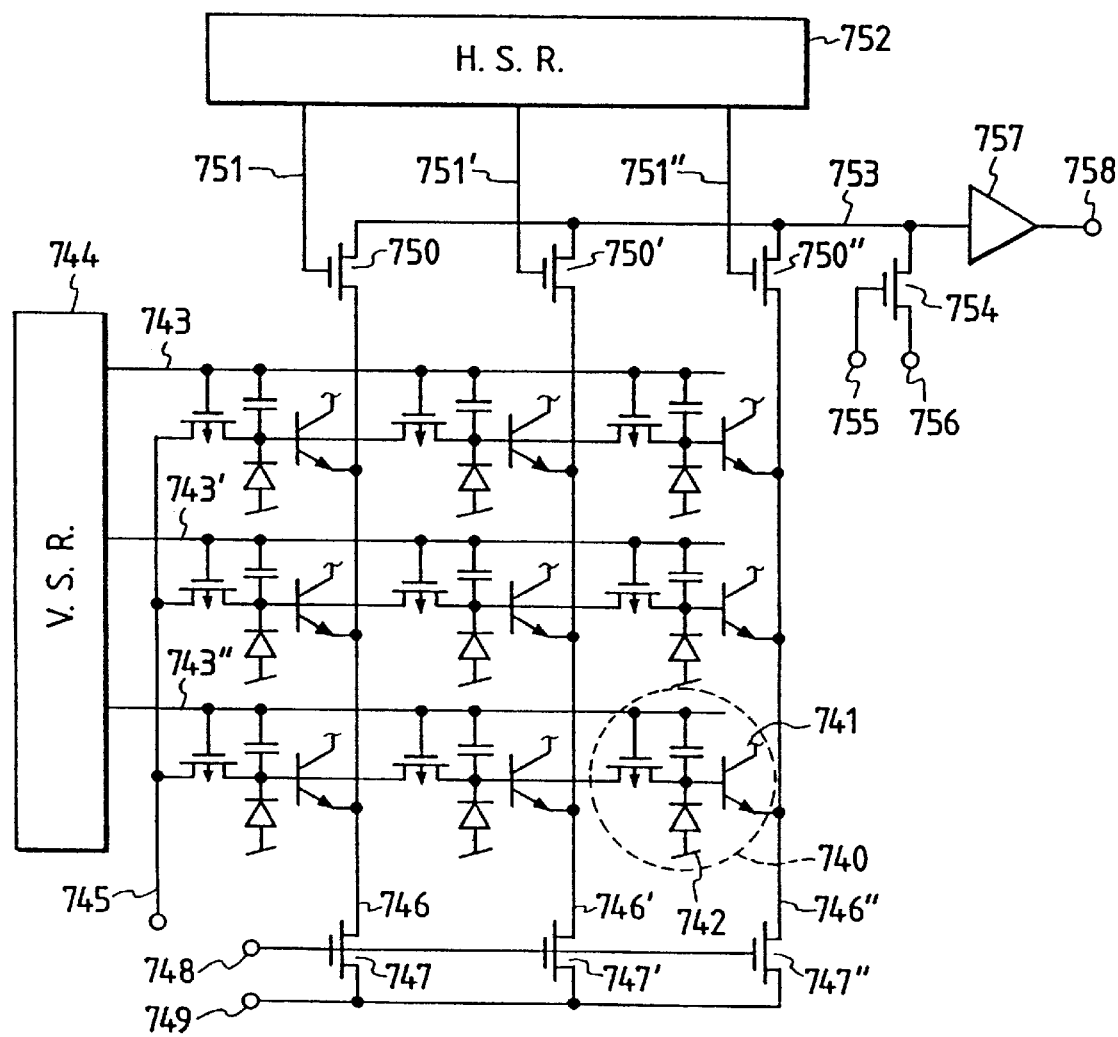

FIG. 25A is a schematic sectional view of a structure near a light-receiving unit of the example of the present invention, FIG. 25B is an equivalent circuit diagram of one pixel, and FIG. 25C is an equivalent circuit diagram and a block diagram of the overall apparatus.

In FIG. 4A, an n$^-$-type layer 702 serving as a collector region is epitaxially grown on an n-type silicon substrate 701, and a p-type base region 703 and an n$^+$-type emitter region 704 are formed in the layer 702, thus constituting a bipolar transistor.

The p-type base region 703 is isolated from adjacent pixels, and a gate electrode 706 is formed between horizontally adjacent p-type base regions to sandwich an oxide film 705 therebetween. Therefore, a p-channel MOS transistor is formed to have the adjacent p-type base regions 703 as source and drain regions. The gate electrode 706 also serves as a capacitor for controlling a potential of the p-type base region 703.

After an insulating layer 707 is formed, an emitter electrode 708 and a base electrode 708' are formed.

Thereafter, an insulating layer 709 is formed, and then, an electrode 711 is formed. The resultant structure is isolated in units of pixels. The electrode 711 is electrically connected to the electrode 708'. Furthermore, an n-type a-$Si_{1-x}Ge_x$:H layer 712 is formed, and is isolated in units of pixels.

Subsequently, a-$Si_{1-x}Ge_x$:H to a-$Si_{1-y}C_y$:H composition change layers 721, 722, and 723 are formed to constitute a multiplication region 713. Then, an a-$Si_{1-x}Ge_x$:H light absorption layer 714 is formed, a p-type a-$Si_{1-x}Ge_x$:H layer 715 is formed, and a transparent electrode 716 for applying a bias voltage to a sensor is formed.

A collector electrode 717 is in ohmic-contact with the lower surface of the substrate 701.

Therefore, an equivalent circuit for one pixel is expressed by a crystalline silicon bipolar transistor 731, the base of which is connected to a p-channel MOS transistor 732, a capacitor 733, and a photoelectric conversion apparatus 734 which is the same as that in Example 1, a terminal 735 for applying a potential to the base, a terminal 736 for driving the p-channel MOS transistor 732 and the capacitor 733, a sensor electrode 737, an emitter electrode 738, and a collector electrode 739, as shown in FIG. 4B.

FIG. 25C is a circuit diagram showing a 3×3 two-dimensional matrix of pixel cells 740 shown in FIGS. 4A and 4B.

In FIG. 25C, a collector electrode 741 of each pixel cell 740 is arranged for all the pixels, and a sensor electrode 742 is also arranged for all the pixels. The gate electrodes and the capacitor electrodes of the p-channel MOS transistors are connected to driving lines 743, 743', and 743" in units of rows, and are connected to a vertical shift register (V.S.R) 744. The emitter electrodes are connected to vertical lines 746, 746', and 746" for reading out signals in units of columns. The vertical lines 746, 746', and 746" are connected to switches 747, 747', and 747" for resetting electric charges on the vertical lines, and read switches 750, 750', and 750", respectively. The gate electrodes of the reset switches 747, 747', and 747" are commonly connected to a terminal 748 for applying a vertical line reset pulse, and their source electrodes are commonly connected to a terminal 749 for applying a vertical line reset voltage. The gate electrodes of the read switches 750, 750', and 750" are connected to a horizontal shift register (H.S.R) via lines 751, 751', and 751", respectively, and their drain electrodes are connected to an output amplifier 757 via a horizontal read line 753. The horizontal read line 753 is connected to a switch 754 for resetting electric charges on the horizontal read line.

The reset switch 754 is connected to a terminal 755 for applying a horizontal line reset pulse and a terminal 756 for applying a horizontal line reset voltage.

Finally, an output from the amplifier 757 is extracted from a terminal 758.

An operation will be briefly described below with reference to FIGS. 25A to 25C.

Incident light is absorbed by the light absorption layer 714 shown in FIG. 25A, and generated carriers are multiplied by the multiplication region 713 and are stored in the base region 703.

When a drive pulse output from the V.S.R. shown in FIG. 25C appears on the driving line 743, a base potential is increased through the capacitor, and signal charges according to a light amount are output from the pixels in the first row onto the vertical lines 746, 746', and 746".

When scanning pulses are sequentially output from the H.S.R. 752 onto the lines 751, 751', and 751", the switches 750, 750', and 750" are sequentially ON/OFF-controlled, and signals are output to the output terminal 758 via the amplifier 757. In this case, the reset switch 754 is set in an ON state while the switches 750, 750', and 750" are sequentially turned on, thus removing residual charges from the horizontal line 753.

The vertical line reset switches 747, 747', and 747" are sequentially turned on to remove residual charges from the vertical lines 746, 746', and 746". When the V.S.R. 744 applies a negative pulse to the driving line 743, the p-channel MOS transistors of the pixels in the first row are turned on, and base residual charges of these pixels are removed, thus initializing the pixels.

Then, a drive pulse output from the V.S.R. 744 appears on the driving line 743', and signal charges of pixels in the second row are similarly output.

An output operation of signal charges of pixels in the third row is performed in the same manner as described above.

The apparatus of this example is operated by repeating the above-mentioned operations.

In the example described above, a circuit invented by the present inventors has been exemplified. However, the present invention may be applied to a conventional photoelectric conversion apparatus.

A case will be described below wherein the present invention is applied to a photoelectric conversion apparatus having a conventional arrangement.

Figure 26:
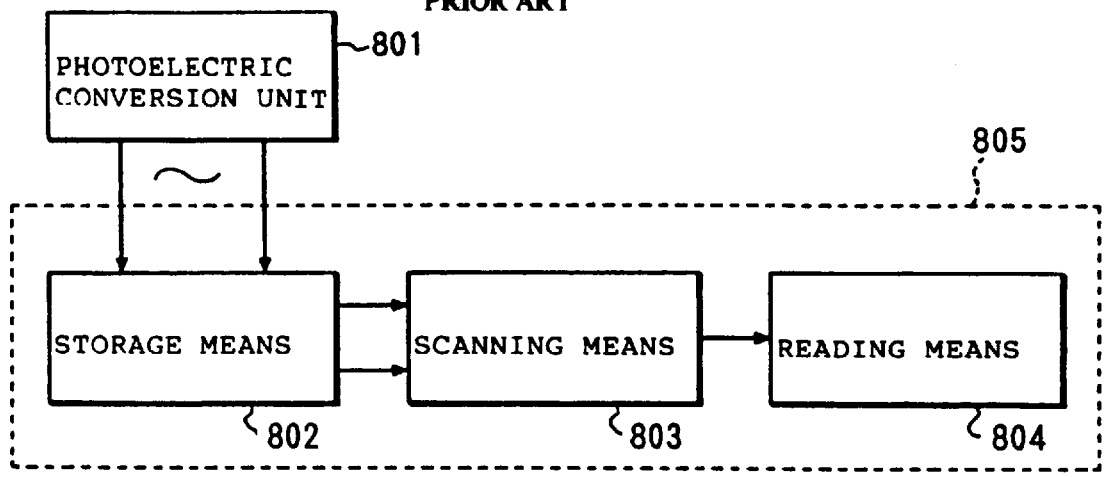
FIG. 26 is a block diagram showing an arrangement obtained when the present invention is applied to a photoelectric conversion apparatus having a conventional arrangement.

FIG. 26 is a block diagram showing an arrangement when the present invention is applied to a photoelectric conversion apparatus having a conventional arrangement.

In FIG. 26, reference numeral 801 denotes a photoelectric conversion unit according to the present invention, which comprises, e.g., a photoelectric conversion apparatus according to the present invention described in, e.g., Example 1 or 2. The photoelectric conversion unit 801 is connected to a signal output unit 805. In the signal output unit 805, reference numeral 802 denotes a storage means for storing signal charges generated by the photoelectric conversion means 801; 803, a scanning means for scanning the signal charges; and 804, a read means comprising, e.g., a circuit for amplifying or noise-compensating signal charges transferred from the scanning means 803. Note that the storage means 802 may be omitted although it is necessary when a storage operation is performed.

As described above, according to the example of the present invention, there can be provided a photoelectric conversion apparatus which is constituted in such a manner that a light absorption layer, having a forbidden bandwidth Eg1, for absorbing light, and a multiplication layer, obtained by stacking one or a plurality of layers having a stepback structure in which a forbidden bandwidth is continuously changed to have a minimum forbidden bandwidth Eg2 and a maximum forbidden bandwidth Eg3, for multiplying the carriers generated upon light absorption, are stacked to be sandwiched between electric charge injection blocking layers, wherein the forbidden bandwidth Eg1 of the light absorption layer and the minimum forbidden bandwidth Eg2 of the multiplication layer are set to be substantially equal to each other, so that various problems caused by band mismatching can be eliminated, and high-response characteristics equivalent to that of a photodiode having no multiplication layer can be obtained, and wherein the forbidden bandwidth Eg1 of the light absorption layer is set to particularly cope with infrared region light to have a high sensitivity for infrared region light.

Light incidence to the multiplication layer can be eliminated, and a variation in multiplication ratio due to light incidence in the multiplication layer can be eliminated.

When the number of layers of the stepback structure is selected, an amplification factor of 2 or more can be obtained, and noise can be further reduced.

When constituting elements of the photoelectric conversion apparatus of the present invention are formed of monocrystalline materials at least containing an Si atom, easy controllability of forbidden bandwidths and low-temperature formation of a multilayered structure can be assured, and various problems caused upon formation of the multilayered structure can be solved.

EXAMPLE 13

Example 13 of the present invention will be described below with reference to FIG. 27 and FIGS. 28A and 28B.

Figure 27:
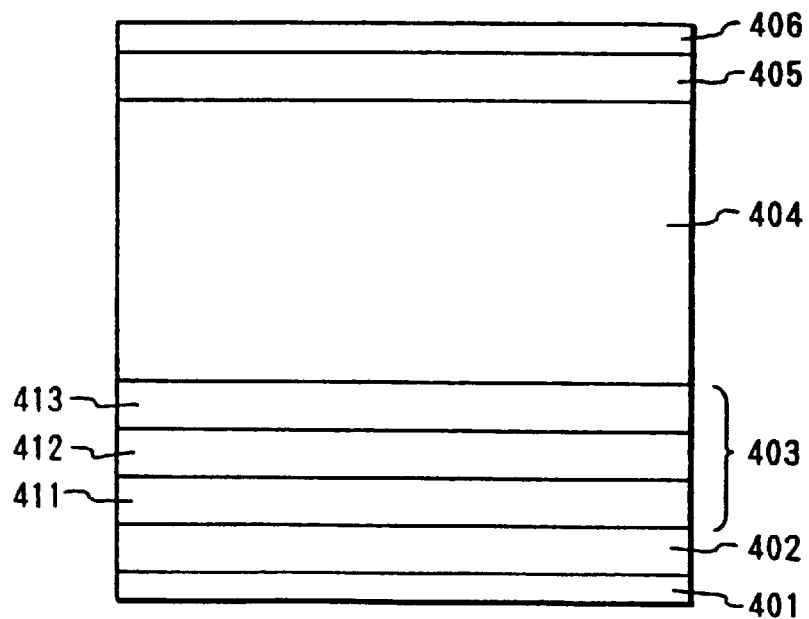
FIGS. 27 and 30A are schematic sectional views showing photoelectric conversion apparatuses according to other embodiments of the present invention.

FIG. 27 is a schematic longitudinal sectional view showing Example 27 of a photoelectric conversion apparatus of the present invention.

In FIG. 27, reference numeral 401 denotes a Cr electrode; 402, a 500-Å thick n-type a-$Si_{1-x}Ge_x$:H electric charge injection blocking layer for blocking hole injection; 403, a multiplication region, whose composition is changed from a-$Si_{1-x}Ge_x$:H to a-$Si_{1-y}C_y$:H, for performing carrier multiplication; 404, a 2-$\mu$m thick light absorption layer, whose composition is changed from a-Si:H to a-$Si_{1-y}C_y$:H, for absorbing light and generating carriers; 405, a 100-Å thick p-type a-Si:H electric charge injection blocking layer for blocking electron injection; and 406, a transparent electrode containing indium oxide as a major component.

The Cr electrode 401 and the transparent electrode 406 were formed by EB evaporation, and amorphous layers, i.e., the electric charge injection blocking layer 402, the multiplication region 403, the light absorption layer 404, and the electric charge injection blocking layer 405 were formed by plasma CVD. As source gases upon formation of amorphous layers, $SiH_4$, $GeH_4$, $PH_3$, and $H_2$ gases were used for the electric charge injection blocking layer 402, $SiH_4$, $GeH_4$, $CH_4$, and $H_2$ were used for the multiplication region 403, $SiH_4$, $CH_4$, and $H_2$ gases were used for the light absorption layer 404, and $SiH_4$, $B_2H_6$, and $H_2$ gases were used for the electric charge injection blocking layer 405.

The multiplication region 403 comprises three layers, i.e., 200-Å thick composition change layers 411, 412, and 413 formed by continuously changing flow rates of $CH_4$ and $GeH_4$ gases of the source gases. The light absorption layer 404 is formed by continuously changing a flow rate of $CH_4$ gas of the source gases.

Figure 28A:
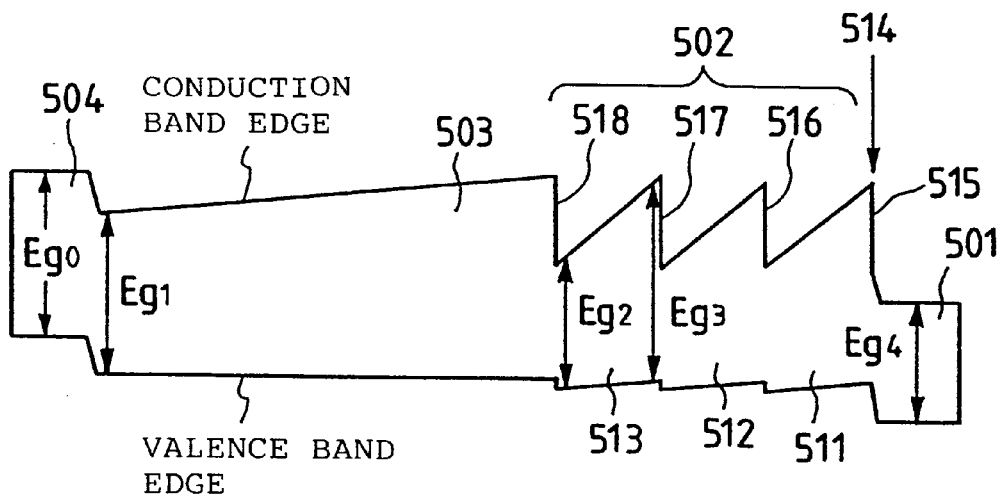
FIGS. 28A and 29A are energy band charts in a non-bias state.
Figure 28B:
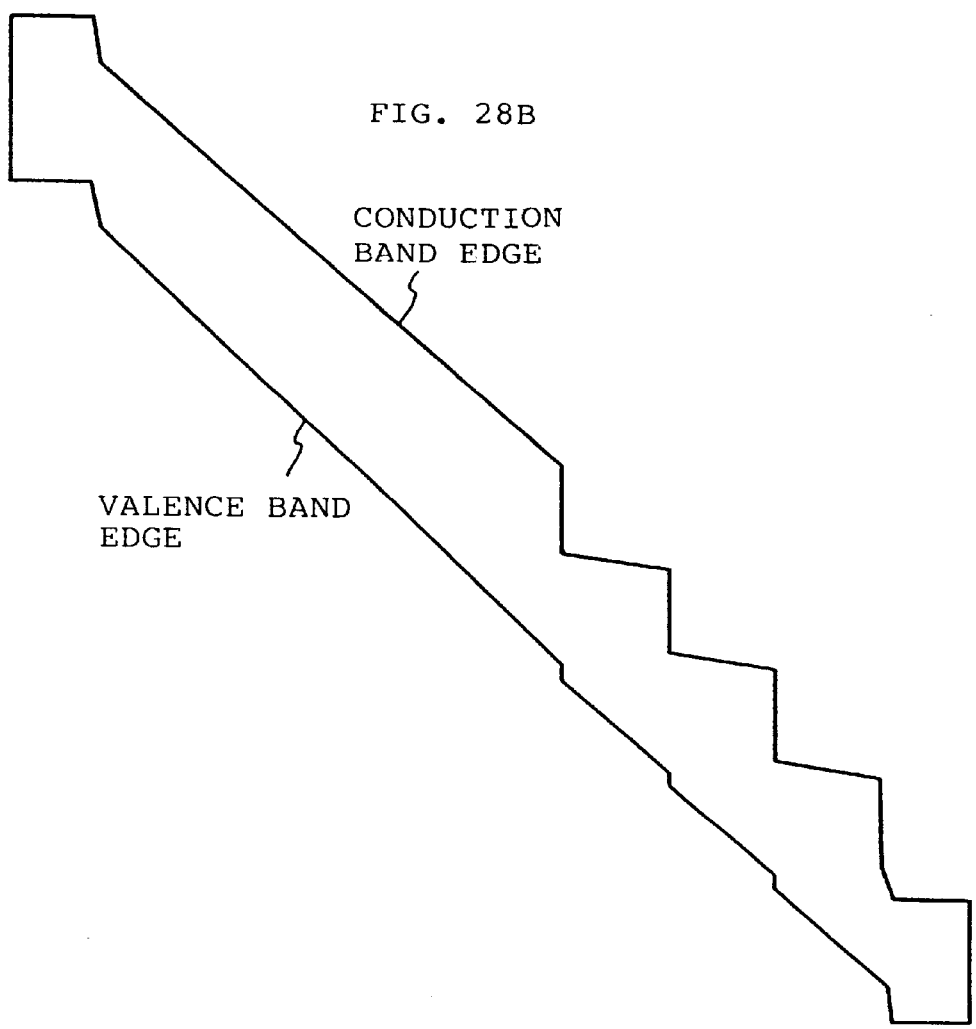
FIGS. 28B and 29B are energy band charts in a bias application state.

The photoelectric conversion apparatus of Example 13 shown in FIG. 27 is assumed to ideally have an energy band structure as shown in FIGS. 28A and 28B.

FIG. 28A is an energy band chart obtained when the photoelectric conversion apparatus of Example 13 is in a non-bias state, and FIG. 28B is an energy band chart obtained when the apparatus is applied with a bias to perform a carrier multiplication operation.

FIGS. 28A and 28B illustrate that an n-type a-$Si_{1-x}Ge_x$:H layer 501 has a forbidden bandwidth Eg4, a multiplication region 502 consisting of three layers, i.e., a-$Si_{1-x}Ge_x$:H to a-$Si_{1-y}C_y$:H composition change layers 511, 512, and 513 has a minimum forbidden bandwidth Eg2, and a maximum forbidden bandwidth Eg3, an a-Si:H to a-$Si_{1-y}C_y$:H layer 503 has a forbidden bandwidth Eg1, and a p-type a-Si:H layer 504 has a forbidden bandwidth Eg0.

In FIG. 28A, although energy discontinuous points are present at both conduction and valence band edges, there is almost no barrier due to energy discontinuity in a migration direction of carriers in a bias application state, as can be seen from FIG. 2B. Thus, carrier migration is not disturbed.

Of the composition change layers 511, 512, and 513 manufactured in this example, a layer giving the maximum forbidden bandwidth Eg3 was formed of a-$Si_{1-y}C_y$:H having a C composition ratio of about 0.4, and Eg3 was also about 2.3 eV. A layer portion giving the maximum forbidden bandwidth of the a-Si:H to a-$Si_{1-y}C_y$:H layer 503 was also formed of a-$Si_{1-y}C_y$:H.

A Ge composition ratio x of the a-$Si_{1-x}Ge_x$:H layer 501 was about 0.6, and the forbidden bandwidth Eg4 was about 1.3 eV. Of the composition change layers 511, 512, and 513, a layer giving the minimum forbidden bandwidth Eg2 was also formed of a-$Si_{1-x}Ge_x$:H, and Eg2 was also about 1.3 ev. A layer portion giving the minimum forbidden bandwidth Eg1 of the a-Si:H to a-$Si_{1-y}C_y$:H layer 503 was formed of a-Si:H, and Eg1 was about 1.8 eV. The forbidden bandwidth Eg0 of the p-type a-Si:H layer 504 was also about 1.8 eV.

The light absorption layer 503 had a light absorption coefficient of about $6 \times 10^3$ cm$^{-1}$ or more for light having a wavelength of 700 nm, and about $3 \times 10^4$ cm$^{-1}$ or more for light having a wavelength of 350 nm. Thus, the layer 503 could satisfactorily absorb light from a visible region to an ultraviolet region.

A multiplication ratio of this apparatus was about 10 times or more upon application of a bias of 10 V.

The multiplication ratio was not changed even if a wavelength was changed for light from a visible region to an ultraviolet region having a wavelength of 700 nm or less.

A leak current in a dark state was as low as 1 nA/cm$^2$ or less upon application of a bias of 10 V.

Furthermore, a light response speed was equivalent to that of a pin-type photoelectric conversion apparatus having no multiplication layer 502, and was high.

In this example, the multiplication region included three composition change layers. However, this is merely an example, and the number of layers may be arbitrarily determined according to a multiplication ratio to be obtained.

In this example, a structure wherein stepbacks are immediately changed is assumed as an ideal energy band chart. Even if the structure has moderate stepbacks, the same effects as described above can be obtained as long as they fall within a mean free path of electrons. Furthermore, if the structure has moderate stepbacks, an operation range can be assured.

In this example, each composition change layer has a thickness of about 200 Å, but may have a thickness within a range wherein carriers can migrate without being re-combined. In this case, each composition change layer preferably has a small thickness since an application bias can be lowered.

In this example, the light absorption layer has a thickness of about 2 μm, but may have a thickness which is large enough to allow light to pass therethrough but not to allow it to reach the multiplication layer. This thickness is determined by a light absorption coefficient.

Although $SiH_4$, $B_2H_6$, $PH_3$, $CH_4$, and $GeH_4$ were used as the source gases for the amorphous layers of this example, in place of $SiH_4$, a chain silane compound such as $SiF_4$, $Si_2H_6$, $Si_2F_6$, $Si_3H_8$, $SiH_3F$, $Si_2F_2$, or the like, or a cyclic silane compound such as $Si_5H_{10}$, $Si_6H_{12}$, $Si_4H_8$, or the like may be used, in place of $B_2H_6$, a gas containing a Group III atom such as B (boron), Al (aluminum), In (indium), Tl (thallium), or the like may be used, in place of $PH_3$, a gas containing a Group IV atom such as P (phosphorus), As (arsenic), Sb (antimony), Bi (bismuth), or the like may be used, in place of $CH_4$, a carbon compound such as $CH_2F_2$, $C_2H_6$, $C_2H_4$, $C_2H_2$, $Si(CH_3)_4$, $SiH(CH_3)_3$, or the like, a nitrogen compound such as $N_2$, $NH_3$, $H_2NNH_2$, $HN_3NH_4N_3$, $F_3N$, $F_4N$, or the like, or an oxygen compound such as $O_2$, $CO_2$, NO, $NO_2$, $N_2O$, $O_3$, $N_2O_3$, $N_2O_4$, $NO_3$, or the like may be used, and in place of $GeH_4$, a germanium compound such as $GeF_4$, or a tin compound such as $SnH_4$ may be used.

Furthermore, a composition ratio of each composition change layer preferably falls within a range of 0 to about 0.6 to eliminate a local level.

Upon formation of the amorphous layers, an ECR plasma method may be employed in place of a plasma CVD method.

In this example, semiconductor layers comprise amorphous layers, but may comprise non-monocrystalline layers such as polycrystalline layers.

In this example, light is incident from the p-type electric charge injection blocking layer side, and a multiplication operation is caused by electrons. However, the p- and n-type electric charge injection blocking layers may be replaced with each other, so that the stepback structure is formed at the valence band side of the multiplication region. Thus, light may be incident from the n-type electric charge injection blocking layer side to cause a multiplication operation by holes.

The forbidden bandwidth Eg2 of the light absorption layer is about 1.8 to 2.3 eV. The C composition ratio may be changed to control Eg2, so that desired spectral sensitivity characteristics can be obtained.

The forbidden bandwidths and doping amounts of the electric charge injection blocking layers (both the p- and n-type layers) need only be adjusted to suppress injection of minority carriers from the corresponding electrodes and not to disturb migration of majority carriers.

EXAMPLE 14

Example 14 of the present invention will be described below with reference to FIGS. 29A and 29B.

Figure 29A:
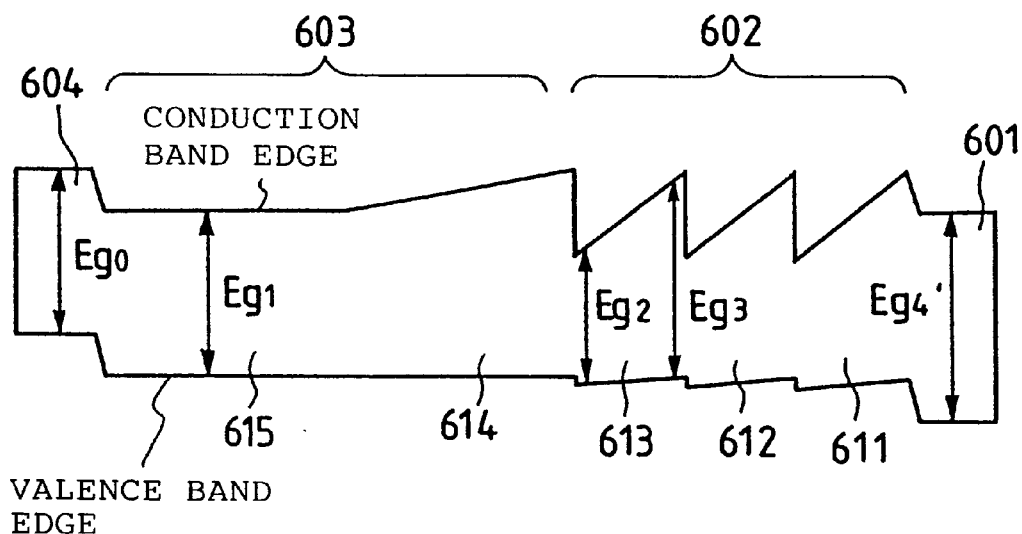
Figure 29B:
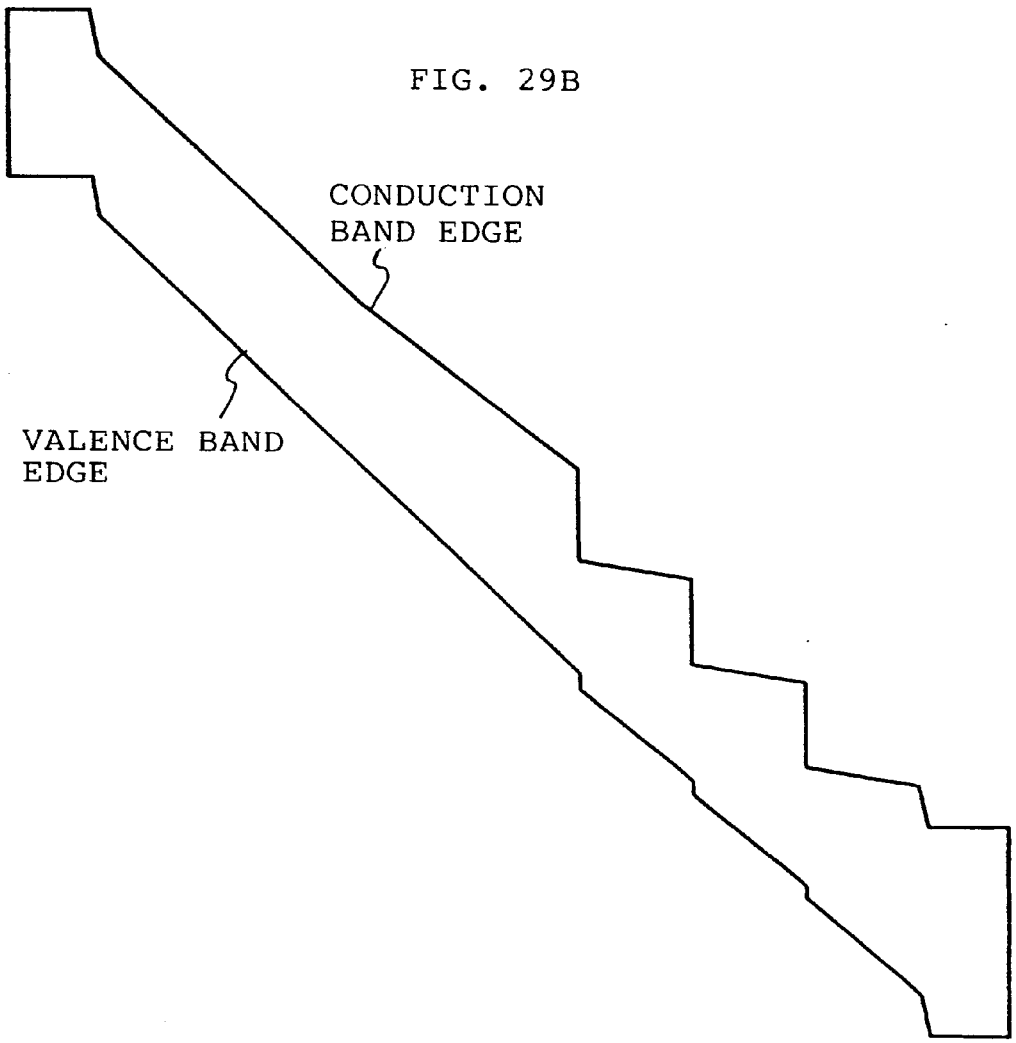

FIGS. 29A and 29B are ideally assumed energy band charts of Example 14 of the present invention.

FIG. 29A is an energy band chart obtained when the photoelectric conversion apparatus of Example 2 is in a non-bias state, and FIG. 29B is an energy band chart obtained when the apparatus is applied with a bias to perform a carrier multiplication operation.

Figure 2C:
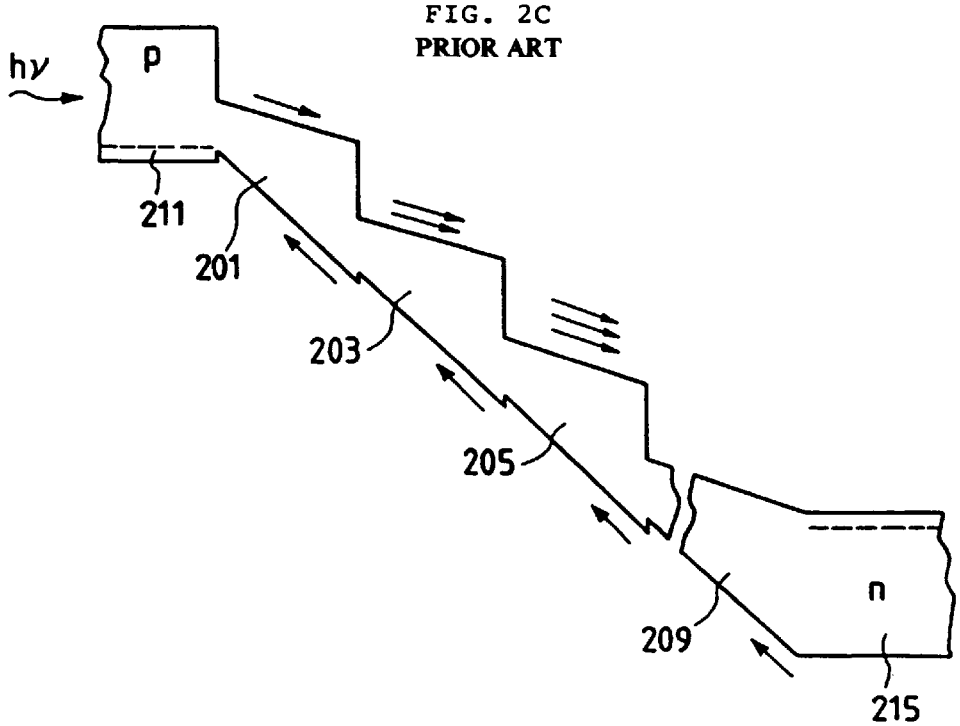
FIG. 2C is a view showing a structure of energy bands when a reverse bias voltage is applied.

FIG. 29A is substantially the same as FIG. 28A, except that 601 denotes an n-type a-$Si_{1-y}C_y$:H layer having a forbidden bandwidth Eg4', and an a-Si:H composition region of a light absorption layer 603 is wider than that in FIG. 2, and illustrates that a multiplication region 602 consisting of three layers, i.e., a-$Si_{1-x}Ge_x$:H to a-$Si_{1-y}C_y$:H composition change layers 611, 612, and 613 has a minimum forbidden bandwidth Eg2, and a maximum forbidden bandwidth Eg3, an a-Si:H to a-$Si_{1-x}C_x$:H layer 603 has a forbidden bandwidth Eg1, and a p-type a-Si:H layer 604 has a forbidden bandwidth Eg0.

A multiplication ratio of this apparatus was about 10 times or more upon application of a bias of 10 V.

The multiplication ratio was not changed even if a wavelength was changed for light from a visible region to an ultraviolet region having a wavelength of 700 nm or less.

A leak current in a dark state was as low as 1 nA/cm$^2$ or less upon application of a bias of 10 V.

Furthermore, a light response speed was equivalent to that of a pin-type photoelectric conversion apparatus having no multiplication layer 602, and was high.

EXAMPLE 15

In this example, a photoelectric conversion apparatus described in Example 13 is stacked on a scanning circuit and a read circuit already proposed in Japanese Laid-Open Patent Application No. 63-278269 by the present inventors.

Figure 30A:
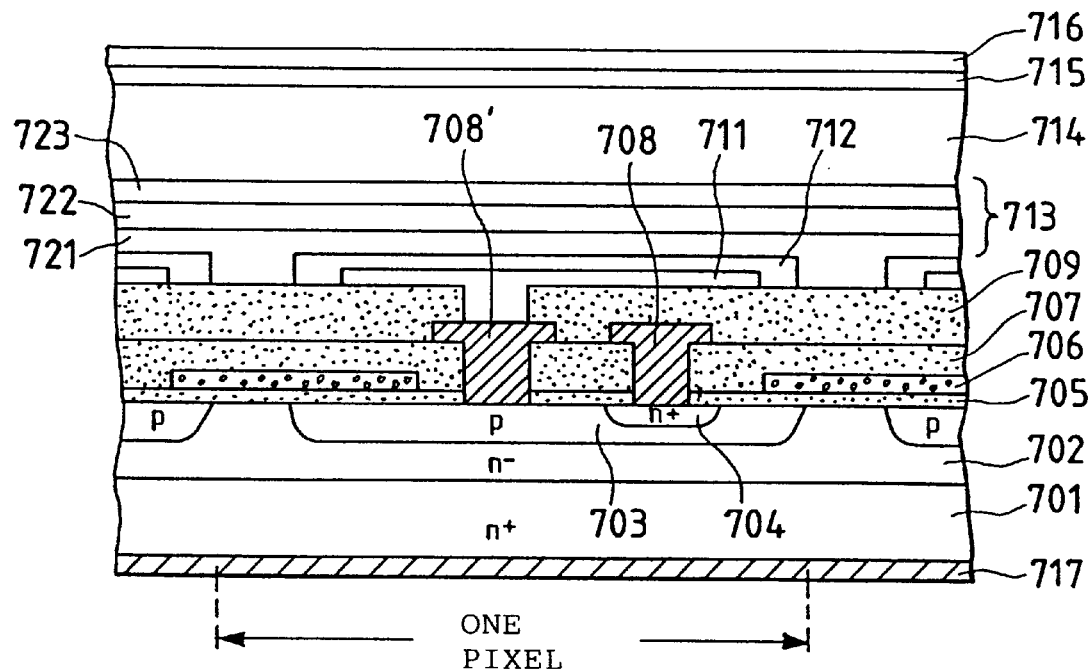
Figure 30B:
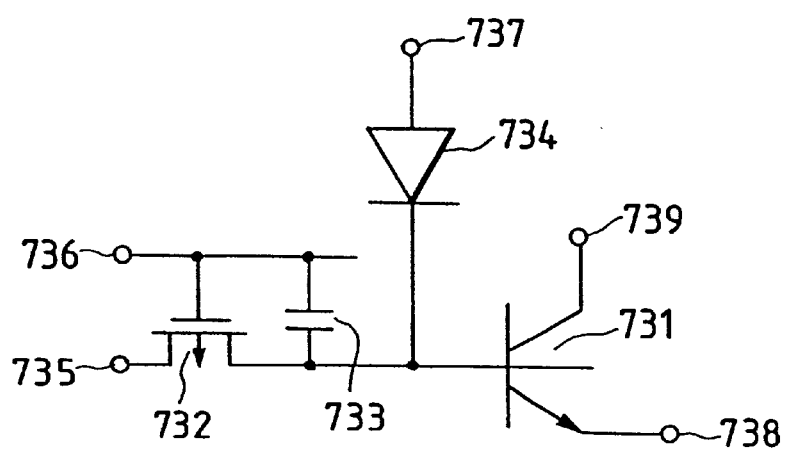
FIGS. 30B and 30C are circuit diagrams showing photoelectric conversion apparatuses according to other embodiments of the present invention.
Figure 30C:
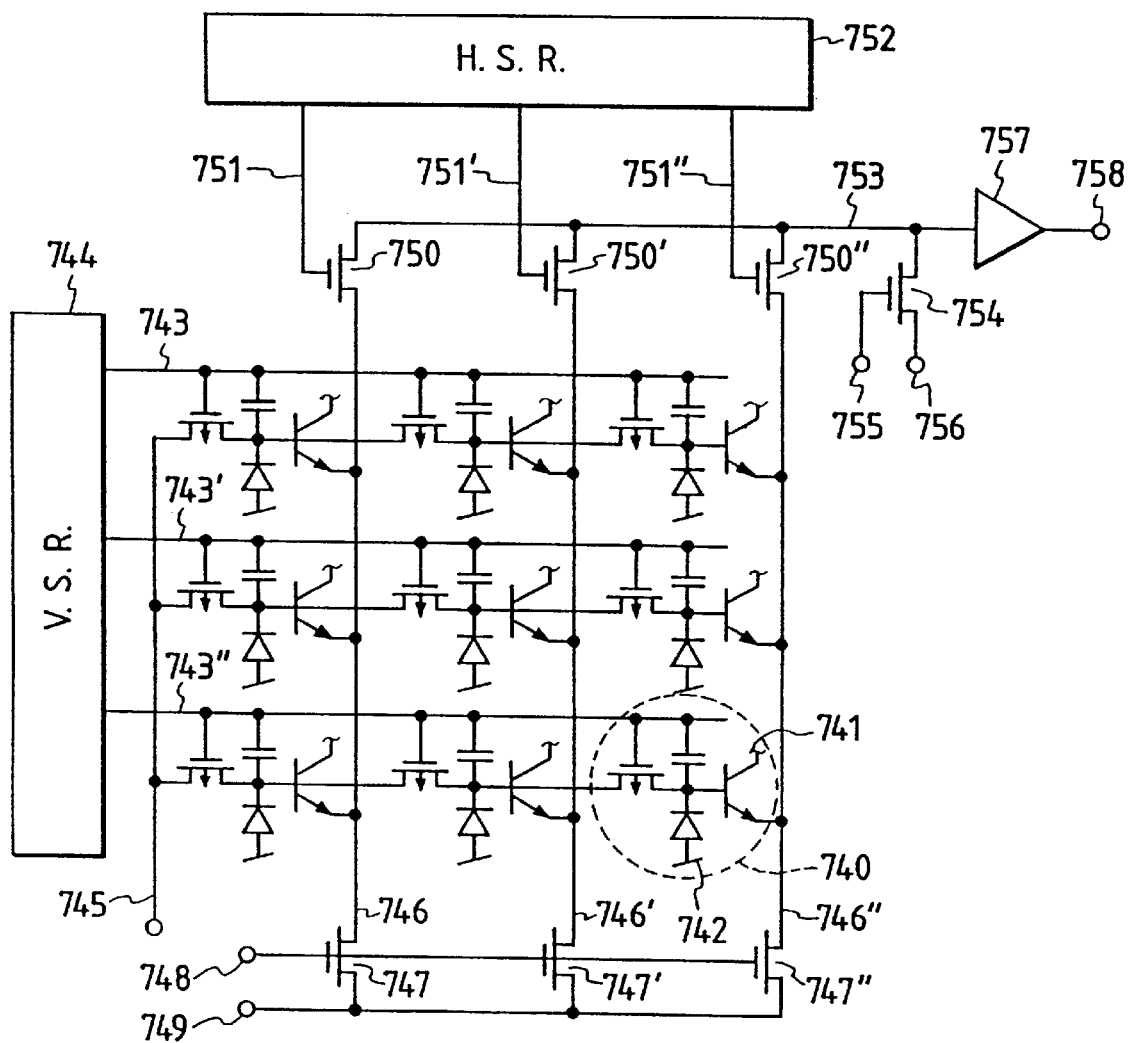

FIG. 30A is a schematic sectional view of a structure near a light-receiving unit of the example of the present invention, FIG. 30B is an equivalent circuit diagram of one pixel, and FIG. 30C is an equivalent circuit diagram and a block diagram of the overall apparatus.

In FIG. 30A, an n$^-$-type layer 702 serving as a collector region is epitaxially grown on an n-type silicon substrate 701, and a p-type base region 703 and an n+-type emitter region 704 are formed in the layer 702, thus constituting a bipolar transistor.

The p-type base region 703 is isolated from adjacent pixels, and a gate electrode 706 is formed between horizontally adjacent p-type base regions to sandwich an oxide film 705 therebetween. Therefore, a p-channel MOS transistor is formed to have the adjacent p-type base regions 703 as source and drain regions. The gate electrode 706 also serves as a capacitor for controlling a potential of the p-type base region 703.

After an insulating layer 707 is formed, an emitter electrode 708 and a base electrode 708' are formed.

Thereafter, an insulating layer 709 is formed, and then, an electrode 711 is formed. The resultant structure is isolated in units of pixels. The electrode 711 is electrically connected to the electrode 708'. Furthermore, an n-type a-$Si_{1-x}Ge_x$:H layer 712 is formed, and is isolated in units of pixels.

Subsequently, a-$Si_{1-x}Ge_x$:H to a-$Si_{1-y}C_y$:H composition change layers 721, 722, and 723 are formed to constitute a multiplication region 713. Then, an a-Si:H to a-$Si_{1-y}C_y$:H layer 714 is formed as a light absorption layer, a p-type a-Si:H layer 715 is formed, and a transparent electrode 716 for applying a bias voltage to a sensor is formed.

A collector electrode 717 is in ohmic-contact with the lower surface of the substrate 701.

Therefore, an equivalent circuit for one pixel is expressed by a crystalline silicon bipolar transistor 731, the base of which is connected to a p-channel MOS transistor 732, a capacitor 733, and a photoelectric conversion apparatus 734 which is the same as that in Example 1, a terminal 735 for applying a potential to the base, a terminal 736 for driving the p-channel MOS transistor 732 and the capacitor 733, a sensor electrode 737, an emitter electrode 738, and a collector electrode 739, as shown in FIG. 4B.

FIG. 30C is a circuit diagram showing a 3×3 two-dimensional matrix of pixel cells 740 shown in FIGS. 30A and 30B.

In FIG. 30C, a collector electrode 741 of each pixel cell 740 is arranged for all the pixels, and a sensor electrode 742 is also arranged for all the pixels. The gate electrodes and the capacitor electrodes of the p-channel MOS transistors are connected to driving lines 743, 743', and 743" in units of rows, and are connected to a vertical shift register (V.S.R) 744. The emitter electrodes are connected to vertical lines 746, 746', and 746" for reading out signals in units of columns. The vertical lines 746, 746', and 746" are connected to switches 747, 747', and 747" for resetting electric charges on the vertical lines, and read switches 750, 750', and 750", respectively. The gate electrodes of the reset switches 747, 747', and 747" are commonly connected to a terminal 748 for applying a vertical line reset pulse, and their source electrodes are commonly connected to a terminal 749 for applying a vertical line reset voltage. The gate electrodes of the read switches 750, 750', and 750" are connected to a horizontal shift register (H.S.R) via lines 751, 751', and 751", respectively, and their drain electrodes are connected to an output amplifier 757 via a horizontal read line 753. The horizontal read line 753 is connected to a switch 754 for resetting electric charges on the horizontal read line.

The reset switch 754 is connected to a terminal 755 for applying a horizontal line reset pulse and a terminal 756 for applying a horizontal line reset voltage.

Finally, an output from the amplifier 757 is extracted from a terminal 758.

An operation will be briefly described below with reference to FIGS. 30A to 30C.

Incident light is absorbed by the light absorption layer 714 shown in FIG. 30A, and generated carriers are multiplied by the multiplication region 713 and are stored in the base region 703.

When a drive pulse output from the V.S.R. shown in FIG. 30C appears on the driving line 743, a base potential is increased through the capacitor, and signal charges according to a light amount are output from the pixels in the first row onto the vertical lines 746, 746', and 746".

When scanning pulses are sequentially output from the H.S.R. 752 onto the lines 751, 751', and 751", the switches 750, 750', and 750" are sequentially ON/OFF-controlled, and signals are output to the output terminal 758 via the amplifier 757. In this case, the reset switch 754 is set in an ON state while the switches 750, 750', and 750" are sequentially turned on, thus removing residual charges from the horizontal line 753.

The vertical line reset switches 747, 747', and 747" are sequentially turned on to remove residual charges from the vertical lines 746, 746', and 746". When the V.S.R. 744 applies a negative pulse to the driving line 743, the p-channel MOS transistors of the pixels in the first row are turned on, and base residual charges of these pixels are removed, thus initializing the pixels.

Then, a drive pulse output from the V.S.R. 744 appears on the driving line 743', and signal charges of pixels in the second row are similarly output.

An output operation of signal charges of pixels in the third row is performed in the same manner as described above.

The apparatus of this example is operated by repeating the above-mentioned operations.

In the example described above, a circuit invented by the present inventors has been exemplified. However, the present invention may be applied to a conventional photoelectric conversion apparatus.

A case will be described below wherein the present invention is applied to a photoelectric conversion apparatus having a conventional arrangement.

Figure 31:
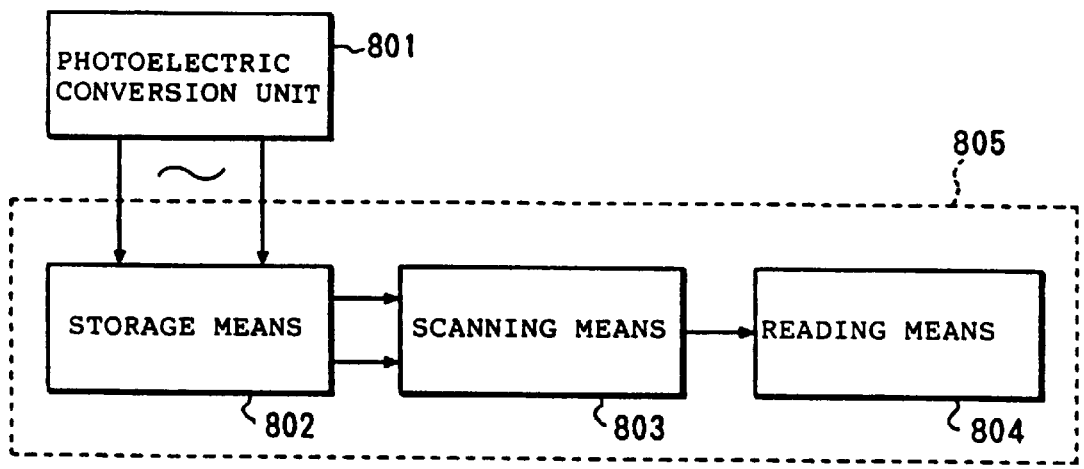
FIG. 31 is a block diagram showing an arrangement obtained when the present invention is applied to a photoelectric conversion apparatus having a conventional arrangement.

FIG. 31 is a block diagram showing an arrangement when the present invention is applied to a photoelectric conversion apparatus having a conventional arrangement.

In FIG. 31, reference numeral 801 denotes a photoelectric conversion unit according to the present invention, which comprises, e.g., a photoelectric conversion apparatus according to the present invention described in, e.g., Example 1 or 2. The photoelectric conversion unit 801 is connected to a signal output unit 805. In the signal output unit 805, reference numeral 802 denotes a storage means for storing signal charges generated by the photoelectric conversion means 801; 803, a scanning means for scanning the signal charges; and 804, a read means comprising, e.g., a circuit for amplifying or noise-compensating signal charges transferred from the scanning means 803. Note that the storage means 802 may be omitted although it is necessary when a storage operation is performed.

As described above, according to the photoelectric conversion apparatus shown in Examples 13 to 15 of the present invention, there can be provided a photoelectric conversion apparatus which is constituted in such a manner that a light absorption layer, having a forbidden bandwidth Eg1, for absorbing light, and a multiplication layer, obtained by stacking one or a plurality of layers having a stepback structure in which a forbidden bandwidth is continuously changed to have a minimum forbidden bandwidth Eg2 and a maximum forbidden bandwidth Eg3, for multiplying the carriers generated upon light absorption, are stacked to be sandwiched between electric charge injection blocking layers, wherein the forbidden bandwidth Eg1 of the light absorption layer is continuously changed from one electric charge injection layer side and is set to be substantially equal to the maximum forbidden bandwidth Eg3 of the multiplication layer at the multiplication layer side, so that various problems caused by band mismatching can be eliminated, and high-response characteristics equivalent to those of a photodiode having no multiplication layer can be obtained, and wherein the forbidden bandwidth Eg1 of the light absorption layer is set to particularly cope with light from a visible region to an ultraviolet region to have a high sensitivity for light from the visible region to the ultraviolet region.

When the number of layers of the stepback structure is selected, an amplification factor of 2 or more can be obtained, and noise can be further reduced.

When constituting elements of the photoelectric conversion apparatus of the present invention are formed of monocrystalline materials at least containing an Si atom, easy controllability of forbidden bandwidths and low-temperature formation of a multilayered structure can be assured, and various problems caused upon formation of the multilayered structure can be solved.

EXAMPLE 16

Example 16 of the present invention will be described below with reference to FIG. 32 and FIGS. 33A and 33B.

Figure 32:
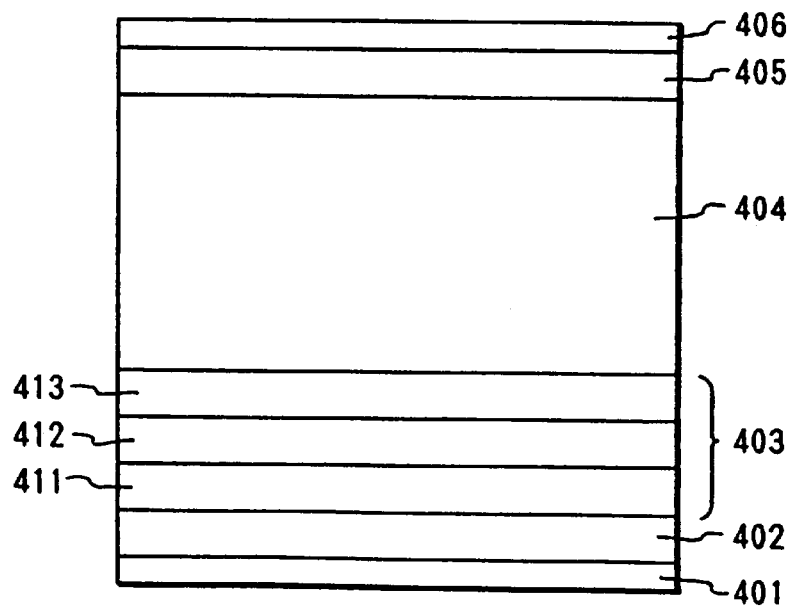
FIGS. 32 and 35A are schematic sectional views showing photoelectric conversion apparatuses according to other embodiments of the present invention.

FIG. 32 is a schematic longitudinal sectional view showing Example 16 of a photoelectric conversion apparatus of the present invention.

In FIG. 32, reference numeral 401 denotes a Cr electrode; 402, a 500-Å thick n-type a-$Si_{1-x}Ge_x$:H electric charge injection blocking layer for blocking hole injection; 403, a multiplication region, whose composition is changed from a-$Si_{1-x}Ge_x$:H to a-$Si_{1-y}C_y$:H, for performing carrier multiplication; 404, a 1-$\mu$m thick light absorption layer, whose composition is changed from a-Si:H to a-$Si_{1-x}Ge_x$:H for absorbing light and generating carriers; 405, a 100-Å thick p-type a-Si:H electric charge injection blocking layer for blocking electron injection; and 406, a transparent electrode containing indium oxide as a major component.

The Cr electrode 401 and the transparent electrode 406 were formed by EB evaporation, and amorphous layers, i.e., the electric charge injection blocking layer 402, the multiplication region 403, the light absorption layer 404, and the electric charge injection blocking layer 405 were formed by plasma CVD. As source gases upon formation of amorphous layers, $SiH_4$, $GeH_4$, $PH_3$, and $H_2$ gases were used for the electric charge injection blocking layer 402, $SiH_4$, $GeH_4$, $CH_4$, and $H_2$ were used for the multiplication region 403, $SiH_4$, $GeH_4$, and $H_2$ gases were used for the light absorption layer 404, and $SiH_4$, $B_2H_6$, and $H_2$ gases were used for the electric charge injection blocking layer 405.

The multiplication region 403 comprises three layers, i.e., 200-Å thick composition change layers 411, 412, and 413 formed by continuously changing flow rates of $CH_4$ and $GeH_4$ gases of the source gases. The light absorption layer 404 is formed by continuously changing a flow rate of $GeH_4$ gas of the source gases.

The photoelectric conversion apparatus of Example 1 shown in FIG. 32 is assumed to ideally have an energy band structure as shown in FIGS. 2A and 2B.

Figure 33A:
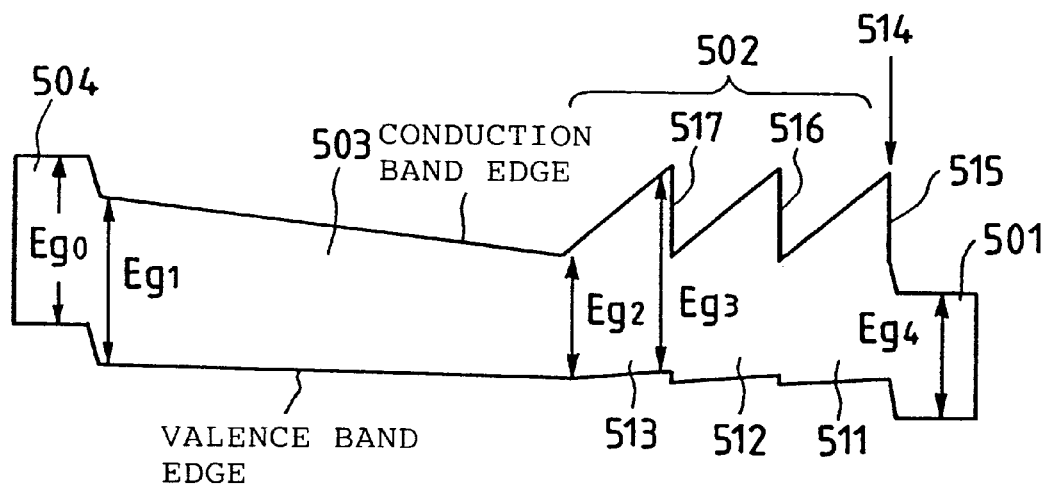
FIGS. 33A and 34A are energy band charts in a non-bias state.
Figure 33B:
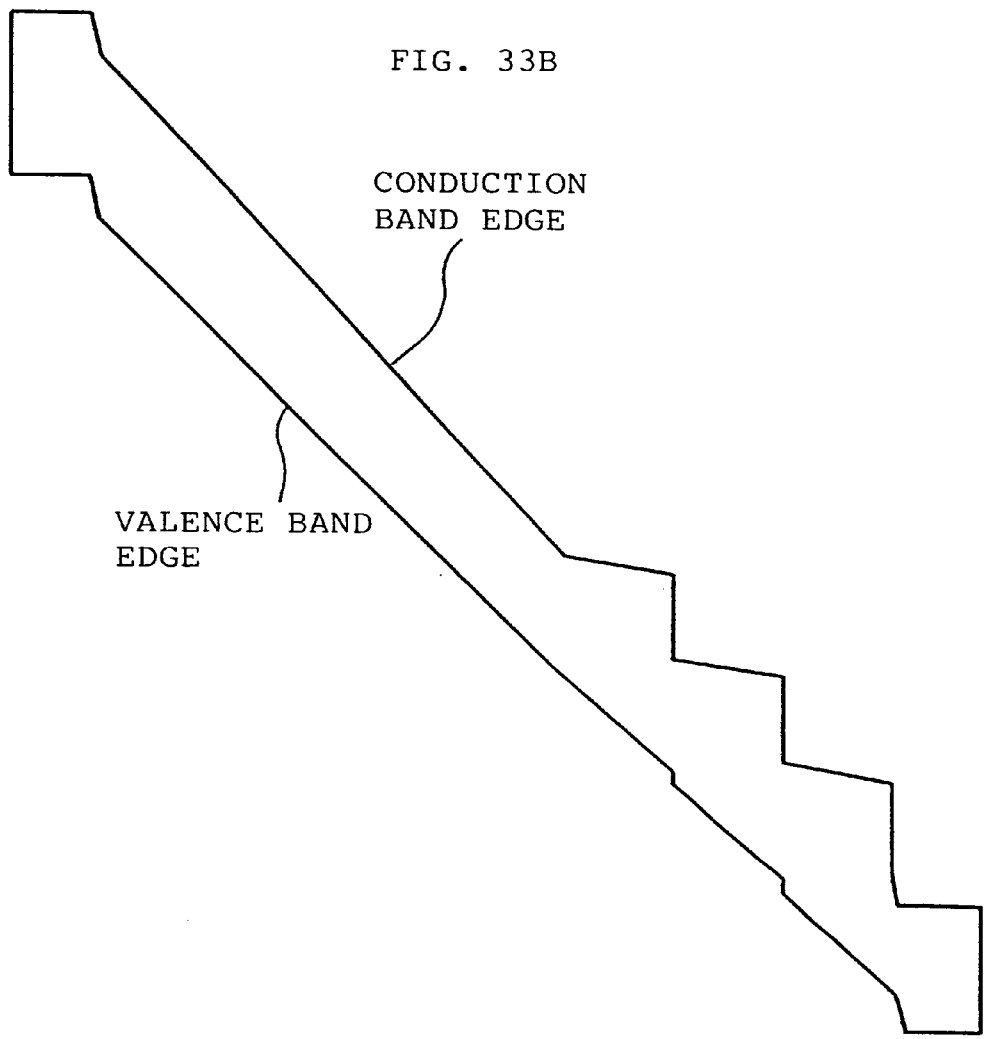
FIGS. 33B and 34B are energy band charts in a bias application state.

FIG. 33A is an energy band chart obtained when the photoelectric conversion apparatus of Example 1 is in a non-bias state, and FIG. 33B is an energy band chart obtained when the apparatus is applied with a bias to perform a carrier multiplication operation.

FIGS. 33A and 33B illustrate that an n-type a-$Si_{1-x}Ge_x$:H layer 501 has a forbidden bandwidth Eg4, a multiplication region 502 consisting of three layers, i.e., a-$Si_{1-x}Ge_x$:H to a-$Si_{1-y}C_y$:H composition change layers 511, 512, and 513 has a minimum forbidden bandwidth Eg2, and a maximum forbidden bandwidth Eg3, an a-Si:H to a-$Si_{1-x}Ge_x$:H layer 503 has a forbidden bandwidth Eg1, and a p-type a-Si:H layer 504 has a forbidden bandwidth Eg0.

In FIG. 33A, although energy discontinuous points are present at both conduction and valence band edges, there is almost no barrier due to energy discontinuity in a migration direction of carriers in a bias application state, as can be seen from FIG. 2B. Thus, carrier migration is not disturbed.

Of the composition change layers 511, 512, and 513 manufactured in this example, a layer giving the maximum forbidden bandwidth Eg3 was formed of a-$Si_{1-y}C_y$:H having a C composition ratio of about 0.4, and Eg3 was also about 2.3 eV.

A Ge composition ratio x of the a-$Si_{1-x}Ge_x$:H layer 501 was about 0.6, and the forbidden bandwidth Eg4 was about 1.3 eV. Of the composition change layers 511, 512, and 513, a layer giving the minimum forbidden bandwidth Eg2 was also formed of a-$Si_{1-x}Ge_x$:H, and Eg2 was also about 1.3 eV. A layer portion giving the minimum forbidden bandwidth Eg1 of the a-Si:H to a-$Si_{1-x}Ge_x$:H layer 503 was also formed of a-$Si_{1-x}Ge_x$:H. A layer portion giving the maximum forbidden bandwidth Eg1 of the a-Si:H to a-$Si_{1-x}Ge_x$:H layer 503 was a-Si:H, and Eg1 was about 1.8 eV. The forbidden bandwidth Eg0 of the p-type a-Si:H layer 504 was also about 1.8 eV.

The light absorption layer 503 had a light absorption coefficient of about $1 \times 10^5$ cm$^{-1}$ or more for light having a wavelength of 400 nm, and about $2 \times 10^4$ cm$^{-1}$ or more for light having a wavelength of 1,000 nm. Thus, the layer 503 could satisfactorily absorb light of an infrared region, a visible region, and an ultraviolet region.

A multiplication ratio of this apparatus was about 10 times or more upon application of a bias of 10 V.

The multiplication ratio was not changed even if a wavelength was changed for light having a wavelength of 1,000 nm or less.

A leak current in a dark state was as low as 1 nA/cm$^2$ or less. upon application of a bias of 10 V.

Furthermore, a light response speed was equivalent to that of a pin-type photoelectric conversion apparatus having no multiplication layer 502, and was high.

In this example, the multiplication region included three composition change layers. However, this is merely an example, and the number of layers may be arbitrarily determined according to a multiplication ratio to be obtained.

In this example, a structure wherein stepbacks are immediately changed is assumed as an ideal energy band chart. Even if the structure has moderate stepbacks, the same effects as described above can be obtained as long as they fall within a mean free path of electrons. Furthermore, if the structure has moderate stepbacks, an operation range can be assured.

In this example, each composition change layer has a thickness of about 200 Å, but may have a thickness within a range wherein carriers can migrate without being re-combined. In this case, each composition change layer preferably has a small thickness since an application bias can be lowered.

In this example, the light absorption layer has a thickness of about 1 μm, but may have a thickness which is large enough to allow light to pass therethrough but not to allow it to reach the multiplication layer. This thickness is determined by a light absorption coefficient.

Although $SiH_4$, $B_2H_6$, $PH_3$, $CH_4$, and $GeH_4$ were used as the source gases for the amorphous layers of this example, in place of $SiH_4$, a chain silane compound such as $SiF_4$, $Si_2H_6$, $Si_2F_6$, $Si_3H_8$, $SiH_3F$, $Si_2F_2$, or the like, or a cyclic silane compound such as $Si_5H_{10}$, $Si_6H_{12}$, $Si_4H_8$, or the like may be used, in place of $B_2H_6$, a gas containing a Group III atom such as B (boron), Al (aluminum), In (indium), Tl (thallium), or the like may be used, in place of $PH_3$, a gas containing a Group IV atom such as P (phosphorus), As (arsenic), Sb (antimony), Bi (bismuth), or the like may be used, in place of $CH_4$, a carbon compound such as $CH_2F_2$, $C_2H_6$, $C_2H_4$, $C_2H_2$, $Si(CH_3)_4$, $SiH(CH_3)_3$, or the like, a nitrogen compound such as $N_2$, $NH_3$, $H_2NNH_2$, $HN_3NH_4N_3$, $F_3N$, $F_4N$, or the like, or an oxygen compound such as $O_2$, $CO_2$, NO, $NO_2$, $N_2O$, $O_3$, $N_2O_3$, $N_2O_4$, $NO_3$, or the like may be used, and in place of $GeH_4$, a germanium compound such as $GeF_4$, or a tin compound such as $SnH_4$ may be used.

Furthermore, a composition ratio of each composition change layer preferably falls within a range of 0 to about 0.6 to eliminate a local level.

Upon formation of the amorphous layers, an ECR plasma method may be employed in place of a plasma CVD method.

In this example, semiconductor layers comprise amorphous layers, but may comprise non-monocrystalline layers such as polycrystalline layers.

In this example, light is incident from the p-type electric charge injection blocking layer side, and a multiplication operation is caused by electrons. However, the p- and n-type electric charge injection blocking layers may be replaced with each other, so that the stepback structure is formed at the valence band side of the multiplication region. Thus, light may be incident from the n-type electric charge injection blocking layer side to cause a multiplication operation by holes.

The forbidden bandwidth Eg2 of the light absorption layer is about 1.8 to 1.3 eV. The Ge composition ratio may be changed to control Eg2, so that desired spectral sensitivity characteristics can be obtained.

The forbidden bandwidths and doping amounts of the electric charge injection blocking layers (both the p- and n-type layers) need only be adjusted to suppress injection of minority carriers from the corresponding electrodes and not to disturb migration of majority carriers.

EXAMPLE 17

Example 2 of the present invention will be described below with reference to FIGS. 34A and 34B.

Figure 34A:
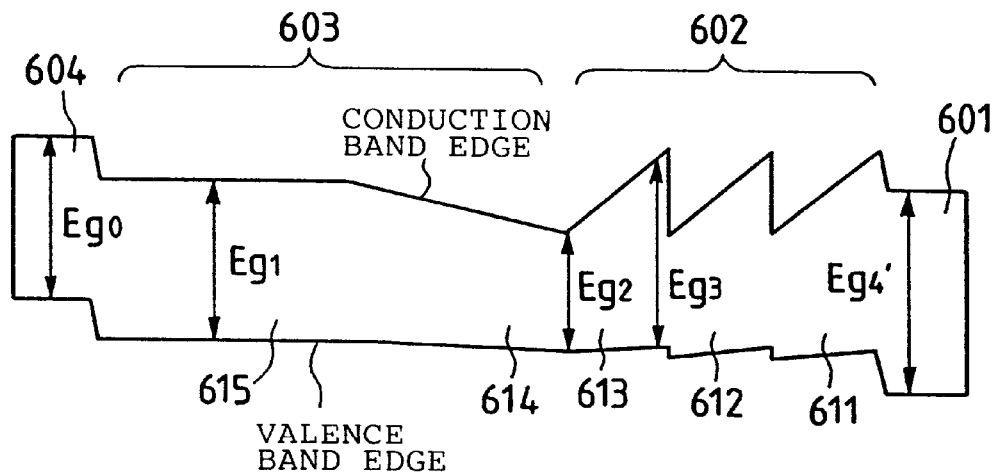
Figure 34B:
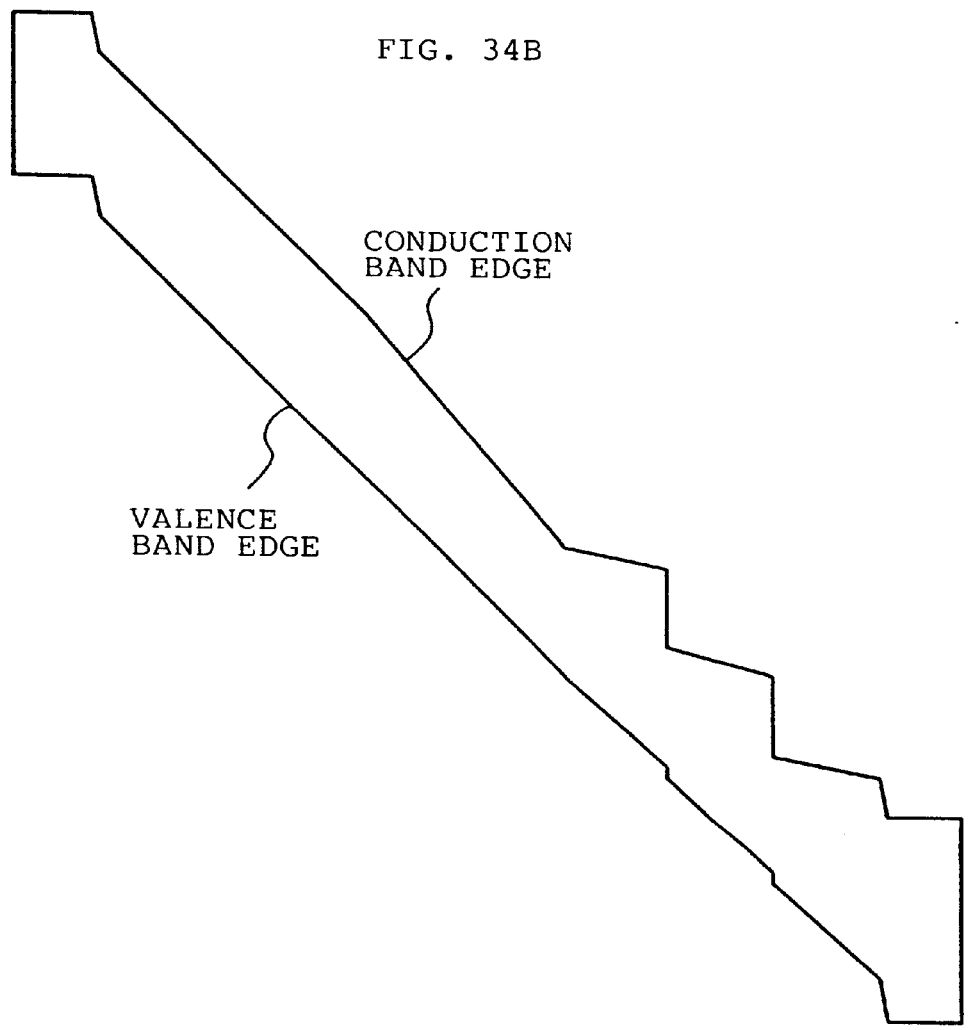

FIGS. 34A and 34B are ideally assumed energy band charts of Example 2 of the present invention.

FIG. 34A is an energy band chart obtained when the photoelectric conversion apparatus of Example 2 is in a non-bias state, and FIG. 34B is an energy band chart obtained when the apparatus is applied with a bias to perform a carrier multiplication operation.

FIG. 34A is substantially the same as FIG. 32A, except that 601 denotes an n-type a-$Si_{1-y}C_y$:H layer having a forbidden bandwidth Eg4', and an a-Si:H composition region of a light absorption layer 603 is wider than FIG. 2, and illustrates that a multiplication region 602 consisting of three layers, i.e., a-$Si_{1-x}Ge_x$:H to a-$Si_{1-y}C_y$:H composition change layers 611, 612, and 613 has a minimum forbidden bandwidth Eg2, and a maximum forbidden bandwidth Eg3, an a-Si:H to a-$Si_{1-x}Ge_x$:H layer 603 has a forbidden bandwidth Eg1, and a p-type a-Si:H layer 604 has a forbidden bandwidth Eg0.

A multiplication ratio of this apparatus was about 10 times or more upon application of a bias of 10 V.

The multiplication ratio was not changed even if a wavelength was changed for for light having a wavelength of 1,000 nm or less.

A leak current in a dark state was as low as 1 nA/cm$^2$ or less upon application of a bias of 10 V.

Furthermore, a light response speed was equivalent to that of a pin-type photoelectric conversion apparatus having no multiplication layer 602, and was high.

EXAMPLE 18

In this example, a photoelectric conversion apparatus described in Example 16 is stacked on a scanning circuit and a read circuit already proposed in Japanese Laid-Open Patent Application No. 63-278269 by the present inventors.

Figure 35A:
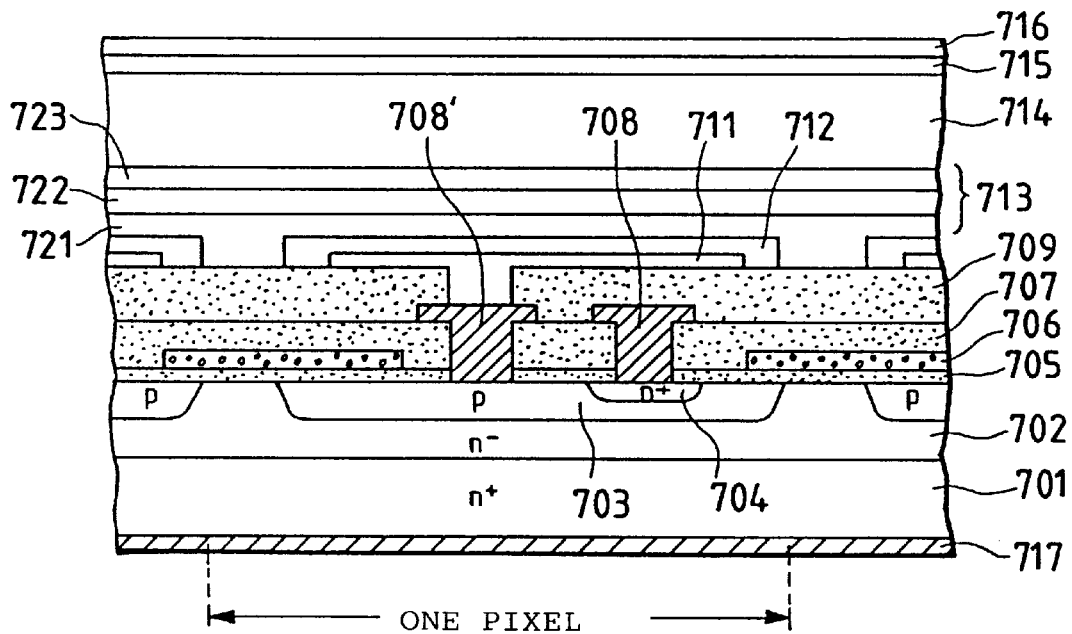
Figure 35B:
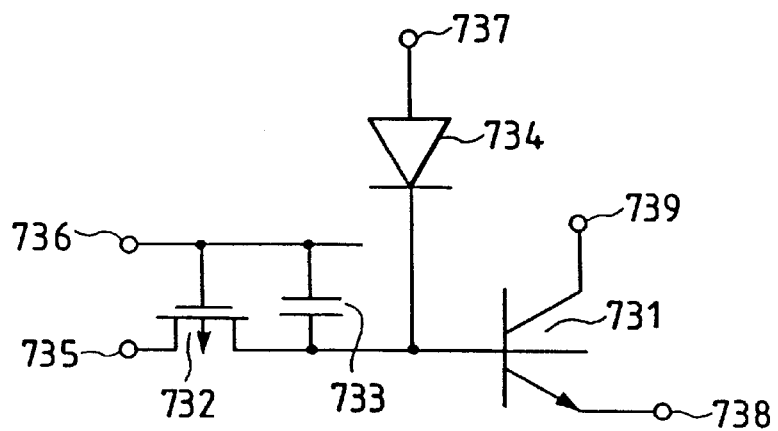
FIGS. 35B and 35C are circuit diagrams showing photoelectric conversion apparatuses according to other embodiments of the present invention.
Figure 35C:
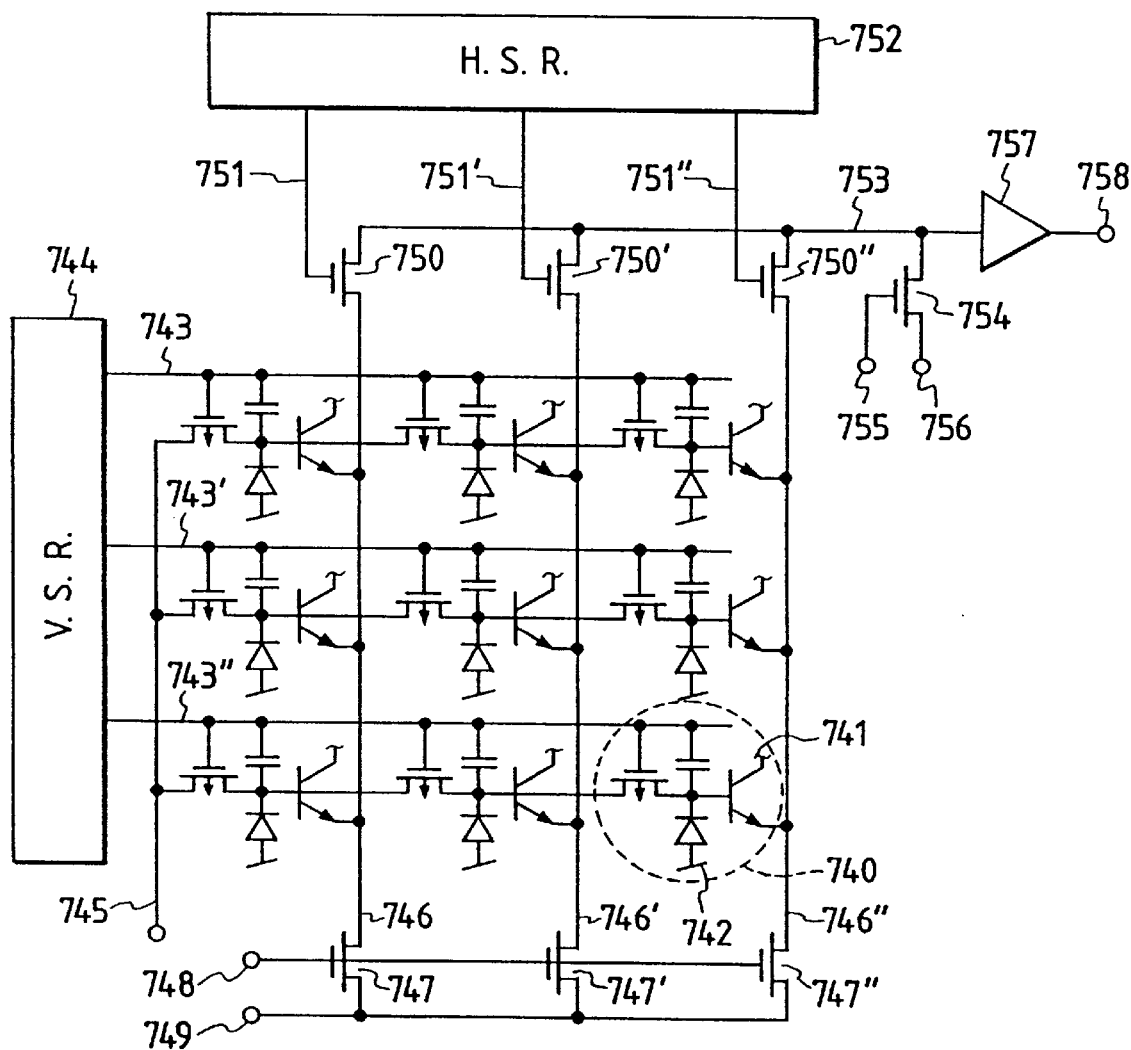

FIG. 35A is a schematic sectional view of a structure near a light-receiving unit of the example of the present invention, FIG. 35B is an equivalent circuit diagram of one pixel, and FIG. 35C is an equivalent circuit diagram and a block diagram of the overall apparatus.

In FIG. 35A, an n$^-$-type layer 702 serving as a collector region is epitaxially grown on an n-type silicon substrate 701, and a p-type base region 703 and an n$^+$-type emitter region 704 are formed in the layer 702, thus constituting a bipolar transistor.

The p-type base region 703 is isolated from adjacent pixels, and a gate electrode 706 is formed between horizontally adjacent p-type base regions to sandwich an oxide film 705 therebetween. Therefore, a p-channel MOS transistor is formed to have the adjacent p-type base regions 703 as source and drain regions. The gate electrode 706 also serves as a capacitor for controlling a potential of the p-type base region 703.

After an insulating layer 707 is formed, an emitter electrode 708 and a base electrode 708' are formed.

Thereafter, an insulating layer 709 is formed, and then, an electrode 711 is formed. The resultant structure is isolated in units of pixels. The electrode 711 is electrically connected to the electrode 708'. Furthermore, an n-type a-Si$_{1-x}$Ge$_x$:H layer 712 is formed, and is isolated in units of pixels.

Subsequently, a-Si$_{1-x}$Ge$_x$:H to a-Si$_{1-y}$C$_y$:H composition change layers 721, 722, and 723 are formed to constitute a multiplication region 713. Then, an a-Si:H to a-Si$_{1-x}$Ge$_x$:H layer 714 is formed as a light absorption layer, a p-type a-Si:H layer 715 is formed, and a transparent electrode 716 for applying a bias voltage to a sensor is formed.

A collector electrode 717 is in ohmic-contact with the lower surface of the substrate 701.

Therefore, an equivalent circuit for one pixel is expressed by a crystalline silicon bipolar transistor 731, the base of which is connected to a p-channel MOS transistor 732, a capacitor 733, and a photoelectric conversion apparatus 734 which is the same as that in Example 1, a terminal 735 for applying a potential to the base, a terminal 736 for driving the p-channel MOS transistor 732 and the capacitor 733, a sensor electrode 737, an emitter electrode 738, and a collector electrode 739, as shown in FIG. 4B.

FIG. 35C is a circuit diagram showing a 3×3 two-dimensional matrix of pixel cells 740 shown in FIGS. 35A and 35B.

In FIG. 35C, a collector electrode 741 of each pixel cell 740 is arranged for all the pixels, and a sensor electrode 742 is also arranged for all the pixels. The gate electrodes and the capacitor electrodes of the p-channel MOS transistors are connected to driving lines 743, 743', and 743" in units of rows, and are connected to a vertical shift register (V.S.R) 744. The emitter electrodes are connected to vertical lines 746, 746', and 746" for reading out signals in units of columns. The vertical lines 746, 746', and 746" are connected to switches 747, 747', and 747" for resetting electric charges on the vertical lines, and read switches 750, 750', and 750", respectively. The gate electrodes of the reset switches 747, 747', and 747" are commonly connected to a terminal 748 for applying a vertical line reset pulse, and their source electrodes are commonly connected to a terminal 749 for applying a vertical line reset voltage. The gate electrodes of the read switches 750, 750', and 750" are connected to a horizontal shift register (H.S.R) via lines 751, 751', and 751", respectively, and their drain electrodes are connected to an output amplifier 757 via a horizontal read line 753. The horizontal read line 753 is connected to a switch 754 for resetting electric charges on the horizontal read line.

The reset switch 754 is connected to a terminal 755 for applying a horizontal line reset pulse and a terminal 756 for applying a horizontal line reset voltage.

Finally, an output from the amplifier 757 is extracted from a terminal 758.

An operation will be briefly described below with reference to FIGS. 35A to 35C.

Incident light is absorbed by the light absorption layer 714 shown in FIG. 35A, and generated carriers are multiplied by the multiplication region 713 and are stored in the base region 703.

When a drive pulse output from the V.S.R. shown in FIG. 35C appears on the driving line 743, a base potential is increased through the capacitor, and signal charges according to a light amount are output from the pixels in the first row onto the vertical lines 746, 746', and 746".

When scanning pulses are sequentially output from the H.S.R. 752 onto the lines 751, 751', and 751", the switches 750, 750', and 750" are sequentially ON/OFF-controlled, and signals are output to the output terminal 758 via the amplifier 757. In this case, the reset switch 754 is set in an ON state while the switches 750, 750', and 750" are sequentially turned on, thus removing residual charges from the horizontal line 753.

The vertical line reset switches 747, 747', and 747" are sequentially turned on to remove residual charges from the vertical lines 746, 746', and 746". When the V.S.R. 744 applies a negative pulse to the driving line 743, the p-channel MOS transistors of the pixels in the first row are turned on, and base residual charges of these pixels are removed, thus initializing the pixels.

Then, a drive pulse output from the V.S.R. 744 appears on the driving line 743', and signal charges of pixels in the second row are similarly output.

An output operation of signal charges of pixels in the third row is performed in the same manner as described above.

The apparatus of this example is operated by repeating the above-mentioned operations.

In the example described above, a circuit invented by the present inventors has been exemplified. However, the present invention may be applied to a conventional photoelectric conversion apparatus.

A case will be described below wherein the present invention is applied to a photoelectric conversion apparatus having a conventional arrangement.

Figure 36:
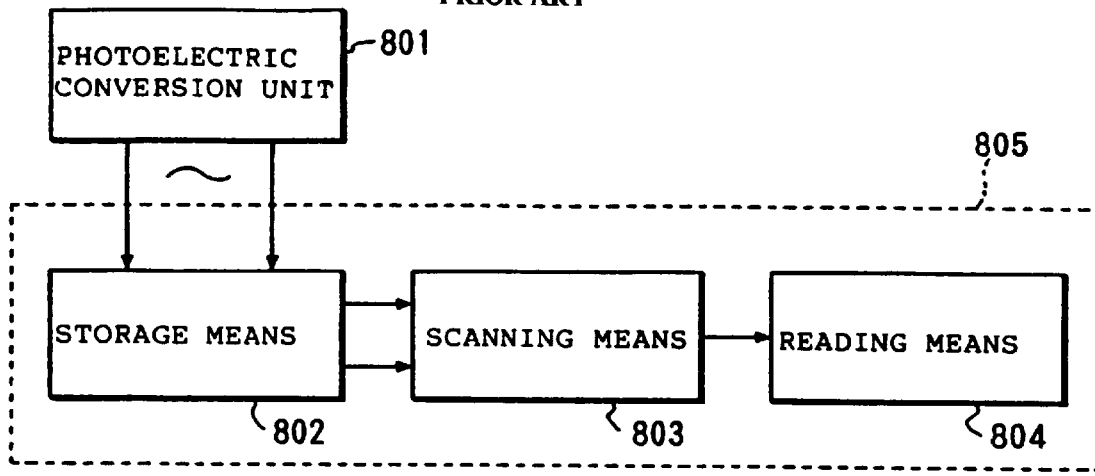
FIG. 36 is a block diagram showing an arrangement obtained when the present invention is applied to a photoelectric conversion apparatus having a conventional arrangement.

FIG. 36 is a block diagram showing an arrangement when the present invention is applied to a photoelectric conversion apparatus having a conventional arrangement.

In FIG. 36, reference numeral 801 denotes a photoelectric conversion unit according to the present invention, which comprises, e.g., a photoelectric conversion apparatus according to the present invention described in, e.g., Example 1 or 2. The photoelectric conversion unit 801 is connected to a signal output unit 805. In the signal output unit 805, reference numeral 802 denotes a storage means for storing signal charges generated by the photoelectric conversion means 801; 803, a scanning means for scanning the signal charges; and 804, a read means comprising, e.g., a circuit for amplifying or noise-compensating signal charges transferred from the scanning means 803. Note that the storage means 802 may be omitted although it is necessary when a storage operation is performed.

As described above, according to the photoelectric conversion apparatus shown in Examples 16 to 18 of the present invention, there can be provided a photoelectric conversion apparatus which is constituted in such a manner that a light absorption layer, having a forbidden bandwidth Eg1, for absorbing light, and a multiplication layer, obtained by stacking one or a plurality of layers having a stepback structure in which a forbidden bandwidth is continuously changed to have a minimum forbidden bandwidth Eg2 and a maximum forbidden bandwidth Eg3, for multiplying the carriers generated upon light absorption, are stacked to be sandwiched between electric charge injection blocking layers, wherein the forbidden bandwidth Eg1 of the light absorption layer is continuously changed from one electric charge injection layer side and is set to be substantially equal to the minimum forbidden bandwidth Eg2 of the multiplication layer at the multiplication layer side, so that various problems caused by band mismatching can be eliminated, and high-response characteristics equivalent to those of a photodiode having no multiplication layer can be obtained, and wherein the forbidden bandwidth Eg1 of the light absorption layer is set to particularly cope with light from an infrared region to an ultraviolet region to have a high sensitivity for light from the infrared region to the ultraviolet region.

When the number of layers of the stepback structure is selected, an amplification factor of 2 or more can be obtained, and noise can be further reduced.

When constituting elements of the photoelectric conversion apparatus of the present invention are formed of monocrystalline materials at least containing an Si atom, easy controllability of forbidden bandwidths and low-temperature formation of a multilayered structure can be assured, and various problems caused upon formation of the multilayered structure can be solved.

EXAMPLE 19

Example 19 of the present invention will be described below with reference to FIG. 37 and FIGS. 38A and 38B.

Figure 37:
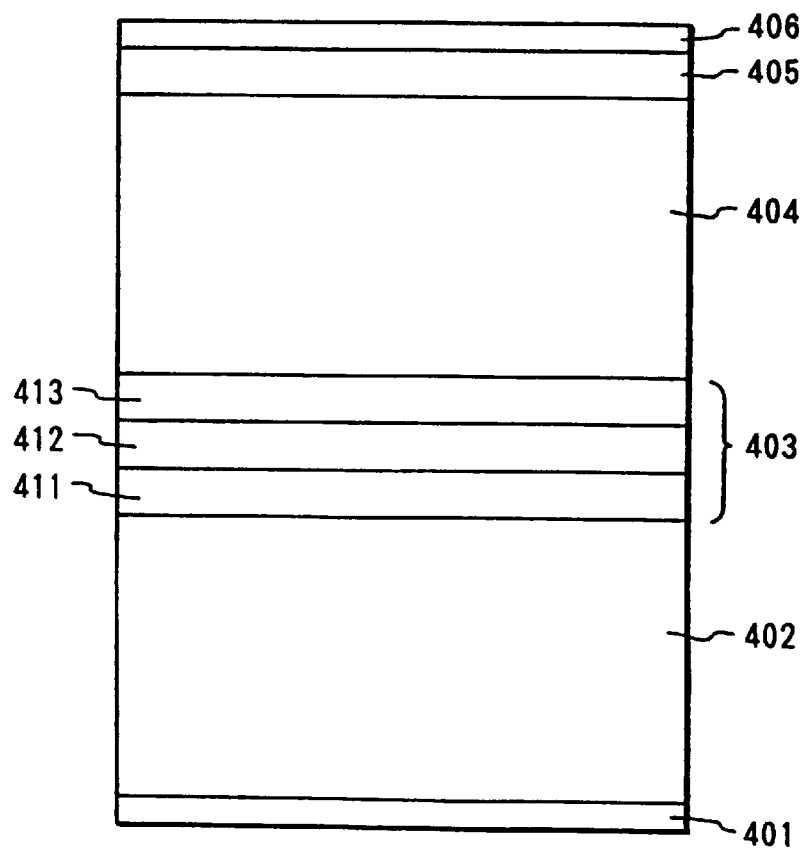
FIGS. 37 and 40A are schematic sectional views showing photoelectric conversion apparatuses according to other embodiments of the present invention.

FIG. 37 is a schematic longitudinal sectional view showing Example 1 of a photoelectric conversion unit of the present invention.

In FIG. 37, reference numeral 401 denotes an Al electrode; 402, an n-type C-Si substrate serving as a substrate having a function of blocking electron injection; 403, a multiplication region, whose composition is changed from a-$Si_{1-x}Ge_x$:H to a-$Si_{1-y}C_y$:H, for performing carrier multiplication; 404, a 2-μm thick a-Si:H light absorption layer for absorbing light and generating carriers; 405, a 100-Å thick p-type a-Si:H electric charge injection blocking layer for blocking electron injection; and 406, a transparent electrode containing indium oxide as a major component.

The Cr electrode 401 and the transparent electrode 406 were formed by EB evaporation, and amorphous layers, i.e., the multiplication region 403, the light absorption layer 404, and the electric charge injection blocking layer 405 were formed by plasma CVD. As source gases upon formation of amorphous layers, $SiH_4$, $GeH_4$, $CH_4$, and $H_2$ were used for the multiplication region 403, $SiH_4$ and $H_2$ gases were used for the light absorption layer 404, and $SiH_4$, $B_2H_6$, and $H_2$ gases were used for the electric charge injection blocking layer 405.

The multiplication region 403 comprises three layers, i.e., 200-Å thick composition change layers 411, 412, and 413 formed by continuously changing flow rates of $CH_4$ and $GeH_4$ gases of the source gases.

The photoelectric conversion apparatus of Example 1 shown in FIG. 2 is assumed to ideally have an energy band structure as shown in FIGS. 3A and 3B.

Figure 38A:
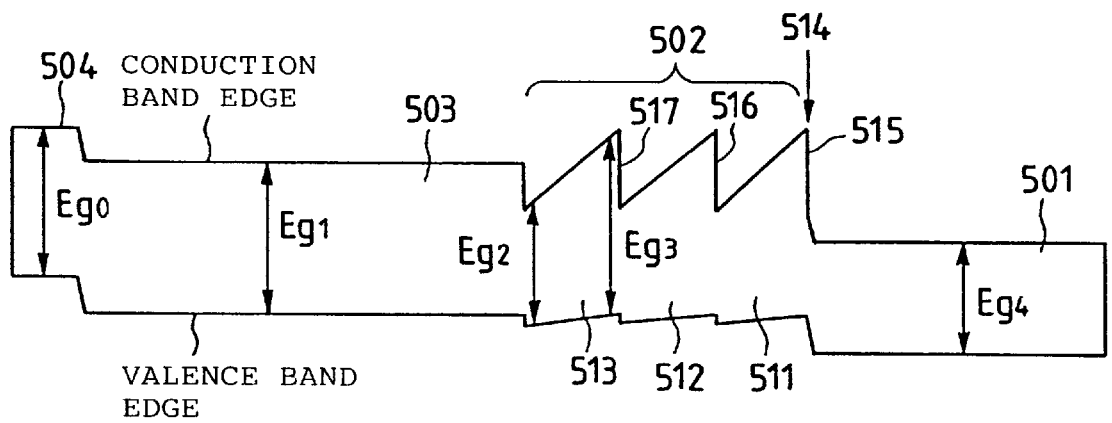
FIGS. 38A and 39A are energy band charts in a non-bias state.
Figure 38B:
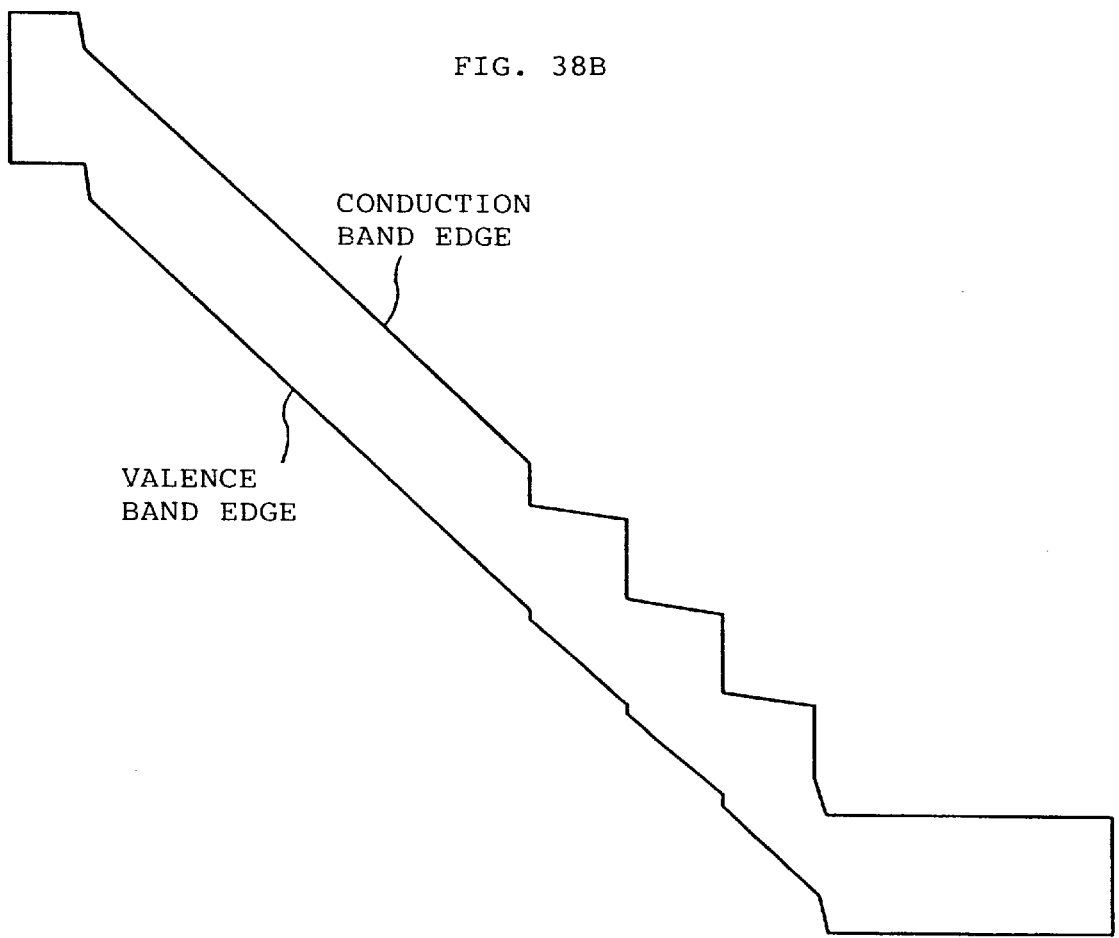
FIGS. 38B and 39B are energy band charts in a bias application state.

FIG. 38A is an energy band chart obtained when the photoelectric conversion apparatus of Example 19 is in a non-bias state, and FIG. 38B is an energy band chart obtained when the apparatus is applied with a bias to perform a carrier multiplication operation.

FIGS. 38A and 38B illustrate that an n-type C-Si substrate 501 has a forbidden bandwidth Eg4, a multiplication region 502 consisting of three layers, i.e., a-$Si_{1-x}Ge_x$:H to a-$Si_{1-y}C_y$:H composition change layers 511, 512, and 513 has a minimum forbidden bandwidth Eg2, and a maximum forbidden bandwidth Eg3, an a-Si:H layer 503 has a forbidden bandwidth Eg1, and a p-type a-Si:H layer 504 has a forbidden bandwidth Eg0.

In FIG. 38A, although energy discontinuous points are present at both conduction and valence band edges, there is almost no barrier due to energy discontinuity in a migration direction of carriers in a bias application state, as can be seen from FIG. 38B. Thus, carrier migration is not disturbed.

Of the composition change layers 511, 512, and 513, a layer giving the maximum forbidden bandwidth Eg3 was formed of a-$Si_{1-y}C_y$:H having a C composition ratio y of about 0.4, and Eg3 was also about 2.3 eV.

Of the composition change layers 511, 512, and 513, a layer giving the minimum forbidden bandwidth Eg2 was an a-$Si_{1-x}Ge_x$:H layer having a Ge composition ratio x of 0.6, and Eg2 was also about 1.3 eV. The forbidden bandwidths Eg1 and Eg0 of the a-Si:H layers 503 and 504 were about 1.8 eV.

The light absorption layer 503 had a light absorption coefficient of about $1\times10^5$ cm$^{-1}$ or more for light having a wavelength of 400 nm, and about $5\times10^3$ cm$^{-1}$ or more for light having a wavelength of 700 nm. Thus, the layer 503 could satisfactorily absorb visible region light.

A multiplication ratio of this apparatus was about 10 times or more upon application of a bias of 10 V.

The multiplication ratio was not changed even if a wavelength was changed for ultraviolet region light having a wavelength of 700 nm or less.

A leak current in a dark state was as low as 1 nA/cm$^2$ or less upon application of a bias of 10 V.

Furthermore, a light response speed was equivalent to that of a pin-type photoelectric conversion apparatus having no multiplication layer 502, and was high.

In this example, the multiplication region included three composition change layers. However, this is merely an example, and the number of layers may be arbitrarily determined according to a multiplication ratio to be obtained.

In this example, a structure wherein stepbacks are immediately changed is assumed as an ideal energy band chart. Even if the structure has moderate stepbacks, the same effects as described above can be obtained as long as they fall within a mean free path of electrons. Furthermore, if the structure has moderate stepbacks, an operation range can be assured.

In this example, each composition change layer has a thickness of about 200 Å, but may have a thickness within a range wherein carriers can migrate without being re-combined. In this case, each composition change layer preferably has a small thickness since an application bias can be lowered.

In this example, the light absorption layer has a thickness of about 2 µm, but may have a thickness which is large enough to allow light to pass therethrough but not to allow it to reach the multiplication layer. This thickness is determined by a light absorption coefficient.

Although $SiH_4$, $B_2H_6$, $PH_3$, $CH_4$, and $GeH_4$ were used as the source gases for the amorphous layers of this example, in place of $SiH_4$, a chain silane compound such as $SiF_4$, $Si_2H_6$, $Si_2F_6$, $Si_3H_8$, $SiH_3F$, $Si_2F_2$, or the like, or a cyclic silane compound such as $Si_5H_{10}$, $Si_6H_{12}$, $Si_4H_8$, or the like may be used, in place of $B_2H_6$, a gas containing a Group III atom such as B (boron), Al (aluminum), In (indium), Tl (thallium), or the like may be used, in place of $PH_3$, a gas containing a Group IV atom such as P (phosphorus), As (arsenic), Sb (antimony), Bi (bismuth), or the like may be used, in place of $CH_4$, a carbon compound such as $CH_2F_2$, $C_2H_6$, $C_2H_4$, $C_2H_2$, $Si(CH_3)_4$, $SiH(CH_3)_3$, or the like, a nitrogen compound such as $N_2$, $NH_3$, $H_2NNH_2$, $HN_3NH_4N_3$, $F_3N$, $F_4N$, or the like, or an oxygen compound such as $O_2$, $CO_2$, NO, $NO_2$, $N_2O$, $O_3$, $N_2O_3$, $N_2O_4$, $NO_3$, or the like may be used, and in place of $GeH_4$, a germanium compound such as $GeF_4$, or a tin compound such as $SnH_4$ may be used.

Furthermore, a composition ratio of each composition change layer preferably falls within a range of 0 to about 0.6 to eliminate a local level.

Upon formation of the amorphous layers, an ECR plasma method may be employed in place of a plasma CVD method.

In this example, semiconductor layers comprise amorphous layers, but may comprise non-monocrystalline layers such as polycrystalline layers.

In this example, light is incident from the p-type electric charge injection blocking layer side, and a multiplication operation is caused by electrons. However, the p- and n-type electric charge injection blocking layers may be replaced with each other, so that the stepback structure is formed at the valence band side of the multiplication region. Thus, light may be incident from the n-type electric charge injection blocking layer side to cause a multiplication operation by holes.

The forbidden bandwidth Eg2 of the light absorption layer is about 1.8 to 2.3 eV. An $H_2$ gas flow rate may be changed to control Eg2, so that desired spectral sensitivity characteristics can be obtained.

The forbidden bandwidths and doping amounts of the electric charge injection blocking layers (both the p- and n-type layers) need only be adjusted to suppress injection of minority carriers from the corresponding electrodes and not to disturb migration of majority carriers.

EXAMPLE 20

Example 20 will be described below with reference to FIG. 39.

Figure 39:
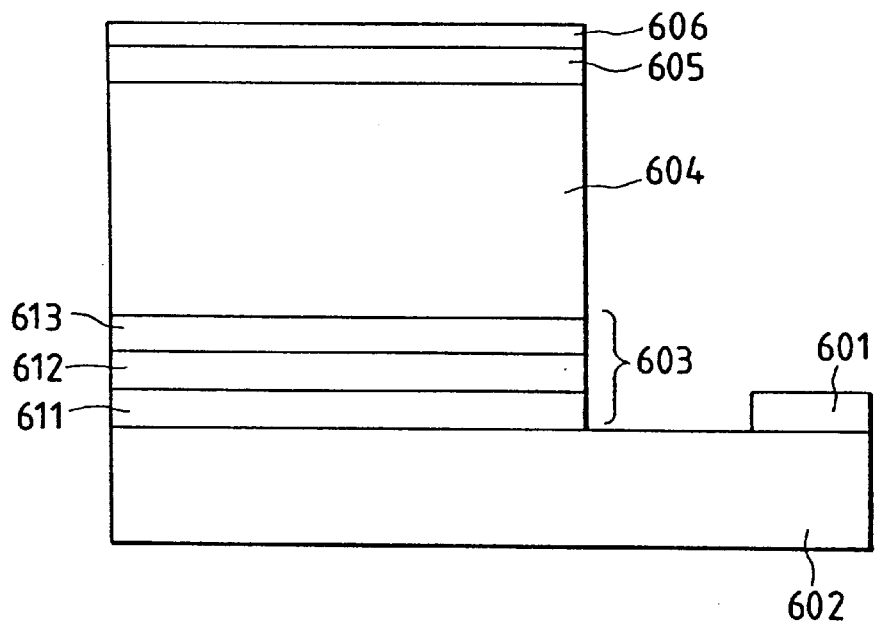

FIG. 39 is a schematic longitudinal sectional view showing a photoelectric conversion unit of Example 20 of the photoelectric conversion apparatus according to the present invention.

FIG. 39 is substantially the same as FIG. 2, except that reference numeral 602 denotes an n-type poly-Si layer formed by a low pressure CVD method, and having a function of blocking electron injection, and in FIG. 39, reference numeral 601 denotes an Al electrode; 603, a multiplication region, which consists of three layers 611, 612, and 613 whose compositions are changed from a-$Si_{1-x}Ge_x$:H to a-$Si_{1-y}C_y$:H, for performing carrier multiplication; 604, a 2-µm thick a-Si:H light absorption layer for absorbing light and generating carriers; 605, a 100-Å thick p-type a-Si:H electric charge injection blocking layer for blocking electron injection; and 606, a transparent electrode containing indium oxide as a major component.

A multiplication ratio of this apparatus was about 10 times or more upon application of a bias of 10 V.

The multiplication ratio was not changed even if a wavelength was changed for ultraviolet region light having a wavelength of 400 nm or less.

A leak current in a dark state was as low as 0.1 nA/cm$^2$ or less upon application of a bias of 10 V.

Furthermore, a light response speed was equivalent to that of a pin-type photoelectric conversion apparatus having no multiplication layer 602, and was high.

The overall structure and operation of the photoelectric conversion apparatus of the present invention will be described below.

In this example to be described below, a photoelectric conversion unit described in Example 1 is stacked on a scanning circuit and a read circuit already proposed in Japanese Laid-Open Patent Application No. 63-278269 by the present inventors.

Figure 40A:
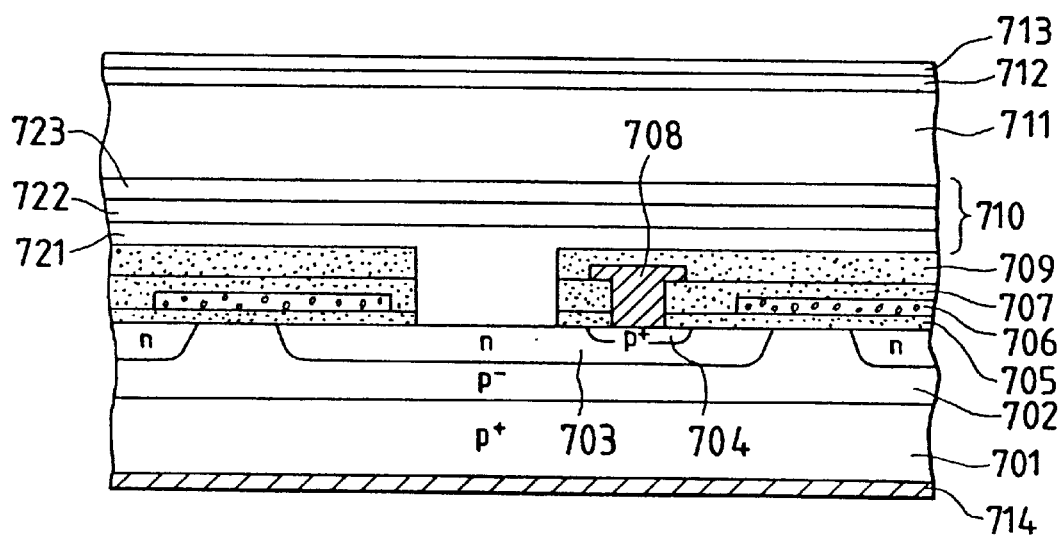
Figure 40B:
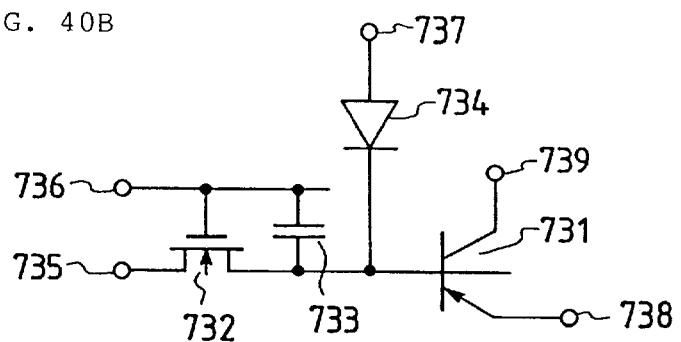
FIGS. 40B and 40C are circuit diagrams showing photoelectric conversion apparatuses according to other embodiments of the present invention.
Figure 40C:
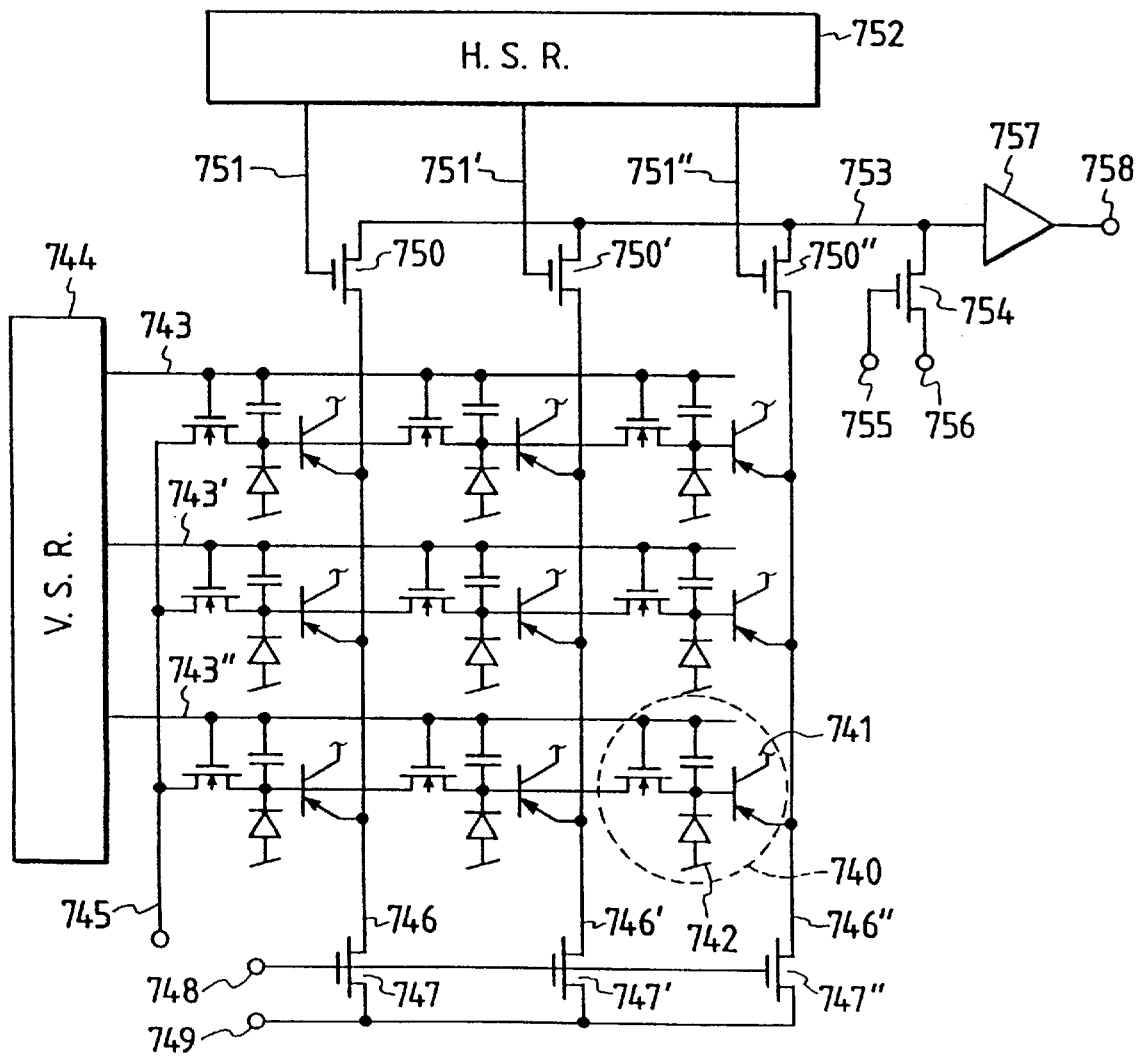

FIG. 40A is a schematic sectional view of a structure near a light-receiving unit of the example of the photoelectric conversion apparatus of the present invention, FIG. 40B is an equivalent circuit diagram of one pixel, and FIG. 40C is an equivalent circuit diagram and a block diagram of the overall apparatus.

In FIG. 40A, a p$^-$-type layer 702 serving as a collector region is epitaxially grown on a p-type silicon substrate 701, and an n-type base region 703 and a p$^+$-type emitter region 704 are formed in the layer 702, thus constituting a bipolar transistor.

The n-type base region 703 is isolated from adjacent pixels, and a gate electrode 706 is formed between horizontally adjacent n-type base regions to sandwich an oxide film 705 therebetween. Therefore, an n-channel MOS transistor is formed to have the adjacent n-type base regions 703 as source and drain regions. The gate electrode 706 also serves as a capacitor for controlling a potential of the n-type base region 703.

After an insulating layer 707 is formed, an emitter electrode 708 is formed.

Thereafter, an insulating layer 709 is formed, and then, a-$Si_{1-x}Ge_x$:H to a-$Si_{1-y}C_y$:H composition change layers 721, 722, and 723 are formed to constitute a multiplication region 710. Then, an a-Si:H light absorption layer 711 is formed, a p-type a-Si:H layer 712 is formed, and a transparent electrode 713 for applying a bias voltage to a sensor is formed.

A collector electrode 714 is in ohmic-contact with the lower surface of the substrate 701.

Therefore, an equivalent circuit for one pixel is expressed by a crystalline silicon bipolar transistor 731, the base of which is connected to an n-channel MOS transistor 732, a capacitor 733, and a photoelectric conversion apparatus 734 which is the same as that in Example 1, a terminal 735 for applying a potential to the base, a terminal 736 for driving the n-channel MOS transistor 732 and the capacitor 733, a sensor electrode 737, an emitter electrode 738, and a collector electrode 739, as shown in FIG. 40B.

FIG. 40C is a circuit diagram showing a 3×3 two-dimensional matrix of pixel cells 740 shown in FIGS. 40A and 40B.

In FIG. 40C, a collector electrode 741 of each pixel cell 740 is arranged for all the pixels, and a sensor electrode 742 is also arranged for all the pixels. The gate electrodes and the capacitor electrodes of the n-channel MOS transistors are connected to driving lines 743, 743', and 743" in units of rows, and are connected to a vertical shift register (V.S.R) 744. The emitter electrodes are connected to vertical lines 746, 746', and 746" for reading out signals in units of columns. The vertical lines 746, 746', and 746" are connected to switches 747, 747', and 747" for resetting electric charges on the vertical lines, and read switches 750, 750', and 750", respectively. The gate electrodes of the reset switches 747, 747', and 747" are commonly connected to a terminal 748 for applying a vertical line reset pulse, and their source electrodes are commonly connected to a terminal 749 for applying a vertical line reset voltage. The gate electrodes of the read switches 750, 750', and 750" are connected to a horizontal shift register (H.S.R) via lines 751, 751', and 751", respectively, and their drain electrodes are connected to an output amplifier 757 via a horizontal read line 753. The horizontal read line 753 is connected to a switch 754 for resetting electric charges on the horizontal read line.

The reset switch 754 is connected to a terminal 755 for applying a horizontal line reset pulse and a terminal 756 for applying a horizontal line reset voltage.

Finally, an output from the amplifier 757 is extracted from a terminal 758.

An operation will be briefly described below with reference to FIGS. 40A to 40C.

Incident light is absorbed by the light absorption layer 714 shown in FIG. 40A, and generated carriers are multiplied by the multiplication region 713 and are stored in the base region 703.

When a negative drive pulse output from the V.S.R. shown in FIG. 40C appears on the driving line 743, a base potential is decreased through the capacitor, and signal charges according to a light amount are output from the pixels in the first row onto the vertical lines 746, 746', and 746".

When scanning pulses are sequentially output from the H.S.R. 752 onto the lines 751, 751', and 751", the switches 750, 750', and 750" are sequentially ON/OFF-controlled, and signals are output to the output terminal 758 via the amplifier 757. In this case, the reset switch 754 is set in an ON state while the switches 750, 750', and 750" are sequentially turned on, thus removing residual charges from the horizontal line 753.

The vertical line reset switches 747, 747', and 747" are sequentially turned on to remove residual charges from the vertical lines 746, 746', and 746". When the V.S.R. 744 applies a negative pulse to the driving line 743, the n-channel MOS transistors of the pixels in the first row are turned on, and base residual charges of these pixels are removed, thus initializing the pixels.

Then, a drive pulse output from the V.S.R. 744 appears on the driving line 743', and signal charges of pixels in the second row are similarly output.

An output operation of signal charges of pixels in the third row is performed in the same manner as described above.

The apparatus of this example is operated by repeating the above-mentioned operations.

In the example described above, a circuit invented by the present inventors has been exemplified. However, the present invention may be applied to a conventional photoelectric conversion apparatus.

A case will be described below wherein the present invention is applied to a photoelectric conversion apparatus having a conventional arrangement.

Figure 41:
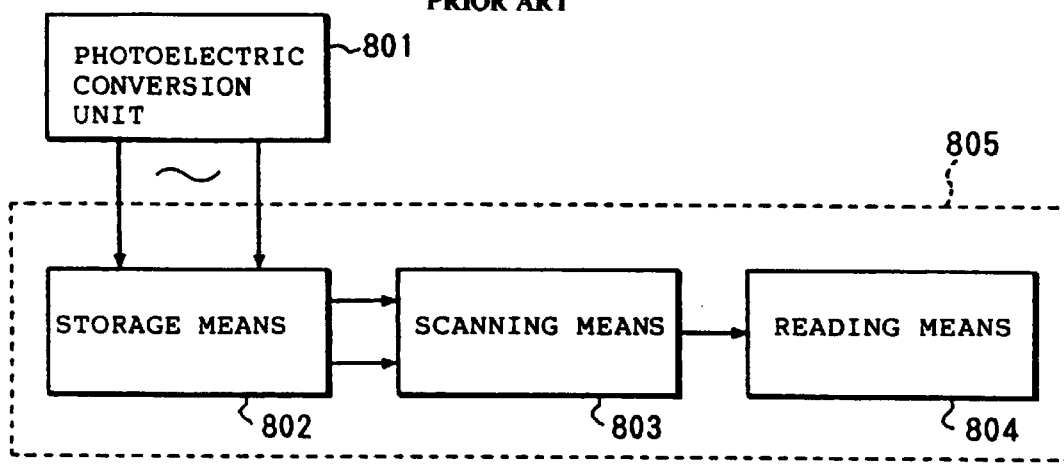
FIG. 41 is a block diagram showing an arrangement obtained when the present invention is applied to a photoelectric conversion apparatus having a conventional arrangement.

FIG. 41 is a block diagram showing an arrangement when the present invention is applied to a photoelectric conversion apparatus having a conventional arrangement.

In FIG. 41, reference numeral 801 denotes a photoelectric conversion unit according to the present invention, which comprises, e.g., a photoelectric conversion apparatus according to the present invention described in, e.g., Example 1 or 2. The photoelectric conversion unit 801 is connected to a signal output unit 805. In the signal output unit 805, reference numeral 802 denotes a storage means for storing signal charges generated by the photoelectric conversion means 801; 803, a scanning means for scanning the signal charges; and 804, a read means comprising, e.g., a circuit for amplifying or noise-compensating signal charges transferred from the scanning means 803. Note that the storage means 802 may be omitted although it is necessary when a storage operation is performed.

As described above, according to the photoelectric conversion apparatus described in Examples 19 and 20 of the present invention, there can be provided a photoelectric conversion apparatus which comprises a plurality of photoelectric conversion units, and a signal output unit comprising at least one of storage means for storing an electrical signal generated by the photoelectric conversion units, scanning means for scanning the electrical signal generated by the photoelectric conversion units, and reading means for reading out the electrical signal generated by the photoelectric conversion units, wherein each photoelectric conversion unit is constituted in such a manner that a light absorption layer for absorbing light, and a multiplication layer, obtained by stacking one or a plurality of layers having a stepback structure in which a forbidden bandwidth is continuously changed to have a minimum forbidden bandwidth Eg2 and a maximum forbidden bandwidth Eg3, for multiplying the carriers generated upon light absorption, are stacked to be sandwiched between an electric charge injection blocking layer stacked on the light absorption layer and a substrate on which the signal output unit is formed, and which has an electric charge injection blocking function. Thus, the substrate having the electric charge injection blocking function on the multiplication layer side is formed by patterning in advance, and need not be subjected to element isolation by, e.g., reactive ion etching. Therefore, there can be provided a photoelectric conversion apparatus in which problems on processes caused by, e.g., the reactive ion etching can be eliminated, and which can suppress an increase in leakage of a dark current caused by element isolation, has high-speed response characteristics, low noise, and a high sensitivity, can cope with light in various wavelength ranges, and can easily attain a large-area structure.

EXAMPLE 21

Example 1 of the present invention will be described below with reference to FIG. 42 and FIGS. 43A and 43B.

Figure 42:
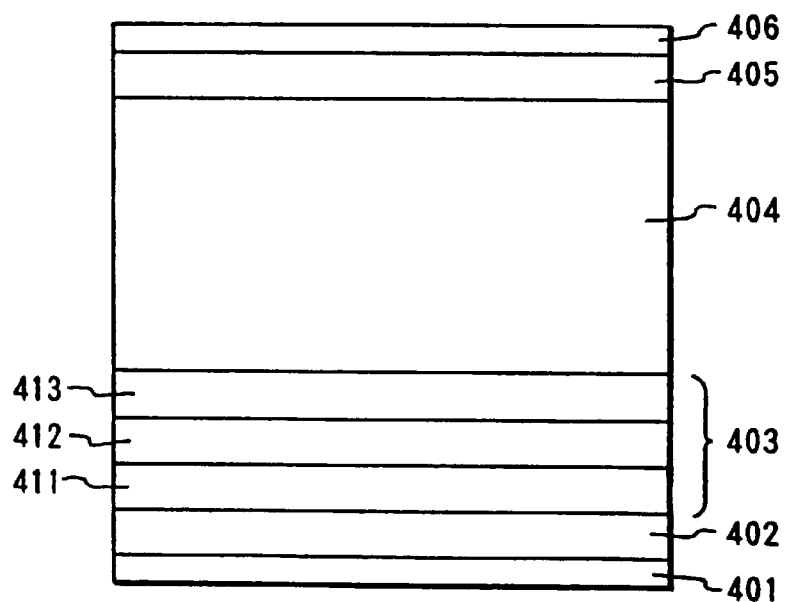
FIGS. 42 and 45A are schematic sectional views showing photoelectric conversion apparatuses according to other embodiments of the present invention.

FIG. 42 is a schematic longitudinal sectional view showing Example 1 of a photoelectric conversion apparatus of the present invention.

In FIG. 42, reference numeral 401 denotes a Cr electrode; 402, a 500-Å thick n-type a-$Si_{1-x}Ge_x$:H electric charge injection blocking layer for blocking hole injection; 403, a multiplication region, whose composition is changed from a-$Si_{1-x}Ge_x$:H to a-$Si_{1-y}C_y$:H, for performing carrier multiplication; 404, a 2-$\mu$m thick a-Si:H light absorption layer for absorbing light and generating carriers; 405, a 100-Å thick p-type a-Si:H electric charge injection blocking layer for blocking electron injection; and 406, a transparent electrode containing indium oxide as a major component.

The Cr electrode 401 and the transparent electrode 406 were formed by EB evaporation, and amorphous layers, i.e., the electric charge injection blocking layer 402, the multiplication region 403, the light absorption layer 404, and the electric charge injection blocking layer 405 were formed by plasma CVD. As source gases upon formation of amorphous layers, $SiH_4$, $GeH_4$, $PH_3$, and $H_2$ gases were used for the electric charge injection blocking layer 402, $SiH_4$, $GeH_4$, $CH_4$, and $H_2$ were used for the multiplication region 403, $SiH_4$ and $H_2$ gases were used for the light absorption layer 404, and $SiH_4$, $B_2H_6$, and $H_2$ gases were used for the electric charge injection blocking layer 405.

The multiplication region 403 comprises three layers, i.e., 200-Å thick composition change layers 411, 412, and 413 formed by continuously changing flow rates of $CH_4$ and $GeH_4$ gases of the source gases.

Figure 43A:
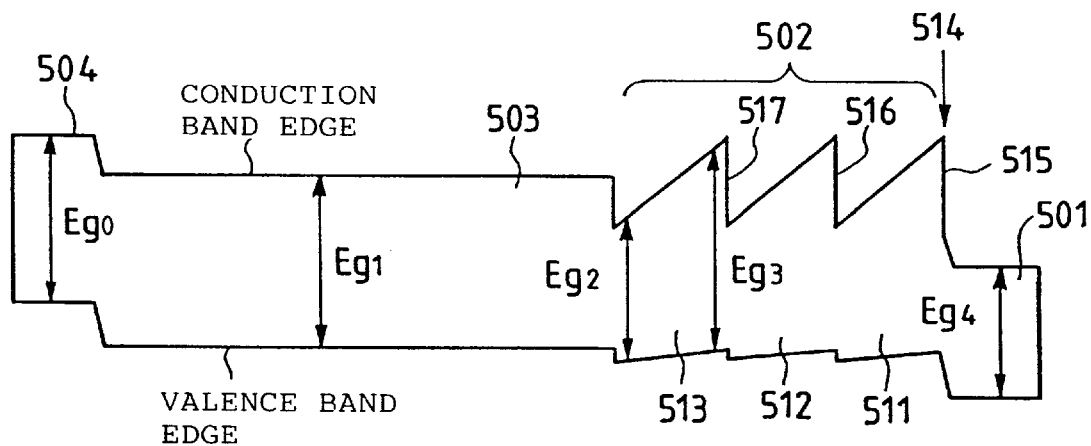
FIGS. 43A and 44A are energy band charts in a non-bias state.
Figure 43B:
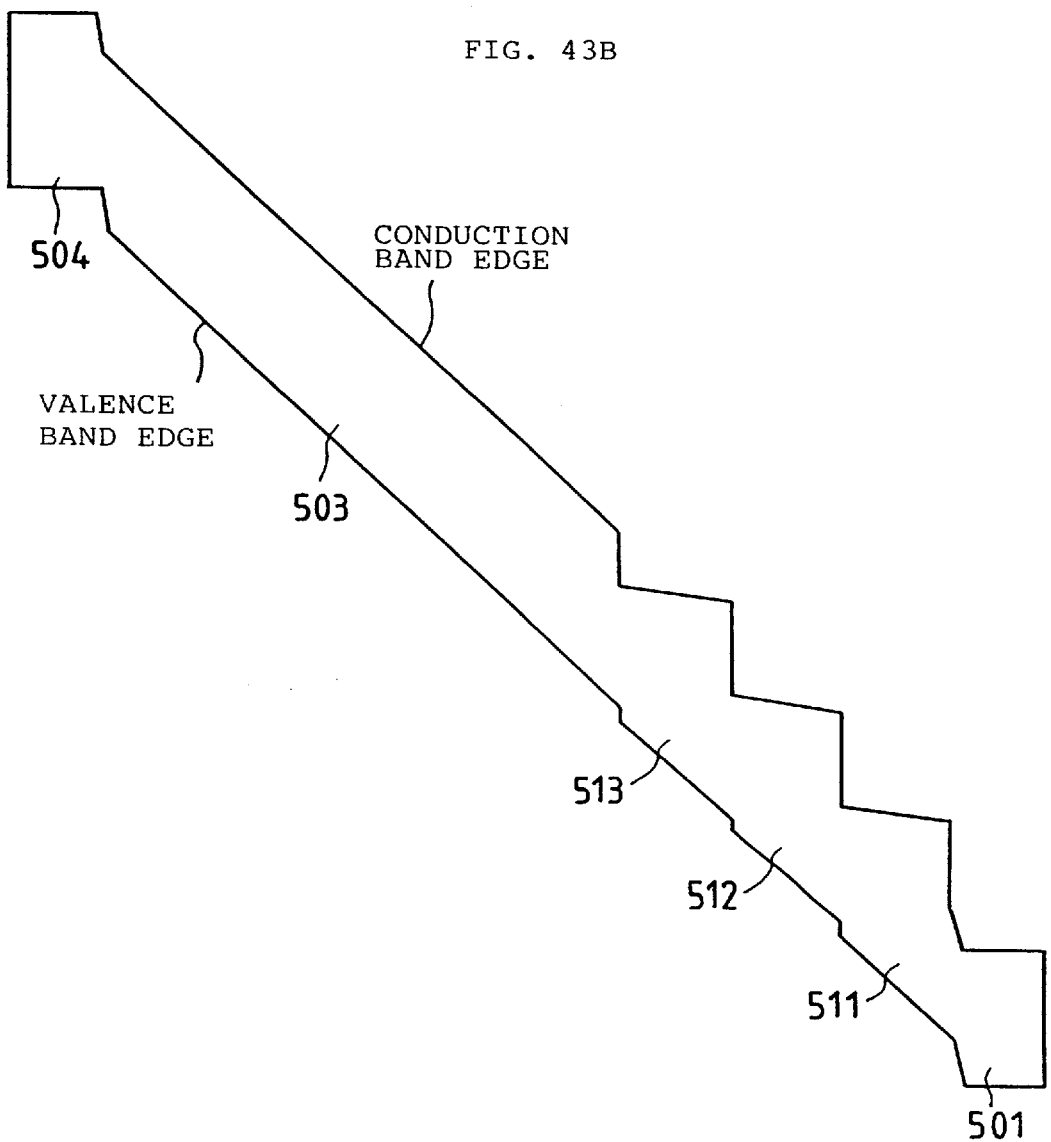
FIGS. 43B and 44B are energy band charts in a bias application state.

The photoelectric conversion apparatus of Example 21 shown in FIG. 42 is assumed to ideally have an energy band structure as shown in FIGS. 43A and 43B.

FIG. 43A is an energy band chart obtained when the photoelectric conversion apparatus of Example 1 is in a non-bias state, and FIG. 43B is an energy band chart obtained when the apparatus is applied with a bias to perform a carrier multiplication operation.

FIGS. 43A and 43B illustrate that an n-type a-$Si_{1-x}Ge_x$:H layer 501 has a forbidden bandwidth Eg4, a multiplication region 502 consisting of three layers, i.e., a-$Si_{1-x}Ge_x$:H to a-$Si_{1-y}C_y$:H composition change layers 511, 512, and 513 has a minimum forbidden bandwidth Eg2, and a maximum forbidden bandwidth Eg3, an a-Si:H layer 503 has a forbidden bandwidth Eg1, and a p-type a-Si:H layer 504 has a forbidden bandwidth Eg0.

In FIG. 43A, although energy discontinuous points are present at both conduction and valence band edges, there is almost no barrier due to energy discontinuity in a migration direction of carriers in a bias application state, as can be seen from FIG. 43B. Thus, carrier migration is not disturbed.

A layer giving the maximum forbidden bandwidth Eg3 of the composition change layers 511, 512, and 513 was a-$Si_{1-y}C_y$:H having a C composition ratio y of about 0.4, and its Eg3 was about 2.3 eV.

A Ge composition ratio x of the a-$Si_{1-x}Ge_x$:H layer 501 was about 0.6, and the forbidden bandwidth Eg4 was about 1.3 eV. Of the composition change layers 511, 512, and 513, a layer giving the minimum forbidden bandwidth Eg2 was also a-$Si_{1-x}Ge_x$:H, and Eg2 was also about 1.3 eV. The forbidden bandwidths Eg1 and Eg0 of the a-Si:H layers 503 and 504 were about 1.8 eV.

The light absorption layer 503 had a light absorption coefficient of about $1\times10^5$ cm$^{-1}$ or more for light having a wavelength of 400 nm, and about $5\times10^3$ cm$^{-1}$ or more for light having a wavelength of 700 nm. Thus, the layer 503 could satisfactorily absorb visible region light.

A multiplication ratio of this apparatus was about 10 times or more upon application of a bias of 10 V.

The multiplication ratio was not changed even if a wavelength was changed for ultraviolet region light having a wavelength of 700 nm or less.

A leak current in a dark state was as low as 1 nA/cm$^2$ or less upon application of a bias of 10 V.

Furthermore, a light response speed was equivalent to that of a pin-type photoelectric conversion apparatus having no multiplication layer 502, and was high.

In this example, the multiplication region included three composition change layers. However, this is merely an example, and the number of layers may be arbitrarily determined according to a multiplication ratio to be obtained.

In this example, a structure wherein stepbacks are immediately changed is assumed as an ideal energy band chart. Even if the structure has moderate stepbacks, the same effects as described above can be obtained as long as they fall within a mean free path of electrons. Furthermore, if the structure has moderate stepbacks, an operation range can be assured.

In this example, each composition change layer (stepback layer) has a thickness of about 200 Å, but may have a thickness within a range wherein carriers can migrate without being re-combined. In this case, each composition change layer preferably has a small thickness since an application bias can be lowered.

In this example, the light absorption layer has a thickness of about 2 $\mu$m, but may have a thickness which is large enough to allow light to pass therethrough but not to allow it to reach the multiplication layer. This thickness is determined by a light absorption coefficient.

Although $SiH_4$, $B_2H_6$, $PH_3$, $CH_4$, and $GeH_4$ were used as the source gases for the amorphous layers of this example, in place of $SiH_4$, a chain silane compound such as $SiF_4$, $Si_2H_6$, $Si_2F_6$, $Si_3H_8$, $SiH_3F$, $Si_2F_2$, or the like, or a cyclic silane compound such as $Si_5H_{10}$, $Si_6H_{12}$, $Si_4H_8$, or the like may be used, in place of $B_2H_6$, a gas containing a Group III atom such as B (boron), Al (aluminum), In (indium), Tl (thallium), or the like may be used, in place of $PH_3$, a gas containing a Group IV atom such as P (phosphorus), As (arsenic), Sb (antimony), Bi (bismuth), or the like may be used, in place of $CH_4$, a carbon compound such as $CH_2F_2$, $C_2H_6$, $C_2H_4$, $C_2H_2$, $Si(CH_3)_4$, $SiH(CH_3)_3$, or the like, a nitrogen compound such as $N_2$, $NH_3$, $H_2NNH_2$, $HN_3NH_4N_3$, $F_3N$, $F_4N$, or the like, or an oxygen compound such as $O_2$, $CO_2$, NO, $NO_2$, $N_2O$, $O_3$, $N_2O_3$, $N_2O_4$, $NO_3$, or the like may be used, and in place of $GeH_4$, a germanium compound such as $GeF_4$, or a tin compound such as $SnH_4$ may be used.

Furthermore, a composition ratio of each composition change layer preferably falls within a range of 0 to about 0.6 to eliminate a local level.

Upon formation of the amorphous layers, an ECR plasma method may be employed in place of a plasma CVD method.

In this example, semiconductor layers comprise amorphous layers, but may comprise non-monocrystalline layers such as polycrystalline layers.

In this example, light is incident from the p-type electric charge injection blocking layer side, and a multiplication operation is caused by electrons. However, the p- and n-type electric charge injection blocking layers may be replaced with each other, so that the stepback structure is formed at the valence band side of the multiplication region. Thus, light may be incident from the n-type electric charge injection blocking layer side to cause a multiplication operation by holes.

The forbidden bandwidth Eg2 of the light absorption layer is about 1.8 eV. An $H_2$ gas flow rate may be changed to control Eg2, so that desired spectral sensitivity characteristics can be obtained.

The forbidden bandwidths and doping amounts of the electric charge injection blocking layers (both the p- and n-type layers) need only be adjusted to suppress injection of minority carriers from the corresponding electrodes and not to disturb migration of majority carriers.

EXAMPLE 22

Example 22 of the present invention will be described below with reference to FIGS. 44A and 44B.

Figure 44A:
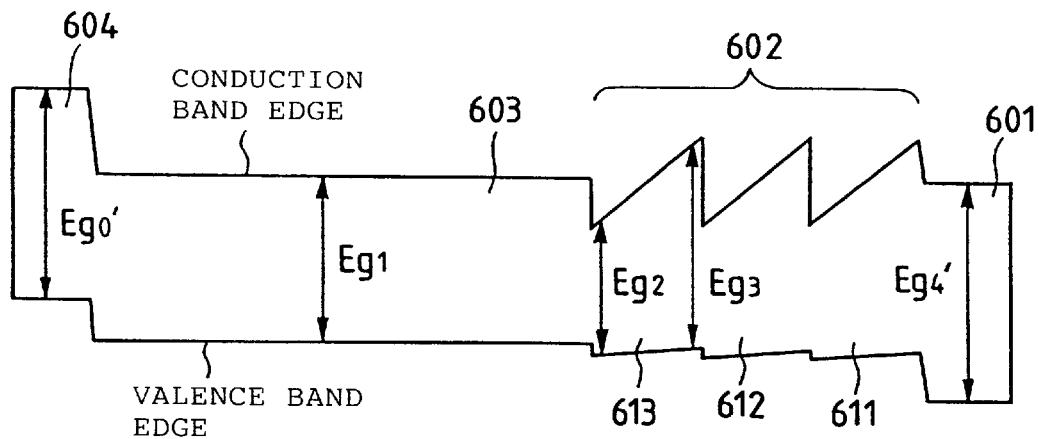
Figure 44B:
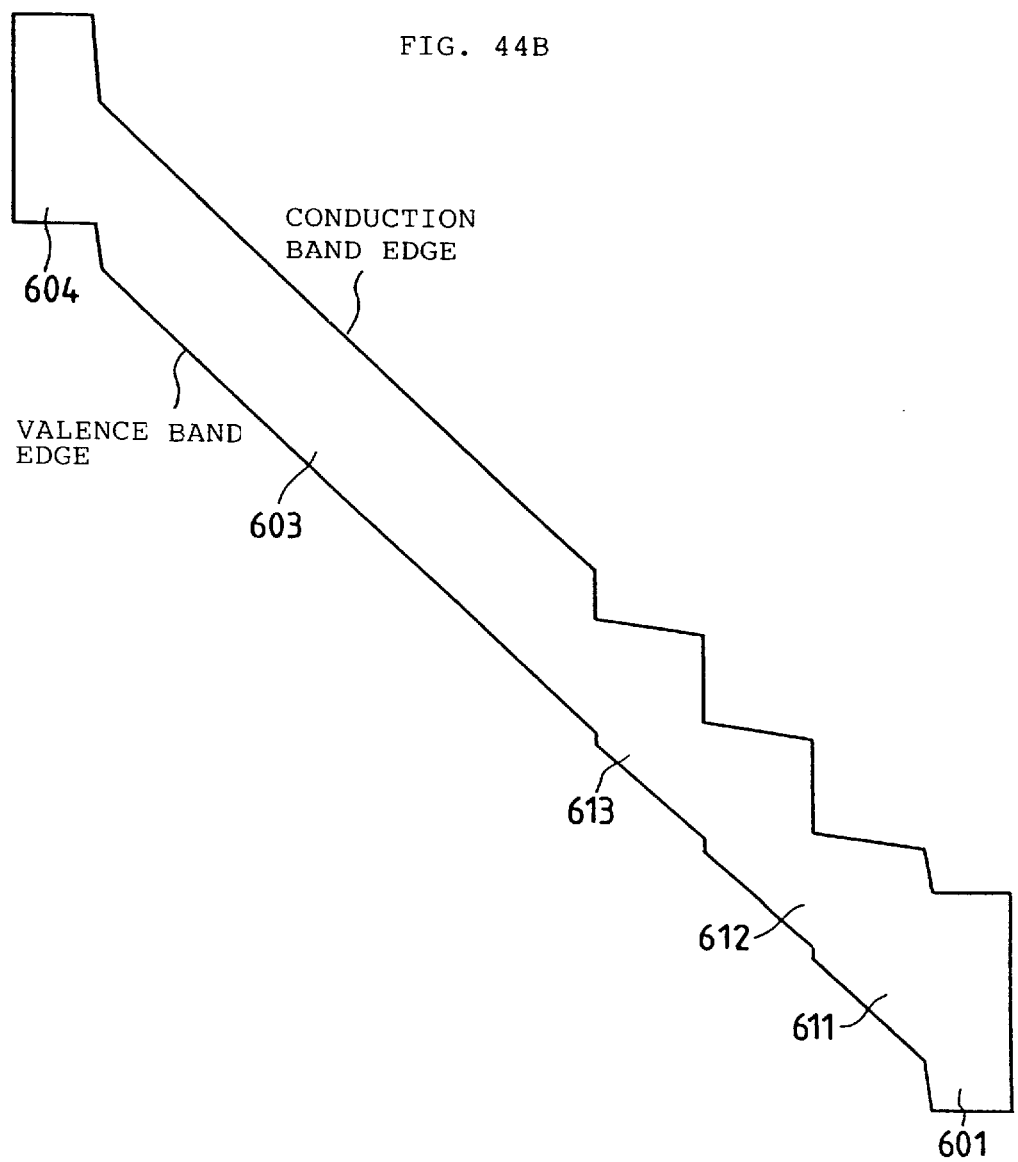

FIGS. 44A and 44B are ideally assumed energy band charts of Example 22 of the present invention.

FIG. 44A is an energy band chart obtained when the photoelectric conversion apparatus of Example 22 is in a non-bias state, and FIG. 44B is an energy band chart obtained when the apparatus is applied with a bias to perform a carrier multiplication operation.

FIG. 44A is substantially the same as FIG. 3A, except that 601 denotes an n-type a-$Si_{1-y}C_y$:H layer having a forbidden bandwidth Eg4'; and 604, a p-type a-$Si_{1-y}C_y$:H layer having a forbidden bandwidth Eg0', and illustrates that a multiplication region 602 consisting of three layers, i.e., a-$Si_{1-x}Ge_x$:H to a-$Si_{1-x}C_x$:H composition change layers 611, 612, and 613 has a minimum forbidden bandwidth Eg2, and a maximum forbidden bandwidth Eg3, and an a-Si:H layer 603 has a forbidden bandwidth Eg1.

A multiplication ratio of this apparatus was about 10 times or more upon application of a bias of 10 V.

The multiplication ratio was not changed even if a wavelength was changed for ultraviolet region light having a wavelength of 700 nm or less.

A leak current in a dark state was as low as 0.1 nA/cm² or less upon application of a bias of 10 V.

Furthermore, a light response speed was equivalent to that of a pin-type photoelectric conversion apparatus having no multiplication layer 602, and was high.

In this example, a structure wherein stepbacks are immediately changed is assumed as an ideal energy band chart. Even if the structure has moderate stepbacks, the same effects as described above can be obtained as long as they fall within a mean free path of electrons. Furthermore, if the structure has moderate stepbacks, a degree of freedom upon selection of materials can be increased.

EXAMPLE 23

In this example, a photoelectric conversion apparatus described in Example 21 is stacked on a scanning circuit and a read circuit already proposed in Japanese Laid-Open Patent Application No. 63-278269 by the present inventors.

Figure 45A:
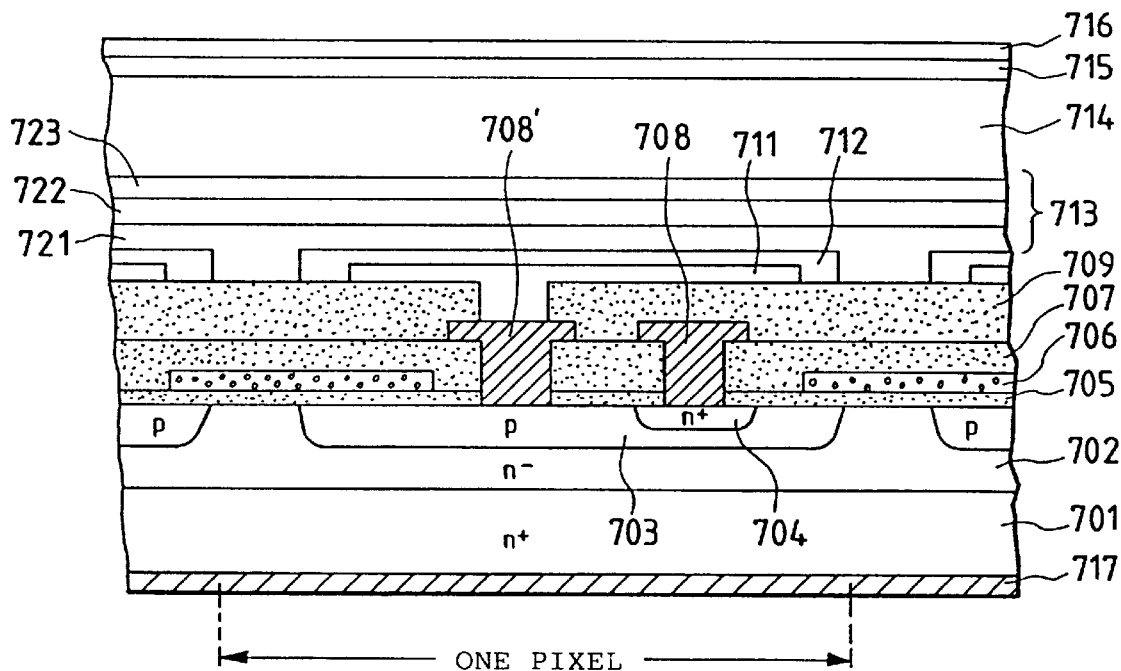
Figure 45B:
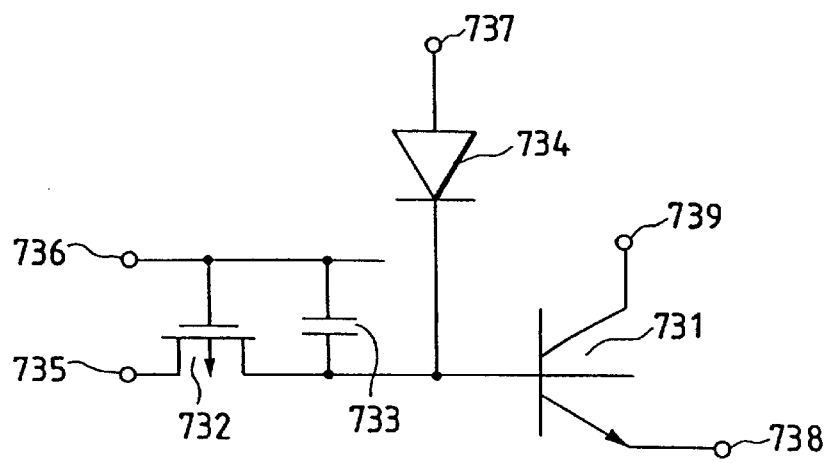
FIGS. 45B and 45C are circuit diagrams showing photoelectric conversion apparatuses according to other embodiments of the present invention.
Figure 45C:
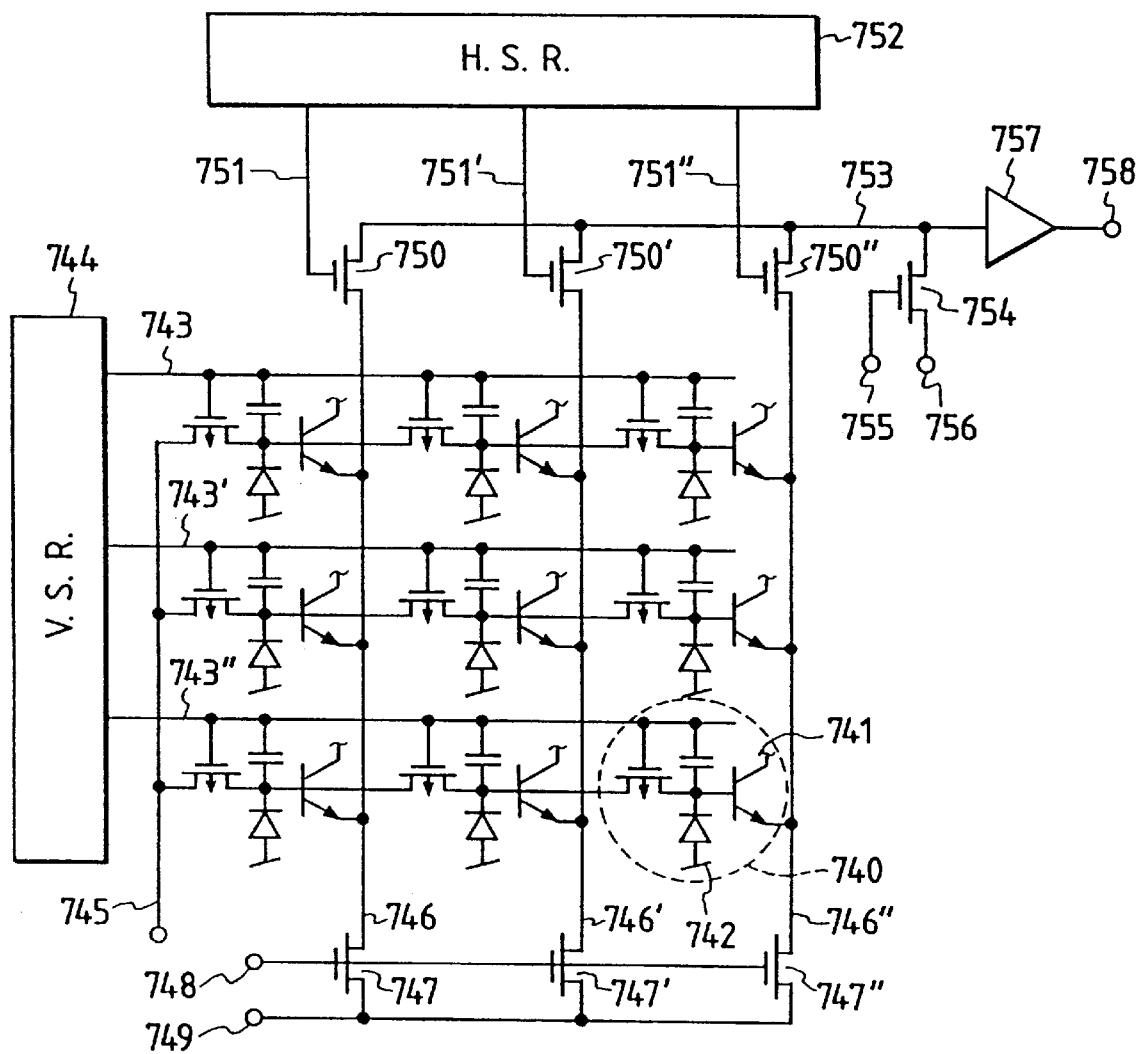

FIG. 45A is a schematic sectional view of a structure near a light-receiving unit of the example of the present invention, FIG. 45B is an equivalent circuit diagram of one pixel, and FIG. 45C is an equivalent circuit diagram and a block diagram of the overall apparatus.

In FIG. 45A, an n⁻-type layer 702 serving as a collector region is epitaxially grown on an n-type silicon substrate 701, and a p-type base region 703 and an n⁺-type emitter region 704 are formed in the layer 702, thus constituting a bipolar transistor.

The p-type base region 703 is isolated from adjacent pixels, and a gate electrode 706 is formed between horizontally adjacent p-type base regions to sandwich an oxide film 705 therebetween. Therefore, a p-channel MOS transistor is formed to have the adjacent p-type base regions 703 as source and drain regions. The gate electrode 706 also serves as a capacitor for controlling a potential of the p-type base region 703.

After an insulating layer 707 is formed, an emitter electrode 708 and a base electrode 708' are formed.

Thereafter, an insulating layer 709 is formed, and then, an electrode 711 is formed. The resultant structure is isolated in units of pixels. The electrode 711 is electrically connected to the electrode 708'. Furthermore, an n-type a-$Si_{1-y}Ge_y$:H layer 712 is formed, and is isolated in units of pixels.

Subsequently, a-$Si_{1-x}Ge_x$:H to a-$Si_{1-y}C_y$:H composition change layers 721, 722, and 723 are formed to constitute a multiplication region 713. Then, an a-Si:H light absorption layer 714 is formed, a p-type a-Si:H layer 715 is formed, and a transparent electrode 716 for applying a bias voltage to a sensor is formed.

A collector electrode 717 is in ohmic-contact with the lower surface of the substrate 701.

Therefore, an equivalent circuit for one pixel is expressed by a crystalline silicon bipolar transistor 731, the base of which is connected to a p-channel MOS transistor 732, a capacitor 733, and a photoelectric conversion apparatus 734 which is the same as that in Example 1, a terminal 735 for applying a potential to the base, a terminal 736 for driving the p-channel MOS transistor 732 and the capacitor 733, a sensor electrode 737, an emitter electrode 738, and a collector electrode 739, as shown in FIG. 45B.

FIG. 45C is a circuit diagram showing a 3×3 two-dimensional matrix of pixel cells 740 shown in FIGS. 45A and 45B.

In FIG. 45C, a collector electrode 741 of each pixel cell 740 is arranged for all the pixels, and a sensor electrode 742 is also arranged for all the pixels. The gate electrodes and the capacitor electrodes of the p-channel OS transistors are connected to driving lines 743, 743', and 743" in units of rows, and are connected to a vertical shift register (V.S.R) 744. The emitter electrodes are connected to vertical lines 746, 746', and 746" for reading out signals in units of columns. The vertical lines 746, 746', and 746" are connected to switches 747, 747', and 747" for resetting electric charges on the vertical lines, and read switches 750, 750', and 750", respectively. The gate electrodes of the reset switches 747, 747', and 747" are commonly connected to a terminal 748 for applying a vertical line reset pulse, and their source electrodes are commonly connected to a terminal 749 for applying a vertical line reset voltage. The gate electrodes of the read switches 750, 750', and 750" are connected to a horizontal shift register (H.S.R) via lines 751, 751', and 751", respectively, and their drain electrodes are connected to an output amplifier 757 via a horizontal read line 753. The horizontal read line 753 is connected to a switch 754 for resetting electric charges on the horizontal read line.

The reset switch 754 is connected to a terminal 755 for applying a horizontal line reset pulse and a terminal 756 for applying a horizontal line reset voltage.

Finally, an output from the amplifier 757 is extracted from a terminal 758.

An operation will be briefly described below with reference to FIGS. 45A to 45C.

Incident light is absorbed by the light absorption layer 714 shown in FIG. 45A, and generated carriers are multiplied by the multiplication region 713 and are stored in the base region 703.

When a drive pulse output from the V.S.R. shown in FIG. 45C appears on the driving line 743, a base potential is increased through the capacitor, and signal charges according to a light amount are output from the pixels in the first row onto the vertical lines 746, 746', and 746".

When scanning pulses are sequentially output from the H.S.R. 752 onto the lines 751, 751', and 751", the switches 750, 750', and 750" are sequentially ON/OFF-controlled, and signals are output to the output terminal 758 via the amplifier 757. In this case, the reset switch 754 is set in an ON state while the switches 750, 750', and 750" are sequentially turned on, thus removing residual charges from the horizontal line 753.

The vertical line reset switches 747, 747', and 747" are sequentially turned on to remove residual charges from the vertical lines 746, 746', and 746". When the V.S.R. 744 applies a negative pulse to the driving line 743, the p-channel MOS transistors of the pixels in the first row are turned on, and base residual charges of these pixels are removed, thus initializing the pixels.

Then, a drive pulse output from the V.S.R. 744 appears on the driving line 743', and signal charges of pixels in the second row are similarly output.

An output operation of signal charges of pixels in the third row is performed in the same manner as described above.

The apparatus of this example is operated by repeating the above-mentioned operations.

In the example described above, a circuit invented by the present inventors has been exemplified. However, the present invention may be applied to a conventional photoelectric conversion apparatus.

A case will be described below wherein the present invention is applied to a photoelectric conversion apparatus having a conventional arrangement.

Figure 46:
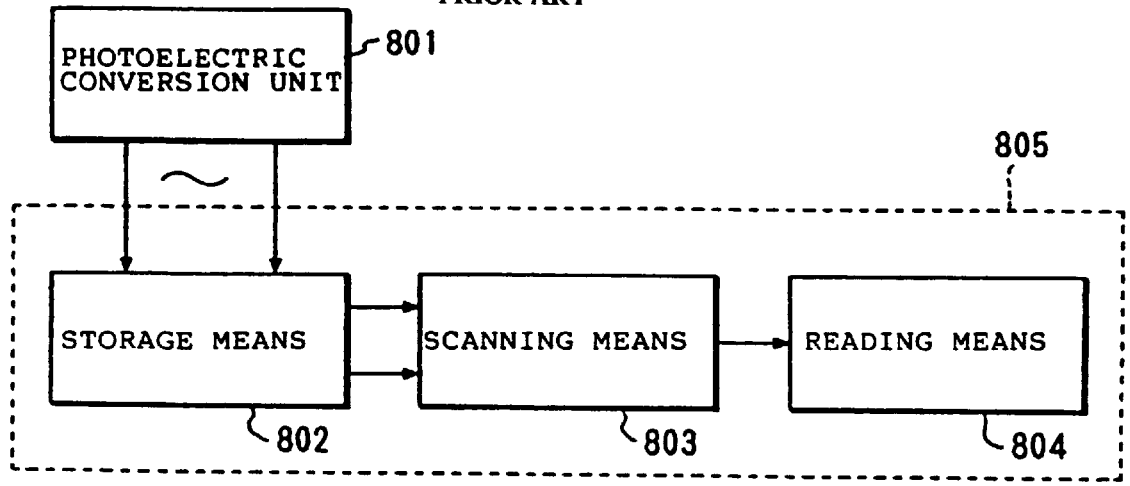
FIG. 46 is a block diagram showing an arrangement obtained when the present invention is applied to a photoelectric conversion apparatus having a conventional arrangement.

FIG. 46 is a block diagram showing an arrangement when the present invention is applied to a photoelectric conversion apparatus having a conventional arrangement.

In FIG. 46, reference numeral 801 denotes a photoelectric conversion unit according to the present invention, which comprises, e.g., a photoelectric conversion apparatus according to the present invention described in, e.g., Example 21 or 22. The photoelectric conversion unit 801 is connected to a signal output unit 805. In the signal output unit 805, reference numeral 802 denotes a storage means for storing signal charges generated by the photoelectric conversion means 801; 803, a scanning means for scanning the signal charges; and 804, a read means comprising, e.g., a circuit for amplifying or noise-compensating signal charges transferred from the scanning means 803. Note that the storage means 802 may be omitted although it is necessary when a storage operation is performed.

In this example, a structure wherein stepbacks are immediately changed is assumed as an ideal energy band chart. Even if the structure has moderate stepbacks, the same effects as described above can be obtained as long as they fall within a mean free path of electrons. Furthermore, if the structure has moderate stepbacks, a degree of freedom upon selection of materials can be increased.

EXAMPLE 24

This example is constituted in such a manner that a light absorption layer, having a forbidden bandwidth Eg1, for absorbing light to generate photocarriers, and a multiplication layer, obtained by stacking one or a plurality of layers having a stepback structure in which a forbidden bandwidth is continuously changed to have a minimum forbidden bandwidth Eg2 and a maximum forbidden bandwidth Eg3, for multiplying the carriers generated upon light absorption, are stacked to be sandwiched between electric charge injection blocking layers, and the forbidden bandwidth Eg1 of the light absorption layer is set to be substantially equal to the maximum forbidden bandwidth Eg3 of the multiplication layer.

In this example, since the forbidden bandwidth Eg1 of the light absorption layer is set to be substantially equal to the maximum forbidden bandwidth Eg3 of the multiplication layer, various problems caused by band mismatching can be eliminated, and high-response characteristics equivalent to those of a photodiode having no multiplication layer can be obtained. At the same time, the forbidden bandwidth Eg1 of the light absorption layer is set to particularly cope with ultraviolet region light to have a high sensitivity for ultraviolet region light. In addition, the number of layers of the stepback structure is selected, so that an amplification factor of 2 or more can be obtained, and noise can be reduced.

Furthermore, when constituting elements of the photoelectric conversion apparatus of the present invention are formed of monocrystalline materials at least containing an Si atom, easy controllability of forbidden bandwidths and low-temperature formation of a multilayered structure can be assured, and various problems caused upon formation of the multilayered structure can be solved.

Example 24 of the present invention will be described below with reference to FIG. 47 and FIGS. 48A and 48B.

Note that this example is substantially the same as Example 1 except that the forbidden bandwidth Eg1 of the light absorption layer is set to be substantially equal to the maximum forbidden bandwidth Eg3 of the multiplication layer, and a description is partially omitted to avoid repetitive descriptions.

Figure 47:
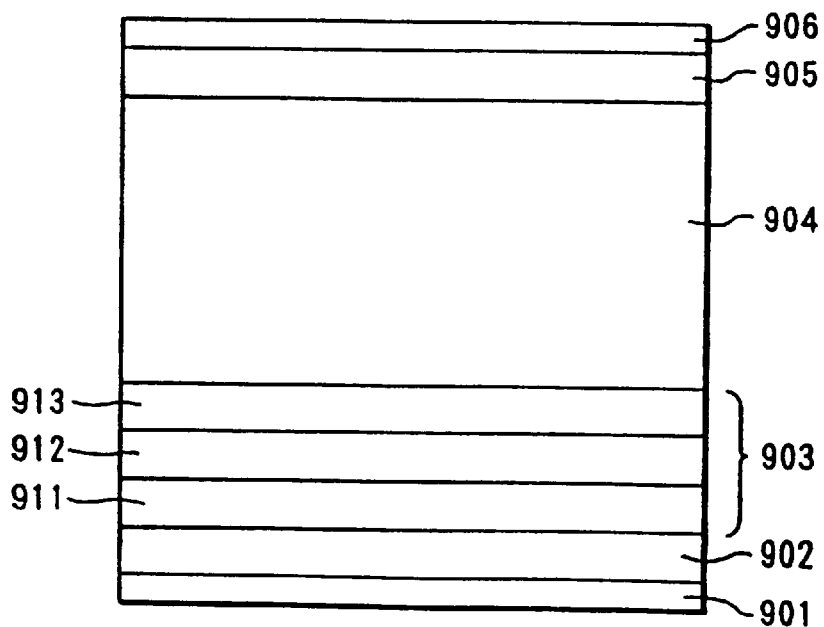
FIGS. 47 and 50 are schematic sectional views showing photoelectric conversion apparatuses according to other embodiments of the present invention.

FIG. 47 is a schematic longitudinal sectional view showing Example 24 of a photoelectric conversion apparatus of the present invention.

In FIG. 47, reference numeral 901 denotes a Cr electrode; 902, a 500-Å thick n-type a-$Si_{1-x}Ge_x$:H electric charge injection blocking layer for blocking hole injection; 903, a multiplication region, whose composition is changed from a-$Si_{1-x}Ge_x$:H to a-$Si_{1-y}C_y$:H, for performing carrier multiplication; 904, a 1-$\mu$m thick a-$Si_{1-y}C_y$:H light absorption layer for absorbing light and generating carriers; 905, a 100-Å thick p-type a-$Si_{1-y}C_y$:H electric charge injection blocking layer for blocking electron injection; and 906, a transparent electrode containing indium oxide as a major component.

The Cr electrode 901 and the transparent electrode 906 were formed by EB evaporation, and amorphous layers, i.e., the electric charge injection blocking layer 902, the multiplication region 903, the light absorption layer 904, and the electric charge injection blocking layer 905 were formed by plasma CVD. As source gases upon formation of amorphous layers, $SiH_4$, $GeH_4$, $PH_3$, and $H_2$ gases were used for the electric charge injection blocking layer 902, $SiH_4$, $GeH_4$, $CH_4$, and $H_2$ were used for the multiplication region 903, $SiH_4$, $CH_4$, and $H_2$ gases were used for the light absorption layer 904, and $SiH_4$, $CH_4$, $B_2H_6$, and $H_2$ gases were used for the electric charge injection blocking layer 905.

The multiplication region 903 comprises three layers, i.e., 200-Å thick composition change layers 911, 912, and 913 formed by continuously changing flow rates of $CH_4$ and $GeH_4$ gases of the source gases.

Figure 48A:
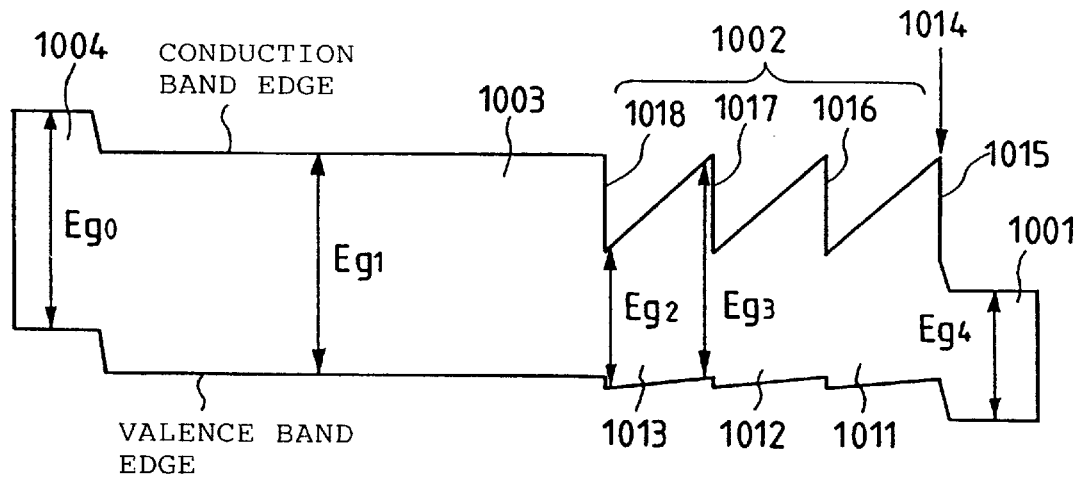
FIGS. 48A, 49A, and 51A are energy band charts in a non-bias state.
Figure 48B:
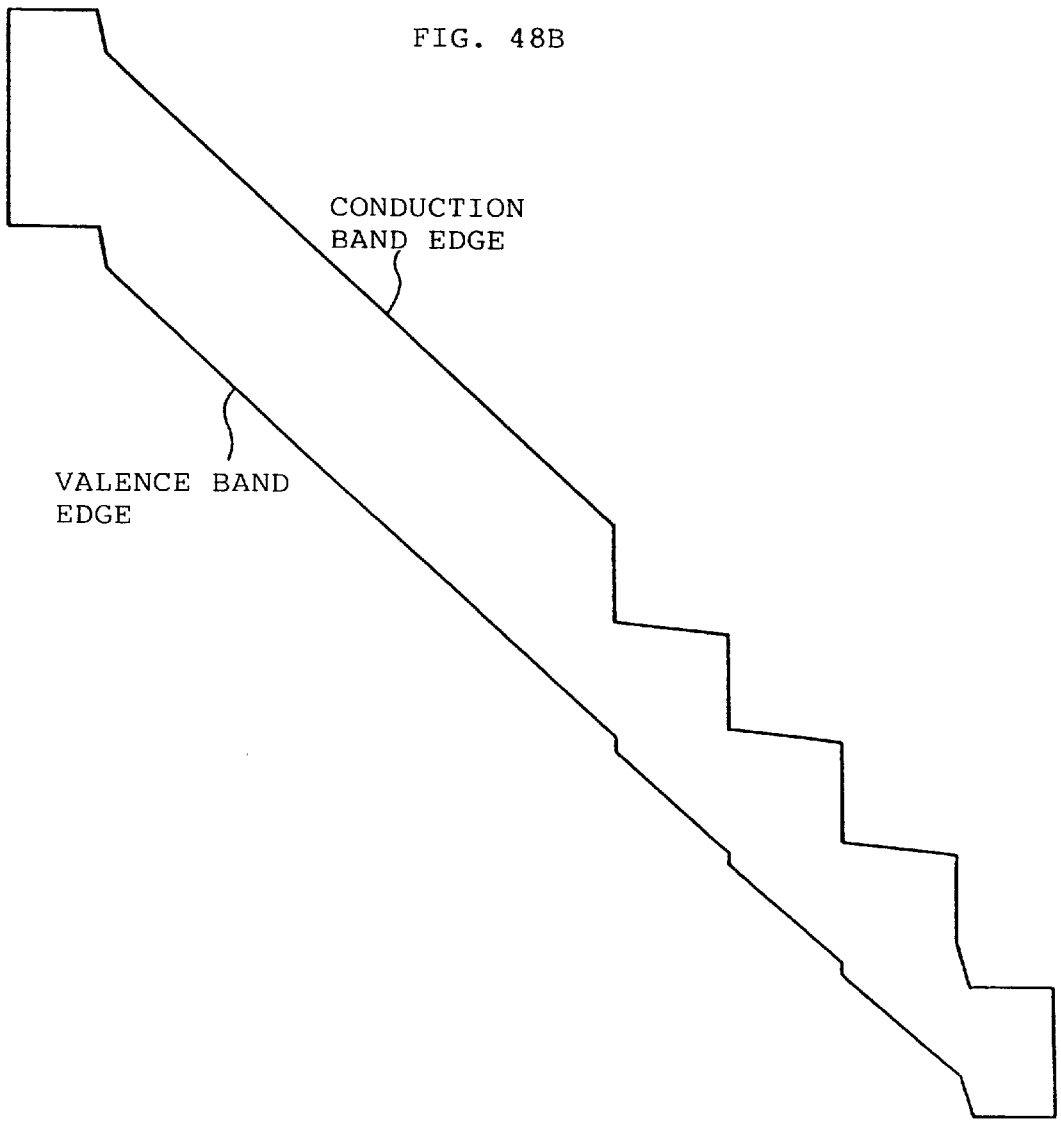
FIGS. 48B, 49B, and 51B are energy band charts in a bias application state.

The photoelectric conversion apparatus of Example 24 shown in FIG. 47 is assumed to ideally have an energy band structure as shown in FIGS. 48A and 48B.

FIG. 48A is an energy band chart obtained when the photoelectric conversion apparatus of Example 24 is in a non-bias state, and FIG. 8B is an energy band chart obtained when the apparatus is applied with a bias to perform a carrier multiplication operation.

FIGS. 48A and 48B illustrate that an n-type a-$Si_{1-x}Ge_x$:H layer 1001 has a forbidden bandwidth Eg4, a multiplication region 1002 consisting of three layers, i.e., a-$Si_{1-x}Ge_x$:H to a-$Si_{1-y}C_y$:H composition change layers 1011, 1012, and 1013 has a minimum forbidden bandwidth Eg2, and a maximum forbidden bandwidth Eg3, an a-$Si_{1-y}C_y$:H layer 1003 has a forbidden bandwidth Eg1, and a p-type a-$Si_{1-y}C_y$:H layer 1004 has a forbidden bandwidth Eg0. In FIG. 48A, although energy discontinuous points are present at both conduction and valence band edges, there is almost no barrier due to energy discontinuity in a migration direction of carriers in a bias application state, as can be seen from FIG. 48B. Thus, carrier migration is not disturbed.

A C composition ratio y of the a-$Si_{1-y}C_y$:H layers 1004 and 1003 manufactured in this example was about 0.4, and both the forbidden bandwidths Eg1 and Eg0 were about 2.3 eV. Of the composition change layers 1011, 1012, and 1013, a layer giving the maximum forbidden bandwidth Eg3 was also formed of a-$Si_{1-y}C_y$:H, and Eg3 was also about 2.3 eV.

A Ge composition ratio x of the a-$Si_{1-x}Ge_x$:H layer 1001 was about 0.6, and the forbidden bandwidth Eg4 was about 1.3 eV. Of the composition change layers 1011, 1012, and 1013, a layer giving the minimum forbidden bandwidth Eg2 was also formed of a-$Si_{1-x}Ge_x$:H, and Eg2 was also about 1.3 eV.

The light absorption layer 1003 had a light absorption coefficient of about $4\times10^3$ $cm^{-1}$ or more for light having a wavelength of 540 nm, and about $3\times10^4$ $cm^{-1}$ or more for light having a wavelength of 350 nm. Thus, the layer 1003 could satisfactorily absorb ultraviolet region light.

A multiplication ratio of this apparatus was about 10 times or more upon application of a bias of 10 V.

The multiplication ratio was not changed even if a wavelength was changed for ultraviolet region light having a wavelength of 400 nm or less.

A leak current in a dark state was as low as 1 $nA/cm^2$ or less upon application of a bias of 10 V.

Furthermore, a light response speed was equivalent to that of a pin-type photoelectric conversion apparatus having no multiplication layer 1002, and was high.

In this example, the light absorption layer has a thickness of about 1 μm, but may have a thickness which is large enough to allow light to pass therethrough but not to allow it to reach the multiplication layer. This thickness is determined by a light absorption coefficient.

In this example, a structure wherein stepbacks are immediately changed is assumed as an ideal energy band chart. Even if the structure has moderate stepbacks, the same effects as described above can be obtained as long as they fall within a mean free path of electrons. Furthermore, if the structure has moderate stepbacks, a degree of freedom upon selection of materials can be increased.

The forbidden bandwidth Eg2 of the light absorption layer is about 2.3 eV. The C composition ratio may be changed to control Eg2, so that desired spectral sensitivity characteristics can be obtained.

EXAMPLE 25

Example 25 of the present invention will be described below with reference to FIGS. 49A and 49B.

Figure 49A:
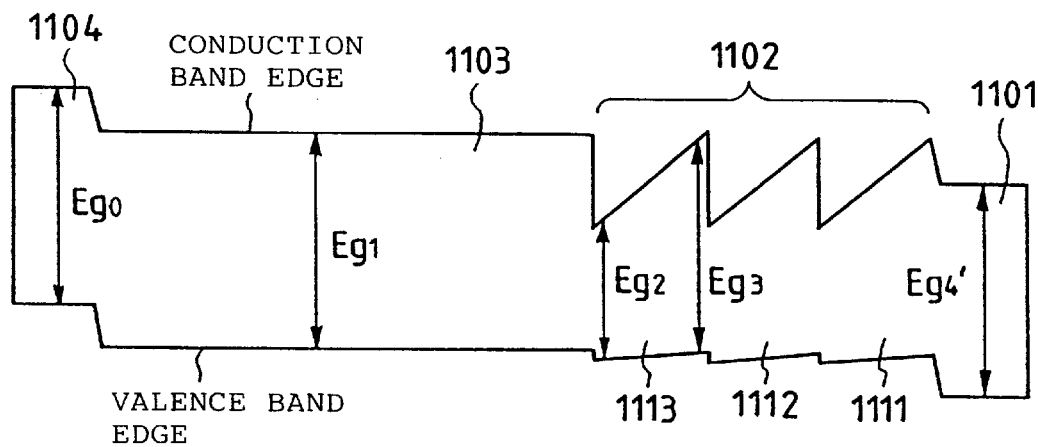
Figure 49B:
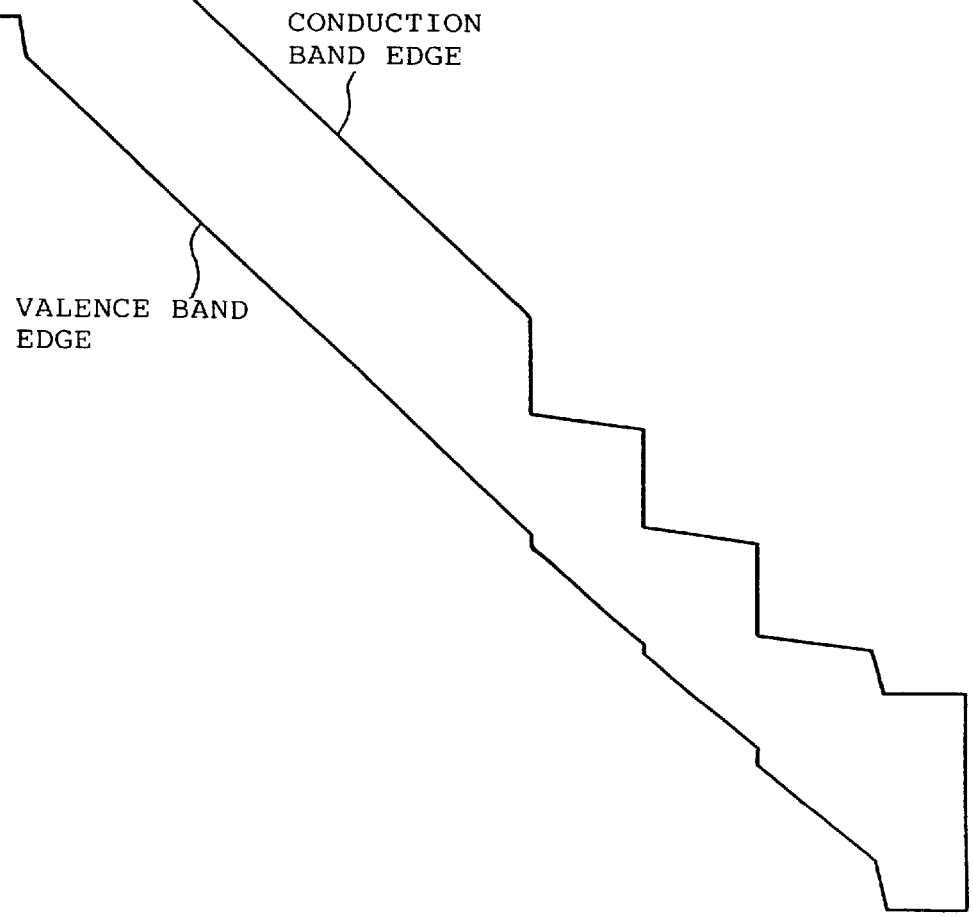

FIGS. 49A and 49B are ideally assumed energy band charts of Example 25 of the present invention.

FIG. 49A is an energy band chart obtained when the photoelectric conversion apparatus of Example 25 is in a non-bias state, and FIG. 49B is an energy band chart obtained when the apparatus is applied with a bias to perform a carrier multiplication operation.

FIG. 49A is substantially the same as FIG. 48A, except that 1101 denotes an n-type a-$Si_{1-y}C_y$:H layer having a forbidden bandwidth Eg4', and illustrates that a multiplication region 1102 consisting of three layers, i.e., a-$Si_{1-x}Ge_x$:H to a-$Si_{1-y}C_y$:H composition change layers 1111, 1112, and 1113 has a minimum forbidden bandwidth Eg2, and a maximum forbidden bandwidth Eg3, an a-$Si_{1-y}C_y$:H layer 1103 has a forbidden bandwidth Eg1, and a p-type a-$Si_{1-y}C_y$:H layer 1104 has a forbidden bandwidth Eg0.

A multiplication ratio of this apparatus was about 10 times or more upon application of a bias of 10 V.

The multiplication ratio was not changed even if a wavelength was changed for ultraviolet region light having a wavelength of 400 nm or less.

A leak current in a dark state was as low as 0.1 $nA/cm^2$ or less upon application of a bias of 10 V.

Furthermore, a light response speed was equivalent to that of a pin-type photoelectric conversion apparatus having no multiplication layer 1102, and was high.

In this example, a structure wherein stepbacks are immediately changed is assumed as an ideal energy band chart. Even if the structure has moderate stepbacks, the same effects as described above can be obtained as long as they fall within a mean free path of electrons. Furthermore, if the structure has moderate stepbacks, a degree of freedom upon selection of materials can be increased.

EXAMPLE 26

In this example, a photoelectric conversion apparatus described in Example 24 is stacked on a scanning circuit and a read circuit already proposed in Japanese Laid-Open Patent Application No. 63-278269 by the present inventors like in Example 23.

Note that the structure of the photoelectric conversion apparatus is substantially the same as that in FIG. 45A except that an a-Si:H layer 714 as the light absorption layer shown in FIG. 45A is used as the a-$Si_{1-y}C_y$:H layer as the light absorption layer, and a p-type a-Si:H layer 715 is used as the p-type a-$Si_{1-y}C_y$:H layer, and its operation is also the same. Thus, a detailed description thereof will be omitted.

In the above example, a circuit invented by the present inventors has been exemplified. However, the present invention is applicable to a conventional photoelectric conversion apparatus like in Example 23.

EXAMPLE 27

This example is constituted in such a manner that a light absorption layer, having a forbidden bandwidth Eg1, for absorbing light to generate photocarriers, and a multiplication layer, obtained by stacking one or a plurality of layers having a stepback structure in which a forbidden bandwidth is continuously changed to have a minimum forbidden bandwidth Eg2 and a maximum forbidden bandwidth Eg3, for multiplying the carriers generated upon light absorption, are stacked to be sandwiched between electric charge injection blocking layers, and the forbidden bandwidth Eg1 of the light absorption layer is set to be substantially equal to the minimum forbidden bandwidth Eg2 of the multiplication layer.

In this example, since the forbidden bandwidth Eg1 of the light absorption layer is set to be substantially equal to the minimum forbidden bandwidth Eg2 of the multiplication layer, various problems caused by band mismatching can be eliminated, and high-response characteristics equivalent to those of a photodiode having no multiplication layer can be obtained. At the same time, the forbidden bandwidth Eg1 of the light absorption layer is set to particularly cope with infrared region light to have a high sensitivity for infrared region light.

In addition, the number of layers of the stepback structure is selected, so that an amplification factor of 2 or more can be obtained, and noise can be reduced.

Furthermore, when constituting elements of the photoelectric conversion apparatus of the present invention are formed of monocrystalline materials at least containing an Si atom, easy controllability of forbidden bandwidths and low-temperature formation of a multilayered structure can be assured, and various problems caused upon formation of the multilayered structure can be solved.

Example 27 of the present invention will be described below with reference to FIG. 50 and FIGS. 51A and 51B.

Note that this example is substantially the same as Example 21 except that the forbidden bandwidth Eg1 of the light absorption layer is set to be substantially equal to the minimum forbidden bandwidth Eg2 of the multiplication layer, and a description is partially omitted to avoid repetitive descriptions.

Figure 50:
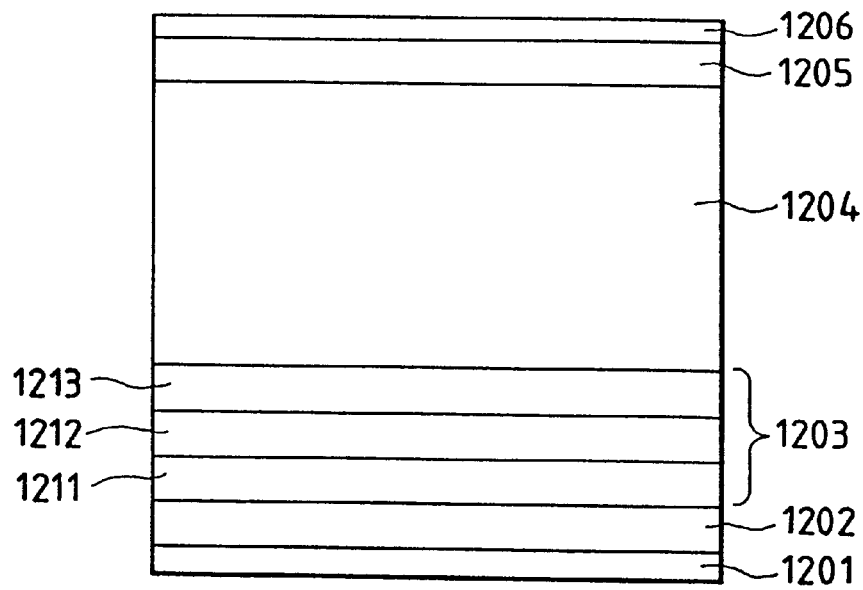

FIG. 50 is a schematic longitudinal sectional view showing Example 7 of a photoelectric conversion apparatus of the present invention.

In FIG. 50, reference numeral 1201 denotes a Cr electrode; 1202, a 500-Å thick n-type a-$Si_{1-x}Ge_x$:H electric charge injection blocking layer for blocking hole injection; 1203, a multiplication region, whose composition is changed from a-$Si_{1-x}Ge_x$:H to a-$Si_{1-y}C_y$:H, for performing carrier multiplication; 1204, a 1-μm thick a-$Si_{1-x}Ge_x$:H light absorption layer for absorbing light and generating carriers; 1205, a 100-Å thick p-type a-$Si_{1-x}Ge_x$:H electric charge injection blocking layer for blocking electron injection; and 1206, a transparent electrode containing indium oxide as a major component.

The Cr electrode 1201 and the transparent electrode 1206 were formed by EB evaporation, and amorphous layers, i.e., the electric charge injection blocking layer 1202, the multiplication region 1203, the light absorption layer 1204, and the electric charge injection blocking layer 1205 were formed by plasma CVD. As source gases upon formation of amorphous layers, $SiH_4$, $GeH_4$, $PH_3$, and $H_2$ gases were used for the electric charge injection blocking layer 1202, $SiH_4$, $GeH_4$, $CH_4$, and $H_2$ were used for the multiplication region 1203, $SiH_4$, $GeH_4$, and $H_2$ gases were used for the light absorption layer 1204, and $SiH_4$, $GeH_4$, $B_2H_6$, and $H_2$ gases were used for the electric charge injection blocking layer 1205.

The multiplication region 1203 comprises three layers, i.e., 200-Å thick composition change layers 1211, 1212, and 1213 formed by continuously changing flow rates of $CH_4$ and $GeH_4$ gases of the source gases.

Figure 51A:
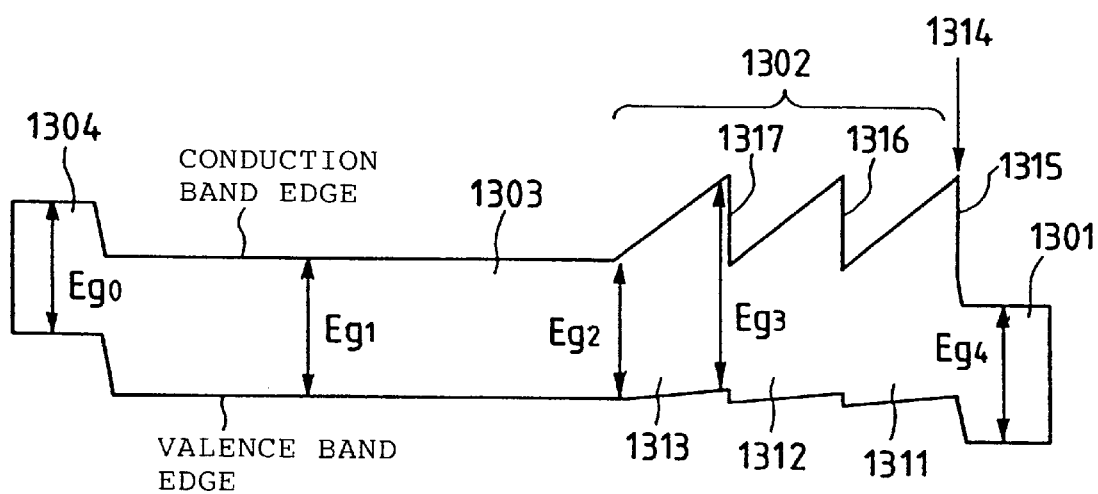
Figure 51B:
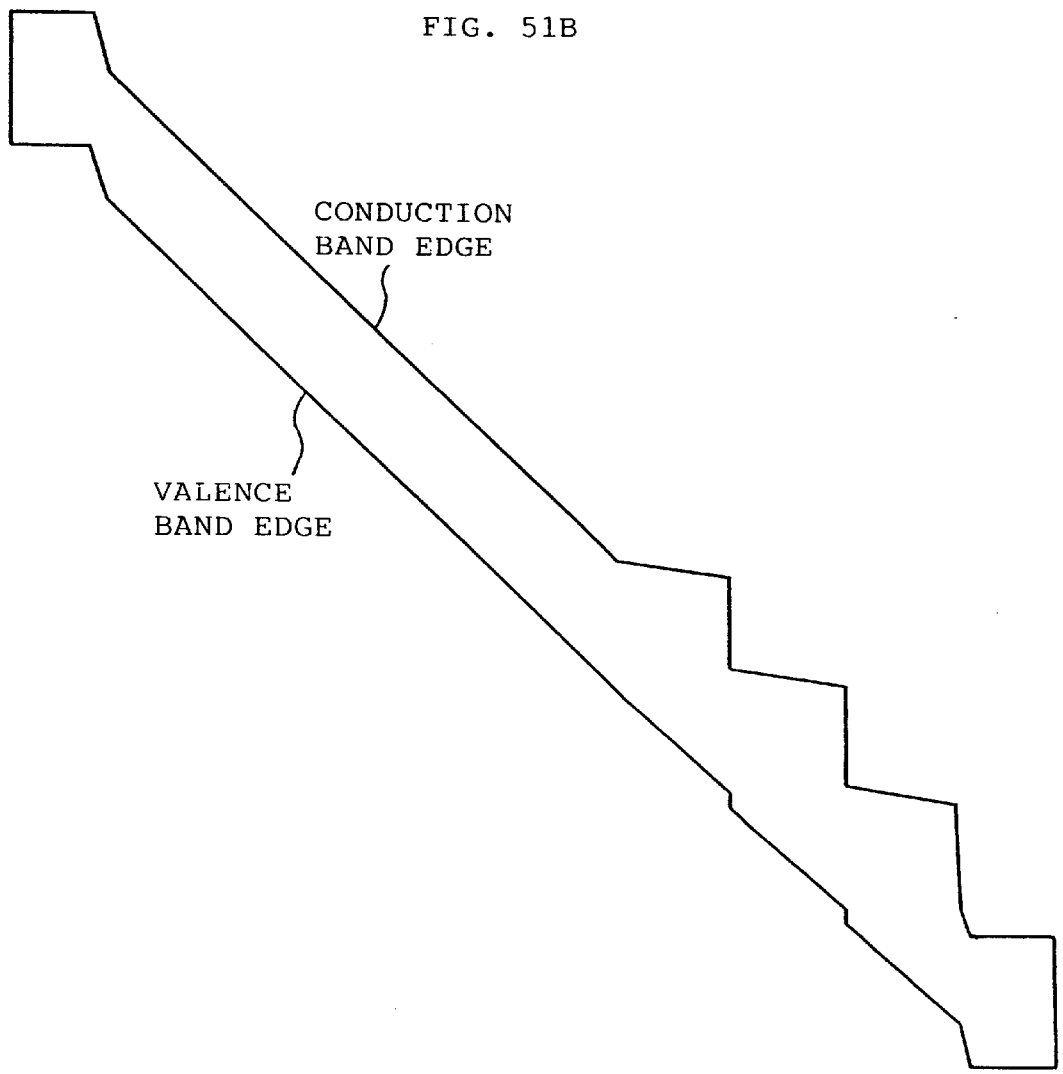

The photoelectric conversion apparatus of Example 27 shown in FIG. 50 is assumed to ideally have an energy band structure as shown in FIGS. 51A and 51B.

FIG. 51A is an energy band chart obtained when the photoelectric conversion apparatus of Example 27 is in a non-bias state, and FIG. 51B is an energy band chart obtained when the apparatus is applied with a bias to perform a carrier multiplication operation.

FIGS. 51A and 51B illustrate that an n-type a-$Si_{1-x}Ge_x$:H layer 1301 has a forbidden bandwidth Eg4, a multiplication region 1302 consisting of three layers, i.e., a-$Si_{1-x}Ge_x$:H to a-$Si_{1-y}C_y$:H composition change layers 1311, 1312, and 1313 has a minimum forbidden bandwidth Eg2, and a maximum forbidden bandwidth Eg3, an a-$Si_{1-x}Ge_x$:H layer 1303 has a forbidden bandwidth Eg1, and a p-type a-$Si_{1-x}Ge_x$:H layer 1304 has a forbidden bandwidth Eg0. In FIG. 51A, although energy discontinuous points are present at both conduction and valence band edges, there is almost no barrier due to energy discontinuity in a migration direction of carriers in a bias application state, as can be seen from FIG. 51B. Thus, carrier migration is not disturbed.

Of the composition change layers 1311, 1312, and 1313 manufactured in this example, a layer giving the maximum forbidden bandwidth Eg3 was formed of a-$Si_{1-y}C_y$:H having a C composition ratio of about 0.4, and Eg3 was also about 2.3 eV.

A Ge composition ratio x of the a-$Si_{1-x}Ge_x$:H layers 1301 1303, and 1304 was about 0.6, and the forbidden bandwidths Eg4, Eg1, and Eg0 were about 1.3 eV. Of the composition change layers 1311, 1312, and 1313, a layer giving the minimum forbidden bandwidth Eg2 was also an a-$Si_{1-x}Ge_x$:H layer, and Eg2 was also about 1.3 eV.

The light absorption layer 1303 had a light absorption coefficient of about $1 \times 10^5$ cm$^{-1}$ or more for light having a wavelength of 800 nm, and about $2 \times 10^4$ cm$^{-1}$ or more for light having a wavelength of 1,000 nm. Thus, the layer 1303 could satisfactorily absorb infrared region light.

A multiplication ratio of this apparatus was about 10 times or more upon application of a bias of 10 V.

The multiplication ratio was not changed even if a wavelength was changed for ultraviolet region light having a wavelength of 1,000 nm or less.

A leak current in a dark state was as low as 10 nA/cm$^2$ or less upon application of a bias of 10 V.

Furthermore, a light response speed was equivalent to that of a pin-type photoelectric conversion apparatus having no multiplication layer 1302, and was high.

In this example, the light absorption layer has a thickness of about 1 μm, but may have a thickness which is large enough to allow light to pass therethrough but not to allow it to reach the multiplication layer. This thickness is determined by a light absorption coefficient.

In this example, a structure wherein stepbacks are immediately changed is assumed as an ideal energy band chart. Even if the structure has moderate stepbacks, the same effects as described above can be obtained as long as they fall within a mean free path of electrons. Furthermore, if the structure has moderate stepbacks, a degree of freedom upon selection of materials can be increased.

The forbidden bandwidth Eg2 of the light absorption layer is about 1.3 eV. The Ge composition ratio may be changed to control Eg2, so that desired spectral sensitivity characteristics can be obtained.

EXAMPLE 28

Example 28 of the present invention will be described below with reference to FIGS. 52A and 52B.

Figure 52A:
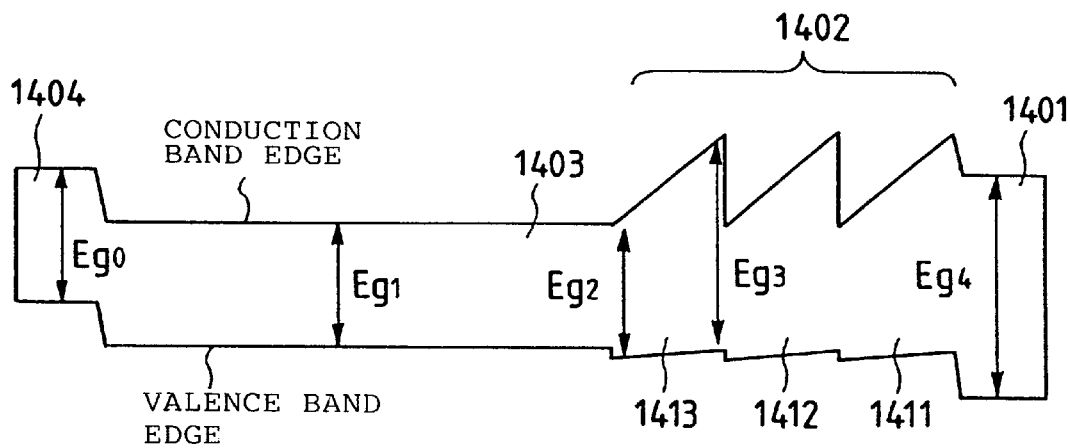
Figure 52B:
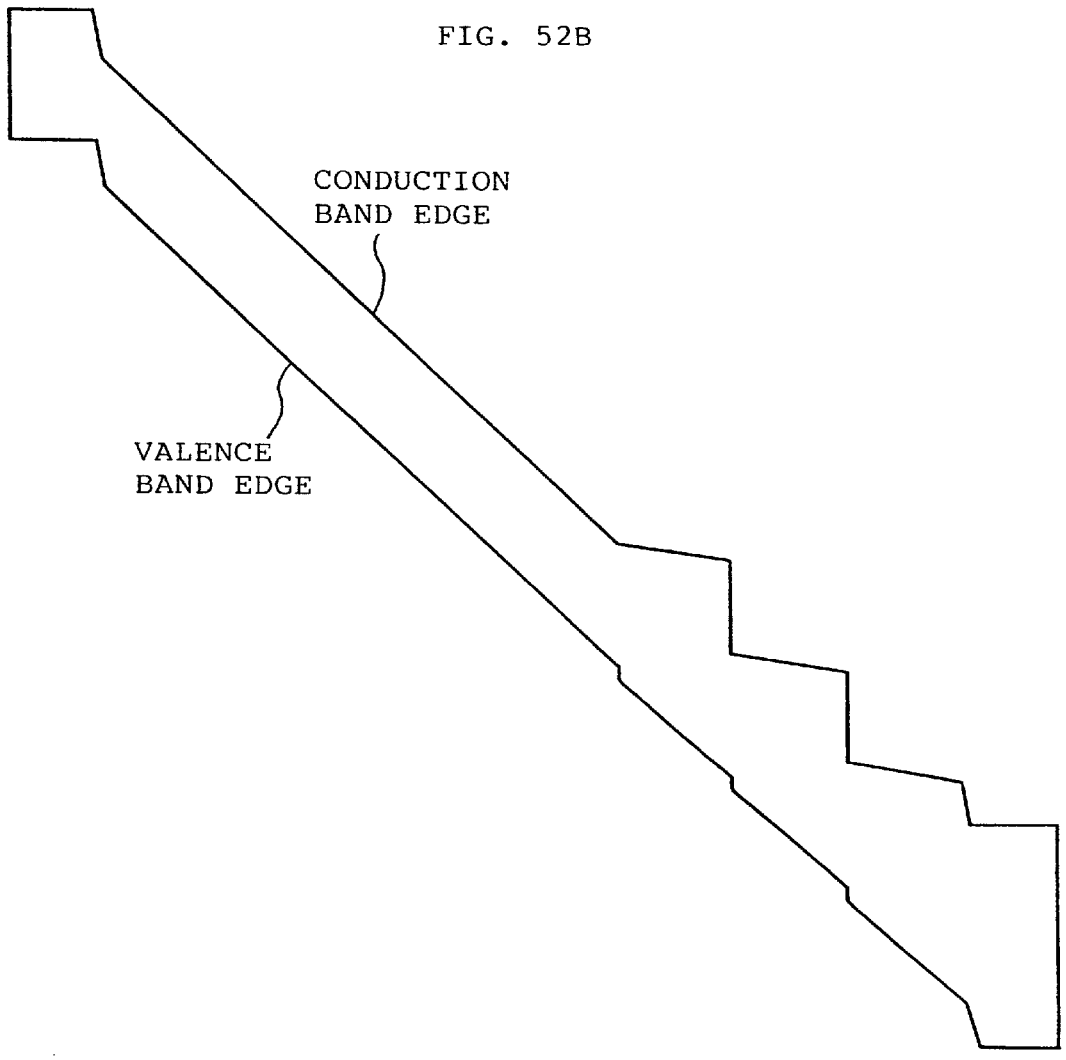
FIGS. 52B, 54B, and 55B are energy band charts in a bias application state.

FIGS. 52A and 52B are ideally assumed energy band charts of Example 28 of the present invention.

FIG. 52A is an energy band chart obtained when the photoelectric conversion apparatus of Example 28 is in a non-bias state, and FIG. 52B is an energy band chart obtained when the apparatus is applied with a bias to perform a carrier multiplication operation.

FIG. 52A is substantially the same as FIG. 51A, except that 1401 denotes an n-type a-$Si_{1-y}C_y$:H layer having a forbidden bandwidth Eg4', and illustrates that a multiplication region 1402 consisting of three layers, i.e., a-$Si_{1-x}Ge_x$:H to a-$Si_{1-y}C_y$:H composition change layers 1411, 1412, and 1413 has a minimum forbidden bandwidth Eg2, and a maximum forbidden bandwidth Eg3, an a-$Si_{1-x}Ge_x$:H layer 1403 has a forbidden bandwidth Eg1, and a p-type a-$Si_{1-x}Ge_x$:H layer 1404 has a forbidden bandwidth Eg0.

A multiplication ratio of this apparatus was about 10 times or more upon application of a bias of 10 V.

The multiplication ratio was not changed even if a wavelength was changed for infrared region light having a wavelength of 1,000 nm or less.

A leak current in a dark state was as low as 10 nA/cm$^2$ or less upon application of a bias of 10 V.

Furthermore, a light response speed was equivalent to that of a pin-type photoelectric conversion apparatus having no multiplication layer 1402, and was high.

In this example, a structure wherein stepbacks are immediately changed is assumed as an ideal energy band chart. Even if the structure has moderate stepbacks, the same effects as described above can be obtained as long as they fall within a mean free path of electrons. Furthermore, if the structure has moderate stepbacks, a degree of freedom upon selection of materials can be increased.

EXAMPLE 29

In this example, a photoelectric conversion apparatus described in Example 27 is stacked on a scanning circuit and a read circuit already proposed in Japanese Laid-Open Patent Application No. 63-278269 by the present inventors like in Example 23. Note that the structure of the photoelectric conversion apparatus is substantially the same as that in FIG. 45A except that an a-Si:H layer 714 as the light absorption layer shown in FIG. 45A is used as the a-$Si_{1-x}Ge_x$:H layer as the light absorption layer, and a p-type a-Si:H layer 715 is used as the p-type a-$Si_{1-x}Ge_x$:H layer, and its operation is also the same. Thus, a detailed description thereof will be omitted.

In the above example, a circuit invented by the present inventors has been exemplified. However, the present invention is applicable to a conventional photoelectric conversion apparatus like in Example 23.

EXAMPLE 30

This example is constituted in such a manner that a light absorption layer, having a forbidden bandwidth Eg1, for absorbing light to generate photocarriers, and a multiplication layer, obtained by stacking one or a plurality of layers having a stepback structure in which a forbidden bandwidth is continuously changed to have a minimum forbidden bandwidth Eg2 and a maximum forbidden bandwidth Eg3, for multiplying the carriers generated upon light absorption, are stacked to be sandwiched between electric charge injection blocking layers, and the forbidden bandwidth Eg1 of the light absorption layer is continuously changed from a side of one electric charge injection blocking layer stacked on the light absorption layer, and is set to be substantially equal to the maximum forbidden bandwidth Eg3 of the multiplication layer on a side of the multiplication layer.

In this example, since the forbidden bandwidth Eg1 of the light absorption layer is continuously changed from the side of one electric charge injection blocking layer stacked on the light absorption layer and is set to be substantially equal to the maximum forbidden bandwidth Eg3 of the multiplication layer on the side of the multiplication layer, various problems caused by band mismatching can be eliminated, and high-response characteristics equivalent to those of a photodiode having no multiplication layer can be obtained. At the same time, the forbidden bandwidth Eg1 of the light absorption layer is set to particularly cope with light from a visible region to an ultraviolet region to have a high sensitivity for light from the visible region to the ultraviolet region.

In addition, the number of layers of the stepback structure is selected, so that an amplification factor of 2 or more can be obtained, and noise can be reduced.

Furthermore, when constituting elements of the photoelectric conversion apparatus of the present invention are formed of monocrystalline materials at least containing an Si atom, easy controllability of forbidden bandwidths and low-temperature formation of a multilayered structure can be assured, and various problems caused upon formation of the multilayered structure can be solved.

Example 30 of the present invention will be described below with reference to FIG. 53 and FIGS. 54A and 54B.

Note that this example is substantially the same as Example 21 except that the forbidden bandwidth Eg1 of the light absorption layer is continuously changed from one electric charge injection blocking layer stacked on the light absorption layer, and is set to be substantially equal to the maximum forbidden bandwidth Eg3 of the multiplication layer on the multiplication layer side, and a description is partially omitted to avoid repetitive descriptions.

Figure 53:
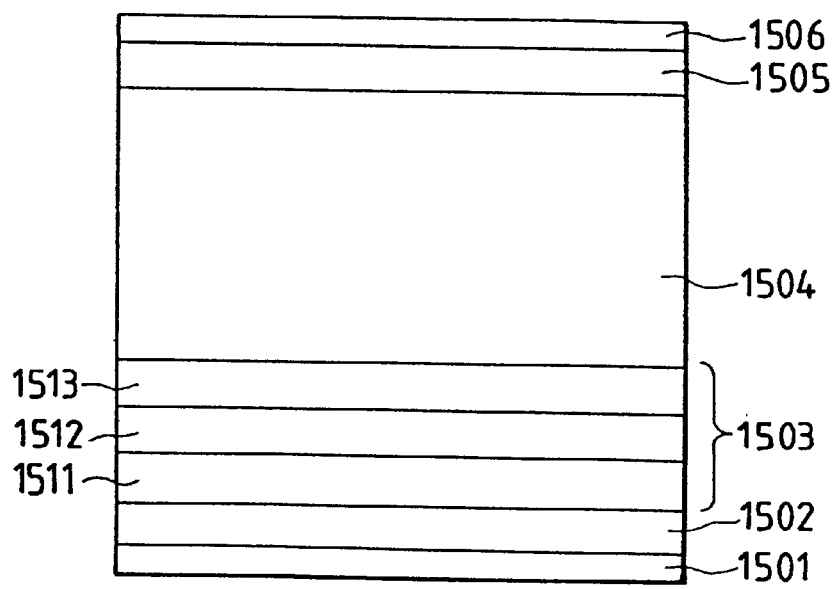
FIGS. 53 and 55A are schematic sectional views showing photoelectric conversion apparatuses according to other embodiments of the present invention.

FIG. 53 is a schematic longitudinal sectional view showing Example 30 of a photoelectric conversion apparatus of the present invention.

In FIG. 53, reference numeral 1501 denotes a Cr electrode; 1502, a 500-Å thick n-type a-$Si_{1-x}Ge_x$:H electric charge injection blocking layer for blocking hole injection; 1503, a multiplication region, whose composition is changed from a-$Si_{1-x}Ge_x$:H to a-$Si_{1-y}C_y$:H, for performing carrier multiplication; 1504, a 2-μm thick light absorption layer, whose composition is changed from a-Si:H to a-$Si_{1-y}C_y$:H, for absorbing light and generating carriers; 1505, a 100-Å thick p-type a-Si:H electric charge injection blocking layer for blocking electron injection; and 1506, a transparent electrode containing indium oxide as a major component.

The Cr electrode 1501 and the transparent electrode 1506 were formed by EB evaporation, and amorphous layers, i.e., the electric charge injection blocking layer 1502, the multiplication region 1503, the light absorption layer 1504, and the electric charge injection blocking layer 1505 were formed by plasma CVD. As source gases upon formation of amorphous layers, $SiH_4$, $GeH_4$, $PH_3$, and $H_2$ gases were used for the electric charge injection blocking layer 1502, $SiH_4$, $GeH_4$, $CH_4$, and $H_2$ were used for the multiplication region 1503, $SiH_4$, $CH_4$, and $H_2$ gases were used for the light absorption layer 1504, and $SiH_4$, $B_2H_6$, and $H_2$ gases were used for the electric charge injection blocking layer 1505.

The multiplication region 1503 comprises three layers, i.e., 200-Å thick composition change layers 1511, 1512, and 1513 formed by continuously changing flow rates of $CH_4$ and $GeH_4$ gases of the source gases. The light absorption layer 1504 is formed by continuously changing a flow rate of $CH_4$ gas of the source gases.

Figure 54A:
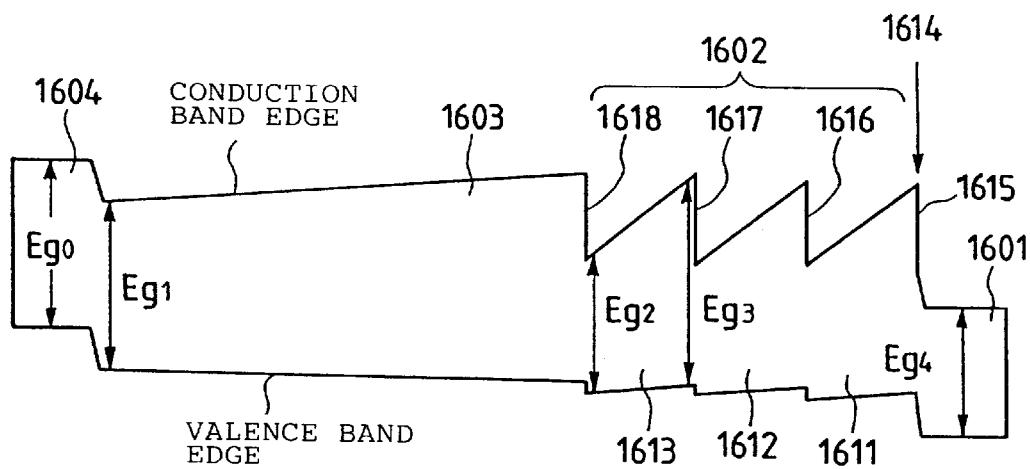
Figure 54B:
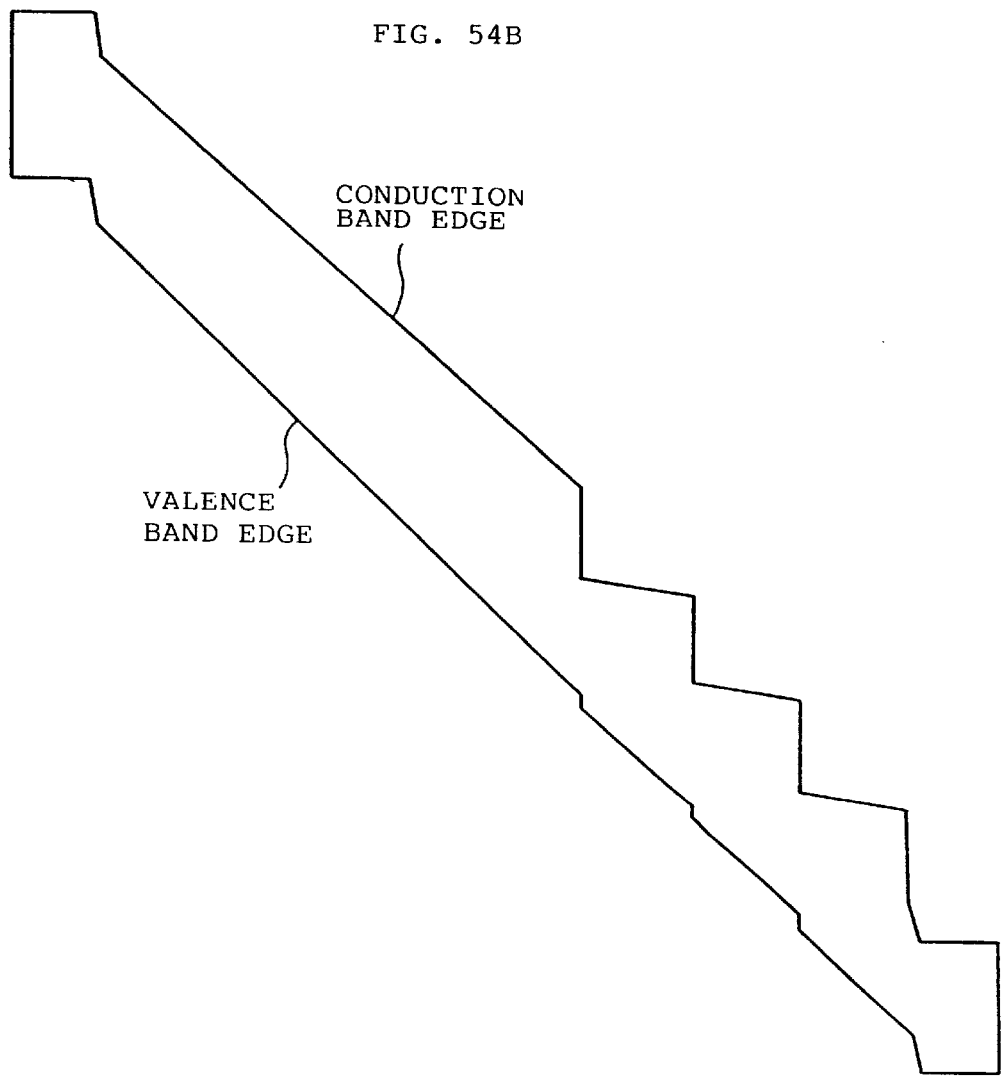

The photoelectric conversion apparatus of Example 30 shown in FIG. 53 is assumed to ideally have an energy band structure as shown in FIGS. 54A and 54B.

FIG. 54A is an energy band chart obtained when the photoelectric conversion apparatus of Example 30 is in a non-bias state, and FIG. 54B is an energy band chart obtained when the apparatus is applied with a bias to perform a carrier multiplication operation.

FIGS. 54A and 54B illustrate that an n-type a-$Si_{1-x}Ge_x$:H layer 1601 has a forbidden bandwidth Eg4, a multiplication region 1602 consisting of three layers, i.e., a-$Si_{1-x}Ge_x$:H to a-$Si_{1-y}C_y$:H composition change layers 1611, 1612, and 1613 has a minimum forbidden bandwidth Eg2, and a maximum forbidden bandwidth Eg3, an a-Si:H to a-$Si_{1-y}C_y$:H layer 1603 has a forbidden bandwidth Eg1, and a p-type a-Si:H layer 1604 has a forbidden bandwidth Eg0.

In FIG. 54A, although energy discontinuous points are present at both conduction and valence band edges, there is almost no barrier due to energy discontinuity in a migration direction of carriers in a bias application state, as can be seen from FIG. 54B. Thus, carrier migration is not disturbed.

Of the composition change layers 1611, 1612, and 1613 manufactured in this example, a layer giving the maximum forbidden bandwidth Eg3 was formed of a-$Si_{1-y}C_y$:H having a C composition ratio of about 0.4, and Eg3 was also about 2.3 eV. A layer portion giving the maximum forbidden bandwidth of the a-Si:H to a-$Si_{1-y}C_y$:H layer 163 was also formed of a-$Si_{1-y}C_y$:H.

A Ge composition ratio x of the a-$Si_{1-x}Ge_x$:H layer 1601 was about 0.6, and the forbidden bandwidth Eg4 was about 1.3 eV. Of the composition change layers 1611, 1612, and 1613, a layer giving the minimum forbidden bandwidth Eg2 was also formed of a-$Si_{1-x}Ge_x$:H, and Eg2 was also about 1.3 eV. A layer portion giving the minimum forbidden bandwidth Eg1 of the a-Si:H to a-$Si_{1-y}C_y$:H layer 1603 was formed of a-Si:H, and Eg1 was about 1.8 eV. The forbidden bandwidth Eg0 of the p-type a-Si:H layer 1604 was also about 1.8 eV.

The light absorption layer 1603 had a light absorption coefficient of about $6\times10^3$ $cm^{-1}$ or more for light having a wavelength of 700 nm, and about $3\times10^4$ $cm^{-1}$ or more for light having a wavelength of 350 nm. Thus, the layer 1603 could satisfactorily absorb light from a visible region to an ultraviolet region.

A multiplication ratio of this apparatus was about 10 times or more upon application of a bias of 10 V.

The multiplication ratio was not changed even if a wavelength was changed for light from a visible region to an ultraviolet region having a wavelength of 700 nm or less.

A leak current in a dark state was as low as 1 $nA/cm^2$ or less upon application of a bias of 10 V.

Furthermore, a light response speed was equivalent to that of a pin-type photoelectric conversion apparatus having no multiplication layer 1602, and was high.

In this example, the light absorption layer has a thickness of about 2 µm, but may have a thickness which is large enough to allow light to pass therethrough but not to allow it to reach the multiplication layer. This thickness is determined by a light absorption coefficient.

The forbidden bandwidth Eg2 of the light absorption layer is about 1.8 to 2.3 eV. The C composition ratio may be changed to control Eg2, so that desired spectral sensitivity characteristics can be obtained.

In this example, a structure wherein stepbacks are immediately changed is assumed as an ideal energy band chart. Even if the structure has moderate stepbacks, the same effects as described above can be obtained as long as they fall within a mean free path of electrons. Furthermore, if the structure has moderate stepbacks, a degree of freedom upon selection of materials can be increased.

EXAMPLE 31

Example 31 of the present invention will be described below with reference to FIGS. 55A and 55B.

Figure 55A:
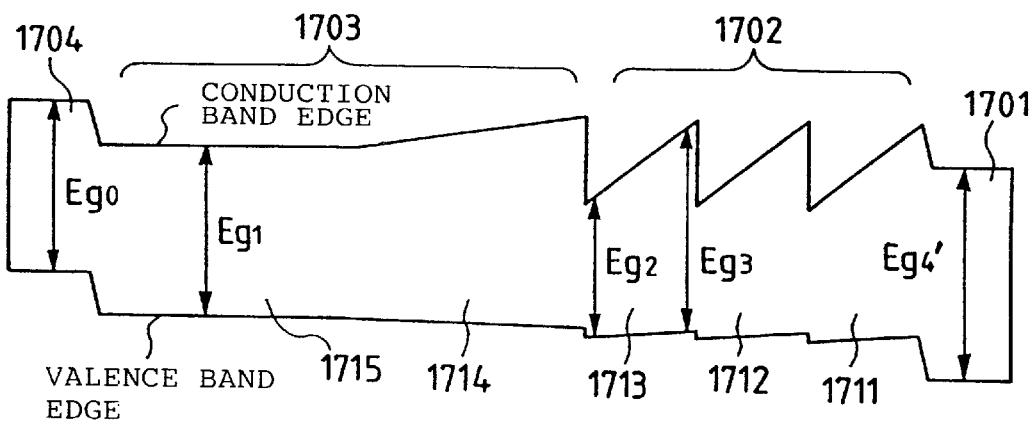
Figure 55B:
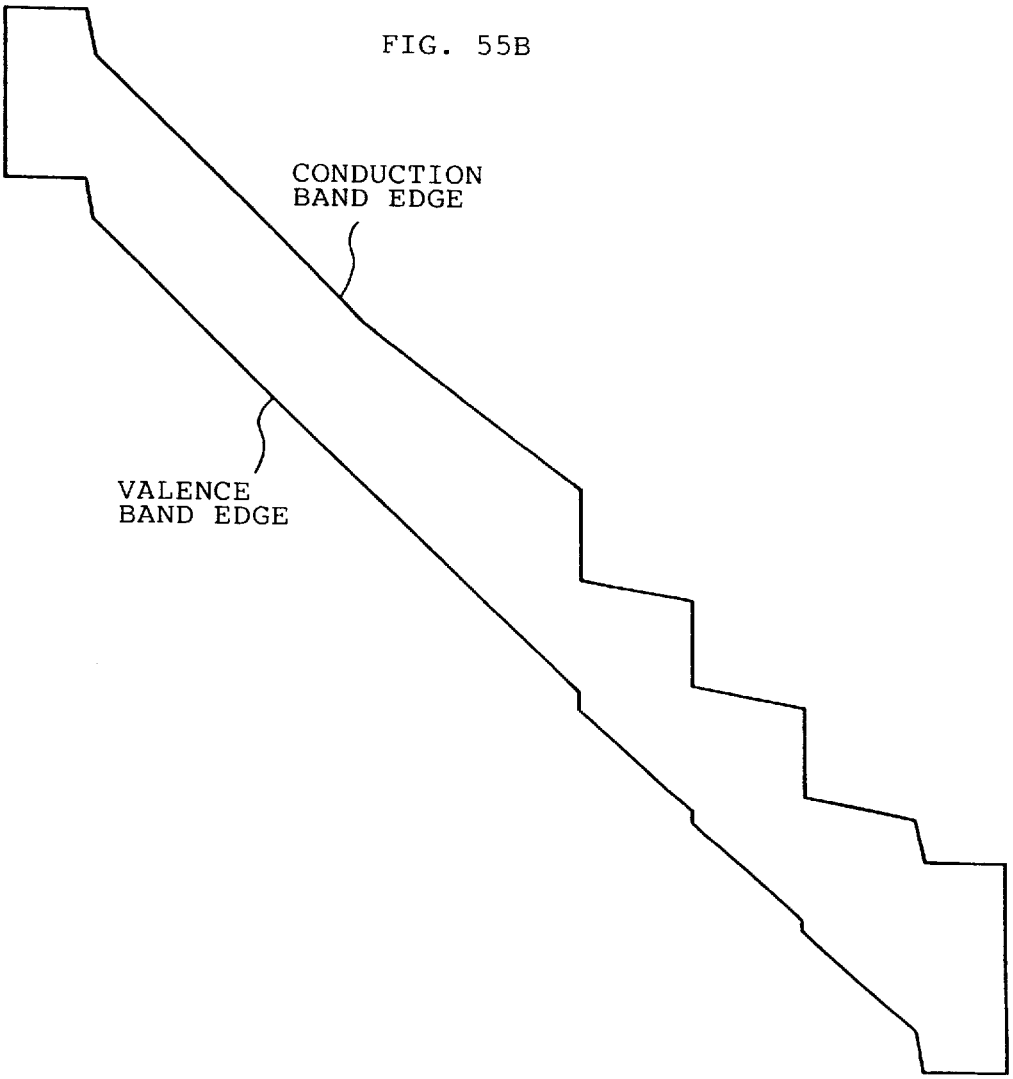

FIGS. 55A and 55B are ideally assumed energy band charts of Example 31 of the present invention.

FIG. 55A is an energy band chart obtained when the photoelectric conversion apparatus of Example 11 is in a non-bias state, and FIG. 55B is an energy band chart obtained when the apparatus is applied with a bias to perform a carrier multiplication operation.

FIG. 55A is substantially the same as FIG. 54A, except that 1701 denotes an n-type a-$Si_{1-y}C_y$:H layer having a forbidden bandwidth Eg4', and an a-Si:H composition region of a light absorption layer 1703 is wider than that in FIG. 54A, and illustrates that a multiplication region 1702 consisting of three layers, i.e., a-$Si_{1-x}Ge_x$:H to a-$Si_{1-y}C_y$:H composition change layers 1711, 1712, and 1713 has a minimum forbidden bandwidth Eg2, and a maximum forbidden bandwidth Eg3, an a-Si:H to a-$Si_{1-y}C_y$:H layer 1703 has a forbidden bandwidth Eg1, and a p-type a-Si:H layer 1704 has a forbidden bandwidth Eg0.

A multiplication ratio of this apparatus was about 10 times or more upon application of a bias of 10 V.

The multiplication ratio was not changed even if a wavelength was changed for light from a visible region to an ultraviolet region having a wavelength of 700 nm or less.

A leak current in a dark state was as low as 1 $nA/cm^2$ or less upon application of a bias of 10 V.

Furthermore, a light response speed was equivalent to that of a pin-type photoelectric conversion apparatus having no multiplication layer 1702, and was high.

In this example, a structure wherein stepbacks are immediately changed is assumed as an ideal energy band chart. Even if the structure has moderate stepbacks, the same effects as described above can be obtained as long as they fall within a mean free path of electrons. Furthermore, if the structure has moderate stepbacks, a degree of freedom upon selection of materials can be increased.

EXAMPLE 32

In this example, a photoelectric conversion apparatus described in Example 30 is stacked on a scanning circuit and a read circuit already proposed in Japanese Laid-Open Patent Application No. 63-278269 by the present inventors like in Example 22.

Note that the structure of the photoelectric conversion apparatus is substantially the same as that in FIG. 45A except that an a-Si:H layer 714 as the light absorption layer shown in FIG. 45A is used as an a-Si:H to a-Si$_{1-y}$C$_y$:H composition change layer as the light absorption layer, and its operation is also the same. Thus, its detailed description will be omitted.

In the above example, a circuit invented by the present inventors has been exemplified. However, the present invention is applicable to a conventional photoelectric conversion apparatus like in Example 3.

EXAMPLE 33

This example is constituted in such a manner that a light absorption layer, having a forbidden bandwidth Eg1, for absorbing light to generate photocarriers, and a multiplication layer, obtained by stacking one or a plurality of layers having a stepback structure in which a forbidden bandwidth is continuously changed to have a minimum forbidden bandwidth Eg2 and a maximum forbidden bandwidth Eg3, for multiplying the carriers generated upon light absorption, are stacked to be sandwiched between electric charge injection blocking layers, and the forbidden bandwidth Eg1 of the light absorption layer is continuously changed from a side of one electric charge injection blocking layer stacked on the light absorption layer, and is set to be substantially equal to the minimum forbidden bandwidth Eg2 of the multiplication layer on a side of the multiplication layer.

In this example, since the forbidden bandwidth Eg1 of the light absorption layer is continuously changed from the side of one electric charge injection blocking layer stacked on the light absorption layer and is set to be substantially equal to the minimum forbidden bandwidth Eg2 of the multiplication layer on the side of the multiplication layer, various problems caused by band mismatching can be eliminated, and high-response characteristics equivalent to those of a photodiode having no multiplication layer can be obtained. At the same time, the forbidden bandwidth Eg1 of the light absorption layer is set to particularly cope with light from an infrared region to an ultraviolet region to have a high sensitivity for light .from the infrared region to the ultraviolet region.

In addition, the number of layers of the stepback structure is selected, so that an amplification factor of 2 or more can be obtained, and noise can be reduced.

Furthermore, when constituting elements of the photoelectric conversion apparatus of the present invention are formed of monocrystalline materials at least containing an Si atom, easy controllability of forbidden bandwidths and low-temperature formation of a multilayered structure can be assured, and various problems caused upon formation of the multilayered structure can be solved.

Example 33 of the present invention will be described below with reference to FIG. 56 and FIGS. 57A and 57B.

Note that this example is substantially the same as Example 21 except that the forbidden bandwidth Eg1 of the light absorption layer is continuously changed from one electric charge injection blocking layer stacked on the light absorption layer, and is set to be substantially equal to the minimum forbidden bandwidth Eg2 of the multiplication layer on the multiplication layer side, and a description is partially omitted to avoid repetitive descriptions.

Figure 56:
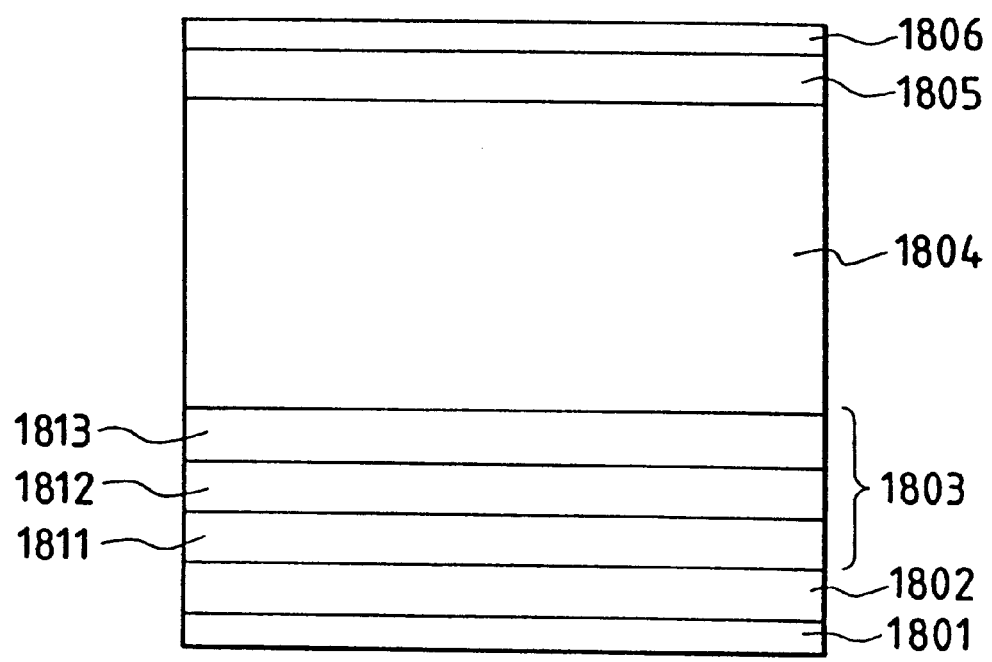
FIG. 56 is a schematic sectional view showing a photoelectric conversion apparatus according to still another embodiment of the present invention.

FIG. 56 is a schematic longitudinal sectional view showing Example 33 of a photoelectric conversion apparatus of the present invention.

In FIG. 56, reference numeral 1801 denotes a Cr electrode; 1802, a 500-Å thick n-type a-Si$_{1-x}$Ge$_x$:H electric charge injection blocking layer for blocking hole injection; 1803, a multiplication region, whose composition is changed from a-Si$_{1-x}$Ge$_x$:H to a-Si$_{1-y}$C$_y$:H, for performing carrier multiplication; 1804, a 1-μm thick light absorption layer, whose composition is changed from a-Si:H to a-Si$_{1-x}$Ge$_x$:H, for absorbing light and generating carriers; 1805, a 100-Å thick p-type a-Si:H electric charge injection blocking layer for blocking electron injection; and 1806, a transparent electrode containing indium oxide as a major component.

The Cr electrode 1801 and the transparent electrode 1806 were formed by EB evaporation, and amorphous layers, i.e., the electric charge injection blocking layer 1802, the multiplication region 1803, the light absorption layer 1804, and the electric charge injection blocking layer 1805 were formed by plasma CVD. As source gases upon formation of amorphous layers, SiH$_4$, GeH$_4$, PH$_3$, and H$_2$ gases were used for the electric charge injection blocking layer 1802, SiH$_4$, GeH$_4$, CH$_4$, and H$_2$ were used for the multiplication region 1803, SiH$_4$, GeH$_4$, and H$_2$ gases were used for the light absorption layer 1804, and SiH$_4$, B$_2$H$_6$, and H$_2$ gases were used for the electric charge injection blocking layer 1805.

The multiplication region 1803 comprises three layers, i.e., 200-Å thick composition change layers 1811, 1812, and 1813 formed by continuously changing flow rates of CH$_4$ and GeH$_4$ gases of the source gases. The light absorption layer 1804 is formed by continuously changing a flow rate of GeH$_4$ gas of the source gases.

Figure 57A:
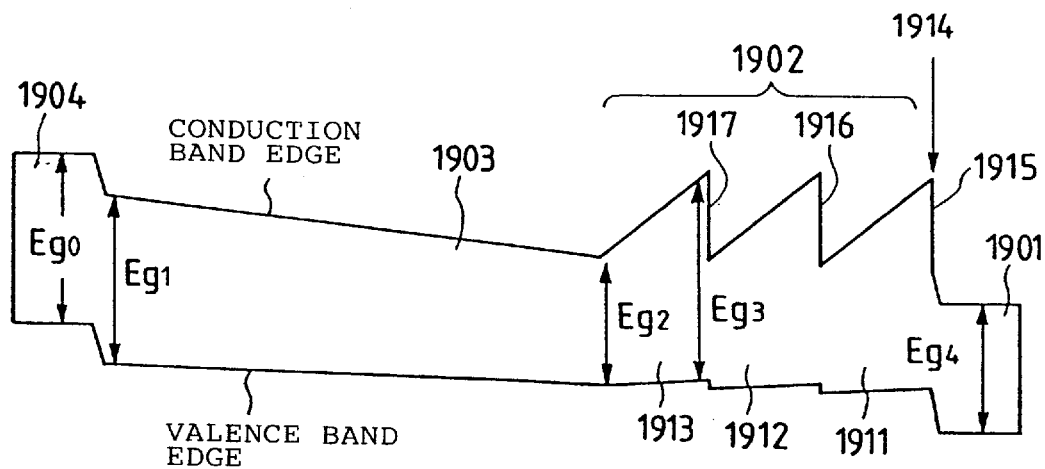
FIGS. 57A and 58A are energy band charts in a non-bias state.
Figure 57B:
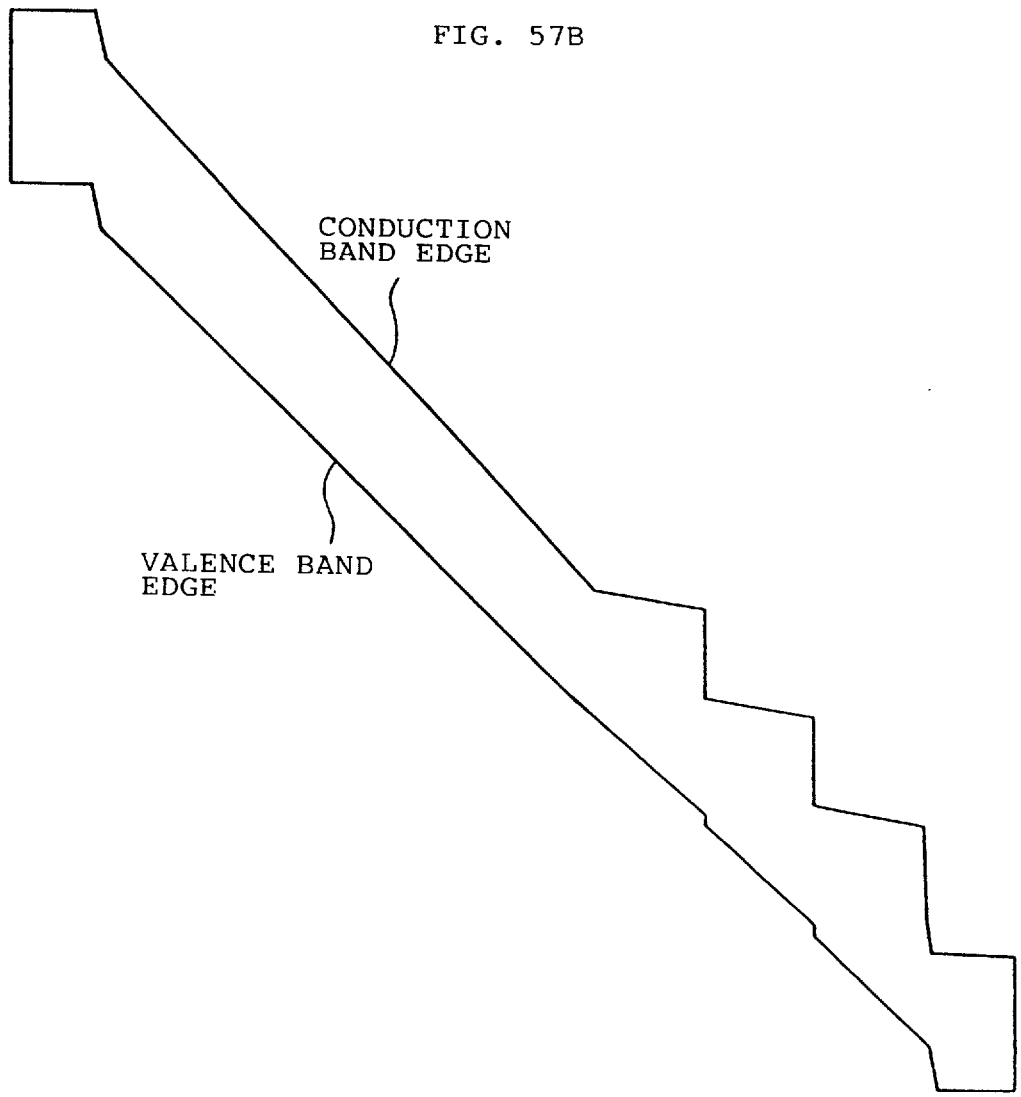
FIGS. 57B and 58B are energy band charts in a bias application state.

The photoelectric conversion apparatus of Example 33 shown in FIG. 56 is assumed to ideally have an energy band structure as shown in FIGS. 57A and 57B.

FIG. 57A is an energy band chart obtained when the photoelectric conversion apparatus of Example 33 is in a non-bias state, and FIG. 57B is an energy band chart obtained when the apparatus is applied with a bias to perform a carrier multiplication operation.

FIGS. 57A and 57B illustrate that an n-type a-Si$_{1-x}$Ge$_x$:H layer 1901 has a forbidden bandwidth Eg4, a multiplication region 1902 consisting of three layers, i.e., a-Si$_{1-x}$Ge$_x$:H to a-Si$_{1-y}$C$_y$:H composition change layers 1911, 1912, and 1913 has a minimum forbidden bandwidth Eg2, and a maximum forbidden bandwidth Eg3, an a-Si:H to a-Si$_{1-x}$Ge$_x$:H layer 1903 has a forbidden bandwidth Eg1, and a p-type a-Si:H layer 1904 has a forbidden bandwidth Eg0.

In FIG. 57A, although energy discontinuous points are present at both conduction and valence. band edges, there is almost no barrier due to energy discontinuity in a migration direction of carriers in a bias application state, as can be seen from FIG. 57B. Thus, carrier migration is not disturbed.

Of the composition change layers 1911, 1912, and 1913 manufactured in this example, a layer giving the maximum forbidden bandwidth Eg3 was formed of a-Si$_{1-y}$C$_y$:H having a C composition ratio of about 0.4, and Eg3 was also about 2.3 eV.

A Ge composition ratio x of the a-Si$_{1-x}$Ge$_x$:H layer 1901 was about 0.6, and the forbidden bandwidth Eg4 was about 1.3 eV. Of the composition change layers 1911, 1912, and 1913, a layer giving the minimum forbidden bandwidth Eg2 was also formed of a-Si$_{1-x}$Ge$_x$:H, and Eg2 was also about 1.3 eV. A layer portion giving the minimum forbidden bandwidth Eg1 of the a-Si:H to a-Si$_{1-x}$Ge$_x$:H layer 1903 was also formed of a-Si$_{1-x}$Ge$_x$:H. A layer portion giving the maximum forbidden bandwidth Eg1 of the a-Si:H to a-Si$_{1-x}$Ge$_x$:H layer 1903 was a-Si:H, and Eg1 was about 1.8 eV. The forbidden bandwidth Eg0 of the p-type a-Si:H layer 1904 was also about 1.8 eV.

The light absorption layer 1903 had a light absorption coefficient of about $1 \times 10^5$ cm$^{-1}$ or more for light having a wavelength of 400 nm, and about $2 \times 10^4$ cm$^{-1}$ or more for light having a wavelength of 1,000 nm. Thus, the layer 1903 could satisfactorily absorb light of an infrared region, a visible region, and an ultraviolet region. A multiplication ratio of this apparatus was about 10 times or more upon application of a bias of 10 V. The multiplication ratio was not changed even if a wavelength was changed for light from a visible region to an ultraviolet region having a wavelength of 1,000 nm or less.

A leak current in a dark state was as low as 1 nA/cm$^2$ or less upon application of a bias of 10 V.

Furthermore, a light response speed was equivalent to that of a pin-type photoelectric conversion apparatus having no multiplication layer 1902, and was high.

In this example, the light absorption layer has a thickness of about 1 μm, but may have a thickness which is large enough to allow light to pass therethrough but not to allow it to reach the multiplication layer. This thickness is determined by a light absorption coefficient.

In this example, a structure wherein stepbacks are immediately changed is assumed as an ideal energy band chart. Even if the structure has moderate stepbacks, the same effects as described above can be obtained as long as they fall within a mean free path of electrons. Furthermore, if the structure has moderate stepbacks, a degree of freedom upon selection of materials can be increased.

The forbidden bandwidth Eg2 of the light absorption layer is about 1.8 to 2.3 eV. The Ge composition ratio may be changed to control Eg2, so that desired spectral sensitivity characteristics can be obtained.

EXAMPLE 34

Example 34 of the present invention will be described below with reference to FIGS. 58A and 58B.

Figure 58A:
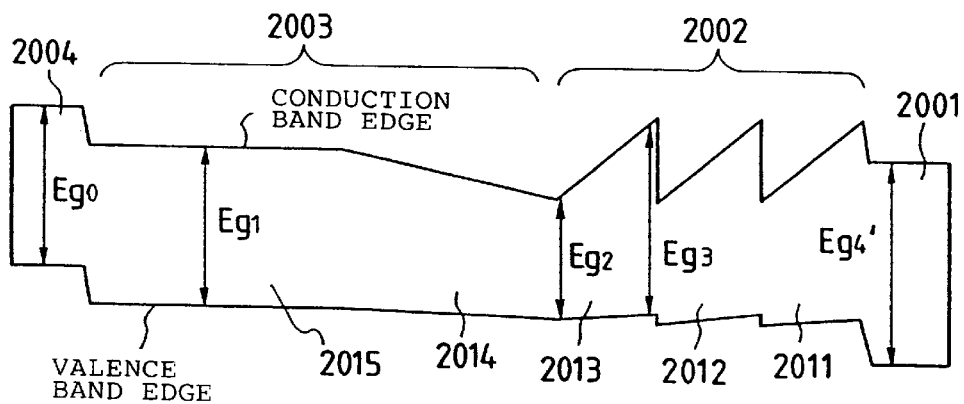
Figure 58B:
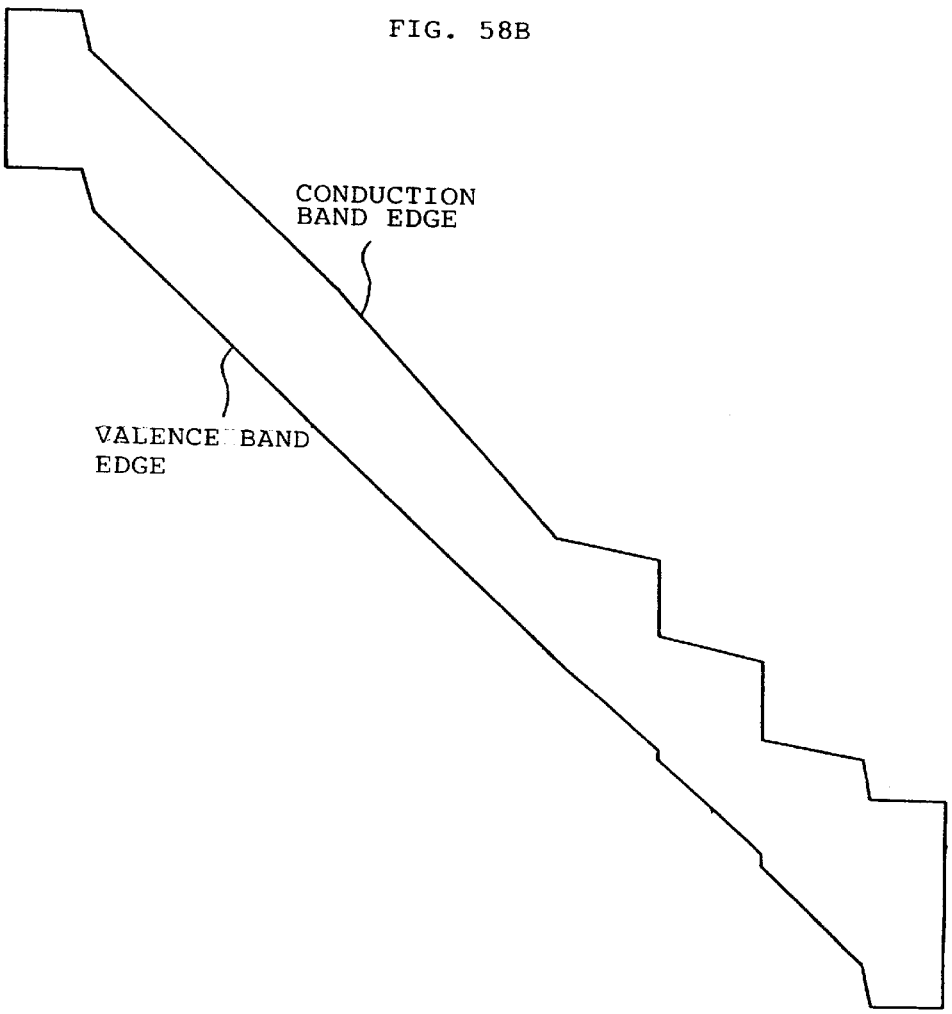

FIGS. 58A and 58B are ideally assumed energy band charts of Example 34 of the present invention.

FIG. 58A is an energy band chart obtained when the photoelectric conversion apparatus of Example 34 is in a non-bias state, and FIG. 58B is an energy band chart obtained when the apparatus is applied with a bias to perform a carrier multiplication operation.

FIG. 58A is substantially the same as FIG. 58A, except that 2001 denotes an n-type a-Si$_{1-y}$C$_y$:H layer having a forbidden bandwidth Eg4', and an a-Si:H composition region of a light absorption layer 2003 is wider than FIG. 17, and illustrates that a multiplication region 2002 consisting of three layers, i.e., a-Si$_{1-x}$Ge$_x$:H to a-Si$_{1-y}$C$_y$:H composition change layers 2011, 2012, and 2013 has a minimum forbidden bandwidth Eg2, and a maximum forbidden bandwidth Eg3, an a-Si:H to a-Si$_{1-x}$Ge$_x$:H layer 2003 has a forbidden bandwidth Eg1, and a p-type a-Si:H layer 2004 has a forbidden bandwidth Eg0.

A multiplication ratio of this apparatus was about 10 times or more upon application of a bias of 10 V.

The multiplication ratio was not changed even if a wavelength was changed for having a wavelength of 1,000 nm or less.

A leak current in a dark state was as low as 1 nA/cm$^2$ or less upon application of a bias of 10 V.

Furthermore, a light response speed was equivalent to that of a pin-type photoelectric conversion apparatus having no multiplication layer 2002, and was high.

In this example, a structure wherein stepbacks are immediately changed is assumed as an ideal energy band chart. Even if the structure has moderate stepbacks, the same effects as described above can be obtained as long as they fall within a mean free path of electrons. Furthermore, if the structure has moderate stepbacks, a degree of freedom upon selection of materials can be increased.

EXAMPLE 35

In this example, a photoelectric conversion apparatus described in Example 33 is stacked on a scanning circuit and a read circuit already proposed in Japanese Laid-Open Patent Application No. 63-278269 by the present inventors like in Example 23. Note that the structure of the photoelectric conversion apparatus is substantially the same as that in FIG. 45A except that an a-Si:H layer 714 as the light absorption layer shown in FIG. 45A is used as an a-Si:H to a-Si$_{1-x}$Ge$_x$:H composition change layer as the light absorption layer, and its operation is also the same. Thus, its detailed description will be omitted.

In the above example, a circuit invented by the present inventors has been exemplified. However, the present invention is applicable to a conventional photoelectric conversion apparatus like in Example 23.

What is claimed is:

1. A photoelectric conversion apparatus comprising:
   a light absorption layer made of non-monocrystalline material having an energy bandgap Eg1 greater than 1.2 eV;
   an avalanche multiplication layer comprising a plurality of stepback layers, adjacent stepback layers being interconnected via a heterojunction, each stepback layer made of non-monocrystalline material having an energy bandgap gradually broadening from a minimum energy bandgap Eg2 to a maximum energy bandgap Eg3 in a direction from a light receiving surface side of said avalanche multiplication layer toward an opposing surface side of said avalanche multiplication layer, wherein said light absorption layer is disposed adjacent to said light receiving surface side of said avalanche multiplication layer, wherein said light absorption layer is of sufficient thickness to generate photocarriers by absorbing all incident visible light so that no photocarriers are generated by said avalanche multiplication layer, and wherein a high-concentration impurity layer is provided between two adjacent layers of said plurality of stepback layers;
   voltage application means for applying to said avalanche multiplication layer a voltage sufficient to cause carrier drift but not sufficient to cause carrier generation by ionization in each said stepback layer; and
   storage means being electrically connected to said avalanche multiplication layer for storing carriers generated by avalanche multiplication,
   wherein the energy difference between the minimum and maximum energy bandgaps is sufficient to cause carrier generation by ionization at an interface between two adjacent layers of said plurality of stepback layers.

2. A photoelectric conversion apparatus according to claim 1, wherein the energy bandgap Eg1 is constant.

3. A photoelectric conversion apparatus according to claim 1, wherein the energy bandgap Eg1 gradually narrows in a direction from a light receiving surface side of said light absorption layer to an opposing surface side of said light absorption layer.

4. A photoelectric conversion apparatus according to claim 1, wherein the energy bandgap Eg1 gradually broadens in a direction from a light receiving surface side of said light absorption layer to an opposing surface side of said light absorption layer.

5. A photoelectric conversion apparatus according to claim 1, wherein the energy bandgap Eg1 near an interface between said light absorption layer and said avalanche multiplication layer is equal to the minimum energy bandgap Eg2.

6. A photoelectric conversion apparatus according to claim 1, wherein the energy bandgap Eg1 near an interface between said light absorption layer and said avalanche multiplication layer is equal to the maximum energy bandgap Eg3.

7. A photoelectric conversion apparatus according to claim 1, wherein said avalanche multiplication layer is formed on an underlying substrate on which an electrical circuit has already been formed.

8. A photoelectric conversion apparatus according to claim 1, further comprising a terminal electrode layer, first and second electric charge blocking layers, and a transparent terminal electrode layer, and wherein, said first electric charge blocking layer is stacked on said terminal electrode layer, said avalanche multiplication layer is stacked on said first electric charge blocking layer, said light absorption layer is stacked on said avalanche multiplication layer, said second electric charge blocking layer is stacked on said light absorption layer, and said transparent terminal electrode layer is stacked on said second electric charge blocking layer.

9. A photoelectric conversion apparatus according to claim 8, wherein a layer thickness of said electric charge blocking layers is not less than 50 Å and not more than 2000 Å.

10. A photoelectric conversion apparatus according to claim 1, wherein a layer thickness of said stepback layers is not less than 50 Å and not more than 1 $\mu$m.

11. A photoelectric conversion apparatus according to claim 1, wherein a layer thickness of said high-concentration impurity layer is not greater than a mean free path $\lambda$ of electrons in said high-concentration impurity layer.

12. A photoelectric conversion apparatus according to claim 1, wherein at least one of said two adjacent stepback layers contains an impurity near an interface between said at least one stepback layer and said high-concentration impurity layer, and the concentration of the impurity decreases toward the center of said at least one stepback layer.

13. A photoelectric conversion apparatus according to claim 1, wherein each of said stepback layers of said avalanche multiplication layer comprises silicon, germanium and carbon, the concentration of germanium being higher toward the light receiving surface side of said stepback layer than at the remainder of said stepback layer, and the concentration of carbon being higher toward the opposing surface side of said stepback layer than at the remainder of said stepback layer.

* * * * *

UNITED STATES PATENT AND TRADEMARK OFFICE
CERTIFICATE OF CORRECTION

PATENT NO.     : 6,127,692
DATED          : October 26, 1993
INVENTOR(S)    : Shigetoshi Sugawa et al.

It is certified that error appears in the above-identified patent and that said Letters Patent is hereby corrected as shown below:

<u>Title page,</u>
Insert: -- [*] Notice: This patent issued on a continued prosecution application filed under 37 CFR 1.53(d), and is subject to the twenty year patent term provisions of 35 U.S.C. 154(a)(2) --.

Item [30], Foreign Application Priority Data
"Aug. 3, 1990 [WO] WIPO PCT/JP90/00999" should be deleted.

Item [56], References Cited - FOREIGN PATENT DOCUMENTS, insert:
-- 4931661      6/5/90    Fukaya et al. --; and
-- 58-157179    9/19/82   Japan" --.
"227016         1/1998    Euro. Pat. Off." should be deleted.

Item [56], References Cited – OTHER PUBLICATIONS, please insert
-- "Multiplication Noise in Uniform Avalanche Diodes" by R. J. McIntyre; IEEE Transactions on Electron Devices, January 1966 Vol. ED-13 No. 1 pgs 164-168 --;
and insert:
-- "The Graded Bandgap Multilayer Avalanche Photodiode: A New Low-Noise Detector" by G.F. William et al. IEEE Electron Device Letters March 1982 Vol. EDL-3, No. 3 pgs. 71-73 --.

<u>Column 2,</u>
Line 11, "a" should read -- $\alpha$ --.

<u>Column 15,</u>
Line 36, "particular" should read -- particular, --.

<u>Column 17,</u>
Line 46, In.As.Sb," should read -- In•As•Sb, --.

<u>Column 19,</u>
Line 23, "described" (second occurrence) should be deleted.

<u>Column 29,</u>
Line 50, "with in" should read -- within --.

UNITED STATES PATENT AND TRADEMARK OFFICE
CERTIFICATE OF CORRECTION

PATENT NO.    : 6,127,692
DATED         : October 26, 1993
INVENTOR(S)   : Shigetoshi Sugawa et al.

It is certified that error appears in the above-identified patent and that said Letters Patent is hereby corrected as shown below:

Column 32,
Line 47, Close up right margin; and
Line 48, Close up left margin.

Column 34,
Line 12, "anode." should read -- anode --.

Column 37,
Line 10, "$SiN^x$" should read -- $SiN_x$ --.

Column 43,
Line 43, "capacitor." should read -- capacitor --.

Column 57,
Line 36, "less." should read -- less --.

Column 59,
Line 2, "for" (second occurrence) should be deleted.

Column 81,
Line 40, ".from" should read -- from --.

Column 82,
Line 46, "valence," should read -- valence --.

UNITED STATES PATENT AND TRADEMARK OFFICE
CERTIFICATE OF CORRECTION

PATENT NO.   : 6,127,692
DATED        : October 26, 1993
INVENTOR(S)  : Shigetoshi Sugawa et al.

It is certified that error appears in the above-identified patent and that said Letters Patent is hereby corrected as shown below:

Column 86,
Line 9, "claim 1" should read -- claim 7 --; and
Line 13, "claim 1" should read -- claim 7 --.

Signed and Sealed this

Eighteenth Day of June, 2002

*Attest:*

*Attesting Officer*

JAMES E. ROGAN
*Director of the United States Patent and Trademark Office*